(12) United States Patent
Shino

(10) Patent No.: US 6,191,449 B1
(45) Date of Patent: Feb. 20, 2001

(54) SOI BASED TRANSISTOR HAVING AN INDEPENDENT SUBSTRATE POTENTIAL CONTROL

(75) Inventor: Tomoaki Shino, Tokyo (JP)

(73) Assignee: Kabushiki Kaisha Toshiba, Kawasaki (JP)

(*) Notice: Under 35 U.S.C. 154(b), the term of this patent shall be extended for 0 days.

(21) Appl. No.: 08/933,346

(22) Filed: Sep. 19, 1997

(30) Foreign Application Priority Data

Sep. 19, 1996 (JP) .................................................. 8-248092
Aug. 27, 1997 (JP) .................................................. 9-230927

(51) Int. Cl.[7] .................................................. H01L 29/76
(52) U.S. Cl. .................... 257/347; 257/276; 257/299; 257/350; 257/351; 257/371; 257/372; 257/375
(58) Field of Search .................... 257/347, 350, 257/351, 372, 371, 299, 375, 276

(56) References Cited

U.S. PATENT DOCUMENTS 5,554,872 * 9/1996 Baba et al. ............................ 257/347
5,679,968 * 10/1997 Smayling et al. ................... 257/213
5,838,047 * 11/1998 Yamauchi et al. ................... 257/371

FOREIGN PATENT DOCUMENTS 6-85262 * 3/1994 (JP) .

OTHER PUBLICATIONS

Fariborz Assaderaghi, et al., "A Dynamic Threshold Voltage MOSFET (DTMOS), for Ultra–Low Voltage Operation", International Electron Devices Meeting Technical Digest, Dec. 11–14, 1994, pp. 809–812.*

Fariborz Assaderaghi, et al., "Dynamic Threshold–Voltage MOSFET (DTMOS) for Ultra–Low VLSI", IEEE Transactions on Electron Devices, vol. 44, No. 3, Mar. 1997, pp. 414–422.*

* cited by examiner

Primary Examiner—Fetsum Abraham
(74) Attorney, Agent, or Firm—Oblon, Spivak, McClelland, Maier & Neustadt, P.C.

(57) ABSTRACT

A semiconductor device comprises a semiconductor layer formed on an insulation layer, a pair of source and drain diffusion layer formed on a surface of the semiconductor layer, a first gate electrode disposed on the semiconductor layer region interposed between the pair of source and drain diffusion layer through a gate insulation film, a substrate potential control layer coupled to the semiconductor layer in a region interposed between the pair of the source and drain diffusion layer and formed in such a manner that the first gate electrode does not exist thereon, and a second gate electrode disposed to be in contact with the first gate electrode.

10 Claims, 130 Drawing Sheets

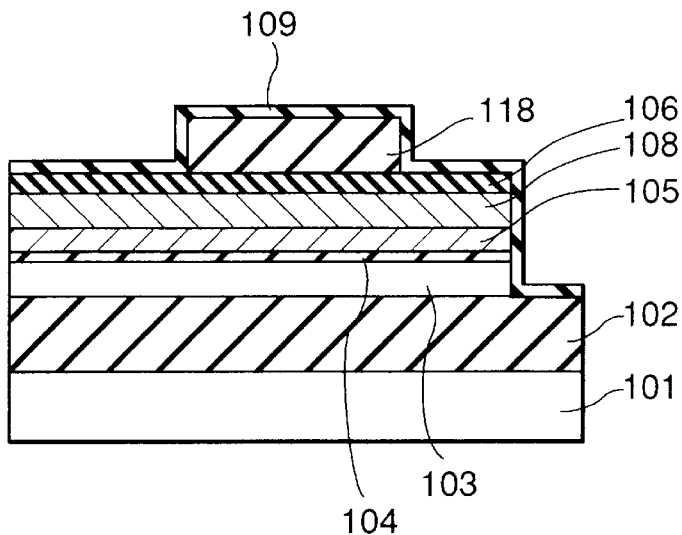
FIG. 59A
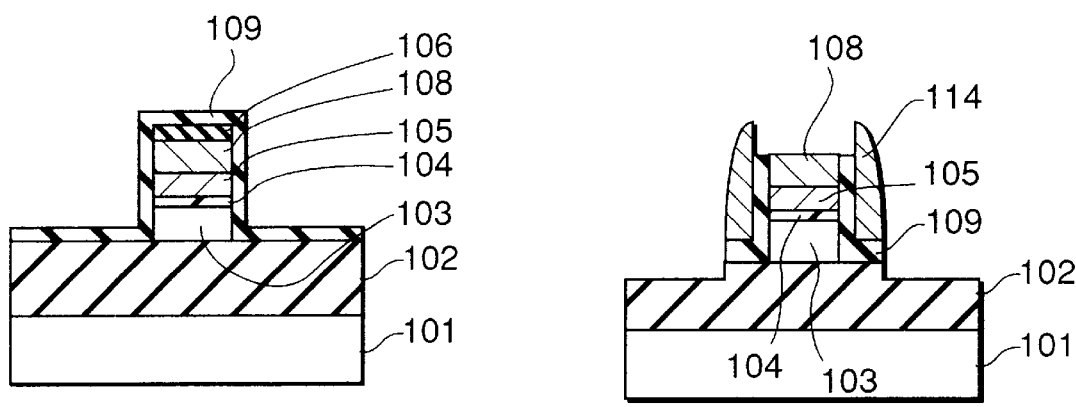
FIG. 59B
FIG. 60B
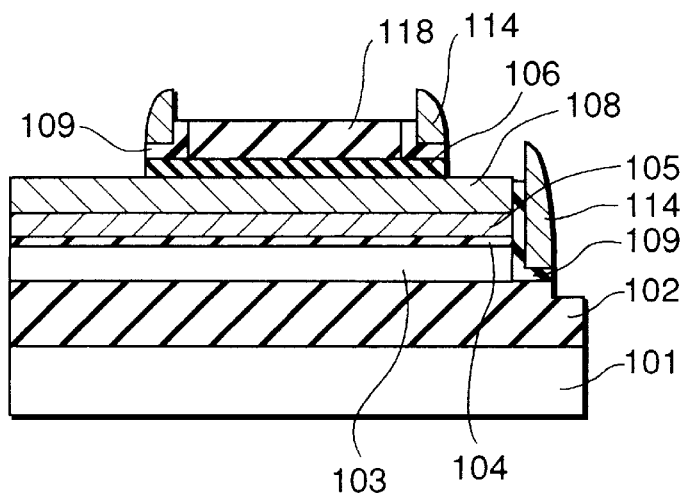
FIG. 60A

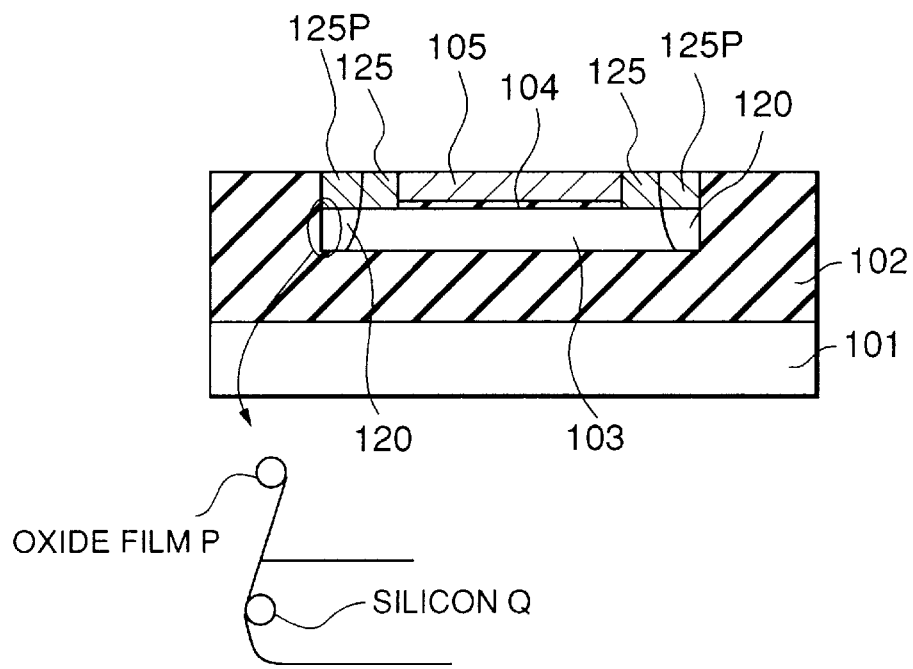
FIG.85A
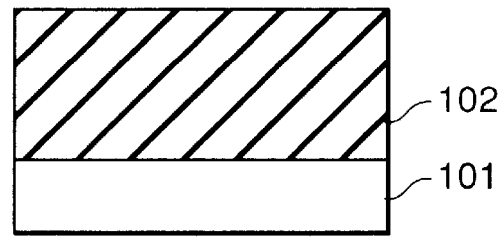
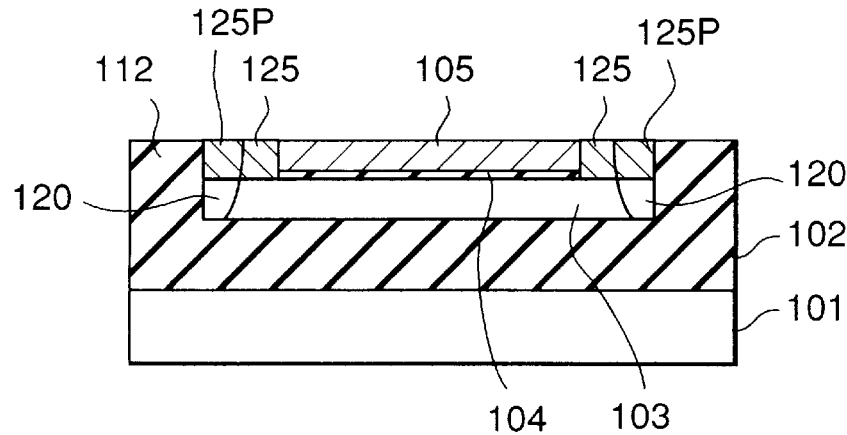
FIG.85B
FIG.85C

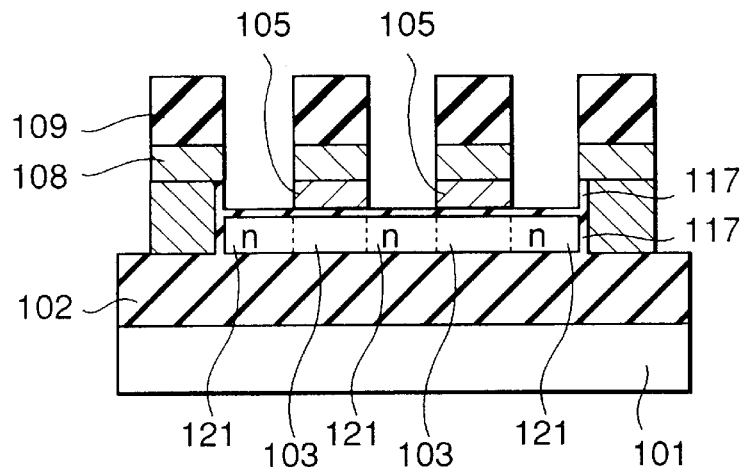
FIG.116A
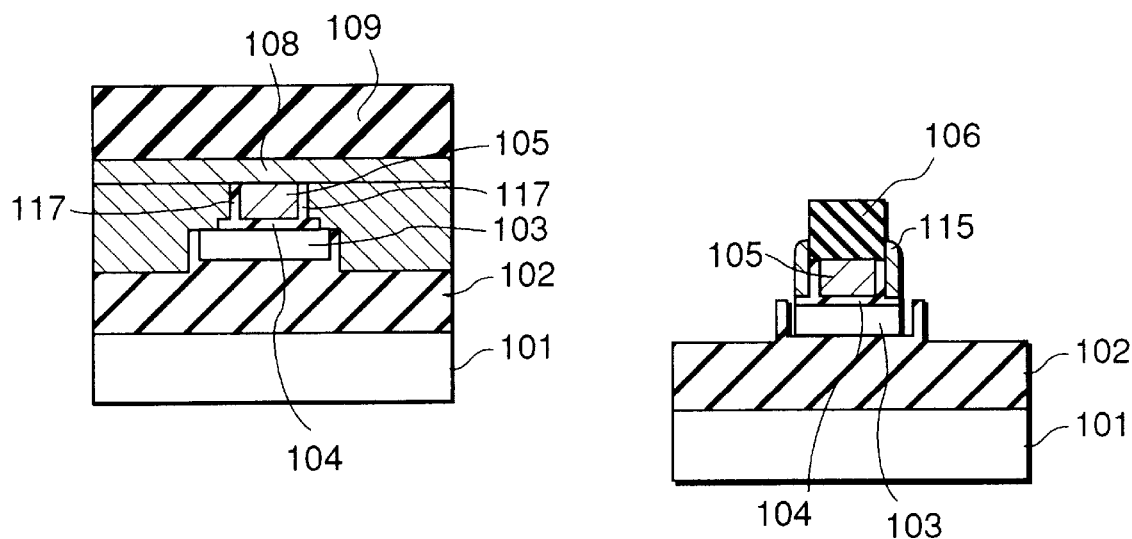
FIG.116B
FIG.117B
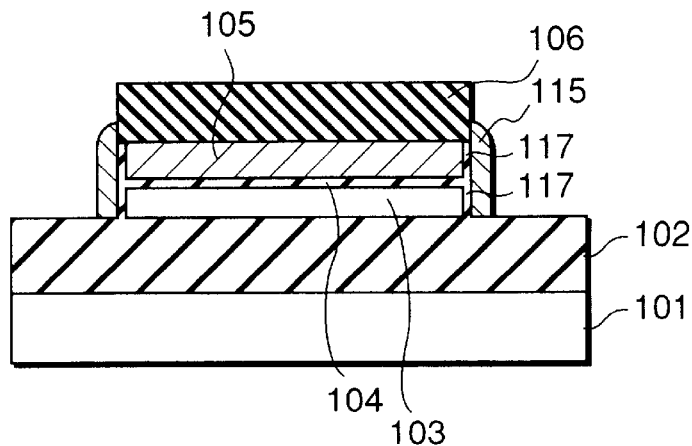
FIG.117A

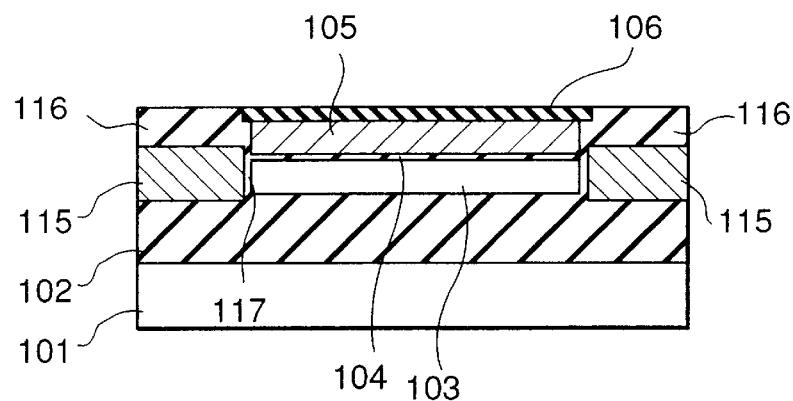
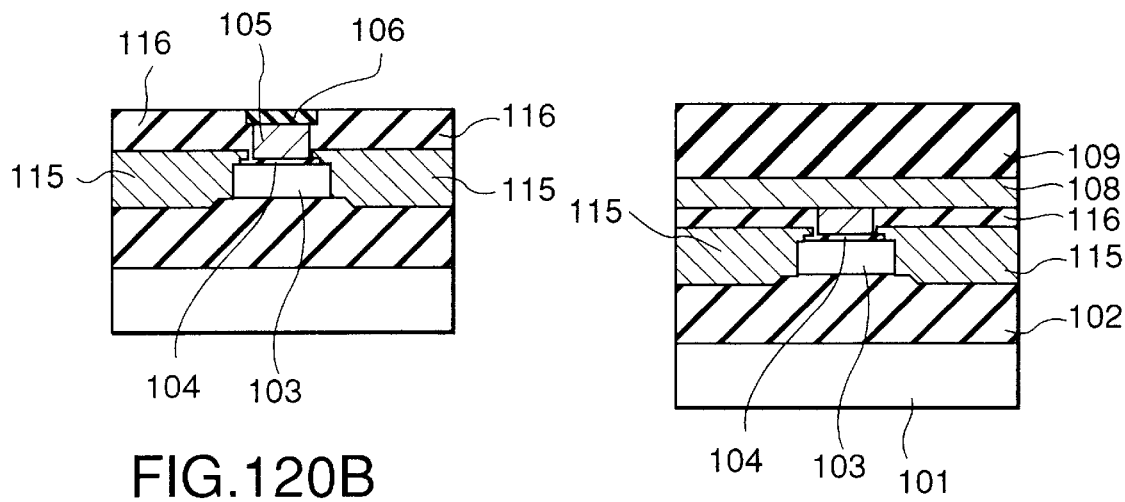
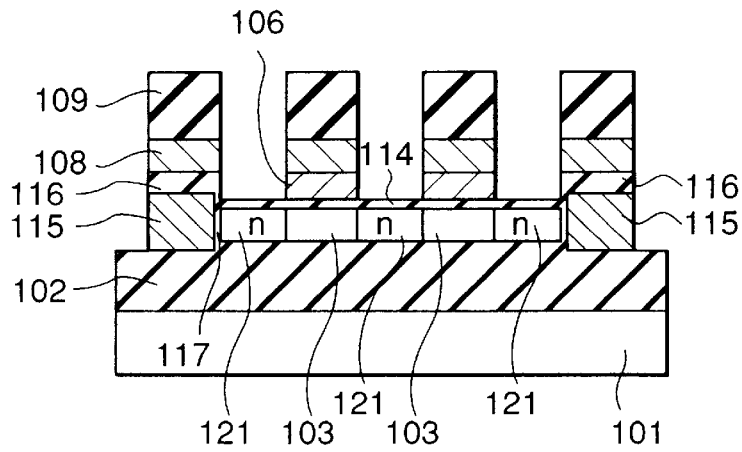

SOI BASED TRANSISTOR HAVING AN INDEPENDENT SUBSTRATE POTENTIAL CONTROL

BACKGROUND OF THE INVENTION

The present invention relates to a semiconductor device and manufacturing method the semiconductor device having a MOS transistor formed on a SOI (Silicon On Insulator) substrate and capable of controlling a potential of a region, in which a channel is formed.

A substrate (an SOI substrate) having a so-called Silicon-On-Insulator (SOI) structure, in which a single crystal silicon film is formed on an insulation film, has been developed and researched from long ago because a semiconductor device having excellent performance can be realized. Since the wafer processing technique has been progressed in recent years, methods for applying the SOI substrate have energetically been investigated FIG. 1 shows a MOS transistor having a body extended portion as an example of a conventional transistor comprising a SOI substrate and having satisfactory performance. FIGS. 2A, 2B and 2C are other conventional MOS transistors and respectively show a perspective view, a plan view and a cross sectional view taken along line 2C—2C shown in FIG. 2B.

The "body" is a portion interposed between a source and a drain (an $n^+$-type diffusion layer) and on which a channel of the MOS transistor will be formed. In a case of an n-channel MOS transistor, the body is a p-type silicon layer in which a low concentration p-type impurity is doped in a SOI.

The "body extended portion" is a portion which is not interposed between the source and the drain and which is a p-type silicon layer coupled to the body.

In a case of an n-channel structure, the source and the drain are n-type silicon regions in which a high concentration n-type impurity is doped in a SOI. Recently, a structure having a region, which is in contact with the channels of the source and the drain doped with low concentration n-type impurity, that is, an LDD (Lightly Doped Drain) structure, may be widely used.

An ion implantation for forming the source and the drain is performed by using a gate electrode and a resist pattern as masks after the gate electrode has been formed. A $p^+$-type diffusion layer is, as a contact layer, formed in a portion of the body extended portion by using the gate electrode and the resist pattern as masks.

In the structure shown in FIG. 2A, the $p^+$-type diffusion layer is, as shown in FIG. 2C, coupled to the gate electrode through an aluminum wiring, and then coupled to the body. The foregoing structure is also applied to the device shown in FIG. 1.

Since the potentials of the bodies of the above-mentioned MOS transistors can be controlled by adjusting the voltage which is applied to the $p^+$-type diffusion layer, a problem such as floating substrate effect can be suppressed when an SOI substrate is employed. Since the threshold voltage is lowered and thus a drain currents are increased if the same voltage is applied to the gate electrode and the body, a transistor which is faster than a MOS transistor formed on a bulk substrate and arranged to be operated with the same power supply voltage can be realized.

However, the MOS transistor of a type having a body extended portion has, for example, the following four problems First Problem Since the conventional device is structured such that the gate electrode is formed also on the body extended portion through a gate oxide film, the capacitance of the device is enlarged undesirably. Since the body extended portion is not a portion which is used as a channel portion, it is not necessary to from a capacitor having an insulation film in the form of a thin oxide film having a thickness similarly to that of the gate oxide film. That is, the capacitor is a parasitic capacitance which obstructs the high speed operation of the device.

Second Problem

The following problems arise because of a boundary (hereinafter called a "parasitic gate edge") between a source and the drain ($n^+$-type diffusion layer) and a body extended portion (a p-type diffusion layer) shown in FIGS. 1 and 2A.

A parasitic capacitance (a p-n junction capacitance) is, in the parasitic gate edge, formed owning to junction of the source and drain (the $n^+$-type diffusion layer) and the body extended portion (the p-type diffusion layer). Also the parasitic capacitance between the gate electrode and the source/drain (the gate/drain capacitance, and the gate/source capacitance) it increase. The above-mentioned parasitic capacitance inhibits the high speed performance of the device. Since leak currents increase because of the junction, disadvantage is realized when the electric power consumption is attempted to be reduced.

Third Problem

A portion of the body extended portion (the p-type diffusion layer) under the gate electrode is a silicon layer (SOI) having high resistance because substantially no impurity is introduced. As a result, the sheet resistance of the body extended portion is raised excessively to hinder the high speed operation, which is the characteristic of the device.

If the $p^+$-type diffusion layer is formed adjacent to the channel edge portion, the sheet resistance of the body extended portion (the p-type diffusion layer) can be reduced by a degree corresponding to the formed $p^+$-type diffusion layer. However, there may arise that the n-type impurity is undesirably implanted into the $p^+$-type diffusion layer if a mask for use when ions are implanted into the source and the drain ($n^+$-type diffusion layer) is deviated. Therefore, the method of reducing the body extended portion (the p-type diffusion layer) having high resistance by forming the $p^+$-type diffusion layer adjacent to the channel edge has a limitation.

Since the SOI substrate comprises the thin silicon layer, reduction in the resistance is an important factor. To reduce the resistance, a salicide (Self-Aligned Silicide) process is generally performed in which metal is applied by a self-alignment manner.

The salicide process has been performed such that the surface of a silicon substrate is exposed after a gate electrode has been performed. Then, metal is applied to the surface of the exposed silicon substrate. Therefore, the portion of the non-exposed body extended portion below the gate electrode cannot be formed into the salicide structure.

Fourth Problem

A fact has been known that the device shown in FIG. 2A having the body extended portion formed only adjacent to the channel edge has a difficulty in controlling the potential of the body adjacent to another channel edge as the channel width is enlarged. The foregoing problem can be overcome by controlling the potential of the body from the two sides after the body extended portions have been formed on the two sides of the channel edges.

The structure of the device shown in FIG. 2C, in which a contact hole is formed in an interlayer insulation film to couple the gate electrode and the body extended portion (the p⁺-type diffusion layer) to each other through an aluminum wiring, requires a gate electrode having an opening in the central portion thereof, the size of which is similar to that of the contact hole. To prevent a problem which arises when the opening is deviated from a predetermined position, the gate electrode must be formed large. Therefore, if the body extended portion is enlarged, the area of the device is enlarged. In this case, it becomes difficult to achieve a high-integration. Moreover, the degree of freedom permitted for the contact hole and the aluminum lines is lowered by a degree corresponding to the enlargement of the body extended portion.

As described above, the conventional MOS transistor formed on a SOI substrate of a type having the body extended portion and controlling the potential of the region in which a channel will be formed has a variety of problems caused from the body extended portion.

BRIEF SUMMARY OF THE INVENTION

An object of the present invention is to provide a semiconductor device having a MOS transistor formed on a SOI substrate which is capable of controlling the potential of a region in which a channel is formed and capable of overcoming the above-mentioned problems.

A semiconductor device according to the first aspect of the present invention is characterized by comprising: a semiconductor layer formed on an insulation layer; a pair of source and drain diffusion layer formed on a surface of the semiconductor layer; a first gate electrode disposed on the semiconductor layer region interposed between the pair of source and drain diffusion layer through a gate insulation film; a substrate potential control layer coupled to the semiconductor layer in a region interposed between the pair of the source and drain diffusion layer and formed in such a manner that the first gate electrode does not exist thereon; and a second gate electrode disposed to be in contact with the first gate electrode. In this case, a preferred manner is an impurity concentration of the substrate potential control layer is higher than that of a region of the semiconductor layer interposed between the pair of source and drain diffusion layer.

Since the semiconductor devices according to the first aspect have the structure in which the first gate electrode does not exist on the first conductive type substrate potential control layer, the parasitic capacitance which is generated by the substrate potential control layer and the first gate electrode can satisfactorily be reduced. As a result, the first problem can be solved.

The structures of the semiconductor devices according to the first aspect, in which a spacer is formed on the side wall of the first gate electrode so as to be used as a mask, is able to form a high concentration diffusion layer and a metal layer in the substrate potential control layer. Thus, the sheet resistance of the substrate potential control layer can be satisfactorily lowered. As a result, the third problem can be overcome.

A semiconductor device according to the second aspect of the present invention is characterized by comprising: a semiconductor layer formed on an insulation layer; a first gate electrode formed on the semiconductor layer through a gate insulation layer; a pair of source and drain diffusion layer formed on a surface of the semiconductor layer so as to interpose the first gate electrode; and a substrate potential control layer coupled to the semiconductor layer in a region interposed between the pair of the source and drain diffusion layer and formed in such a manner that a width of a connection portion of a region of the semiconductor layer is the same length as a channel length defined by the gate electrode. Where, the first gate electrode is formed in a region except for a region, in which the substrate potential control layer is formed, and the apparatus further comprises a second gate electrode disposed to be coupled to the first gate electrode. Since the structure is formed such that the width of the substrate potential control layer in a portion coupled to the semiconductor layer is the same as the channel length defined by the gate electrode, the substrate potential control layer and the second conductive type source/drain diffusion layer do not form p-n junction. Moreover, the parasitic capacitance of the gate electrode and the source/drain diffusion layer can be reduced. Thus, the second problem can be solved.

A semiconductor device according to the third aspect of the present invention is characterized by comprising: a semiconductor layer formed on an insulation layer; a gate electrode disposed on the semiconductor layer through a gate insulation film; a pair of source and drain diffusion layer formed on a surface of the semiconductor layer to interpose the gate electrode; a substrate potential control layer coupled to the semiconductor layer in a region interposed between the pair of the source and drain diffusion layer; and a conductor formed on a region of the substrate potential control layer and coupled to the gate electrode. With this configuration, since a conductor is formed by a self-alignment in a region of the substrate potential control layer and is coupled to first gate electrode, no contact hole is required. Thus, the fourth problem can be solved.

Another semiconductor device according to the third aspect of the present invention is characterized by comprising: a semiconductor layer formed on an insulation layer; a pair of source and drain diffusion layer formed on the surface of the semiconductor layer to interpose the gate electrode; a gate electrode disposed on the semiconductor layer through a gate insulation film; a substrate potential control layer coupled to the semiconductor layer in a region interposed between the pair of the source and drain diffusion layer and formed in such a manner that the first gate electrode does not exist thereon; and a second gate electrode disposed to be in contact with the first gate electrode and coupled directly or through a conductive material to the substrate potential control layer. Where, the apparatus may further comprise an insulation layer formed between the substrate potential control layer and the buffer layer. With this configuration, since each of the second gate electrode is, directly or through a conductive member, coupled to the substrate potential control layer, the contact hole for connecting between the gate electrode and the portion (a semiconductor layer in a region interposed by the pair of the source/drain diffusion layer) in which the channel is, formed can be omitted. As a result, the fourth problem can be solved.

With above case, the second gate electrode has a lager contact area to an upper surface of the substrate potential control layer than that of a side surface thereof. The area of contact between the side surface of the substrate potential control layer and the second gate electrode may be zero. The structure is able to easily enlarge the area of contact between the gate electrode and the substrate potential control layer. That is, the area of contact between the top surface of the substrate potential control layer and the second gate electrode can easily be enlarged in terms of the manufacturing steps as compared with the area of contact between the side surface of the substrate potential control layer and the second gate electrode. Therefore, the present invention is able to easily lower the contact resistance between the second gate electrode and the substrate potential control layer.

With above case, the apparatus further comprises a buffer layer formed on the top surface of the substrate potential control layer adjacent to the boundary with the first gate electrode; and a second gate electrode disposed to be in contact with the first gate electrode and coupled to the substrate potential control layer across the buffer layer. It is preferable that the buffer layer be made of a conductive material. As a result, reduction in the area of contact between the second gate electrode and the substrate potential control layer occurring attributable to provision of the buffer layer can be prevented. According to the structure, the buffer layer mitigates the difference in level between the first gate electrode and the substrate potential control layer. Thus, disconnection of the second gate electrode can be prevented, and a resist pattern for forming the second gate electrode can easily be formed.

A method of manufacturing a semiconductor device having a semiconductor layer formed on an insulation layer, a first gate electrode disposed on the semiconductor layer through a gate insulation film, a pair of source and drain diffusion layer formed on the surface of the semiconductor layer to interpose the first gate electrode, a substrate potential control layer coupled to the semiconductor layer in a region interposed between the pair of the source and drain diffusion layer and a second gate electrode disposed to be in contact with the first gate electrode, according to the present invention is characterized by comprising the steps of: forming the first gate electrode; forming a conductive film on the overall surface in such a manner that the conductive film is in contact with the first gate electrode so as to serve as the second gate electrode; forming a mask pattern on the conductive film; forming the second gate electrode by transferring the mask pattern to the conductive film; and forming the substrate potential control layer by transferring the pattern of the second gate electrode to the semiconductor layer. The manufacturing method according to the present invention enables the semiconductor device having the above-mentioned characteristic and according to the present invention to be manufactured.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE SEVERAL VIEWS OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIGS. 59A and 59B are cross sectional views showing the process of the method of manufacturing the MOS transistor having the body extended portion according to the ninth embodiment of the present invention;

FIGS. 60A and 60B are cross sectional views showing the process of the method of manufacturing the MOS transistor having the body extended portion according to the ninth embodiment of the present invention;

FIGS. 85A to 85C are cross sectional views showing the process of the method of manufacturing the MOS transistor having the body extended portion according to the eleventh embodiment of the present invention;

FIGS. 116A and 116B are cross sectional views showing the process of the method of manufacturing the MOS transistor having the body extended portion according to the fifteenth embodiment of the present invention;

FIGS. 117A and 117B are cross sectional views showing the process of the method of manufacturing the MOS transistor having the body extended portion according to the fifteenth embodiment of the present invention;

FIG. 119 is a perspective view showing a select transistor of a memory cell array of a DRAM according to a sixteenth embodiment of the present invention;

FIGS. 120A and 120B are cross sectional views showing the process of a method of manufacturing a MOS transistor having a body extended portion according to the sixteenth embodiment of the present invention;

FIGS. 121A and 121B are cross sectional views showing the process of the method of manufacturing the MOS transistor having the body extended portion according to the sixteenth embodiment of the present invention;

FIG. 122 is a perspective view showing a MOS transistor having a body extended portion according to a seventeenth embodiment of the present invention;

FIG. 123 is a diagram showing a variety of mask patterns for use to manufacture the MOS transistor according to the seventeenth embodiment;

FIGS. 124A to 124C are cross sectional views showing the process of a method of manufacturing a MOS transistor having a body extended portion according to the seventeenth embodiment of the present invention;

FIGS. 125A to 125C are cross sectional views showing the process of the method of manufacturing the MOS transistor having the body extended portion according to the seventeenth embodiment of the present invention;

FIGS. 126A to 126C are cross sectional views showing the process of the method of manufacturing the MOS transistor having the body extended portion according to the seventeenth embodiment of the present invention;

FIGS. 127A to 127C are cross sectional views showing the process of the method of manufacturing the MOS transistor having the body extended portion according to the seventeenth embodiment of the present invention;

FIGS. 128A to 128C are cross sectional views showing the process of the method of manufacturing the MOS transistor having the body extended portion according to the seventeenth embodiment of the present invention;

FIGS. 129A to 129C are cross sectional views showing the process of the method of manufacturing the MOS transistor having the body extended portion according to the seventeenth embodiment of the present invention;

FIGS. 130A to 130C are cross sectional views showing the process of the method of manufacturing the MOS transistor having the body extended portion according to the seventeenth embodiment of the present invention;

Figure 131:
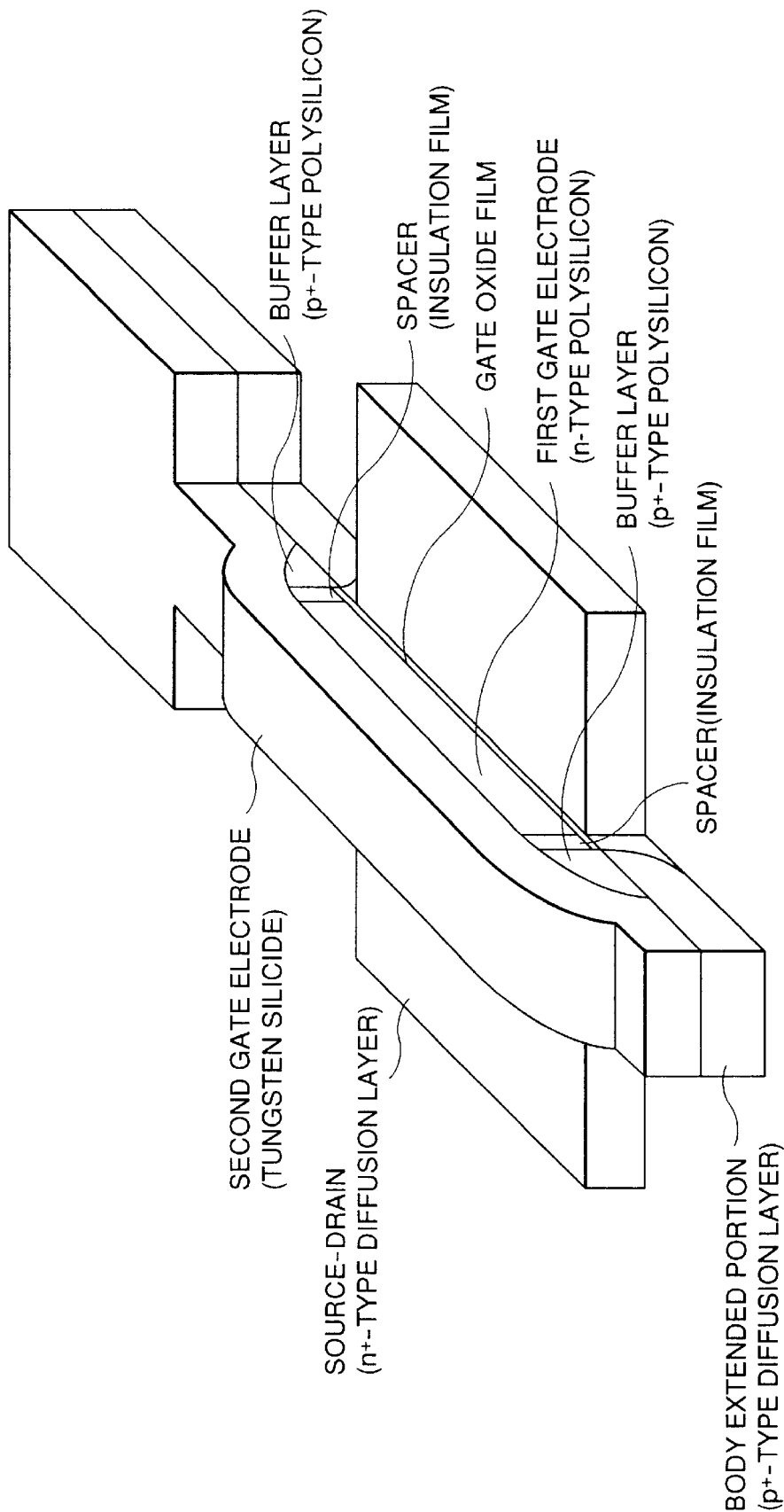
Figure 132A:
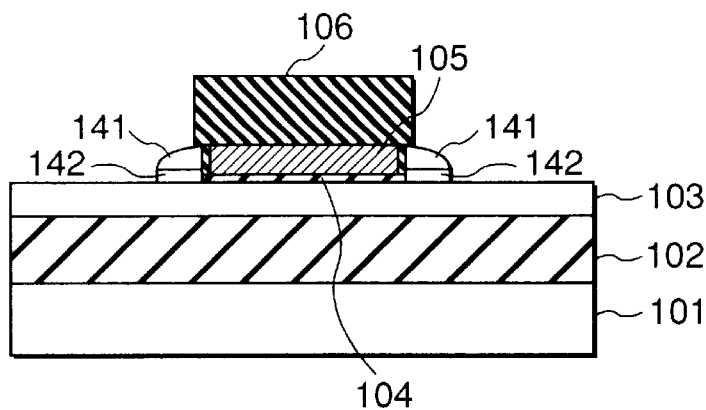
Figure 132B:
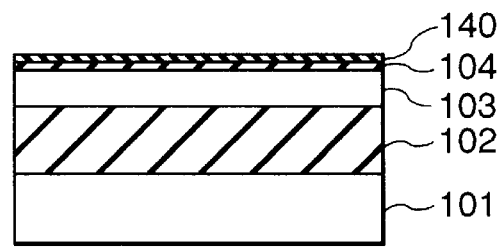
Figure 132C:
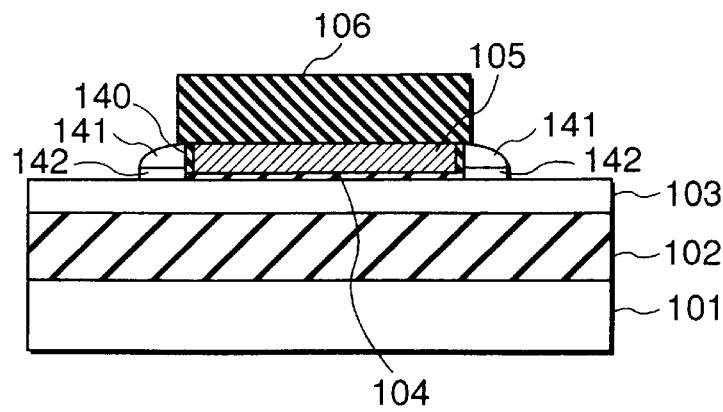
Figure 133A:
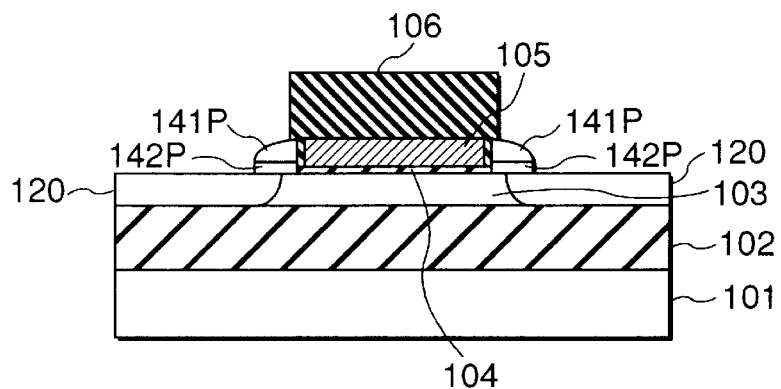
Figure 133B:
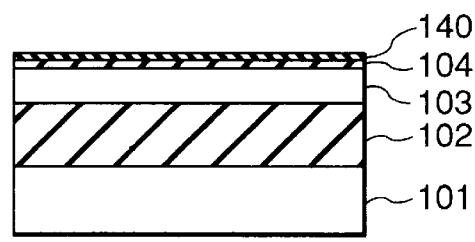
Figure 133C:
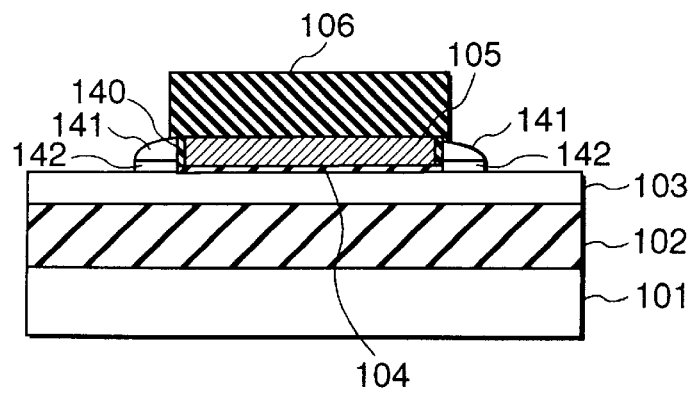
Figure 134A:
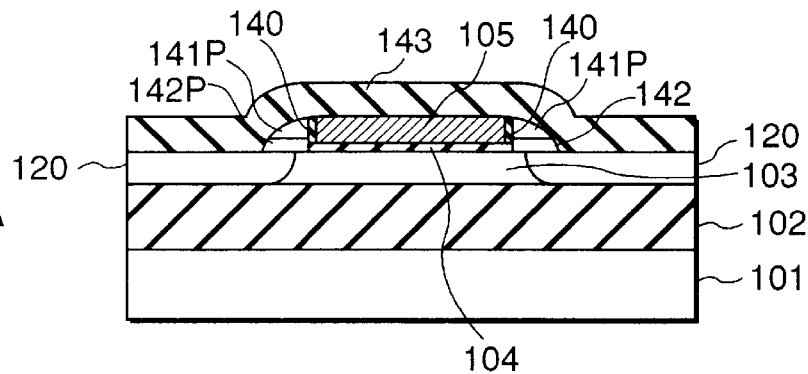
Figure 134B:
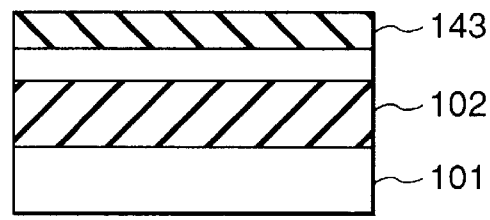
Figure 134C:
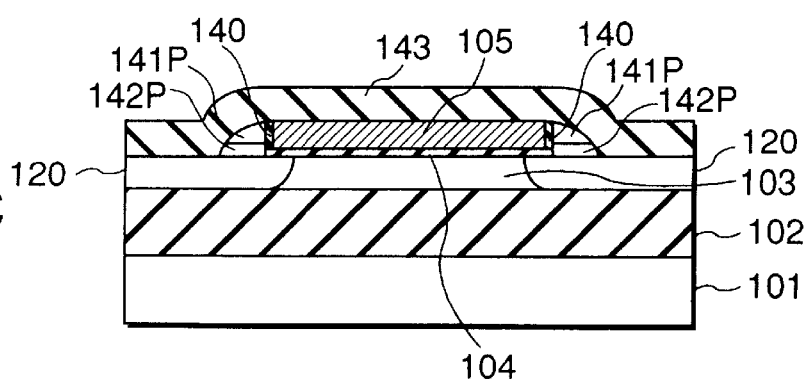
Figure 135A:
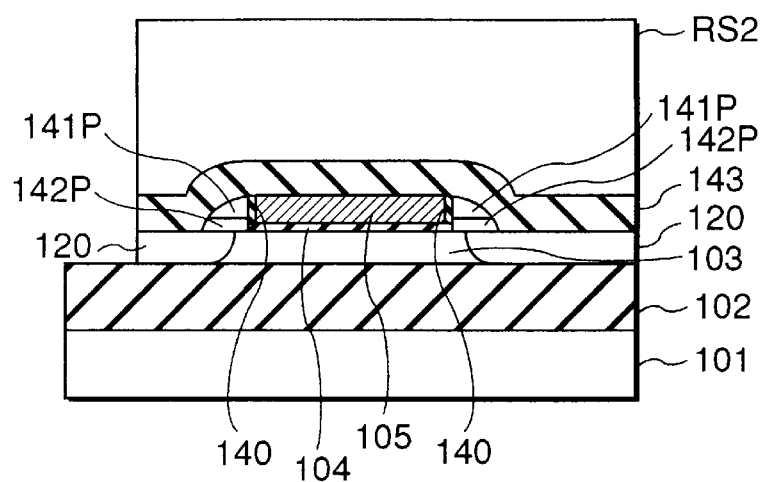
Figure 135B:
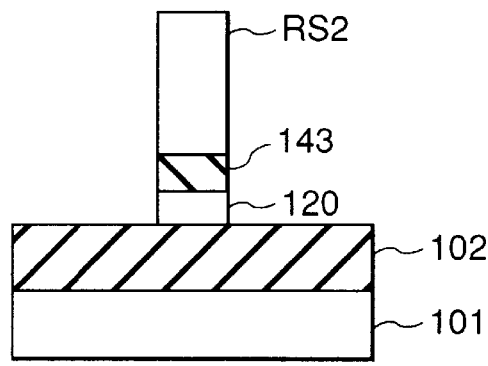
Figure 135C:
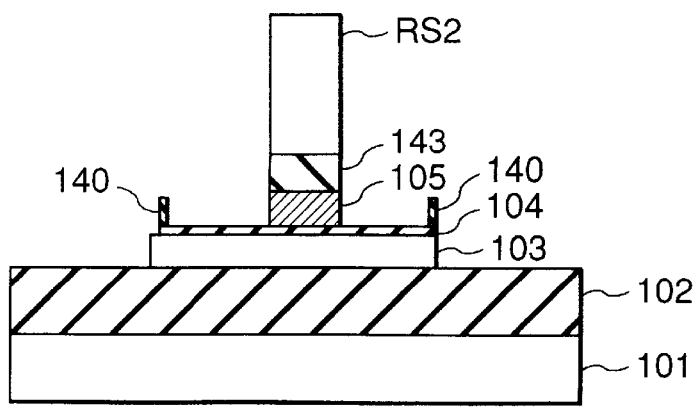
Figure 136A:
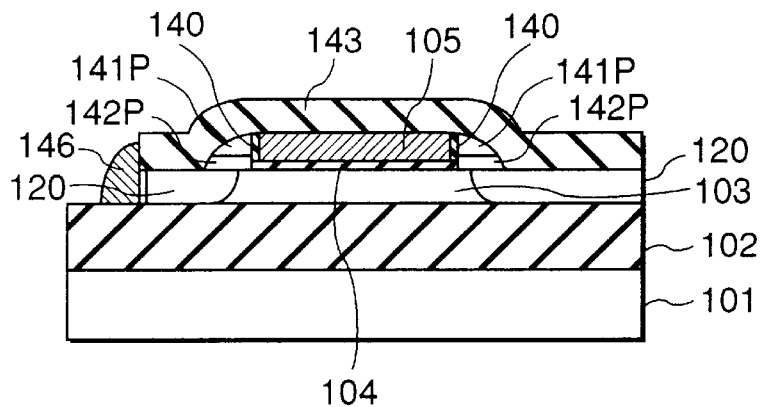
Figure 136B:
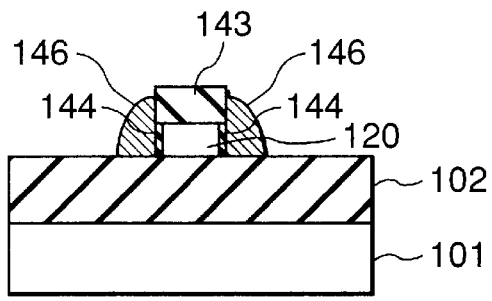
Figure 136C:
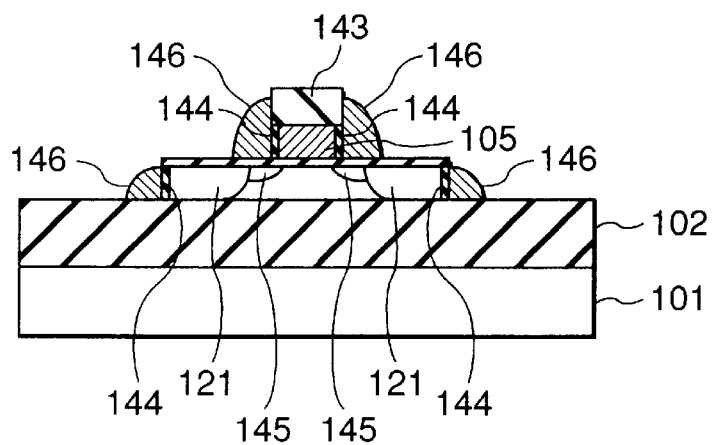
Figure 137A:
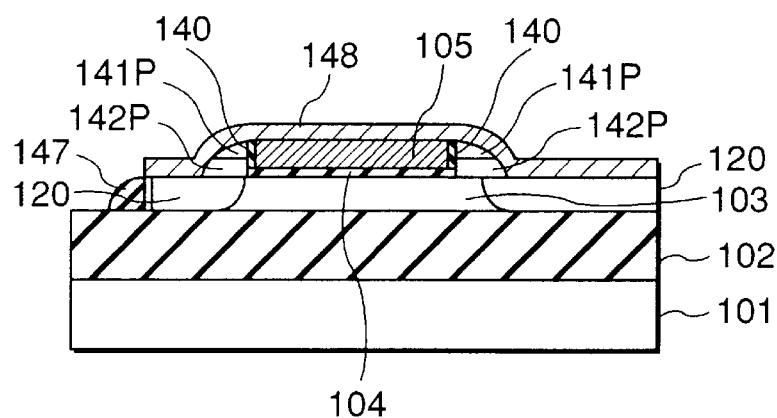
Figure 137B:
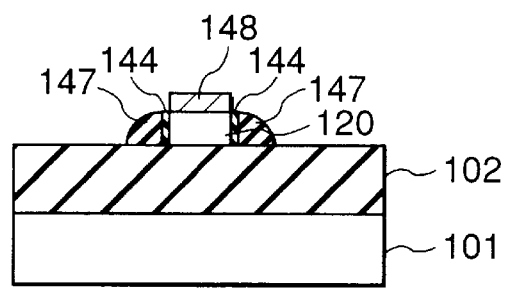
Figure 137C:
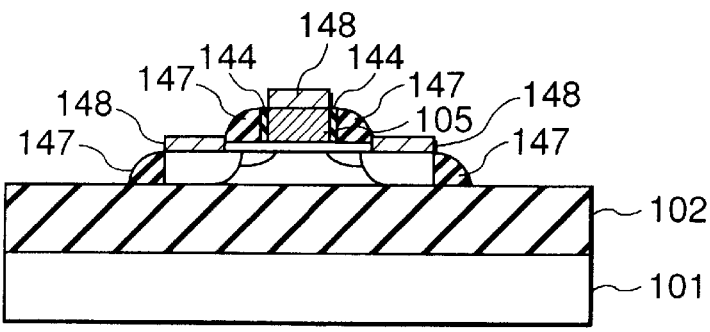
Figure 138A:
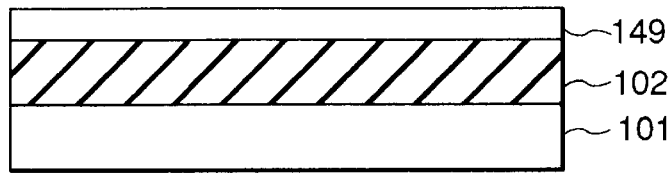
Figure 138B:
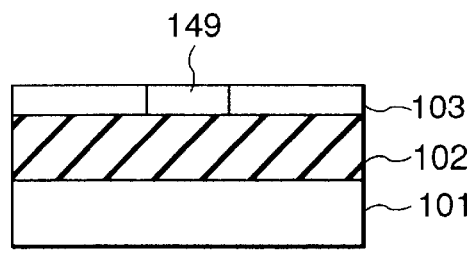
Figure 138C:
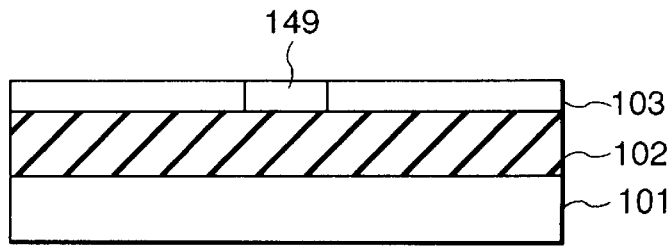
Figure 139A:
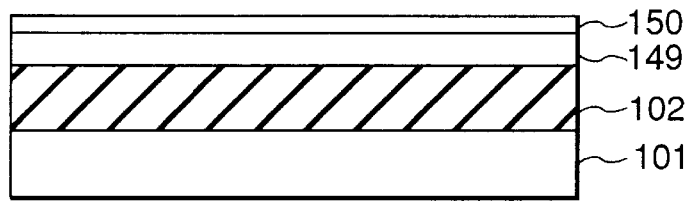
Figure 139B:
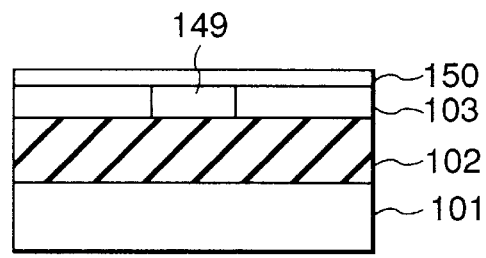
Figure 139C:
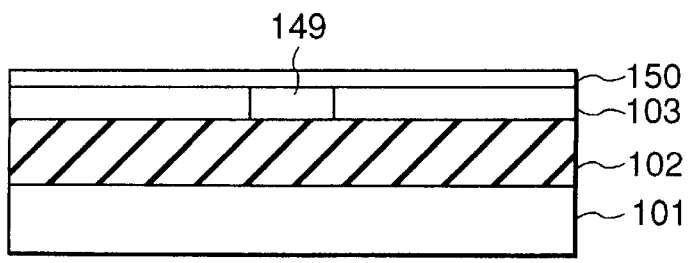
Figure 140:
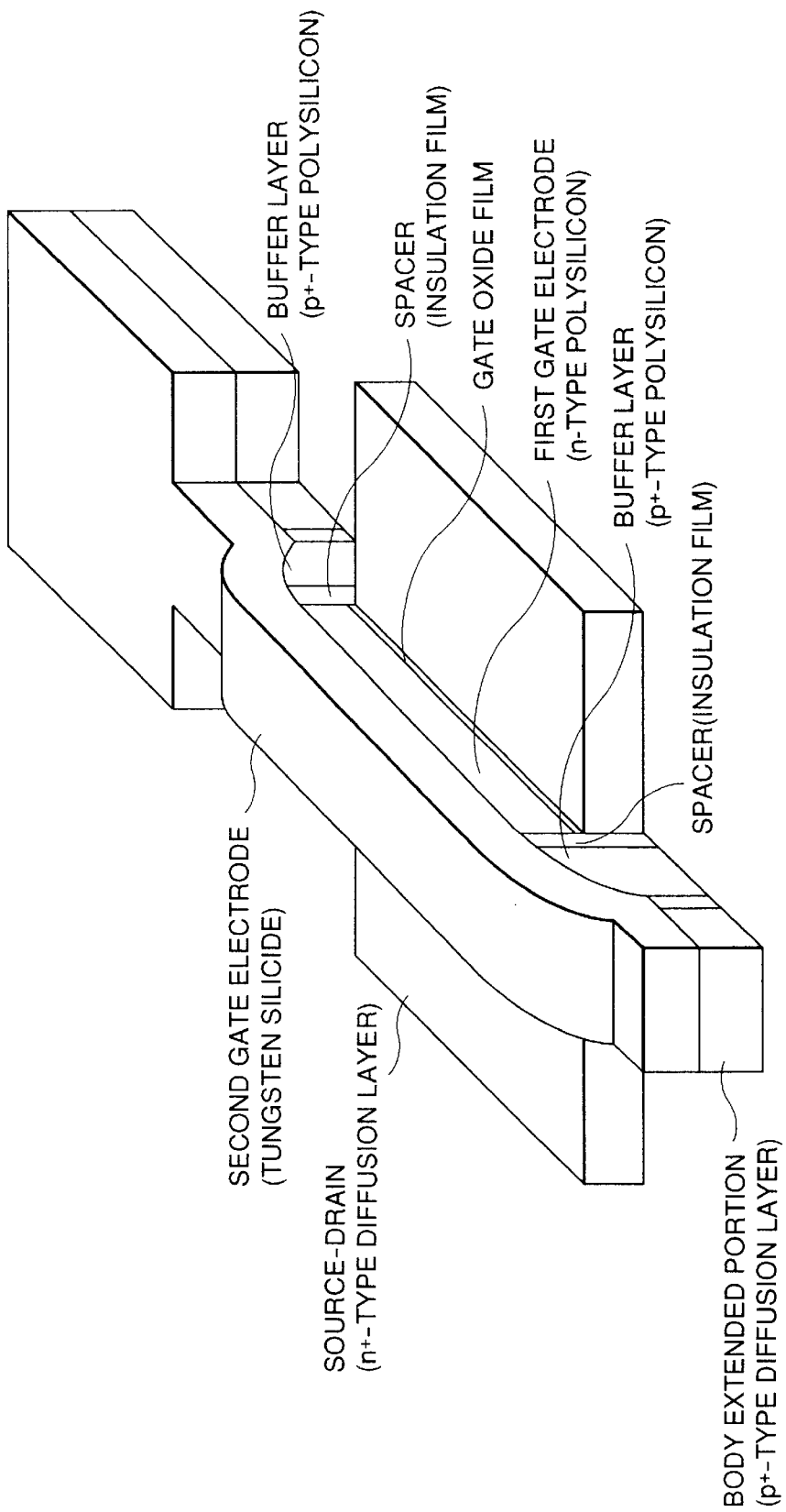
Figure 141:
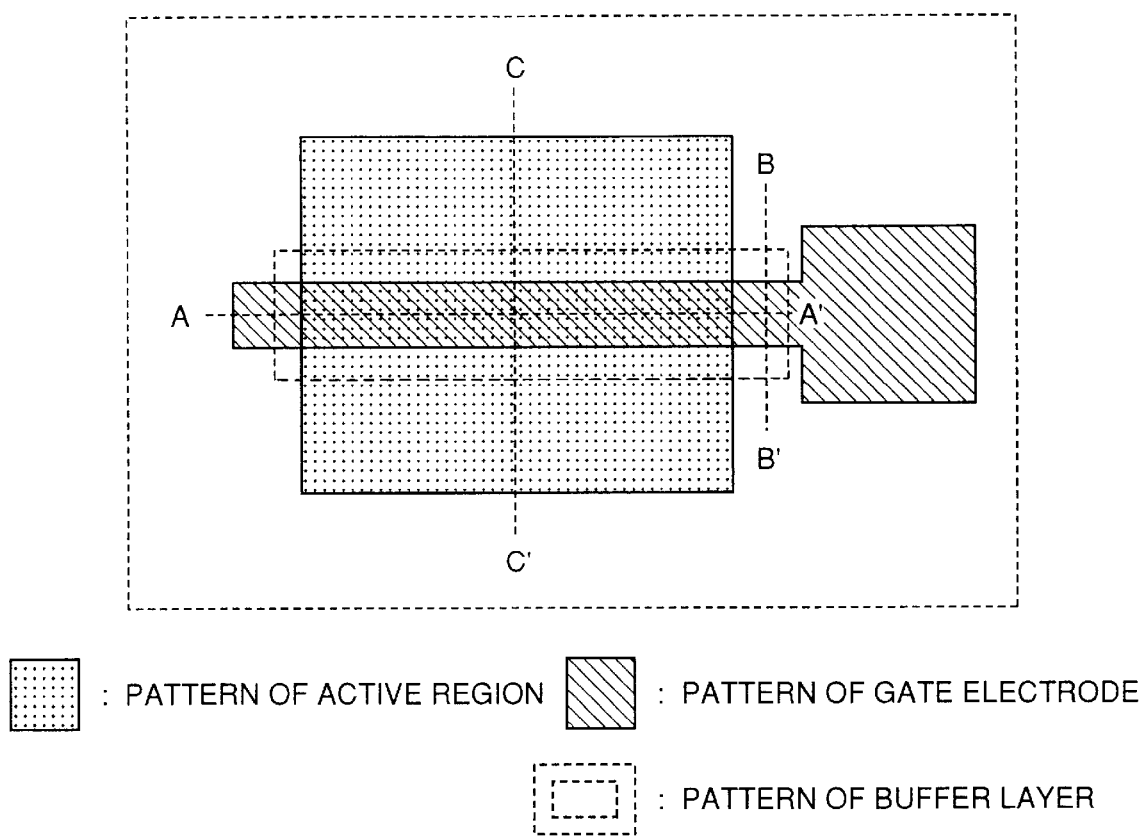
Figure 142A:
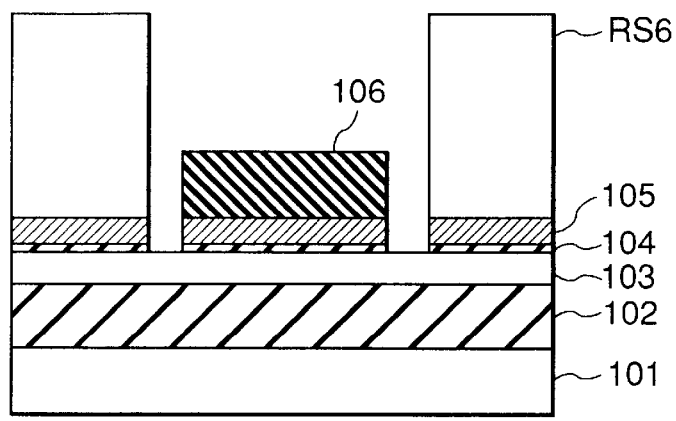
Figure 142B:
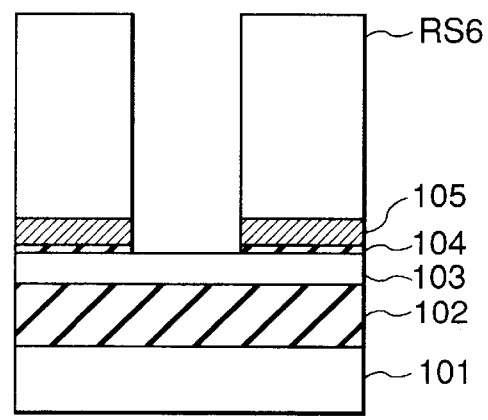
Figure 142C:
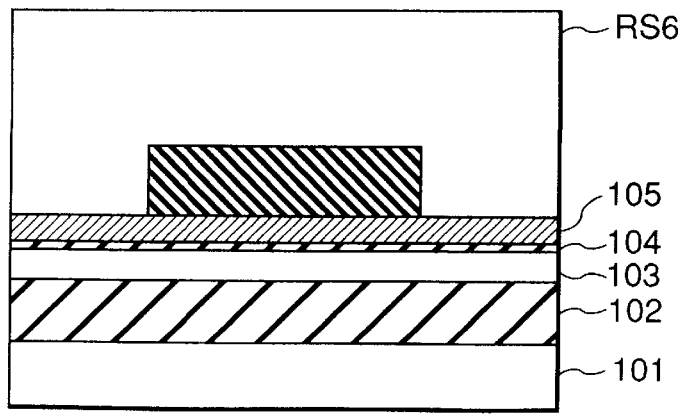
Figure 143A:
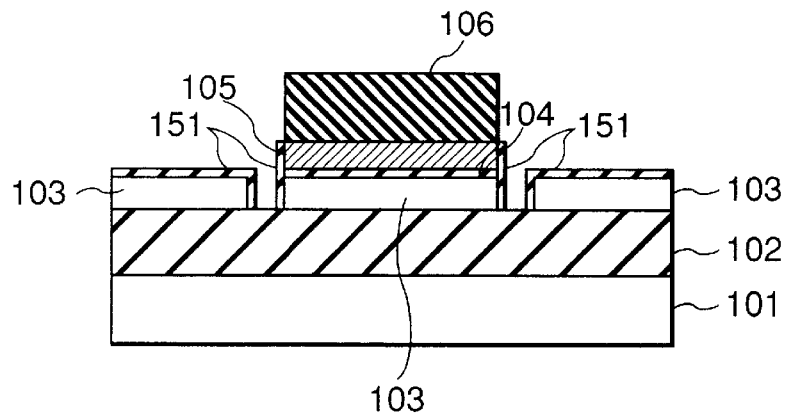
Figure 143B:
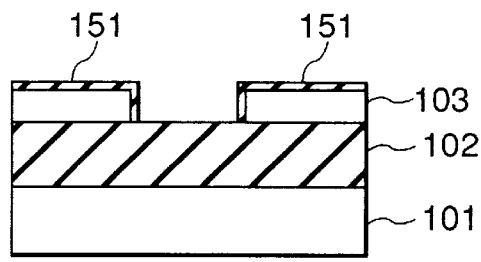
Figure 143C:
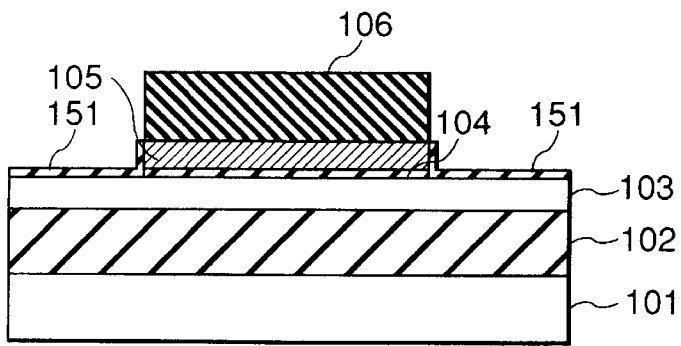
Figure 144A:
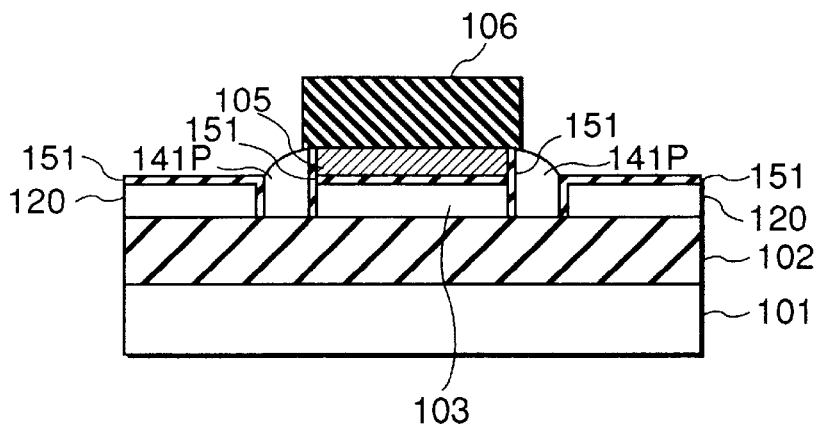
Figure 144B:
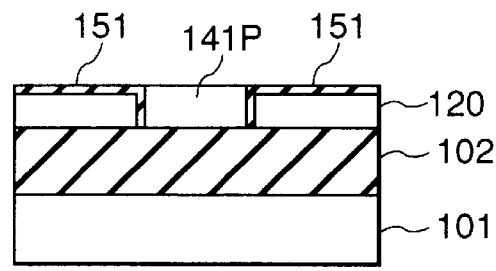
Figure 144C:
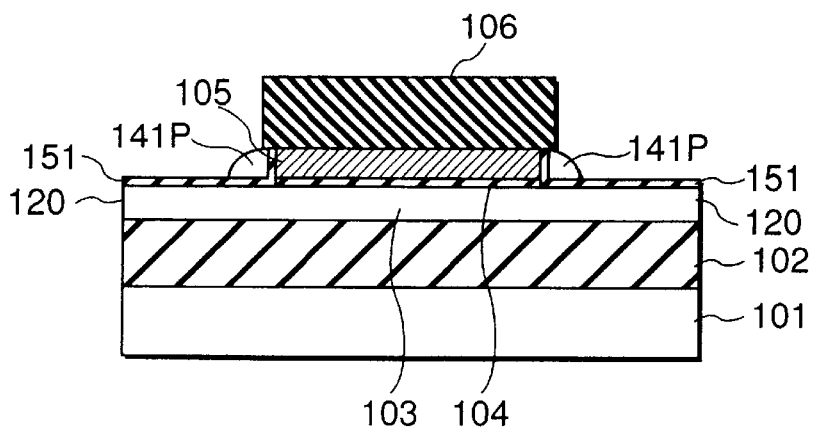
Figure 145A:
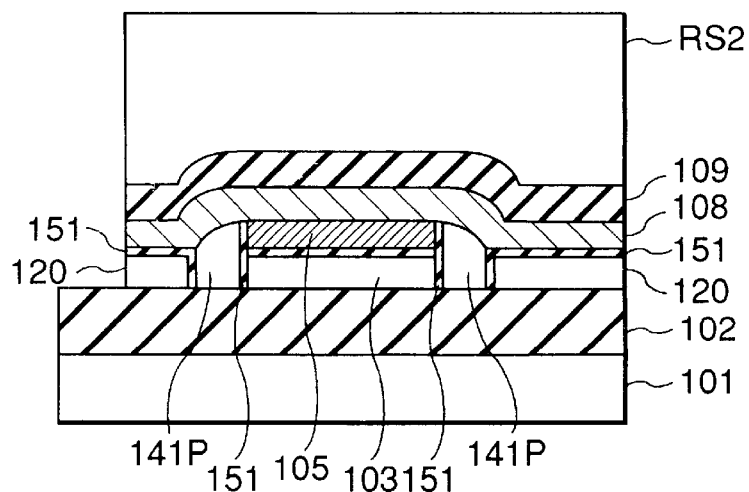
Figure 145B:
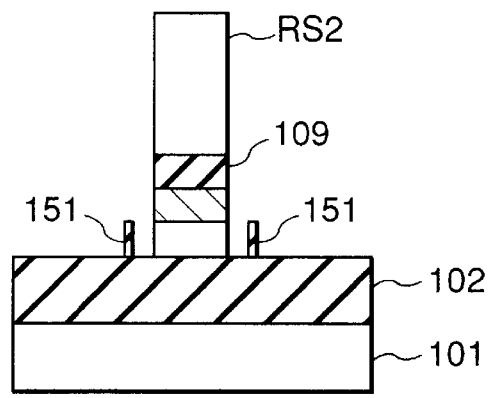
Figure 145C:
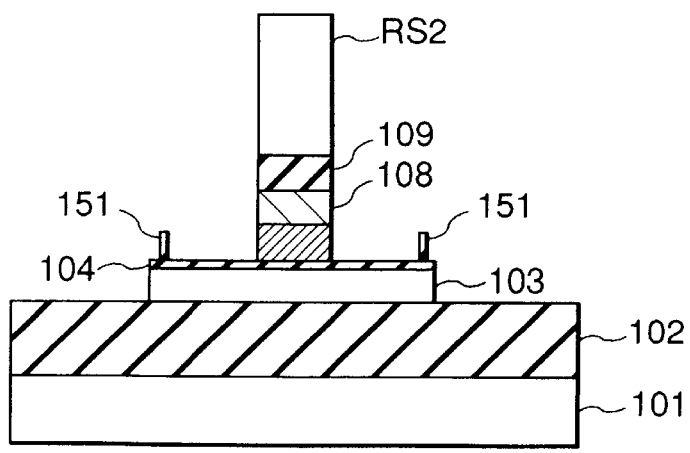

FIG. 131 is a perspective view showing a MOS transistor having a body extended portion according to an eighteenth embodiment of the present invention;

FIGS. 132A to 132C are cross sectional views showing the process of a method of manufacturing a MOS transistor having a body extended portion according to the eighteenth embodiment of the present invention;

FIGS. 133A to 133C are cross sectional views showing the process of the method of manufacturing the MOS transistor having the body extended portion according to the eighteenth embodiment of the present invention;

FIGS. 134A to 134C are cross sectional views showing the process of the method of manufacturing the MOS transistor having the body extended portion according to the eighteenth embodiment of the present invention;

FIGS. 135A to 135C are cross sectional views showing the process of the method of manufacturing the MOS transistor having the body extended portion according to the eighteenth embodiment of the present invention;

FIGS. 136A to 136C are cross sectional views showing the process of the method of manufacturing the MOS transistor having the body extended portion according to the eighteenth embodiment of the present invention;

FIGS. 137A to 137C are cross sectional views showing the process of the method of manufacturing the MOS transistor having the body extended portion according to the eighteenth embodiment of the present invention;

FIGS. 138A to 138C are cross sectional views showing the process of a method of manufacturing a MOS transistor having a body extended portion according to a twentieth embodiment;

FIGS. 139A to 139C are cross sectional views showing the process of the method of manufacturing the MOS transistor having the body extended portion according to the twentieth embodiment;

FIG. 140 is a perspective view showing a MOS transistor according to a twenty-first embodiment of the present invention;

FIG. 141 is a diagram showing a variety of mask patterns for use to manufacture the MOS transistor according to the twentieth embodiment;

FIGS. 142A to 142C are cross sectional views showing the process of a method of manufacturing a MOS transistor according to the twenty-first embodiment of the present invention;

FIGS. 143A to 143C are cross sectional views showing the process of the method of manufacturing the MOS transistor according to the twenty-first embodiment of the present invention;

FIGS. 144A to 144C are cross sectional views showing the process of the method of manufacturing the MOS transistor according to the twenty-first embodiment of the present invention; and FIGS. 145A to 145C are cross sectional views showing the process of the method of manufacturing the MOS transistor according to the twenty-first embodiment of the present invention.

DETAILED DESCRIPTION OF THE INVENTION

Referring to the drawings, embodiments of the present invention will now be described.

First Embodiment

Figure 3:
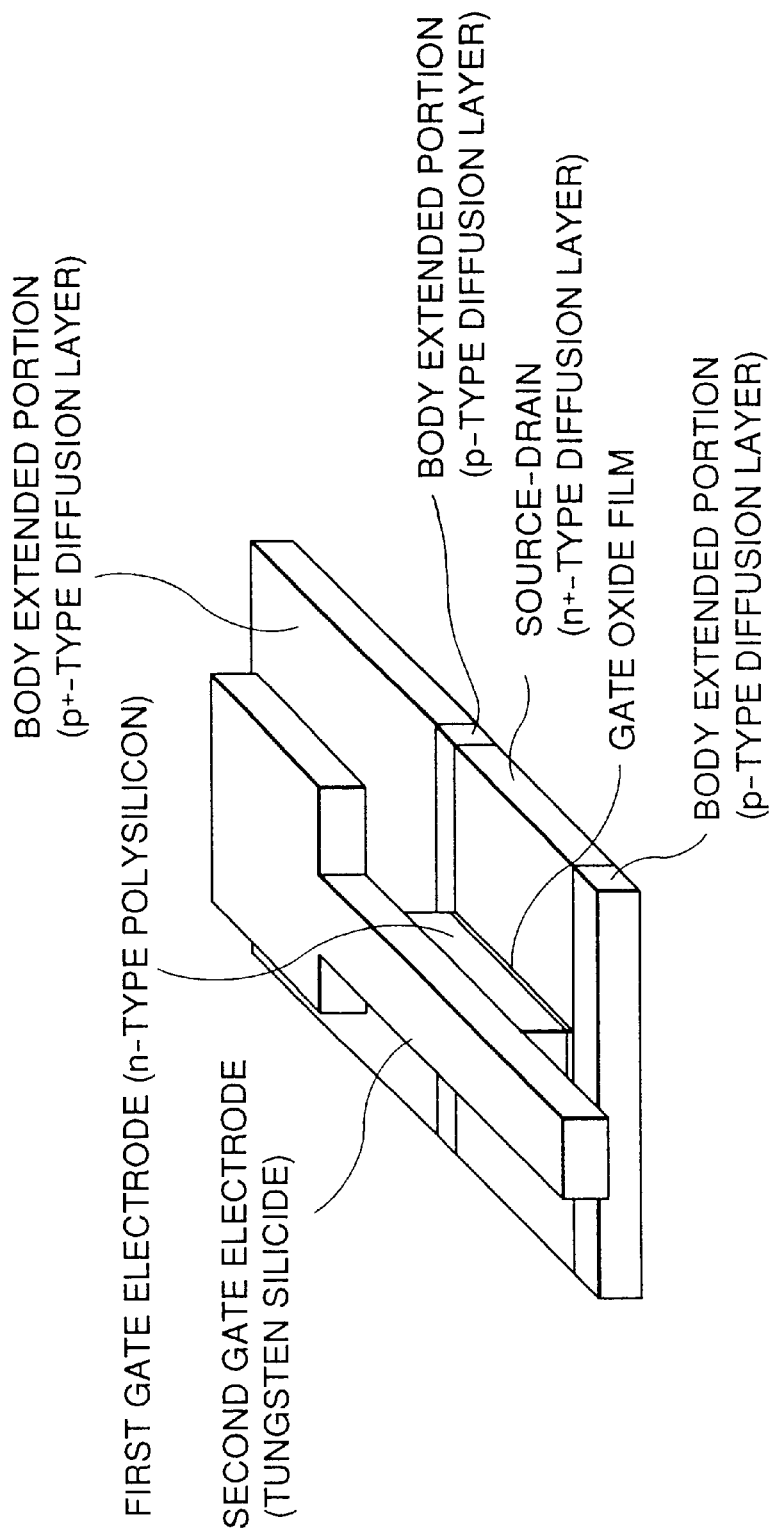
FIG. 3 is a perspective view showing a MOS transistor having a body extended portion according to a first embodiment of the present invention.
Figure 4:
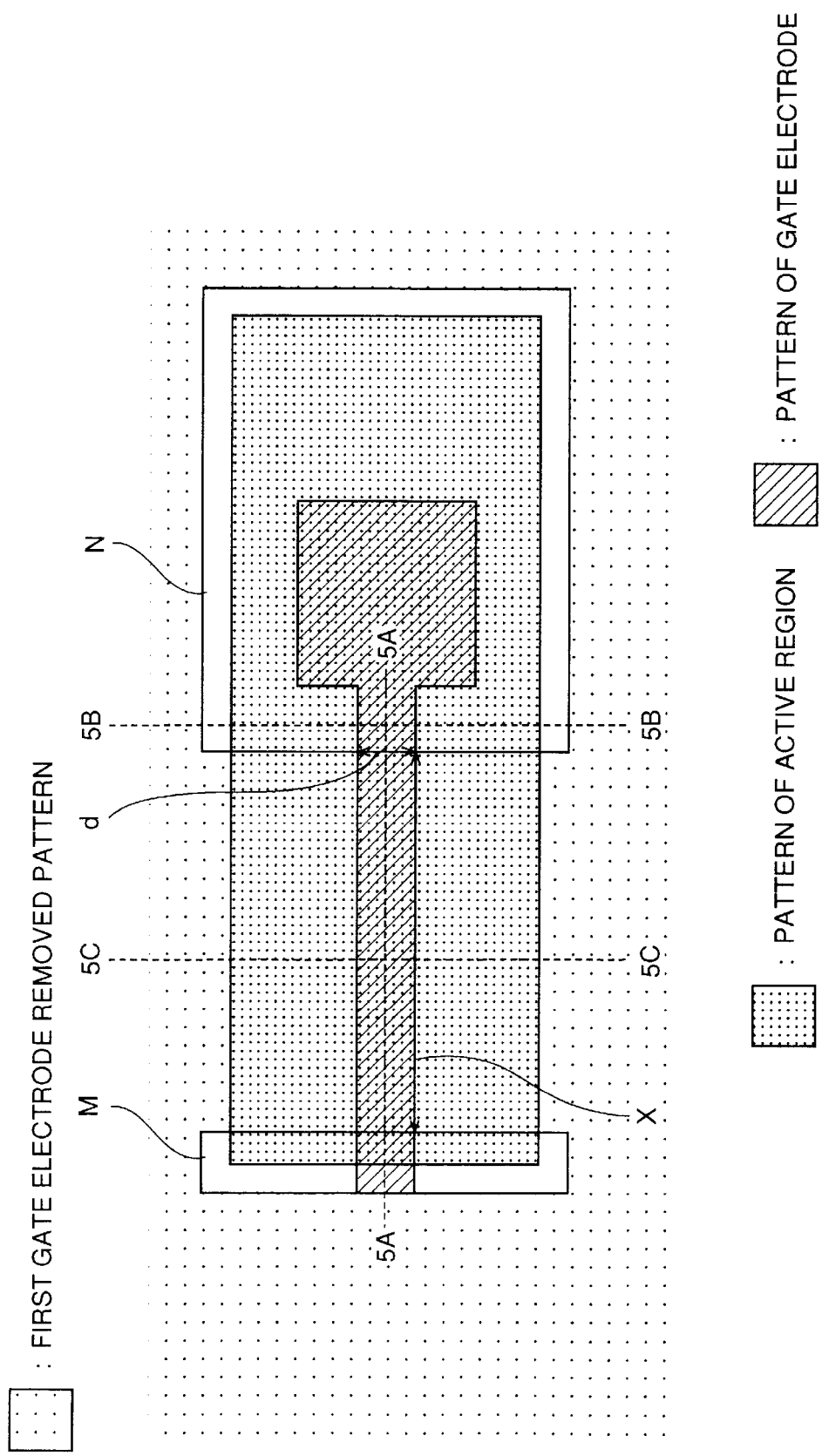
FIG. 4 is a diagram showing a variety of mask patterns for use to manufacture the MOS transistor according to the first embodiment.

FIG. 3 is a perspective view showing an n-channel type MOS transistor according to a first embodiment of the present invention. FIG. 4 shows a variety of mask patterns for use to manufacture the MOS transistor.

The characteristic of the device according to this embodiment lies in that a first gate electrode is disposed on only a body thereof through a gate oxide film. That is, the first gate electrode is not disposed in the body extended portion. Therefore, this embodiment is free from generation of any parasitic capacitance in the body extended portion thereof so that the first problem is overcome.

To realize this, this embodiment has a structure in which a resist pattern for defining the first gate electrode removed area shown in FIG. 4 is used to remove the first electrode in a prospective region for the body extended portion and a thick oxide film is embedded, thereby since a MOS capacitor having the first gate electrode, the thin gate oxide film and the body extended portion becomes a MOS capacitor having a second electrode, the thick oxide film and the body extended portion, a parasitic capacitance decreases.

Although the first gate electrode of the device shown in FIG. 3 is made of n-type polysilicon, metal or silicide may be employed.

Moreover, p-type impurity ions having a high concentration are implanted into the body extended portion. The reason for this is that formation of an inverted layer in the elongated portion causing the parasitic capacitance to be enlarged must be prevented. Moreover, the sheet resistance of the body extended portion must be lowered. At this time, a spacer having an appropriate thickness is formed adjacent to the channel edge and the source and drain, and then p-type impurity ions are implanted so that foregoing portions are formed into p-type diffusion layer (the body extended portion) having a low concentration.

Since the isolation oxide film in the body extended portion serves as a mask when the source and the drain (the $n^+$-type diffusion layers) are formed by implanting ions as described later, an n-type impurity is not introduced into the body extended portion.

Referring to a plan view shown in FIG. 4, a p-type diffusion layer and $p^+$-type diffusion layer, which are the body extended portions, are formed in regions M and N. Symbol x represents the channel width.

If the first gate electrode in the region M is not removed, it is preferable because the p-type layer is not formed in the region M and thus the conjunction area between the source and drain (the $n^+$-type diffusion layer) and the p-type diffusion layer can be reduced. However, there arises a problem in that the channel width disperses because of deviation of the patterns of the first gate electrode removed region and that of the device region.

Figure 1:
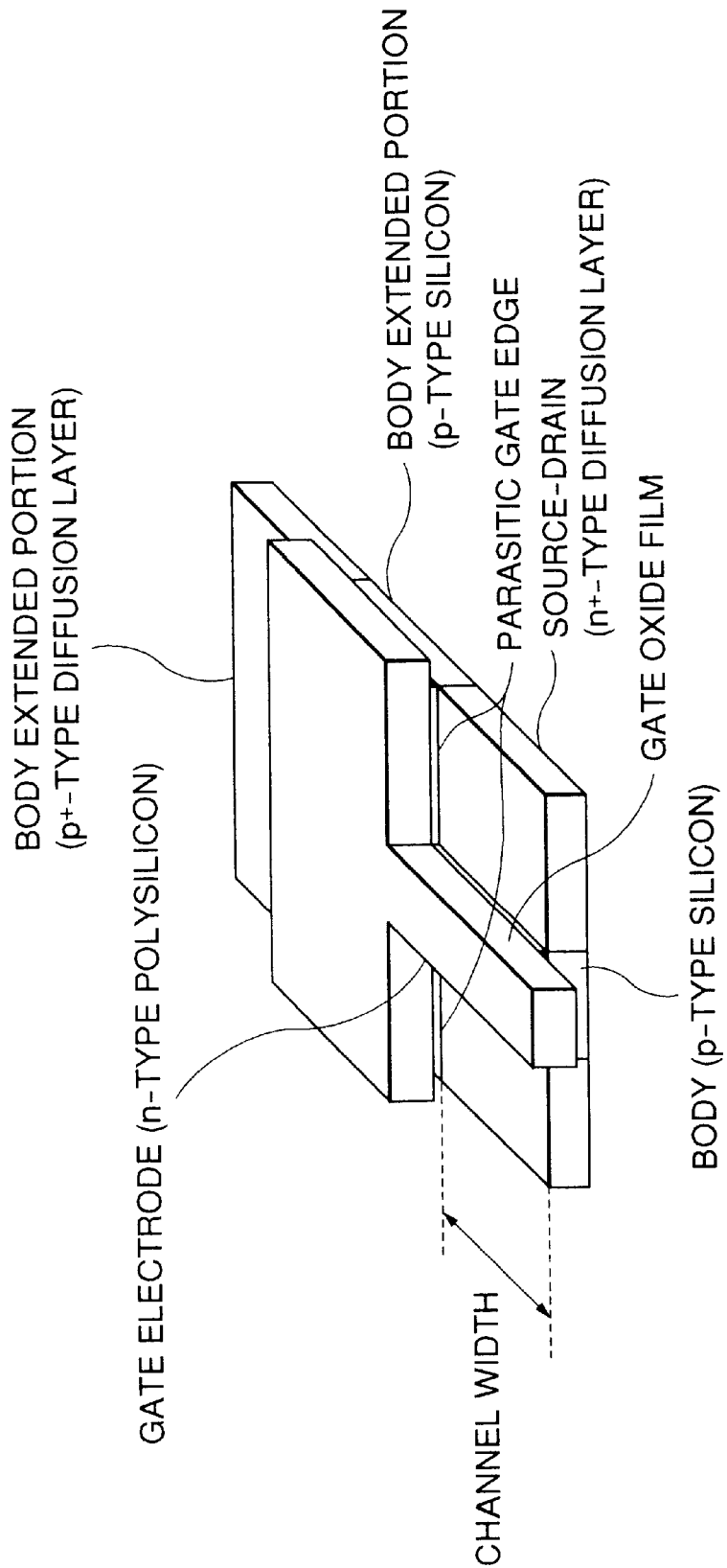
FIG. 1 is a perspective view showing a conventional MOS transistor having a body extended portion.
Figure 2A:
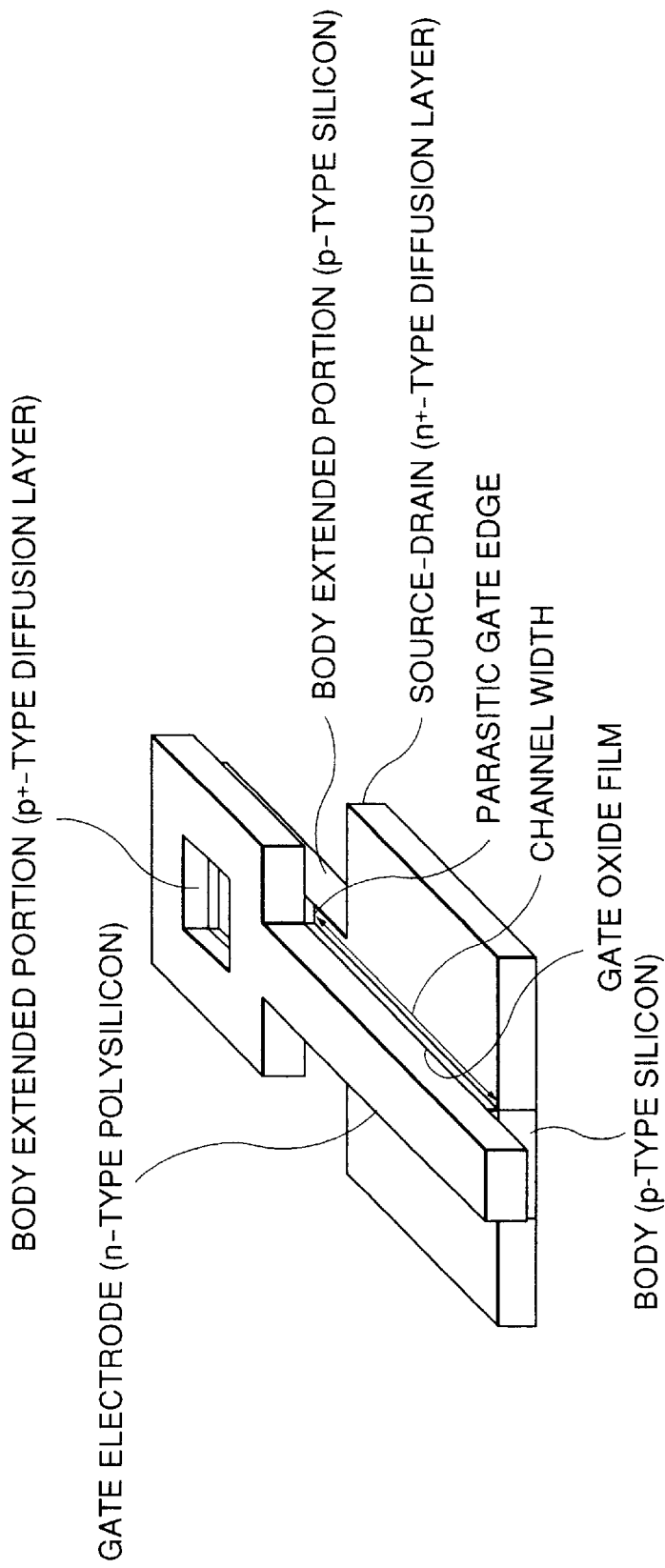
FIGS. 2A to 2C respectively are a perspective view, a plan view and a cross sectional view showing another conventional MOS transistor having the body extended portion.

The conventional structure shown in FIGS. 1 and 2A also have the same problem because of the deviation of the resist pattern for the device region and the resist pattern for the gate electrode.

As described above, if the channel width is defined by two resist patterns, deviation in alignment of the two resist patterns causes the channel width to disperse. Since this embodiment is arranged in such a way that the first gate electrode in the regions M and N-type is removed by etching which is performed by using one resist pattern as a mask, dispersion in the channel width can be prevented. As an alternative to this, parasitic p-n junction undesirably increases attributable to the p-type diffusion layer and the source and the drain (the $n^+$-type diffusion layer) formed in the region M. A method of preventing the parasitic p-n junction will be described in a sixth embodiment.

Referring to FIGS. 5A to 10C, a method of manufacturing a semiconductor device according to this embodiment will now be described. Referring to FIGS. 5A to 10C, FIGS. 5A to 5C respectively are cross sectional views of FIG. 4, which is a plan view, taken along lines 5A—5A, 5B—5B and 5C—5C.

Figure 5A:
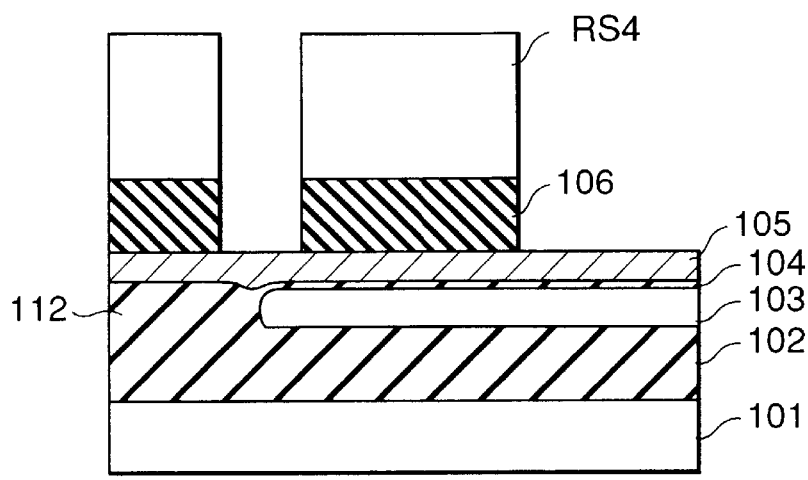
FIGS. 5A to 5C are cross sectional views showing the process of a method of manufacturing a MOS transistor having the body extended portion according to the first embodiment of the present invention.
Figure 5B:
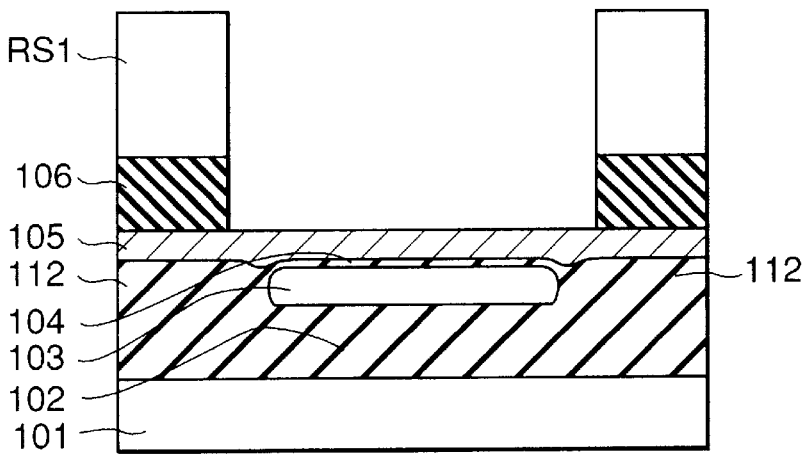
Figure 5C:
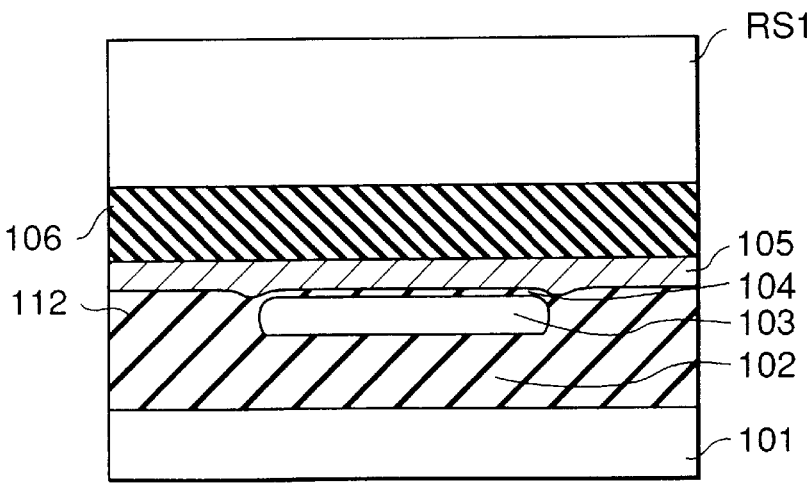

(1) Step 1-1 (FIGS. 5A to 5C)

Initially, an SOI substrate composed of a support substrate 101, a buried oxide film 102 and a silicon layer (SOI) 103 is formed. It is preferable that the thickness of the silicon layer 103 be 50 nm to 150 nm.

A Then, a resist pattern (not shown) for defining the device region pattern shown in FIG. 4 is used to form an isolation oxide film 112. The method of forming the isolation oxide film 112 may be either a conventional local oxidation method for forming a thermal oxide film (the isolation oxide film 112) or a method having the steps of removing a silicon layer 103 in an element isolation region by anisotropic etching and embedding an oxide film (the isolation oxide film 112) in a portion from which the silicon layer 103 has been removed.

(2) Step 1-2 (FIGS. 5A to 5C)

Then, p-type impurity ions required to adjust to the threshold voltage are implanted into the silicon layer 103. Then, a gate oxide film 104 having a thickness of about 5 nm to about 10 nm is formed on the silicon layer 103, and then an n-type polysilicon film 105 and a silicon nitride film 106 having a thickness of about 10 nm are sequentially formed by a CVD (Chemical Vapor Deposition) method.

(3) Step 1-3 (FIGS. 5A to 5C)

Then, a resist pattern RS1 for defining the first gate electrode removed region pattern shown in FIG. 4 is formed, and then the silicon nitride film 106 is anisotropically etched by using the resist pattern RS1 as a mask.

Figure 6A:
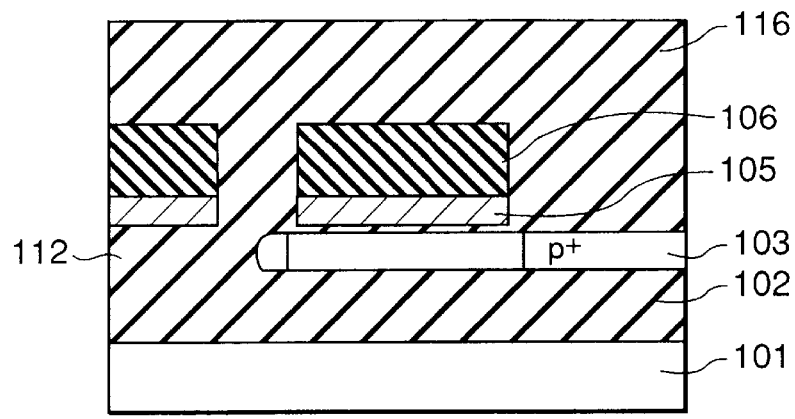
FIGS. 6A to 6C are cross sectional views showing the process of a method of manufacturing a MOS transistor having the body extended portion according to the first embodiment of the present invention.
Figure 6B:
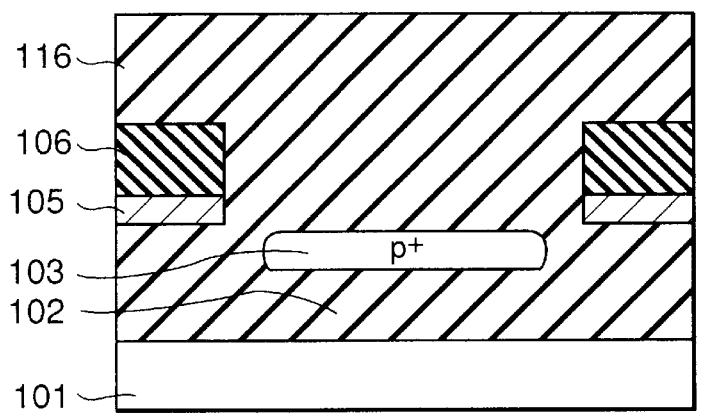
Figure 6C:
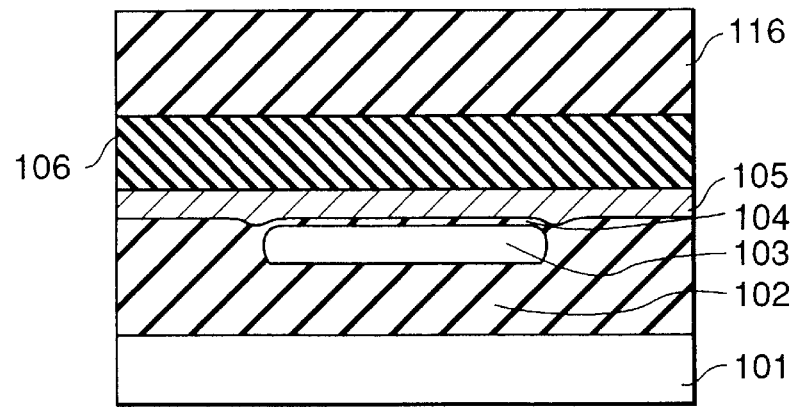

(4) Step 1-4 (FIGS. 6A to 6C)

Then, the resist pattern RS1 is separated, and then the n-type polysilicon film 105 is anisotropically etched by using the silicon nitride film 106 as a mask. As a result, the silicon layer 103 in the body extended portion in the regions M and N shown in FIG. 4 are exposed. Then, a p-type impurity is introduced into the exposed surface of the silicon layer 103 so that the body extended portion (the $p^+$-type diffusion layer) is formed to achieve the foregoing object. The ion implantation can be performed to the body extended portion by the self-alignment regardless to a set deviation of resist pattern and the like. Accordingly, a resistance of the body extended portion can be lowered and a dispersion thereof can be reduced.

(5) Step 1-5 (FIGS. 6A to 6C)

Then, an isolation oxide film 116 having a thickness sufficiently large to fill the groove formed in steps 1-3 and 1-4 is formed on the overall surface.

Figure 7A:
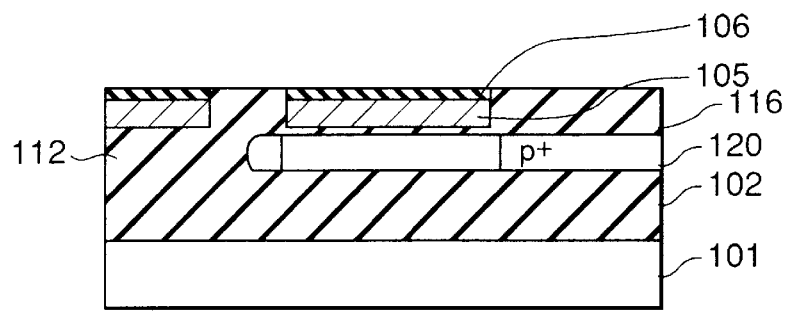
FIGS. 7A to 7C are cross sectional views showing the process of a method of manufacturing a MOS transistor having the body extended portion according to the first embodiment of the present invention.
Figure 7B:
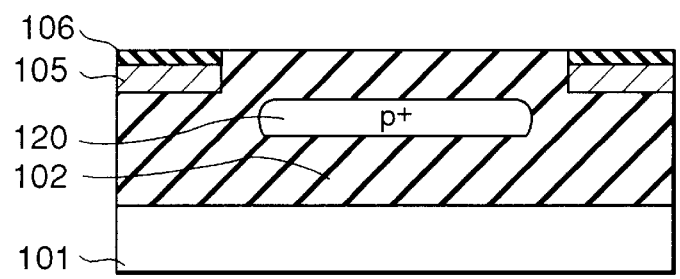
Figure 7C:
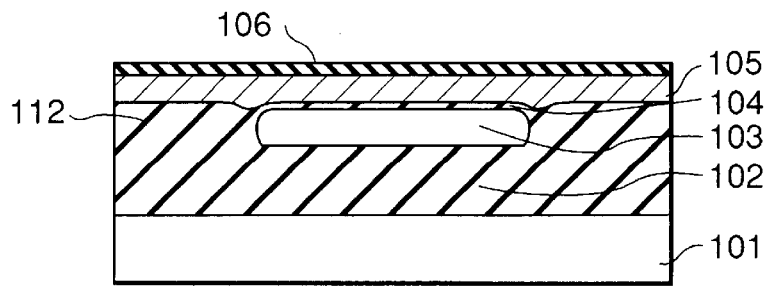

(6) Step 1-6 (FIGS. 7A to 7C)

Then, the isolation oxide film 116 and the silicon nitride film 106 are etched back by anisotropic etching so that the surface is smoothed and flattened. As an alternative to this, the surface may be polished by CMP (Chemical Mechanical Polishing) to smooth and flatten the surface.

Figure 8A:
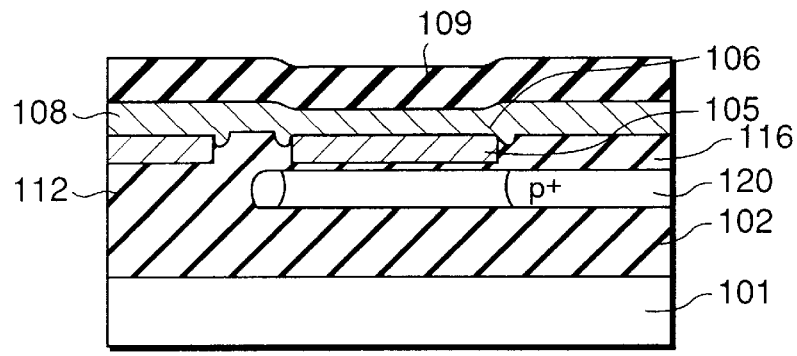
FIGS. 8A to 8C are cross sectional views showing the process of a method of manufacturing a MOS transistor having the body extended portion according to the first embodiment of the present invention.
Figure 8B:
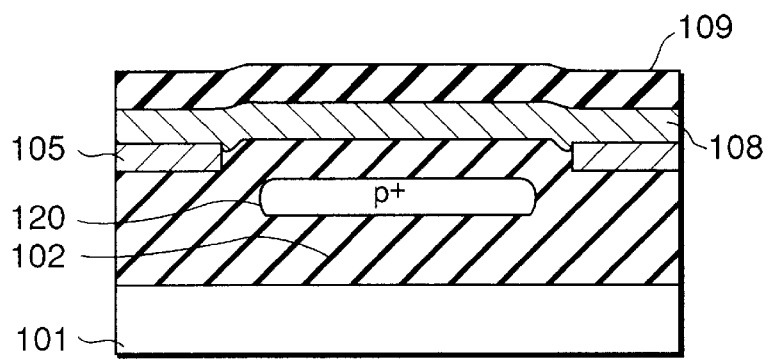
Figure 8C:
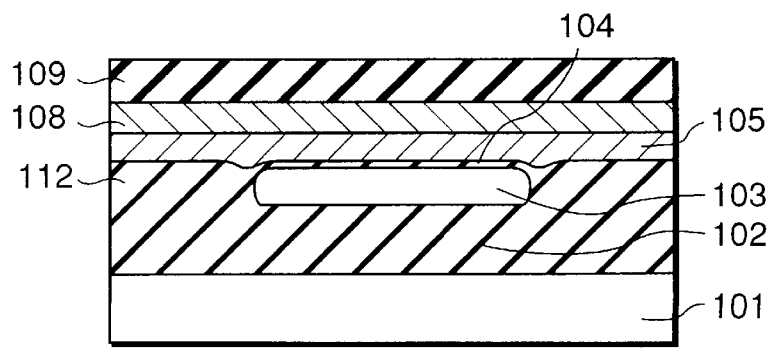

(7) Step 1-7 (FIGS. 8A to 8C)

Then, the silicon nitride film 106 is selectively removed.

(8) Step 1-8 (FIGS. 8A to 8C)

Then, a tungsten silicide film 108 having a thickness of about 100 nm is formed on the overall surface, and then a silicon nitride film 109 having a thickness of about 100 nm is formed. The tungsten silicide film 108 will be formed into a second gate electrode.

Figure 9A:
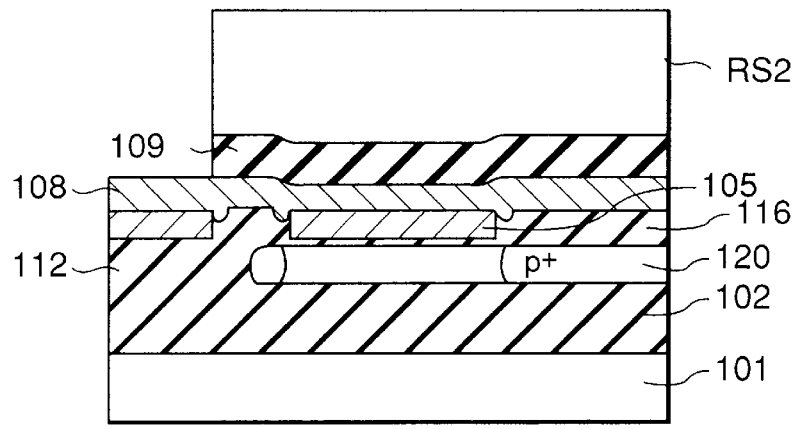
FIGS. 9A to 9C are cross sectional views showing the process of a method of manufacturing a MOS transistor having the body extended portion according to the first embodiment of the present invention.
Figure 9B:
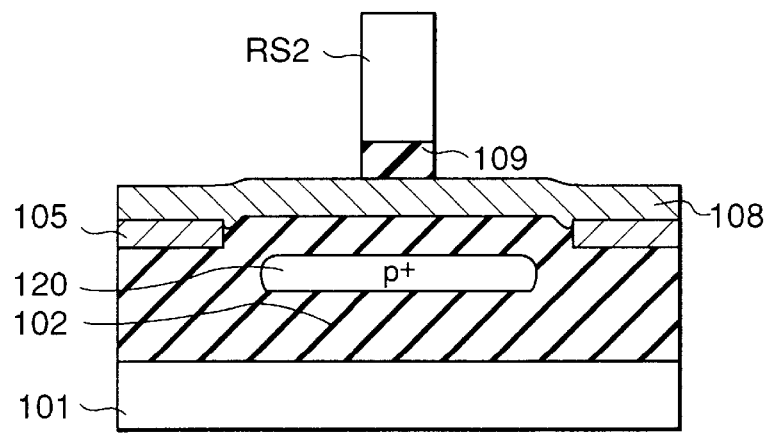
Figure 9C:
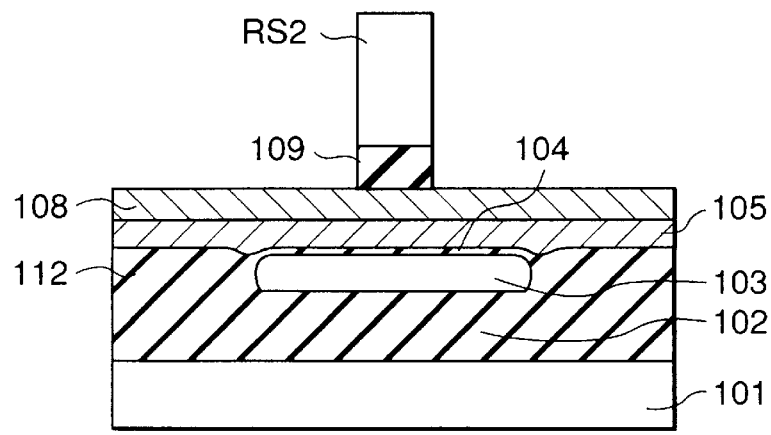

(9) Step 1-9 (FIGS. 9A to 9C)

Then, a resist pattern RS2 for defining the gate electrode pattern shown in FIG. 4 is formed, and then a silicon nitride film 109 is anisotropically etched by using the resist pattern RS2 as a mask.

Figure 10A:
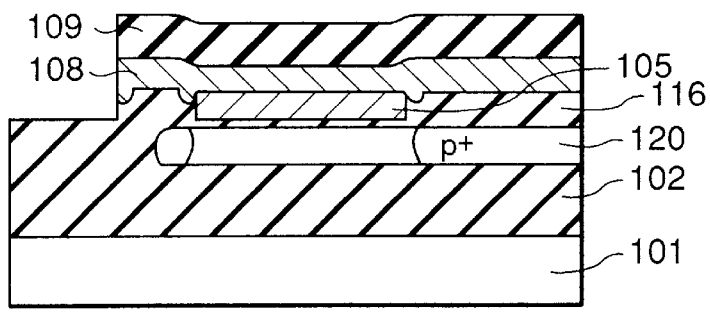
FIGS. 10A to 10C are cross sectional views showing the process of a method of manufacturing a MOS transistor having the body extended portion according to the first embodiment of the present invention.
Figure 10B:
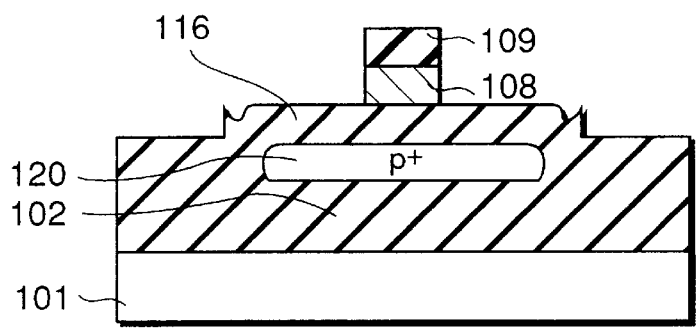
Figure 10C:
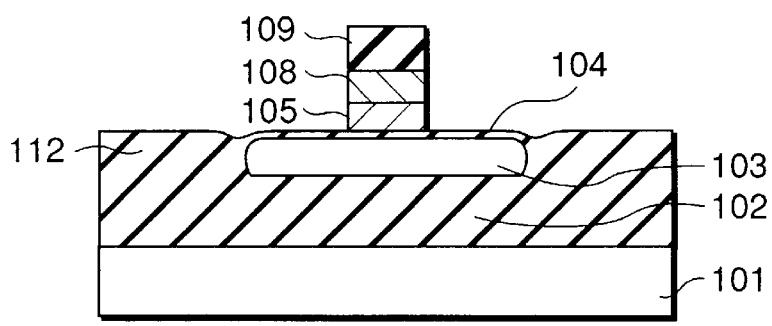

(10) Step 1-10 (FIGS. 10A to 10C)

Then, the resist pattern RS2 is separated, and then the tungsten silicide film 108 and the n-type polysilicon film 105 are anisotropically etched by using the silicon nitride film 109 as a mask.

The anisotropic etching process is performed under condition with which the isolation oxide film 116 on the body extended portion is not thinned. That is, when the source and the drain will be formed by implanting n-type impurity ions, the isolation oxide film 116 is able to serve as a mask so that n-type impurity is not introduced into the body extended portion. Since the thickness of the isolation oxide film 116 is made to be larger than that of the gate oxide film 104, the parasitic capacitance can be reduced.

(11) Step 1-11

Then, a silicon oxide film having a thickness of about 20 nm is formed on the overall surface, and then ions are implanted in order to form an LDD (Lightly Doped Drain).

(12) Step 1-12

Then, a polysilicon film is formed on the overall surface, and then anisotropically etched. Thus, a spacer is formed on the side wall of the gate electrode. The spacer and the gate electrode are used as masks when n-type impurity ions are implanted. Thus, the source and the drain ($n^+$-type diffusion layer-) are formed.

(13) Step 1-13

Then, the spacer is removed by etching by CDE (Chemical Dry Etching) or the like, and then an interlayer insulation film is formed on the overall surface. Then, a contact hole is formed in the interlayer insulation film on the gate electrode, and a metal electrode made of aluminum or tungsten is embedded into the contact hole. Finally, a metal film is formed on the interlayer insulation film, and then the metal film is patterned so that a metal wiring is formed.

The processes following step 1-9, which are similar to those for forming a usual MOS transistor, may adequately be modified.

Although this embodiment has been described about the method of manufacturing the n-channel MOS transistor, this embodiment may be applied to a method of manufacturing a p-channel type MOS transistor by changing the conductive type of the impurity.

A CMOS process for forming MOS transistors of the two channels on the same substrate may be performed by a method comprising the steps of forming a resist mask, introducing an impurity into only the n-channel type MOS transistor, separating the resist mask and subjecting the p-channel type MOS transistor region to a similar process.

Second Embodiment

Figure 11:
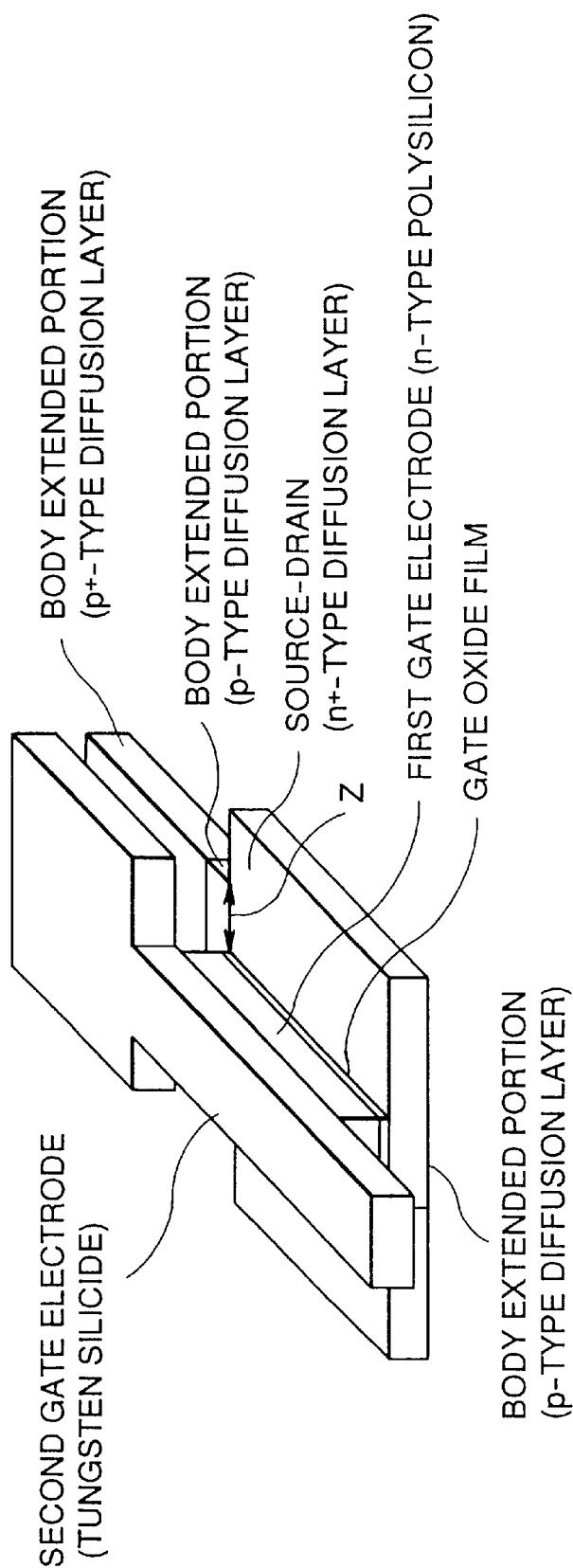
FIG. 11 is a perspective view showing a MOS transistor having a body extended portion according to a second embodiment of the present invention.
Figure 12:
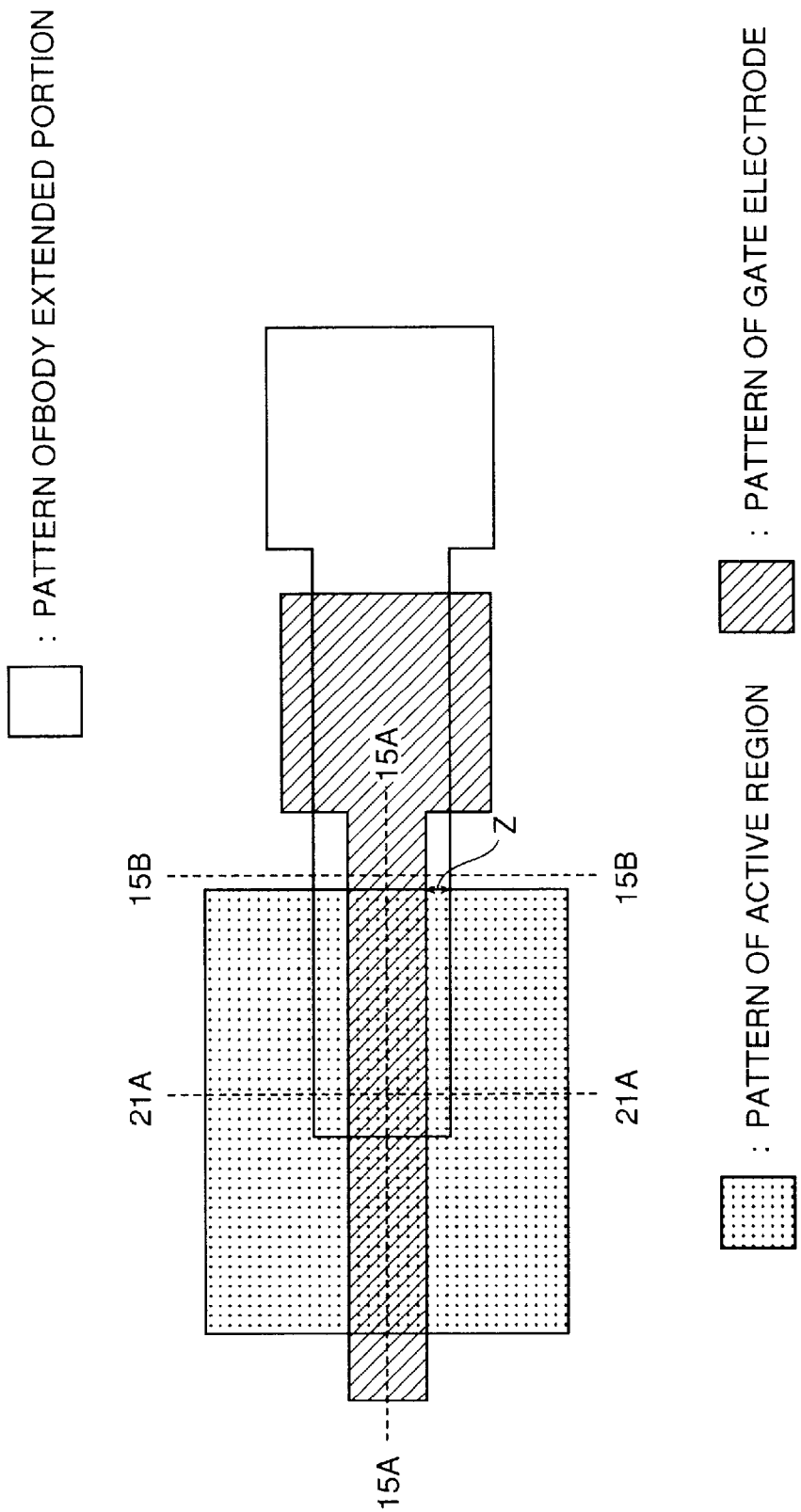
FIG. 12 is a diagram showing a variety of mask patterns for use to manufacture the MOS transistor according to the second embodiment.
Figure 13:
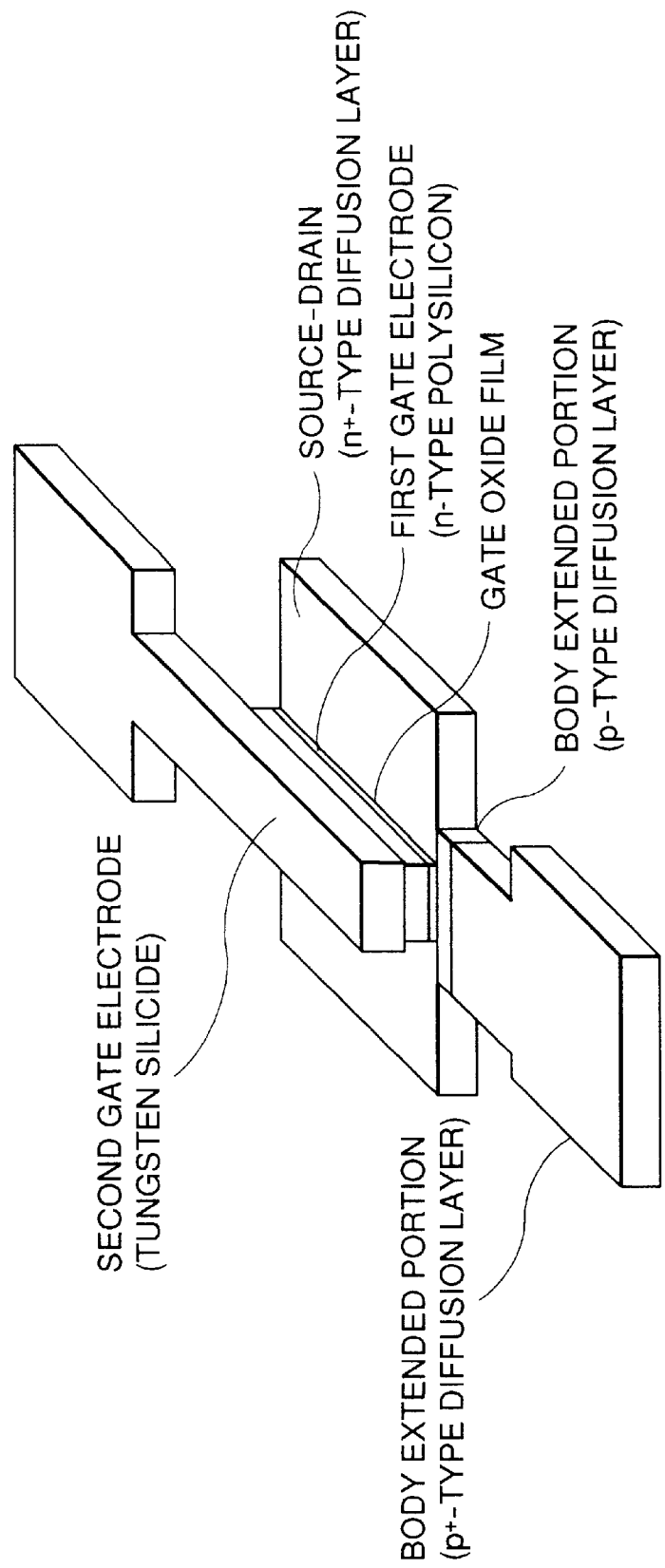
FIG. 13 is a perspective view showing a MOS transistor according to a modification of the second embodiment.
Figure 14:
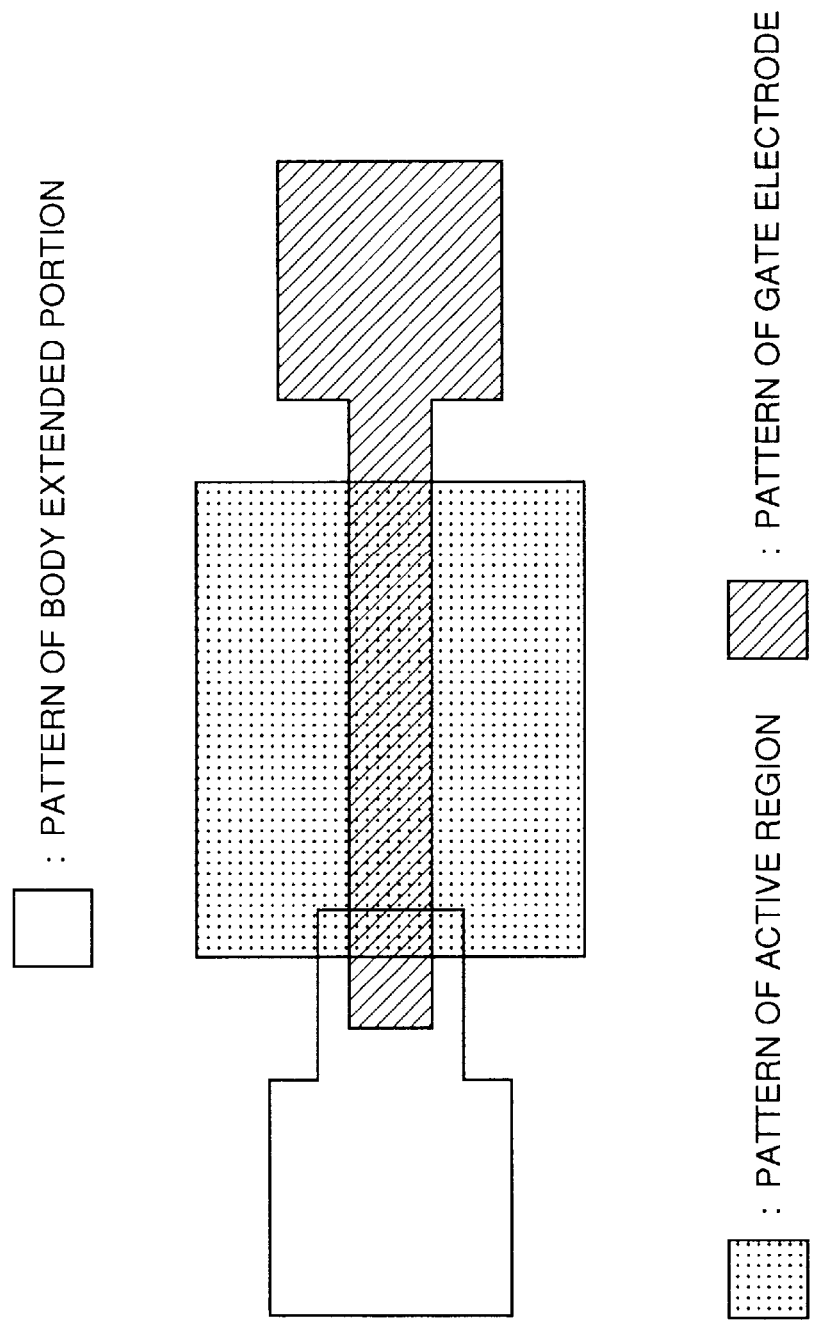
FIG. 14 is a diagram showing a variety of mask patterns for use to manufacture the MOS transistor according to the second embodiment.

FIG. 11 is a perspective view showing an n-channel type MOS transistor according to a second embodiment of the present invention. FIG. 12 shows various patterns for use to manufacture the MOS transistor shown in FIG. 11. FIG. 13 is a perspective view showing a MOS transistor according to a modification of this embodiment, and FIG. 14 shows various mask patterns for use to manufacture the MOS transistor shown in FIG. 13.

Also this embodiment enables an effect similar to that obtainable from the first embodiment to be obtained. Although the first embodiment has the structure such that the junctions between the body extended portion and the source and the drain exist at two ends of the source and the drain, this embodiment has the junction at only either end. Thus, the area required for the junction can be reduced. As a result, the capacitance of the p-n junction (the parasitic capacitance) can furthermore be reduced.

Referring to FIGS. 11 and 12, a portion given symbol z is enlarged in order to cause a silicon layer to exist below the gate electrode even if the resist pattern of the body extended portion and the resist pattern of the gate are deviated.

Figure 2B:
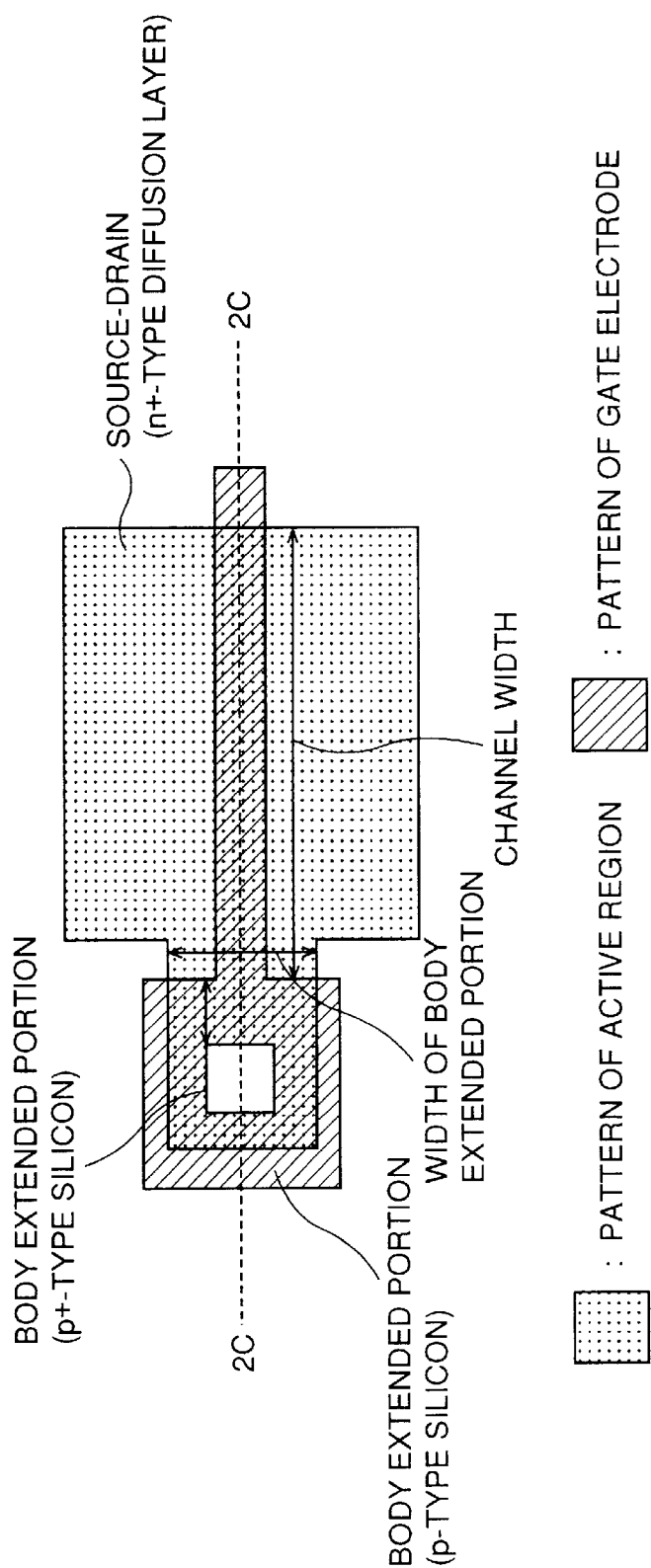
Figure 2C:
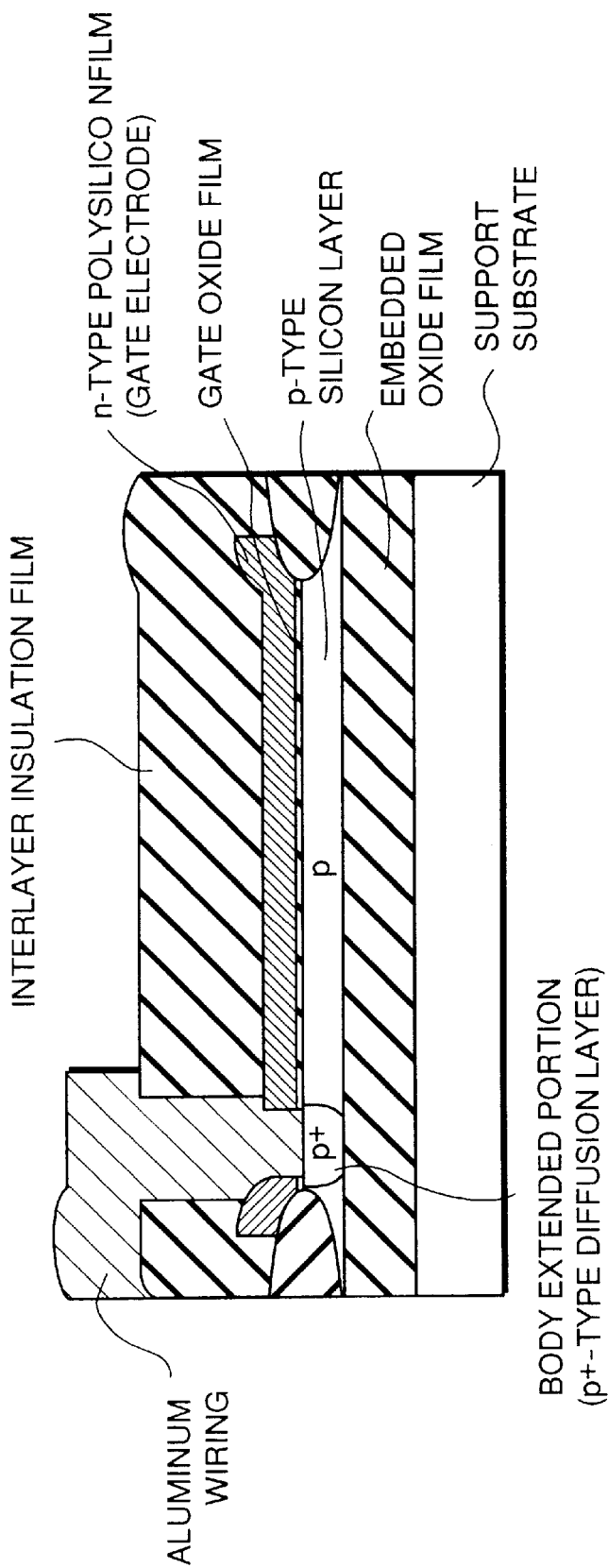

The portion z has a similar structure to that of the conventional device shown in FIG. 2A. The p-n junction area is the same as that of the device shown in FIG. 2. However, the parasitic capacitance of the gate electrode and the source and the drain can be reduced. To further reduce the p-n junction area, the method may be combined with a method which will be described in a seventh embodiment.

Figure 15A:
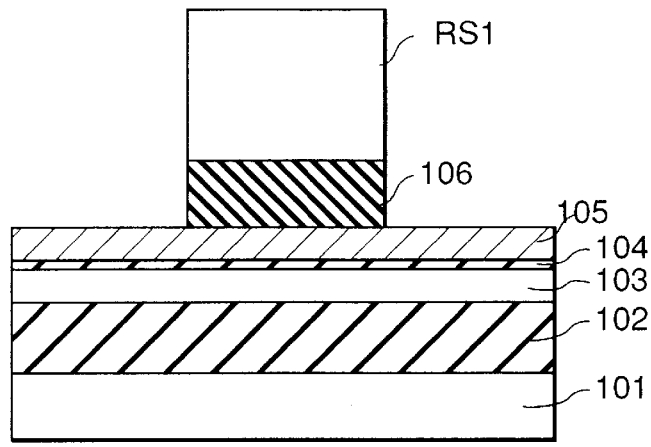
FIGS. 15A and 15B are cross sectional views showing the process of a method of manufacturing a MOS transistor having a body extended portion according to a second embodiment of the present invention.

Referring to FIGS. 15A to 21B, a manufacturing method according to this embodiment will now be described. FIGS. 15A to 21B are made such that FIGS. 15A and 15B are cross sectional views taken along lines 15A—15A and 15B—15B shown in FIG. 12 which is a plan view.

Figure 15B:
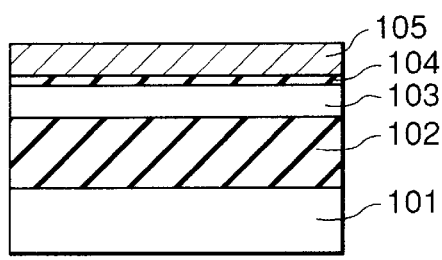

(1) Step 2-1 (FIGS. 15A and 15B)

Initially, an SOI substrate composed of a support substrate 101, a buried oxide film 102 and a silicon layer (SOI) 103 is formed. It is preferable that the thickness of the silicon layer 103 be 50 nm to 150 nm.

Then, p-type impurity ions required to adjust to the threshold voltage are implanted into the silicon layer 103. Then, a gate oxide film 104 having a thickness of about 5 nm to about 10 nm is formed on the silicon layer 103, and then an n-type polysilicon film 105 and a silicon nitride film 106 having a thickness of about 100 nm are sequentially formed by a CVD method.

(2) Step 2-2 (FIGS. 15A and 15B)

Then, a resist pattern RS1 for defining the device region pattern shown in FIG. 12 is formed, and then the silicon nitride film 106 is anisotropically etched by using the resist pattern RS1 as a mask.

Figure 16B:
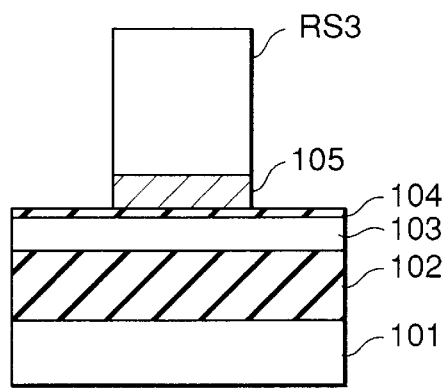
FIGS. 16A and 16B are cross sectional views showing the process of the method of manufacturing the MOS transistor having the body extended portion according to the second embodiment of the present invention.
Figure 16A:
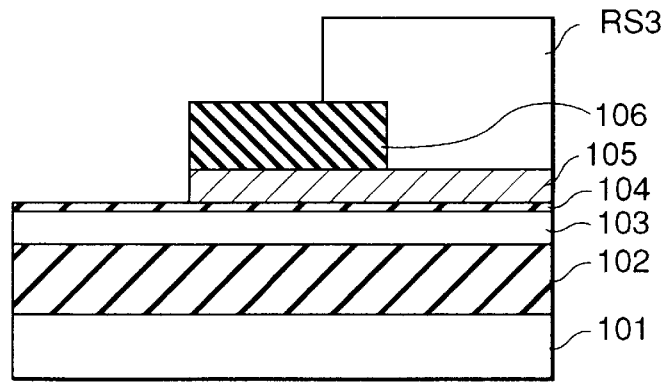

(3) Step 2-3 (FIGS. 16A and 16B)

Then, the resist pattern RS1 is separated, and a resist pattern RS3 for defining the pattern of the body extended portion shown in FIG. 12 is formed. Then, the silicon layer 103 is anisotropically etched by using the resist pattern RS3 and the silicon nitride film 106 as a masks.

Figure 17A:
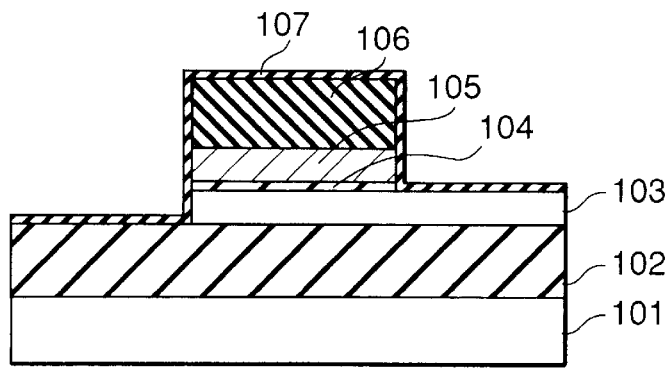
FIGS. 17A and 17B are cross sectional views showing the process of the method of manufacturing the MOS transistor having the body extended portion according to the second embodiment of the present invention.
Figure 17B:
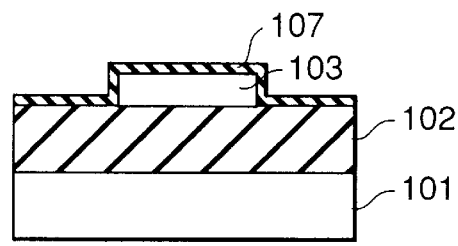

(4) Step 2-4 (FIGS. 17A and 17B)

Then, the resist pattern RS3 is separated, and then the gate oxide film 104 is anisotropically etched. Thus, the silicon layer 103 in the portions except for those on the body extended portion and the device region are exposed.

(5) Step 2-5 (FIGS. 17A and 17B)

Then, the silicon layer 103 is anisotropically etched. As a result, the patterns of the device region and the body extended portion are transferred to the silicon layer 103. In this state, the n-type polysilicon film 105 and the silicon nitride film 106 are left on the device region, while the gate oxide film 104 is left on the body extended portion.

(6) Step 2-6 (FIGS. 17A and 17B)

Then, a silicon oxide film 107 having a thickness of about 20 nm is formed on the overall surface by a CVD method. As a result, the silicon oxide film 107 is formed on the side wall of the n-type polysilicon film 105, that of the silicon layer 103 in the device region and the side wall and the top surface of the silicon layer 103 in the body extended portion.

Figure 18A:
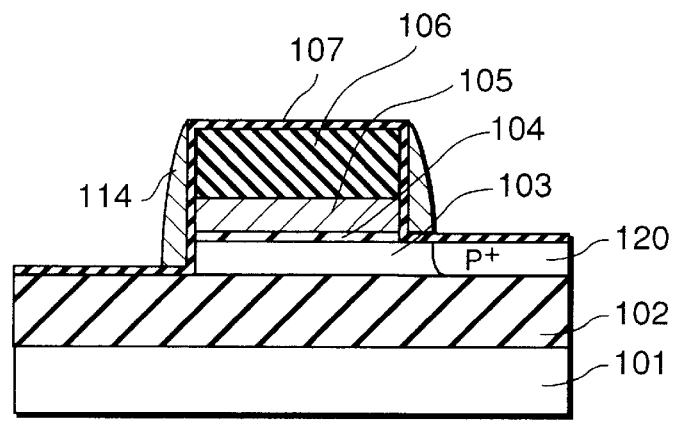
FIGS. 18A and 18B are cross sectional views showing the process of the method of manufacturing the MOS transistor having the body extended portion according to the second embodiment of the present invention.
Figure 18B:
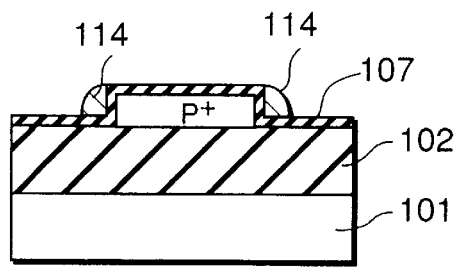

(7) Step 2-7 (FIGS. 18A and 18B)

Then, a polysilicon film having a thickness of about 100 nm is formed, and then the polysilicon film is anisotropically etched. Thus, a spacer 114 is formed on the side wall of the first gate electrode. Then, ions of a high concentration p-type impurity are implanted into the body extended portion by using the spacer 114 and the gate portion as masks so that a body extended portion (a $p^+$-type diffusion layer) 120 is formed.

The high concentration p-type impurity implanted into the body extended portion is diffused in the direction of the channel attributable to the following thermal process. On the other hand, a high concentration n-type impurity is introduced into the source and the drain, and then diffused into the direction of the channel attributable to the following thermal process. Accordingly, this embodiment has a structure such that a p-type impurity is implanted by using the spacer 114 as a mask, and the thickness of the spacer 114 is adjusted in such a manner that high concentration p-n junction cannot be formed.

Although the spacer 114 is made of polysilicon film in this embodiment, any one of an oxide film, a nitride film, amorphous silicon, single crystal silicon, metal, silicide or their combination may be employed.

Figure 19A:
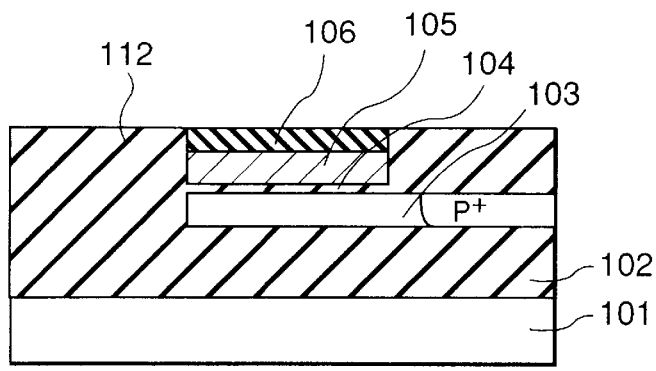
FIGS. 19A and 19B are cross sectional views showing the process of the method of manufacturing the MOS transistor having the body extended portion according to the second embodiment of the present invention.
Figure 19B:
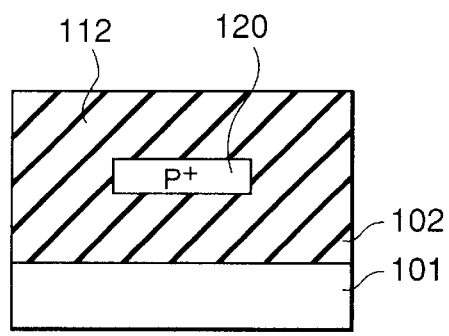

(8) Step 2-8 (FIGS. 19A and 19B)

Then, the spacer 114 is separated by using a CDE (Chemical Dry Etching) method. Then, an isolation oxide film 112 is formed on the overall surface, and then the isolation oxide film 112 is polished by a CMP (Chemical Mechanical Polishing) method so that the surface of the silicon nitride film 106 is exposed.

The isolation oxide film 112 formed in the foregoing step also serves an isolation oxide film for separating the body extended portion 120 and a second gate electrode, which will be formed in the latter process, from each other.

Figure 20A:
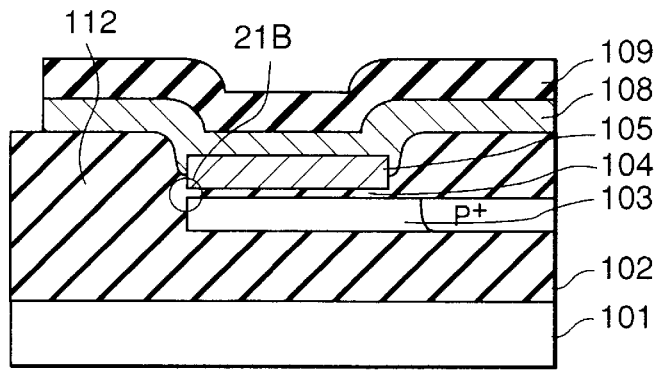
FIGS. 20A and 20B are cross sectional views showing the process of the method of manufacturing the MOS transistor having the body extended portion according to the second embodiment of the present invention.
Figure 20B:
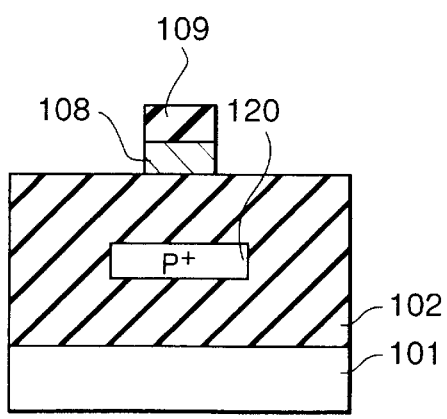
Figure 21A:
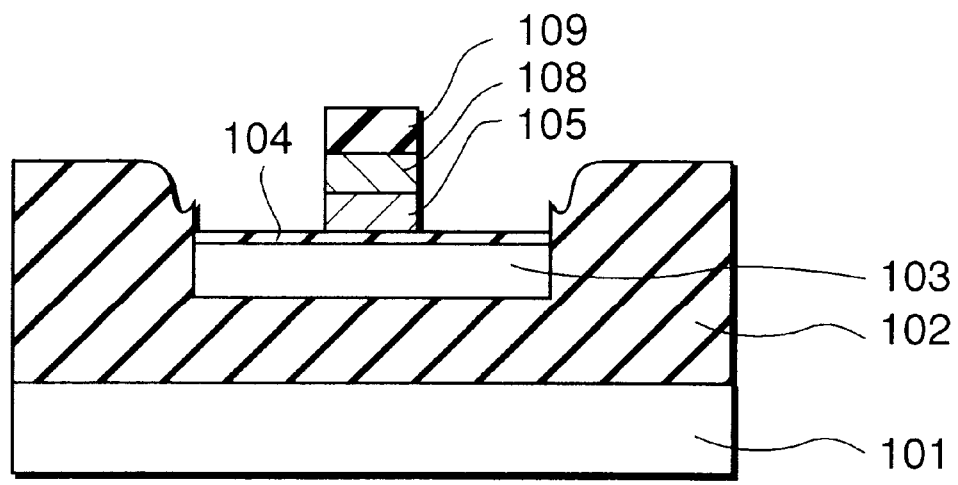
FIGS. 21A and 21B are cross sectional views showing the process of the method of manufacturing the MOS transistor having the body extended portion according to the second embodiment of the present invention.
Figure 21B:
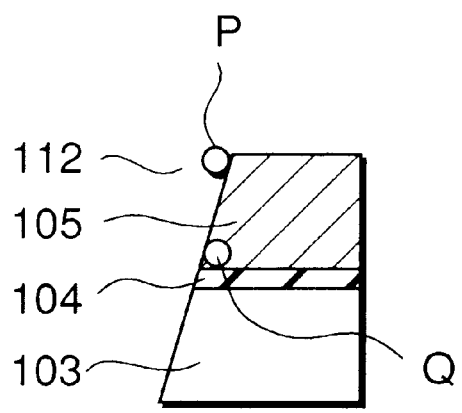

(9) Step 2-9 (FIGS. 20A and 21B)

Then, the silicon nitride film 106 is selectively separated. FIG. 21A is a cross sectional view taken along line 21A—21A shown in FIG. 12, and FIG. 21B is an enlarged cross sectional view of a portion given a circular mark 21B shown in FIG. 20A.

(10) Step 2-10 (FIGS. 20A to 21B)

Then, a tungsten silicide film 108 having a thickness of about 100 nm and a silicon nitride film 109 having a thickness of about 100 nm are sequentially formed on the overall surface. The tungsten silicide film 108 will serve as a second gate electrode.

(11) Step 2-11 (FIGS. 20A to 21B)

Then, a resist pattern for forming the gate electrode shown in FIG. 12 is formed, and then the silicon nitride film 109 is anisotropically etched by using the foregoing resist pattern. Then, the resist pattern is separated.

(12) Step 2-12 (FIGS. 20A to 21B)

Then, the tungsten silicide film 108 and the n-type polysilicon film 105 are anisotropically etched by using the silicon nitride film 109 as a mask.

(13) Step 2-13

Then, a silicon oxide film having a thickness of about 20 nm is formed on the overall surface, and ions for forming an LDD (n⁻-type diffusion layer) are implanted.

(14) Step 2-14

Then, a polysilicon film is formed on the overall surface, and the polysilicon film is anisotropically etched. Thus, a spacer is formed on the side wall of the gate electrode. Then, n-type impurity ions are implanted by using the spacer and the gate electrode as masks so that the source and the drain (n⁺-type diffusion layer) are formed. Then, the spacer is removed by etching by CDE or the like.

(15) Step 2-15

Then, an interlayer insulation film is formed on the overall surface, and then a contact hole is formed on the interlayer insulation film on the gate electrode. Then, a metal electrode made of aluminum or tungsten is embedded in the contact hole. Finally, a metal film is formed on the interlayer insulation film, and then the metal film is patterned so that a metal wiring is formed.

Since the processes following step 2-13 are similar to those for forming the usual MOS transistor, the processes may arbitrarily be modified.

Note that the above-mentioned embodiment has been described about the method of manufacturing the n-channel type MOS transistor, the structure of this embodiment may be applied to manufacture a p-channel type MOS transistor by changing the conduction type of the impurity.

A CMOS process for forming MOS transistors of the two channels on the same substrate may be performed by a method comprising the steps of forming a resist mask, introducing an impurity into only the n-channel type MOS transistor, separating the resist mask and subjecting the p-channel type MOS transistor region to a similar process.

Third Embodiment

Figure 22:
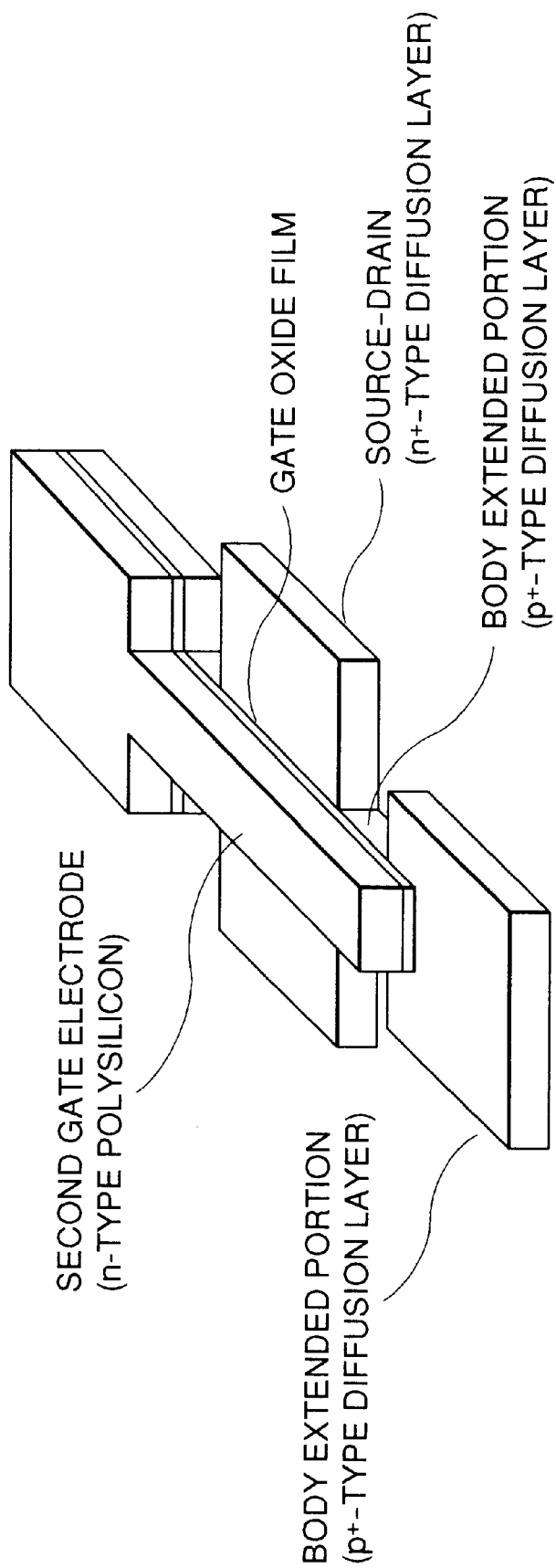
FIG. 22 is a perspective view showing a MOS transistor having a body extended portion according to a third embodiment of the present invention.
Figure 23:
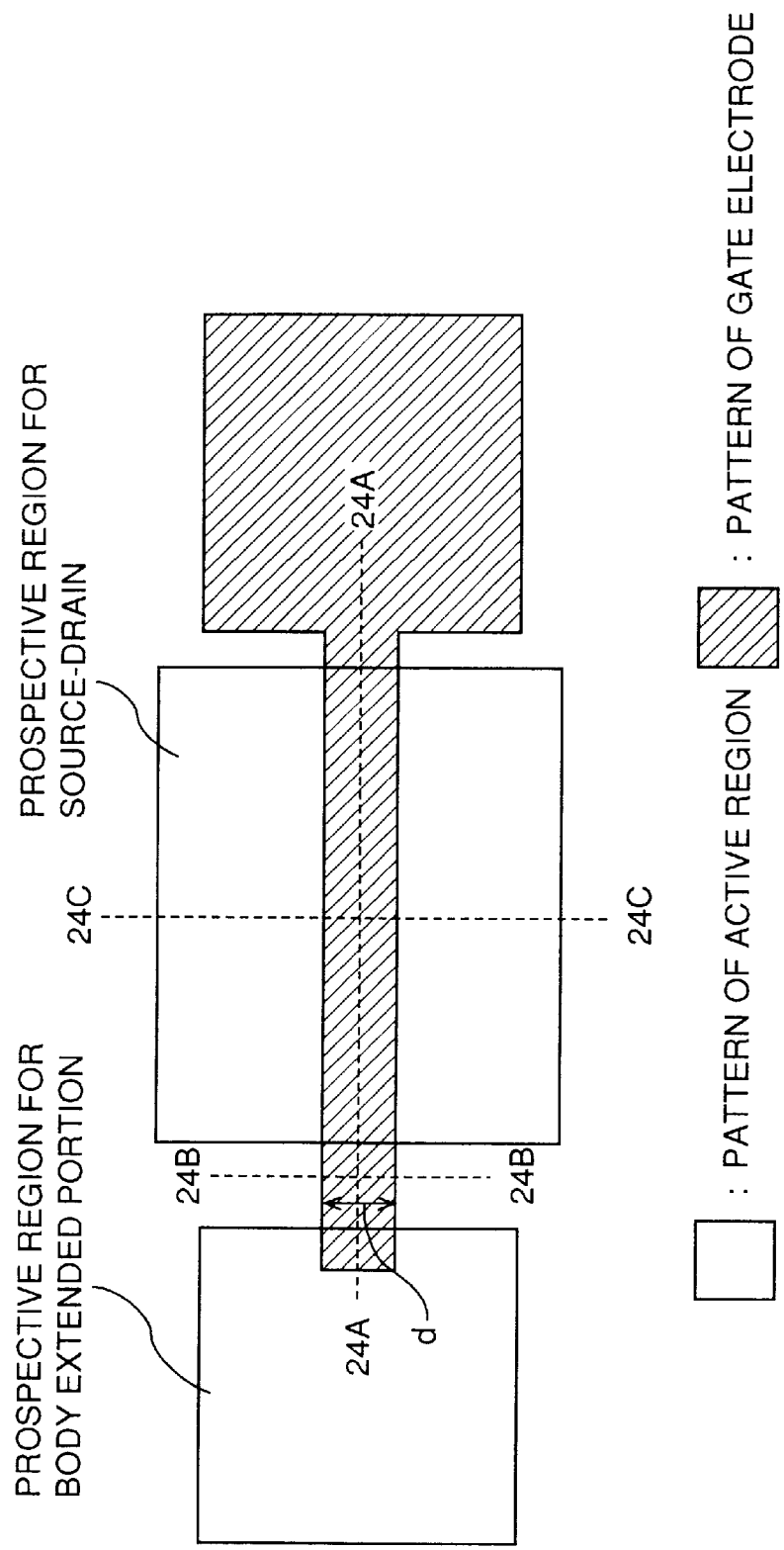
FIG. 23 is a diagram showing a variety of mask patterns for use to manufacture the MOS transistor according to the third embodiment.

FIG. 22 is a perspective view showing an n-channel type MOS transistor according to a third embodiment of the present invention. FIG. 23 shows a variety of mask patterns for use to manufacture the MOS transistor according to this embodiment.

This embodiment is characterized in that the width of a portion of the body extended portion which is coupled to the body is the same as the width of the gate electrode, that is, the channel length. The width of the portion of the body extended portion which is coupled to the body is the lengthwise directional length of the channel in a portion indicated by symbol d shown in FIG. 23. That is, the parasitic gate edge of the conventional device structure shown in FIGS. 1 and 2A is made to be zero. As a result, the area of the p-n junction between the body extended portion and the source and the drain can be reduced so that the junction capacitance and the junction leak are reduced. Moreover, the gate/drain capacitance and the gate/source capacitance can be reduced.

A width of the body extended portion of a portion connected to the body is wider, the sheet resistance becomes lower, thereby a potential of the body can be effectively controlled. However, if the width becomes wider than the gate length, a parasitic p-n junction shown by z of FIG. 12. Therefore, it is preferable the width is the same as the gate length.

Although FIG. 22 shows a structure in which the gate electrode is formed by the single layer film of the n-type polysilicon film, a single layered film of metal or silicide or a double layered film of polycide or polymetal may be employed.

Figure 24A:
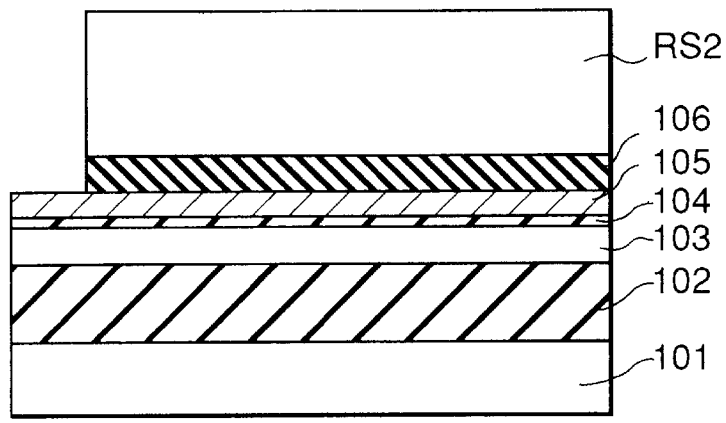
FIGS. 24A to 24C are cross sectional views showing the process of a method of manufacturing a MOS transistor having a body extended portion according to the third embodiment of the present invention.

Referring to FIGS. 24A to 28C, a manufacturing method according to this embodiment will now be described. FIGS. 24A to 28C are arranged such that FIGS. 24A to 24C are cross sectional views taken along lines 24A—24A, 24B—24B and 24C—24C of FIG. 23.

Figure 24B:
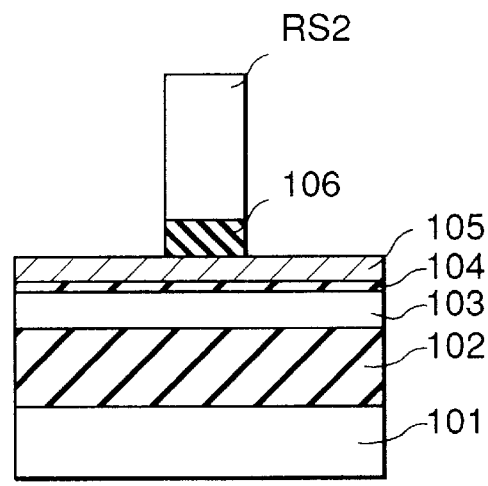
Figure 24C:
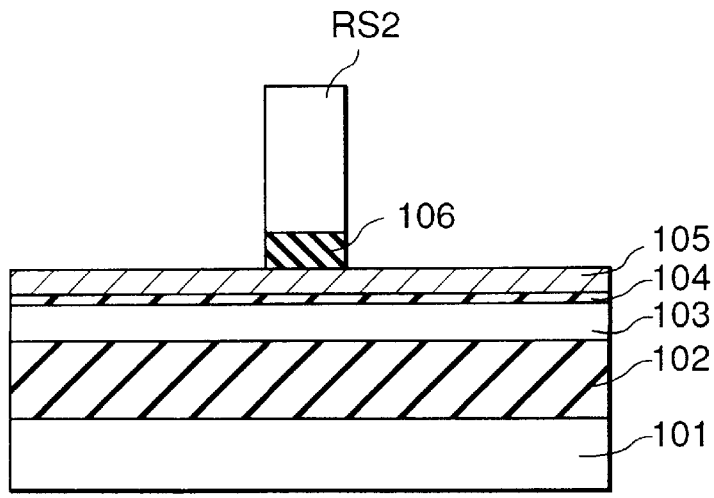

(1) Step 3-1 (FIGS. 24A to 24C)

Initially, an SOI substrate composed of a support substrate 101, a buried oxide film 102 and a silicon layer (SOI) 103 is formed. It is preferable that the thickness of the silicon layer 103 be 50 nm to 150 nm.

Then, p-type impurity ions required to adjust the threshold voltage are implanted into the silicon layer 103. Then, a gate oxide film 104 having a thickness of about 5 nm to about 10 nm is formed on the silicon layer 103. Then, an n-type polysilicon film 105 and a silicon nitride film 106 having a thickness of about 100 nm are sequentially formed on the surface of the gate oxide film 104 by the CVD method.

(2) Step 3-2 (FIGS. 24A to 24C)

Then, a resist pattern RS2 for defining the gate electrode pattern shown in FIG. 23 is formed, and then the silicon nitride film 106 is anisotropically etched by using the resist pattern RS2 as a mask.

Figure 25A:
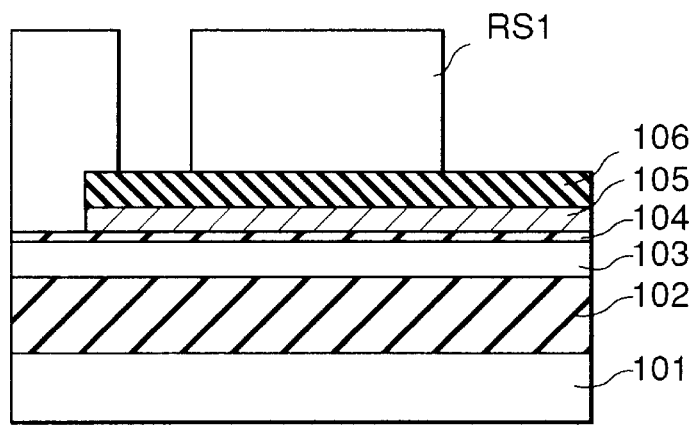
FIGS. 25A to 25C are cross sectional views showing the process of the method of manufacturing the MOS transistor having the body extended portion according to the third embodiment of the present invention.
Figure 25B:
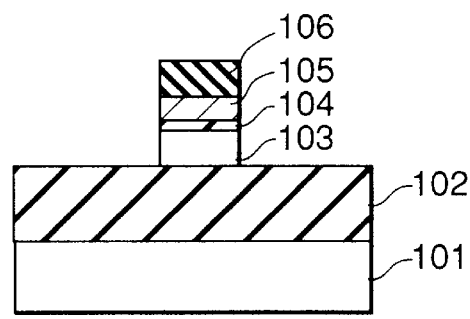
Figure 25C:
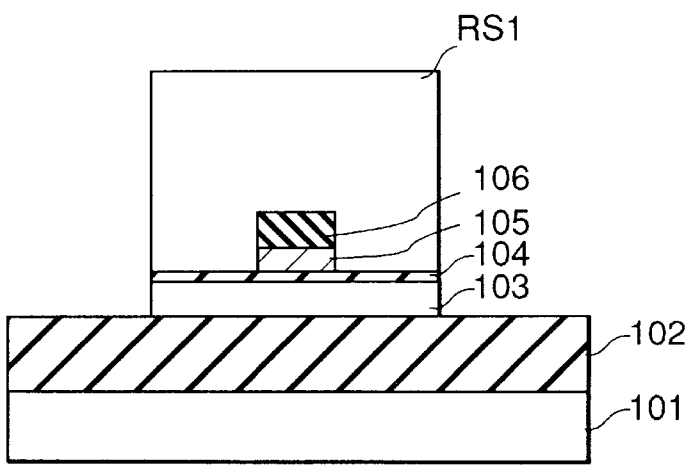

(3) Step 3-3 (FIGS. 25A to 25C)

Then, the resist pattern RS2 is separated, and then the n-type polysilicon film 105 is anisotropically etched by using the silicon nitride film 106 as a mask. Thus, a gate electrode is formed.

(4) Step 3-4 (FIGS. 25A to 25C)

A resist pattern RS1 for defining the device region pattern shown in FIG. 23 is formed, and then the gate oxide film 104 and the silicon layer 103 are anisotropically etched by using the resist pattern RS1 as a mask.

At this time, a region of the silicon layer 103 in the field region on which the n-type polysilicon film 105 is formed such that the n-type polysilicon film 105 is not anisotropically etched because the silicon nitride film 106 on the n-type polysilicon film 105 serves as a mask. Therefore, a structure composed of the n-type polysilicon film 105, the gate oxide film 104 and the silicon layer 103 is formed.

As a result of the foregoing process, a portion of the body extended portion (the p-type diffusion layer) coupled to the body is formed in a self-alignment manner at a position below the n-type polysilicon film 105, as shown in FIG. 25B to have a width which is the same as the width of the n-type polysilicon film 105, that is, the channel length.

Figure 26A:
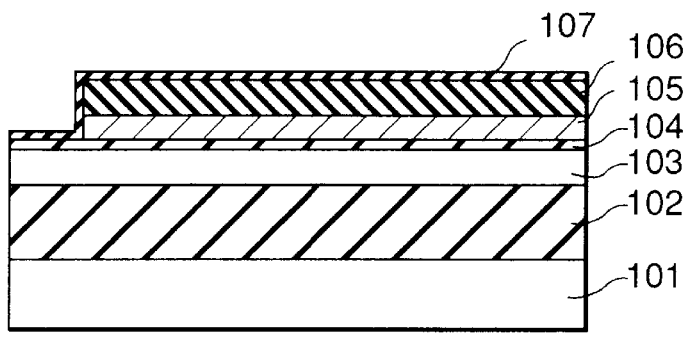
FIGS. 26A to 26C are cross sectional views showing the process of the method of manufacturing the MOS transistor having the body extended portion according to the third embodiment of the present invention.
Figure 26B:
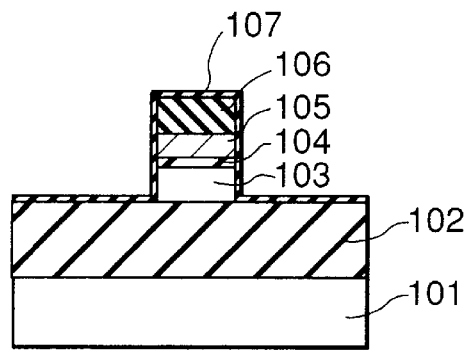
Figure 26C:
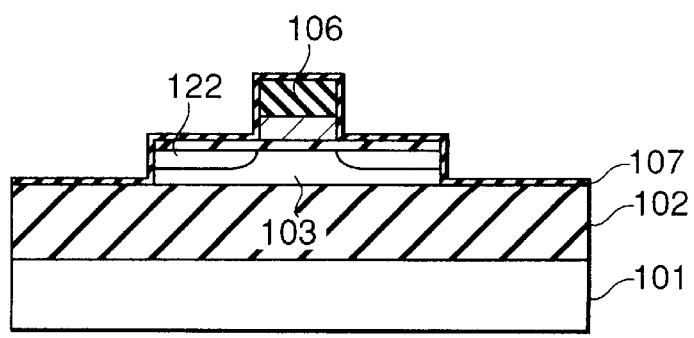

(5) Step 3-5 (FIGS. 26A to 26C)

Then, the resist pattern RS1 is separated, and then a silicon oxide film 107 having a thickness of about 20 nm is formed on the overall surface by the CVD method. As a result, a silicon oxide film 107 is formed on the side wall of the n-type polysilicon film 105, the side wall of the silicon layer 103 and the side wall and the top surface of the silicon layer 103 in the body extended portion. Then, n-type impurity ions are implanted so that an LDD (n⁻-type diffusion layer) 122 is formed.

Figure 27A:
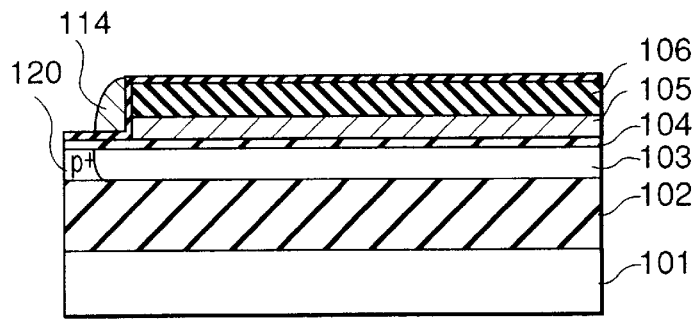
FIGS. 27A to 27C are cross sectional views showing the process of the method of manufacturing the MOS transistor having the body extended portion according to the third embodiment of the present invention.
Figure 27B:
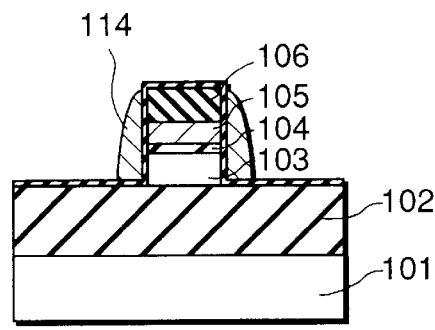
Figure 27C:
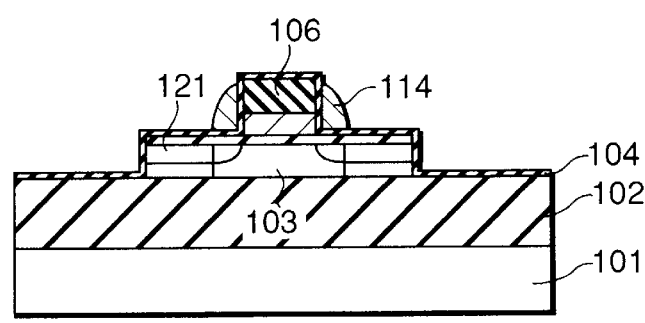

(6) Step 3-6 (FIGS. 27A to 27C)

Then, a polysilicon film is formed on the overall surface, and then anisotropically etched so that a spacer 114 is formed on the side wall of the gate portion.

Then, n-type impurity ions are implanted by using the spacer 114, the gate portion and a resist mask (not shown) as masks so that a source and drain region 121 is formed. Then, the resist mask is separated, and then p-type impurity ions are implanted by using the spacer 114, the gate portion and another resist mask (not shown) as masks. Thus, a body extended portion (a p$^+$-type diffusion layer) 120 is formed. The forming order of the source and drain region 121 and the body extended portion 120 may be inverted.

(7) Step 3-7

Then, the spacer 114 is removed by etching by CDE or the like, and then an interlayer insulation film is formed on the overall surface. Then, a contact hole is formed in a portion of the interlayer insulation film on the gate electrode. Then, a metal electrode made of aluminum or tungsten is embedded in the contact hole. Finally, a metal film is formed on the interlayer insulation film, and then the metal film is patterned so that a metal wiring is formed.

Since the process following step 3-5 is similar to that for forming a usual MOS transistor, the process may arbitrarily be modified.

Although this embodiment has been described about the method of manufacturing the n-channel type MOS transistor, the method according to this embodiment may be applied to manufacture a p-channel type transistor by changing the conduction type of the impurity.

A CMOS process for forming MOS transistors of the two channels on the same substrate may be performed by a method comprising the steps of forming a resist mask, introducing an impurity into only the n-channel type MOS transistor, separating the resist mask and subjecting the p-channel type MOS transistor region to a similar process.

Since a step portion is formed attributable to the n-type polysilicon film 105 when the resist pattern RS1 in the device region is formed in step 3-4, the resolution in exposure deteriorates and thus a designed resist pattern RS1 cannot easily be obtained. The foregoing problem can be overcome by employed the following steps 3-3' and 3-4' in place of steps 3-3 and 3-4.

Figure 28A:
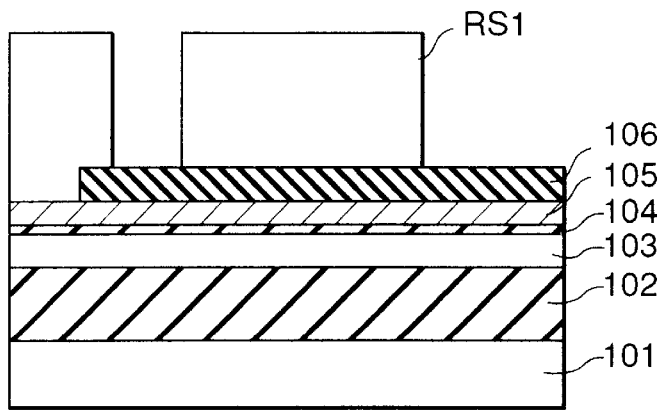
FIGS. 28A to 28C are cross sectional views showing the process of the method of manufacturing the MOS transistor having the body extended portion according to the third embodiment of the present invention.
Figure 28B:
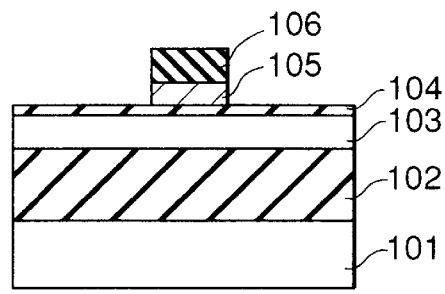
Figure 28C:
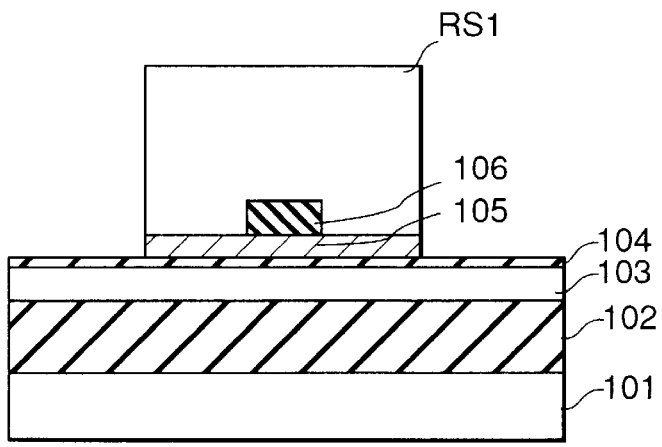

(3') Step 3-3' (FIGS. 28A to 28C)

After the process in step 3-2 has been performed, a RS1 for defining the device region shown in FIG. 23 is formed, and then n-type polysilicon film is anisotropically etched by using the resist pattern RS1 as a mask.

Since the stepped portion in the base portion is only the silicon nitride film 106 to which the pattern of the gate electrode has been transferred, the stepped portion can be reduced as compared with step 3-3. Thus, the deterioration in the resolution in exposure can be prevented.

In a region of the silicon layer 103 in the field region on which the n-type polysilicon film 105 has been formed, the n-type polysilicon film 105 is not anisotropically etched because the silicon nitride film 106 on the n-type polysilicon film 105 serves as a mask. Therefore, a structure composed of the n-type polysilicon film 105, the gate oxide film 104 and the silicon layer 103 is formed.

(4') Step 3-4'

Then, the exposed gate oxide film 104 is anisotropically etched, and then the resist pattern RS1 is separated. Then, the n-type polysilicon film 105 is anisotropically etched by using the silicon nitride film 106 as a mask. In this state, a cross section as shown sin the cross sectional views shown in FIGS. 25A to 25C from which the resist pattern RS2 is removed is realized.

As a result of the foregoing etching operation, the pattern of the gate electrode is transferred to the n-type polysilicon film 105 on the device region, as shown in FIG. 25B. In the field region, the silicon layer 103 is etched.

As a result of the foregoing process, a portion of the body extended portion corresponding to the body is formed below the n-type polysilicon film 105 in a self-alignment manner to have a width which is the same as the width of the n-type polysilicon film 105, that is the channel length.

The following processes (Steps 3-5 to 3-7) are the same.

Fourth Embodiment

Figure 29:
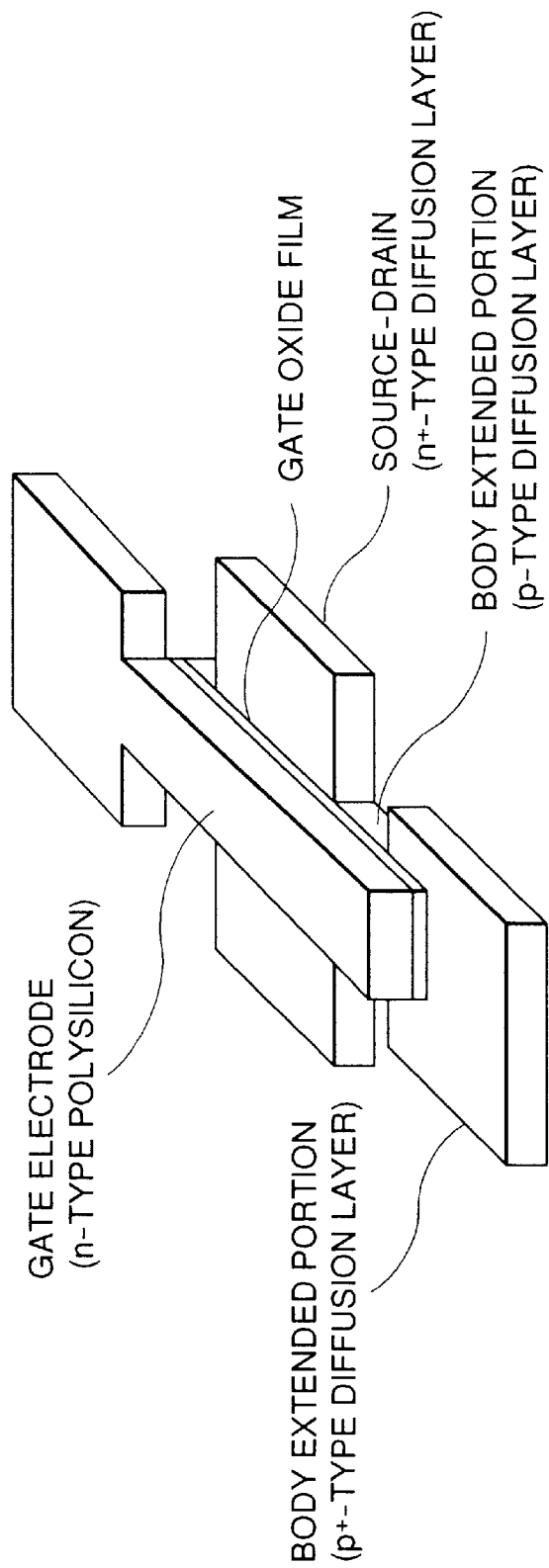
FIG. 29 is a perspective view showing a MOS transistor having a body extended portion according to a fourth embodiment of the present invention.
Figure 30:
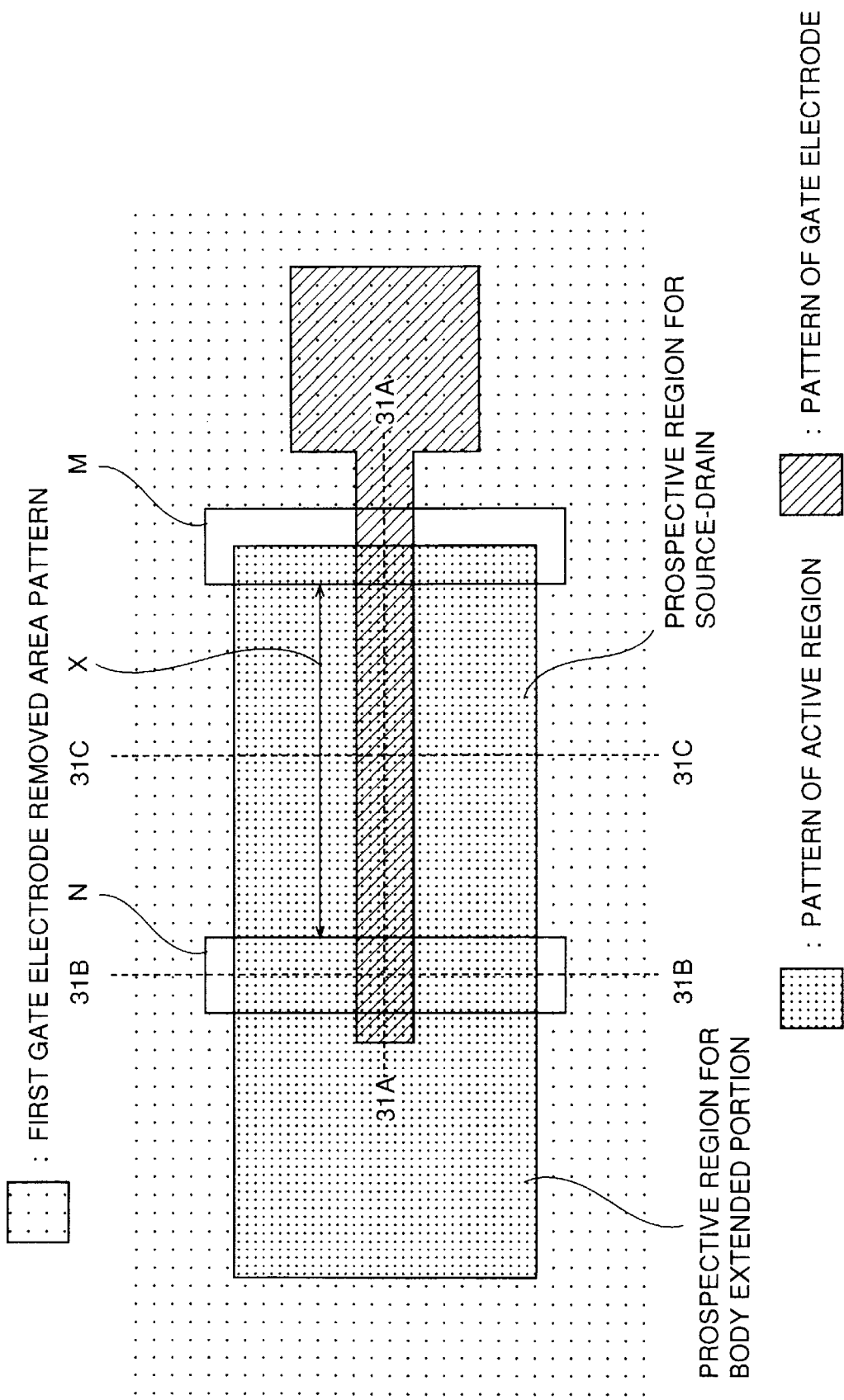
FIG. 30 is a diagram showing a variety of mask patterns for use to manufacture the MOS transistor according to the fourth embodiment.

FIG. 29 is a perspective view showing an n-channel type MOS transistor according to a fourth embodiment of the present invention. FIG. 30 shows a variety of mask patterns for use to manufacture the MOS transistor according to this embodiment.

In the third embodiment, the overall surface of the gate electrode is formed into a MOS capacitor having an insulation film which is the gate oxide film. Although the MOS capacitor in the channel region is a region required to control the electric field, the MOS capacitor in the other region is a parasitic capacitance. That is, the structure according to the third embodiment has a large quantity of needless MOS capacitor (the parasitic capacitance).

According to this embodiment, only a small region adjacent to the channel serves as a parasitic capacitance except for the MOS capacitor in the channel region, as shown in FIG. 29. Although the gate electrode is in the form of a single-layered film of n-type polysilicon film in the structure shown in FIG. 29., the gate may be formed by a single-layered film of metal or silicide or a double-layered film of polycide or polymetal.

This embodiment has the steps of transferring the pattern of the gate electrode to a silicon nitride film on the gate electrode and removing the gate electrode materials in the regions M and N shown in FIG. 30 by anisotropic etching to expose the silicon layer (SOI). Therefore, a portion of the silicon layer in the gate removed region on which the resist pattern for defining the pattern of the gate electrode is not anisotropically etched because the silicon nitride film on the n-type polysilicon film (the gate electrode) serves as a mask. It leads to a fact that a structure composed of the n-type polysilicon film, the gate oxide film and the silicon layer is formed.

When the n-type polysilicon film serving as the gate electrode on the device region is etched, the silicon layer in the regions M and N is etched. Therefore, the width of the channel is a length of a portion indicated by a symbol x shown in FIG. 30.

It is preferable that the region M is not included in the resist pattern and thus the gate electrode is not removed because the gate capacitor in the region M does not serve as the parasitic capacitance. However, there arises another problem in that the width of the channel disperses owning to deviation in alignment between the gate electrode removed region and the device region. A method which is capable of overcoming the two problems will be described in fifth to seventh embodiments.

Figure 31A:
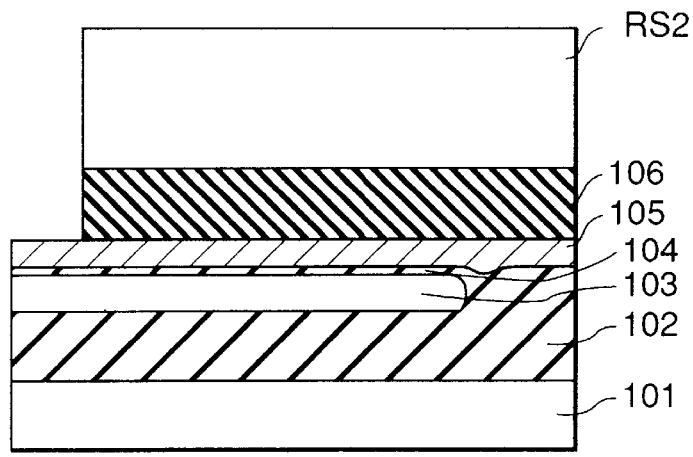
FIGS. 31A to 31C are cross sectional views showing the process of a method of manufacturing a MOS transistor having a body extended portion according to the fourth embodiment of the present invention.

Referring to FIGS. 31A to 33C, a manufacturing method according to this embodiment will now be described. FIGS. 31A to 33C are arranged such that FIGS. 31A, 31B and 31C are cross sectional views taken along lines 31A—31A, 31B—31B and 31C—31C of FIG. 30 which is a plan view.

Figure 31B:
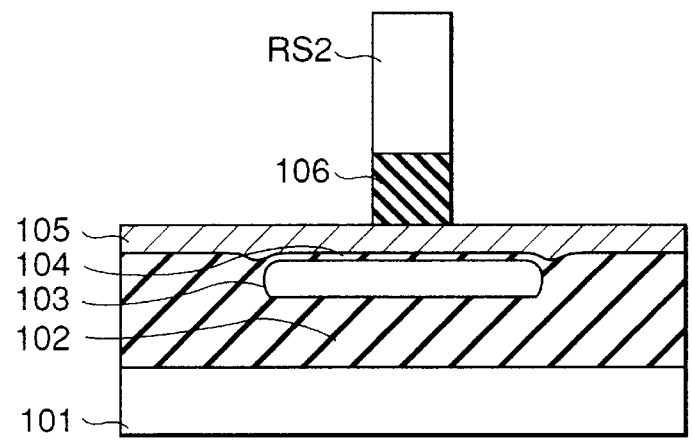
Figure 31C:
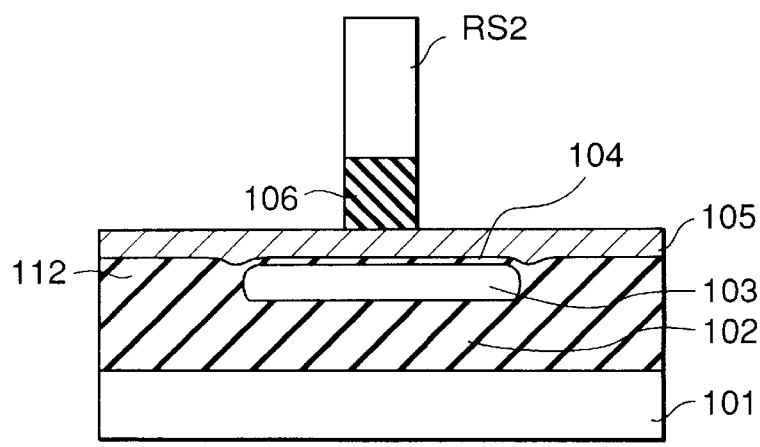

(1) Step 4-1 (FIGS. 31A to 31C)

Initially, an SOI substrate composed of a support substrate 101, a buried oxide film 102 and a silicon layer (SOI) 103 is formed. It is preferable that the thickness of the silicon layer 103 be 50 nm to 150 nm.

A resist pattern for defining the device region shown in FIG. 30 is used to form an isolation oxide film 112. The forming method may be a conventional local oxidation method using a thermal oxide film (an isolation oxide film 112) or a method having the steps of removing the silicon layer 103 in the device region by anisotropic etching and embedding an oxide film (the isolation oxide film 112) into the removed region.

(2) Step 4-2 (FIGS. 31A to 31C)

Then, p-type impurity ions required to adjust the threshold voltage are implanted into the silicon layer 103. Then, a gate oxide film 104 having a thickness of about 5 nm to about 10 nm is formed on the silicon layer 103. Then, an n-type polysilicon film 105 and a silicon nitride film 106 having a thickness of about 100 nm are sequentially formed by the CVD method.

(3) Step 4-3 (FIGS. 31A to 31C)

Then, a resist pattern RS2 for defining the pattern of the gate electrode shown in FIG. 30 is formed, and then the silicon nitride film 106 is anisotropically etched by using the resist pattern RS2 as a mask.

Figure 32A:
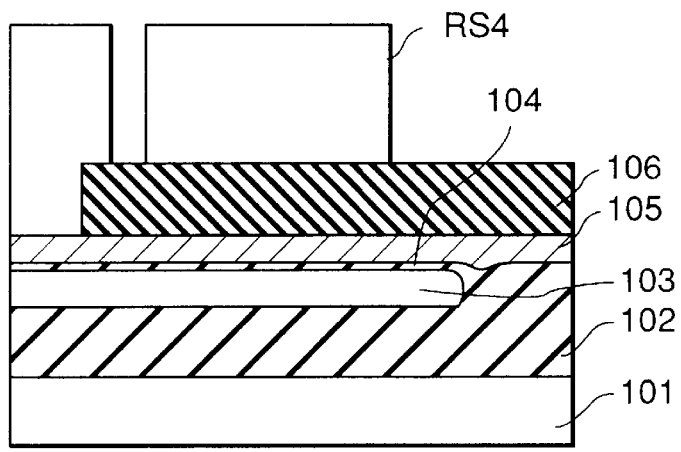
FIGS. 32A to 32C are cross sectional views showing the process of the method of manufacturing the MOS transistor having the body extended portion according to the fourth embodiment.
Figure 32B:
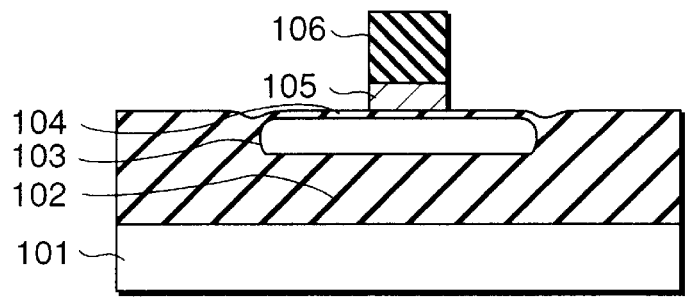
Figure 32C:
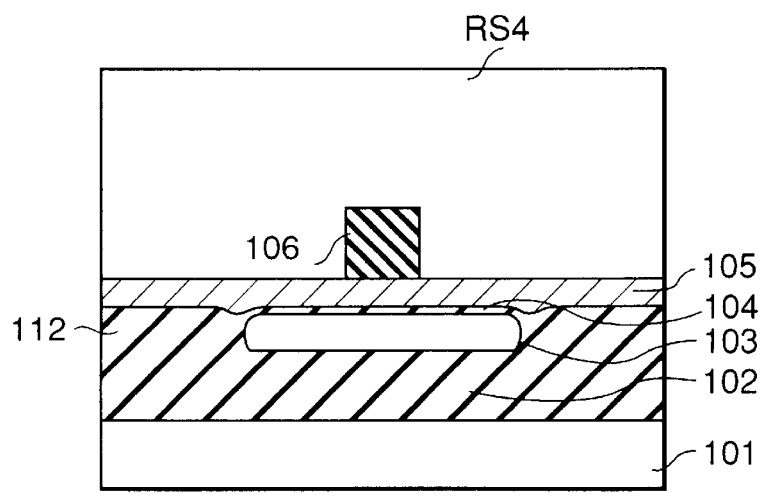

(4) Step 4-4 (FIGS. 32A to 32C)

Then, a resist pattern RS4 for defining the gate electrode removed region shown in FIG. 30 is formed, and then the n-type polysilicon film 105 is anisotropically etched by using the resist pattern RS4 as a mask.

Since the n-type polysilicon film 105 is, as described above, not anisotropically etched because the silicon nitride film 106 serves as a mask in the region in the regions M and N in which the gate electrode pattern exists, a structure composed of the n-type polysilicon film 105, the gate oxide film 104 and the silicon layer 103 is formed.

Figure 33A:
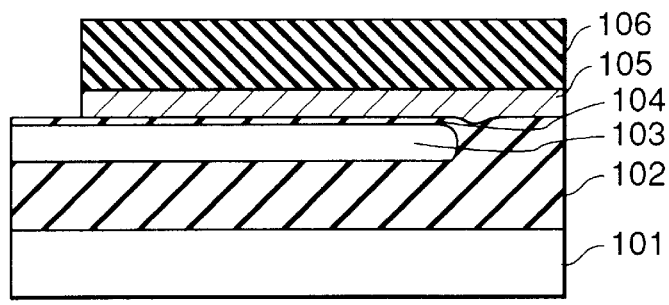
FIGS. 33A to 33C are cross sectional views showing the process of the method of manufacturing the MOS transistor having the body extended portion according to the fourth embodiment.
Figure 33B:
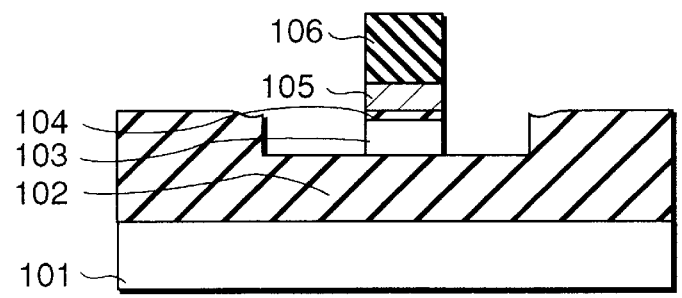
Figure 33C:
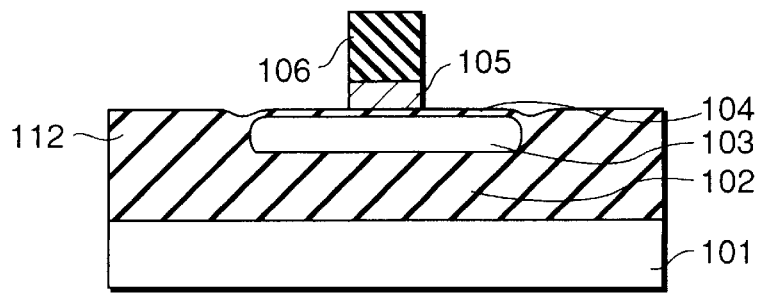

(5) Step 4-5 (FIGS. 33A to 33C)

Then, the exposed gate oxide film 104 is removed by anisotropic etching, and then the resist pattern RS4 is separated. Then, the resist pattern RS2 shown in FIG. 30 and having the pattern of the gate electrode region is used to anisotropically etch the n-type polysilicon film 105. As a result of the foregoing etching operation, the pattern of the gate electrode is transferred to the n-type polysilicon film 105 in the device region. Moreover, the silicon layer 103 in the regions M and N is etched.

As a result of the above-mentioned process, the body extended portion (the p-type diffusion layer) in the portion coupled to the body is formed below the n-type polysilicon film 105 in a self-alignment manner to have a width which is the same as the width of the n-type polysilicon film 105, that is the channel length.

The following process is similar to that according to the third embodiment.

Fifth Embodiment

Figure 34:
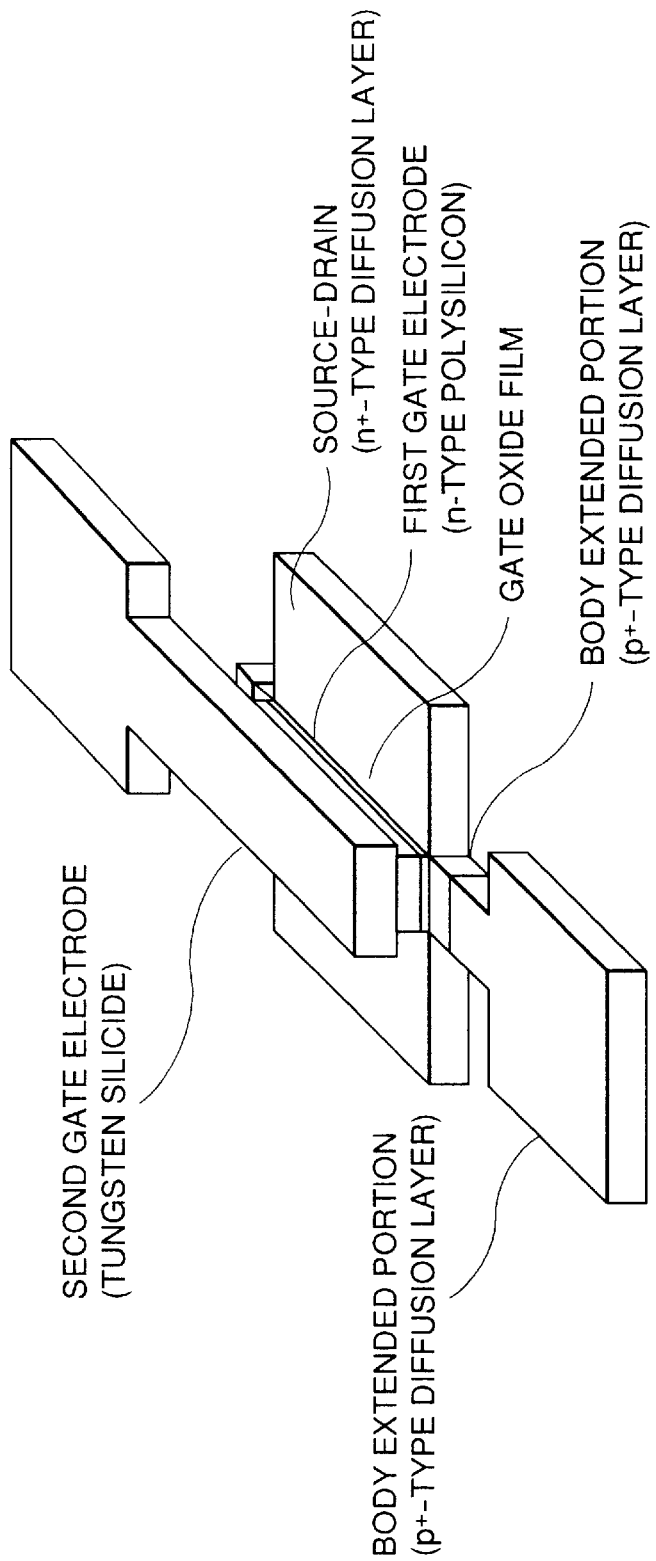
FIG. 34 is a perspective view showing a MOS transistor having a body extended portion according to a fifth embodiment of the present invention.
Figure 35:
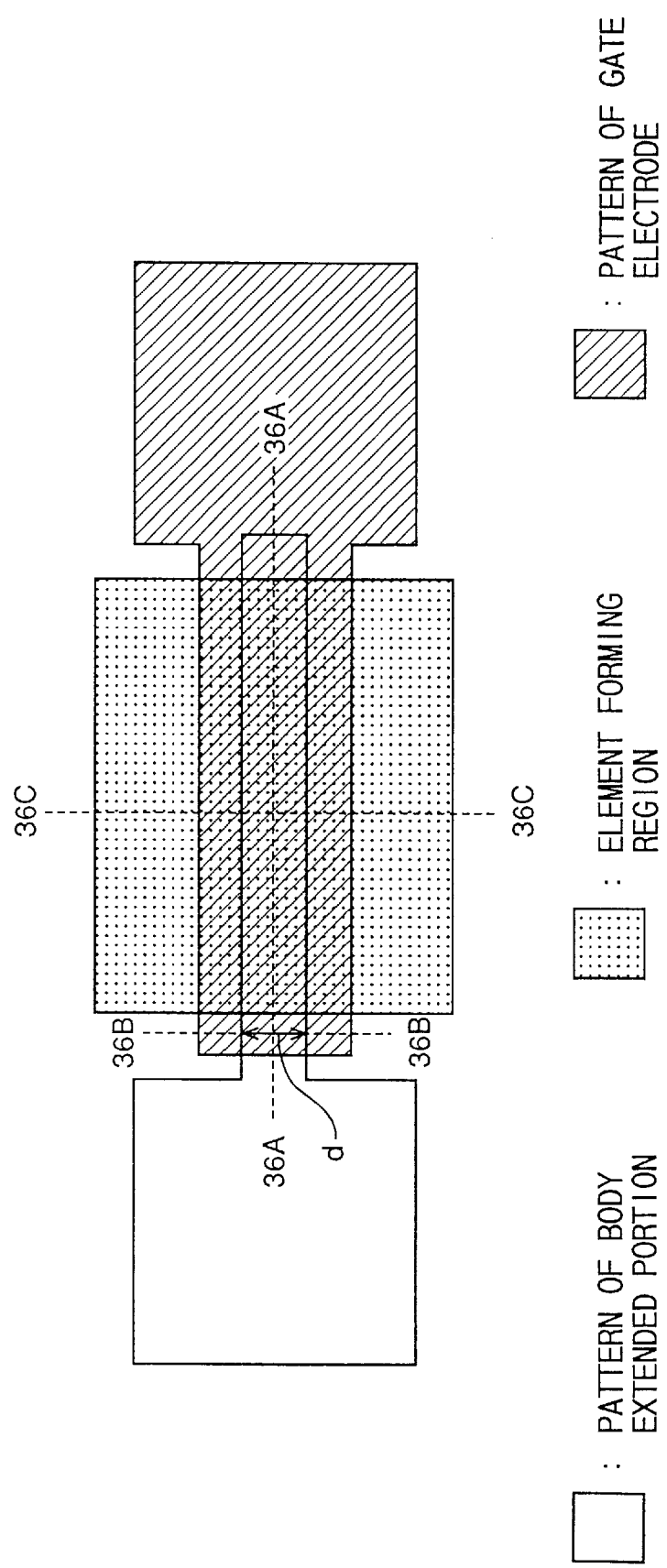
FIG. 35 is a diagram showing a variety of mask patterns for use to manufacture the MOS transistor according to the fifth embodiment.

FIG. 34 is a perspective view showing an n-channel type MOS transistor according to a fifth embodiment of the present invention. FIG. 35 shows a variety of mask patterns for use to manufacture the MOS transistor according to this embodiment.

A first gate electrode is patterned by using the pattern of the body extended portion. A first characteristic of this embodiment lies in that the first gate electrode is not disposed in the body extended portion, similarly to the first embodiment. As a result, the parasitic capacitance of the gate and the body extended portion, which has raised a problem for the conventional structure, can be reduced. Moreover, the resistance of the body extended portion can be lowered.

A second characteristic lies in that the width of the body extended portion is the same as the width of the first gate electrode similarly to the third embodiment. Since the parasitic gate edge can be eliminated in this case, the junction capacitance, the junction leak and the gate/drain capacitance and the gate/source capacitance can be reduced.

The second gate electrode is formed to have a large diameter than that of the first gate electrode. The reason for this lies in that the second gate must be in contact with the overall region on the first gate electrode in consideration of the deviation in aligning the patterns because the first gate electrode and the second gate electrode are formed by individual resist patterns. Since the silicon nitride film gate electrode is required to simply be in contact with the first gate electrode, the extension portion of the second gate electrode may traverse the diffusion layer.

Figure 36A:
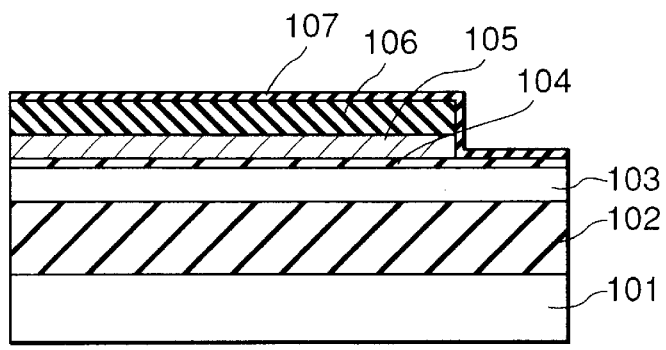
FIGS. 36A and 36B are cross sectional views showing the process of a method of manufacturing a MOS transistor having a body extended portion according to the fifth embodiment of the present invention.

Referring to FIGS. 36A to 41C, a manufacturing method according to this embodiment will now be described. FIGS. 36A to 41C are arranged such that FIGS. 36A, 36B and 38C are cross sectional views taken along lines 36A—36A, 36B—36B and 38C—38C shown in FIG. 35.

Figure 36B:
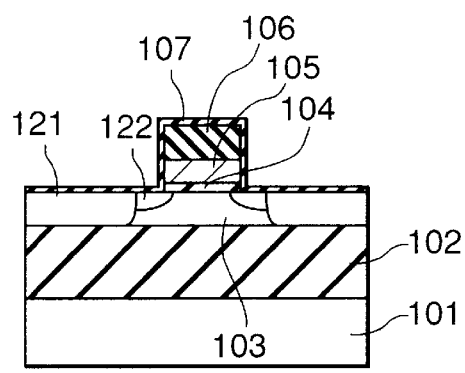

(1) Step 5-1 (FIGS. 36A and 36B)

Initially, an SOI substrate composed of a support substrate 101, a buried oxide film 102 and a silicon layer (SOI) 103 is formed. It is preferable that the thickness of the silicon layer 103 be 50 nm to 150 nm.

Then, p-type impurity ions required to adjust the threshold voltage are implanted into the silicon layer 103. Then, a gate oxide film 104 having a thickness of about 5 nm to about 10 nm is formed on the silicon layer 103. Then, an n-type polysilicon film 105 and a silicon nitride film 106 having a thickness of about 100 nm are sequentially formed by the CVD method.

(2) Step 5-2 (FIGS. 36A and 36B)

Then a resist pattern (not shown) for defining the body extended portion shown in FIG. 35 is formed, and then the silicon nitride film 106 is anisotropically etched by using the resist pattern as a mask. After the resist pattern has been separated, the n-type polysilicon film 105 is anisotropically etched by using the silicon nitride film 106 as a mask. As a result, the resist pattern is transferred to the n-type polysilicon film 105.

(3) Step 5-3 (FIGS. 36A and 36B)

Then, a silicon oxide film 107 having a thickness of about 20 nm is formed on the overall surface, and then an LDD (an n⁻-type diffusion layer) 122 is formed by an ion implanting method. Then, a polysilicon film is formed on the overall surface, and then the polysilicon film is anisotropically etched so that a spacer is formed on the side surface of the gate. Then, the spacer and the gate portion are used as masks to implant high concentration n-type impurity ions into the silicon layer 103 so that the source and the drain (n⁺-type diffusion layer) 121 is formed. Then, the spacer is removed by etching by CDE or the like.

Figure 37A:
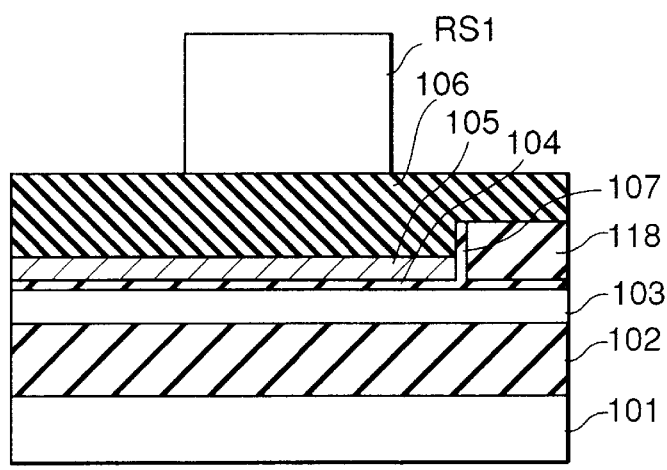
FIGS. 37A and 37B are cross sectional views showing the process of the method of manufacturing the MOS transistor having the body extended portion according to the fifth embodiment of the present invention.
Figure 37B:
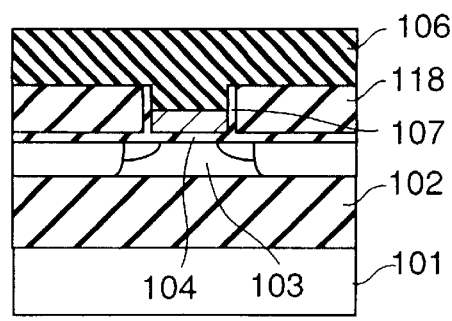

(4) Step 5-4 (FIGS. 37A and 37B)

Then, a silicon oxide film 118 is formed on the overall surface, and then the silicon oxide film 118 is polished by the CMP method until the surface of the silicon nitride film 106 is exposed so that the surface is smoothed and flattened. The smoothing and flattening operation is combined with etching back of the silicon oxide film 118 by anisotropic etching, if necessary.

(5-1) Step 5-5 (FIGS. 37A and 37B)

Then, another silicon nitride film 106 is formed on the overall surface. Then, a resist pattern RS1 for defining the device region shown in FIG. 35 is formed.

(5-2) Step 5-5

Then, the silicon nitride film 106, the silicon oxide films 107 and 118 are anisotropically etched by using the resist pattern RS1 as a mask until the n-type polysilicon film 105 and the silicon layer 103 are exposed.

Figure 38A:
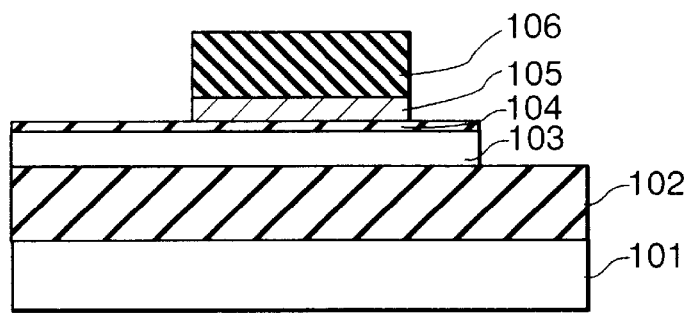
FIGS. 38A to 38C are cross sectional views showing the process of the method of manufacturing the MOS transistor having the body extended portion according to the fifth embodiment of the present invention.
Figure 38B:
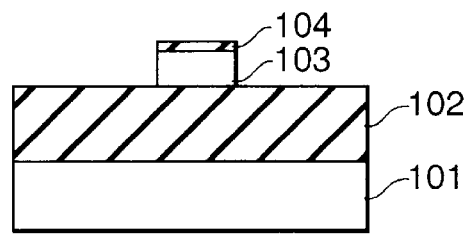
Figure 38C:
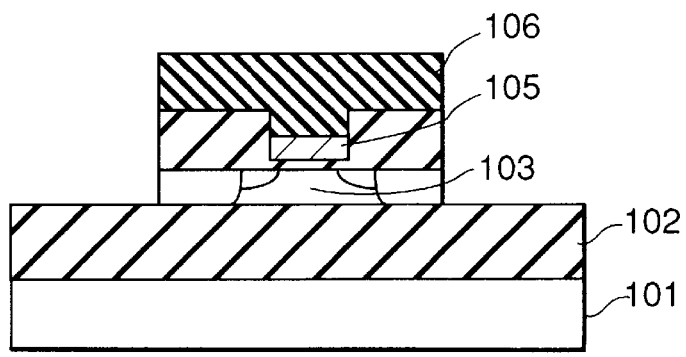

(5-3) Step 5-5 (FIGS. 38A to 38C)

Then, the resist pattern RS1 is separated, and then the n-type polysilicon film 105 is anisotropically etched by using the silicon nitride film 106 as a mask. As a result, the silicon layer 103 in the field region is removed by etching so that the gate oxide film 104 in the body extended portion is exposed.

Figure 39A:
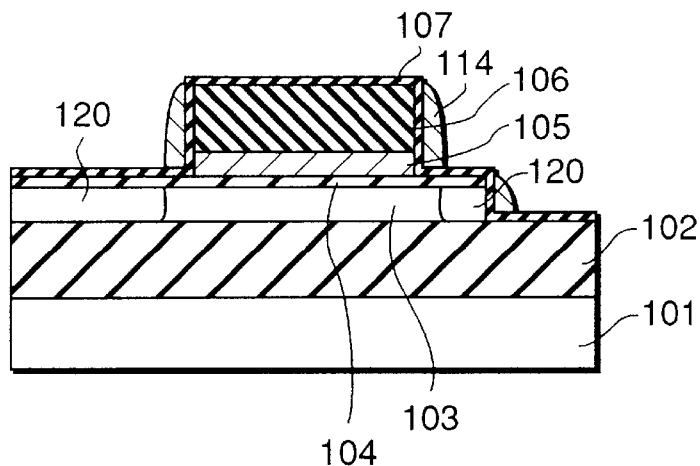
FIGS. 39A to 39C are cross sectional views showing the process of the method of manufacturing the MOS transistor having the body extended portion according to the fifth embodiment of the present invention.
Figure 39B:
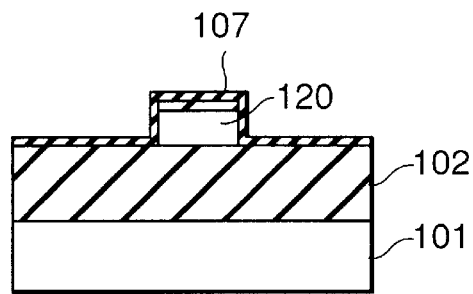
Figure 39C:
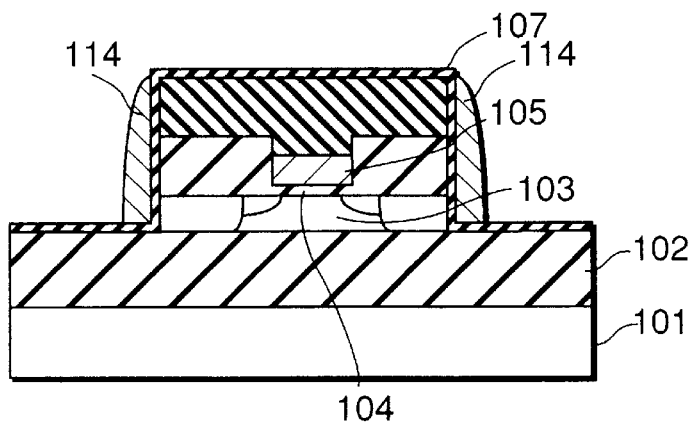

(6) Step 5-6 (FIGS. 39A to 39C)

Then, a silicon oxide film 107 having a thickness of about 20 nm is formed on the overall surface by the CVD method. As a result, the silicon oxide film 107 is formed on the side wall of the n-type polysilicon film 105, the side wall of the silicon layer 103 in the device region and the side wall and the top surface of the silicon layer 103 in the body extended portion.

(7) Step 5-7 (FIGS. 39A to 39C)

Then, a polysilicon film having a thickness of about 100 nm is formed on the overall surface, and then the polysilicon film is anisotropically etched. Thus, a spacer 114 is formed on the side surface of the first gate electrode. Then, p-type impurity ions are implanted by using the spacer 114 as a mask so that a body extended portion (a $p^+$-type diffusion layer) 120 is formed in a self-alignment manner.

Figure 40A:
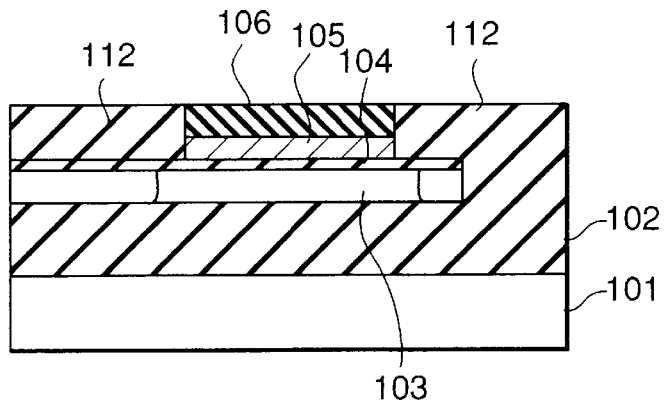
FIGS. 40A to 40C are cross sectional views showing the process of the method of manufacturing the MOS transistor having the body extended portion according to the fifth embodiment of the present invention.
Figure 40B:
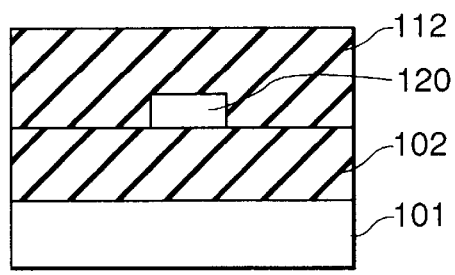
Figure 40C:
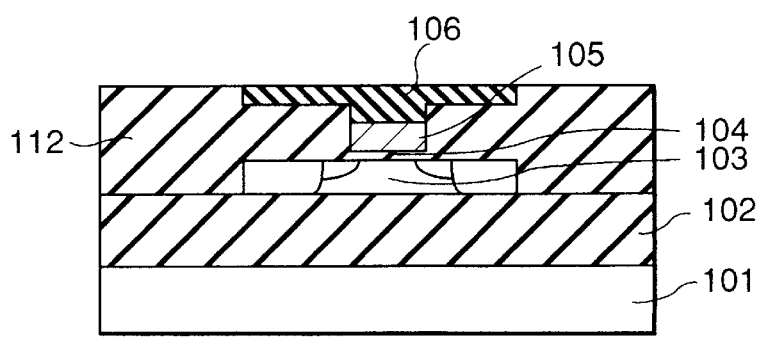

(8) Step 5-8 (FIGS. 40A to 40C)

Then, the spacer 114 is separated by the CDE method. Then, an isolation oxide film 112 is formed on the overall surface, and then the isolation oxide film 112 is polished by the CMP method so that the surface of the silicon nitride film 106 is exposed.

Figure 41A:
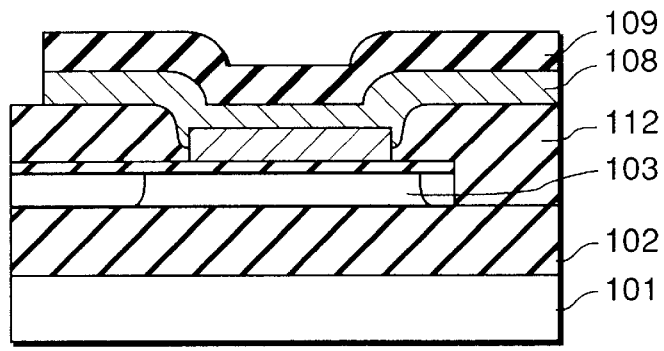
FIGS. 41A to 41C are cross sectional views showing the process of the method of manufacturing the MOS transistor having the body extended portion according to the fifth embodiment of the present invention.
Figure 41B:
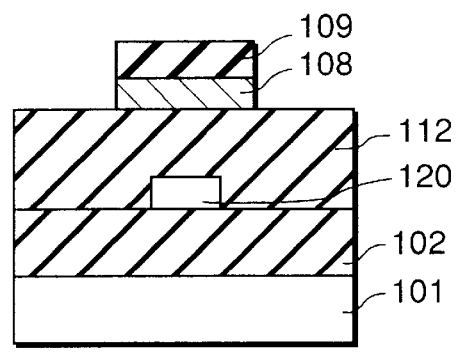
Figure 41C:
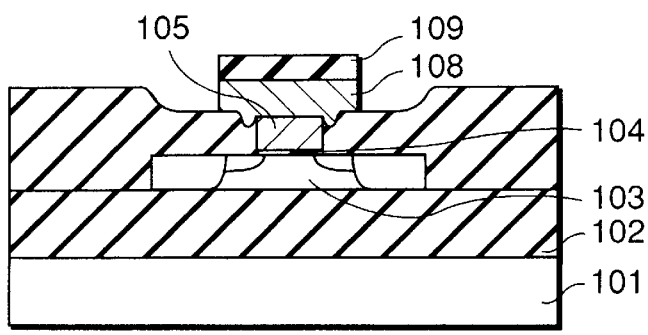

(9) Step 5-9 (FIGS. 41A to 41C)

Then, the silicon nitride film 106 is selectively separated.

(10) Step 5-10 (FIGS. 41A to 41C)

Then, a tungsten silicide film 108 having a thickness of about 100 nm to serve as a second gate electrode and a silicon nitride film 109 having a thickness of about 100 nm are sequentially formed on the overall surface.

(11) Step 5-11 (FIGS. 41A to 41C)

Then, a resist pattern for defining the pattern of the gate electrode shown in FIG. 34 is formed, and then the silicon nitride film 109 is anisotropically etched by using the resist pattern as a mask. Then, the resist pattern is separated.

(12) Step 5-12 (FIGS. 41A to 41C)

Then, the tungsten silicide film 108 is anisotropically etched by using the silicon nitride film 109 as a mask so that a second gate electrode is formed.

The following process is similar to that in step 1-11 and the following process according to the first embodiment.

Sixth Embodiment

Figure 42:
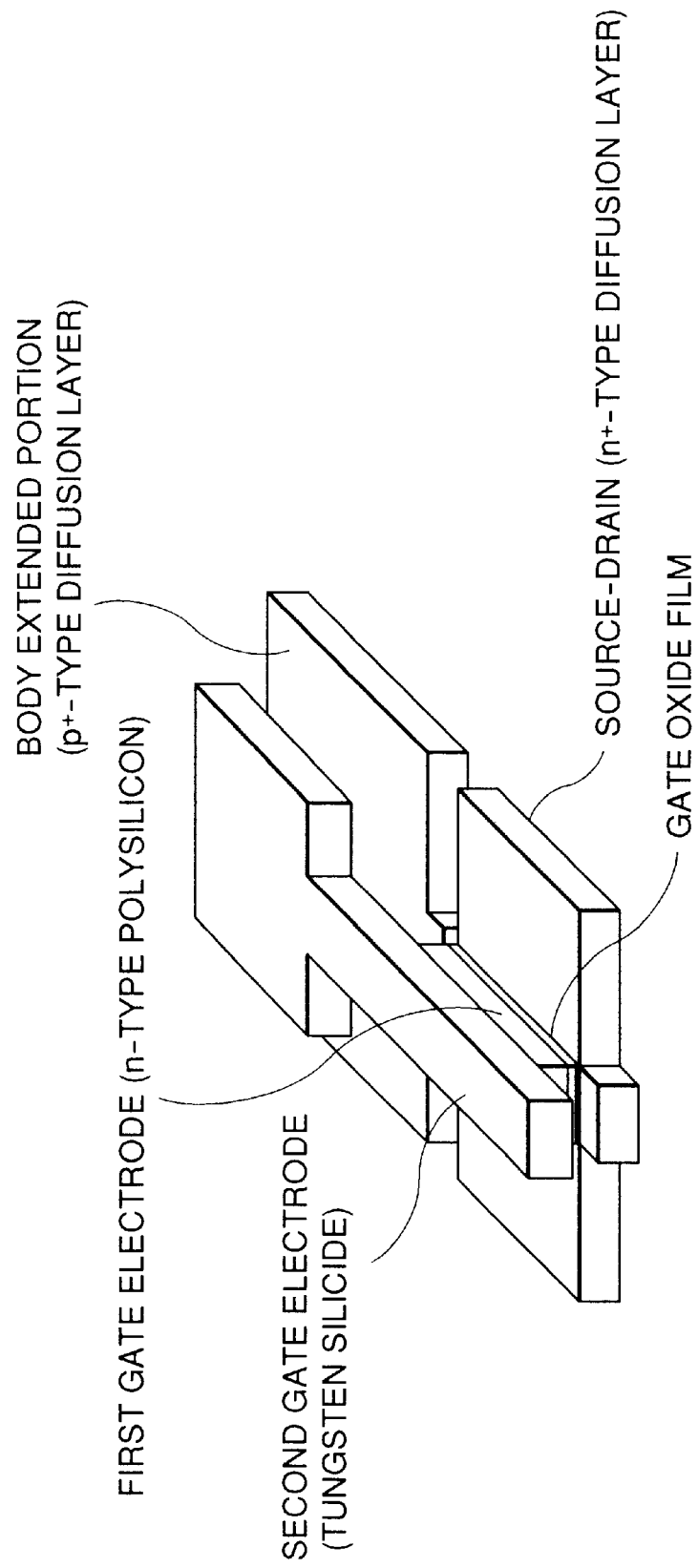
FIG. 42 is a perspective view showing a MOS transistor having a body extended portion according to a sixth embodiment of the present invention.
Figure 43:
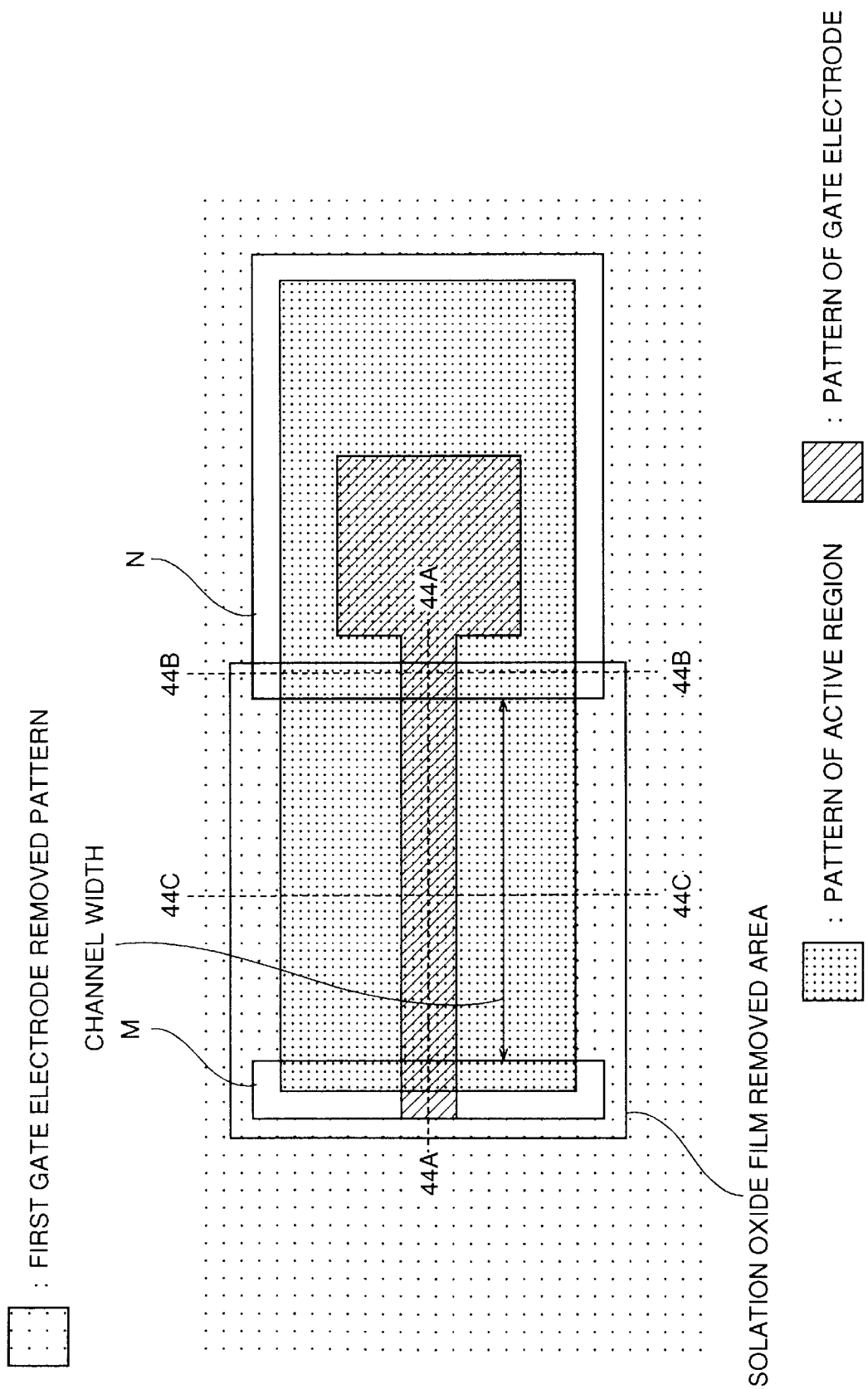
FIG. 43 is a diagram showing a variety of mask patterns for use to manufacture the MOS transistor according to the sixth embodiment.

FIG. 42 is a perspective view showing an n-channel type MOS transistor according to a sixth embodiment of the present invention. FIG. 43 shows a variety of mask patterns for use to manufacture the MOS transistor according to this embodiment.

A first characteristic of this embodiment lies in that the first gate electrode is not disposed in the body extended portion, similarly to the first embodiment. As a result, the parasitic capacitance of the gate and the body extended portion, which has raised a problem for the conventional structure, can be reduced. Moreover, the resistance of the body extended portion can be lowered.

A second characteristic lies in that the width of the body extended portion is the same as the width of the first gate electrode, similarly to the third embodiment. Since the parasitic gate edge can be eliminated in this case, the junction capacitance, the junction leak and the gate/drain capacitance can be reduced.

Figure 44A:
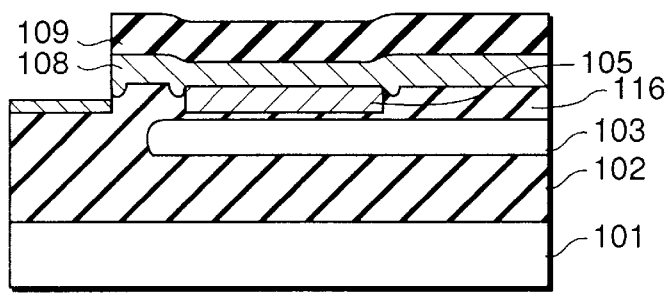
FIGS. 44A to 44C are cross sectional views showing the process of a method of manufacturing a MOS transistor having a body extended portion according to the sixth embodiment of the present invention.

Referring to FIGS. 44A to 46C, a manufacturing method according to this embodiment will now be described. FIGS. 44A to 46C are arranged such that FIGS. 44A, 44B and 44C are cross sectional views taken along lines 44A—44A, 44B—44B and 44C—44C shown in FIG. 43 which is a plan view.

Figure 44B:
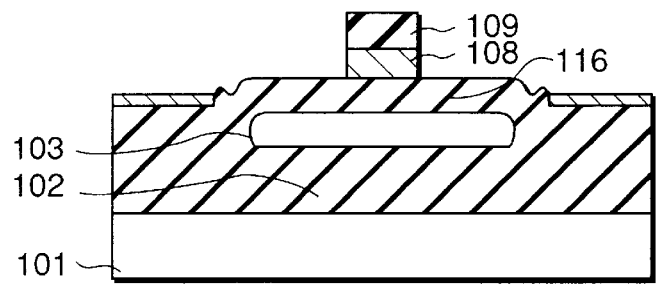
Figure 44C:
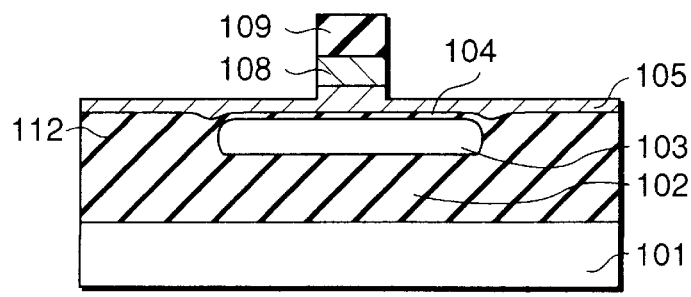

(1) Step 6-1 (FIGS. 44A to 44C)

Processes similar to those in steps 1-1 to 1-9according to the first embodiment are performed.

(2) Step 6-2 (FIGS. 44A to 44C)

Then, a tungsten silicide film 108 is anisotropically etched by using a silicon nitride film 109 as a mask. By using a method different from that according to the first embodiment, the foregoing etching process is performed such that the etching period of time is adjusted in such a manner that only the tungsten silicide film 108 is etched and the n-type polysilicon film 105 on the device region is not etched.

Figure 45A:
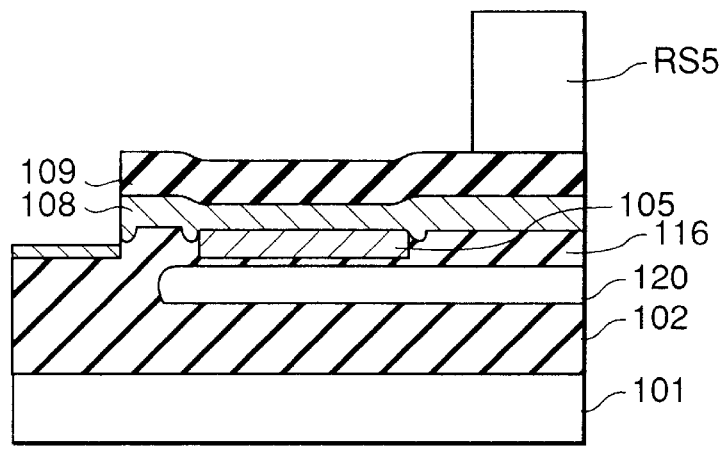
FIGS. 45A to 45C are cross sectional views showing the process of the method of manufacturing the MOS transistor having the body extended portion according to the sixth embodiment of the present invention.
Figure 45B:
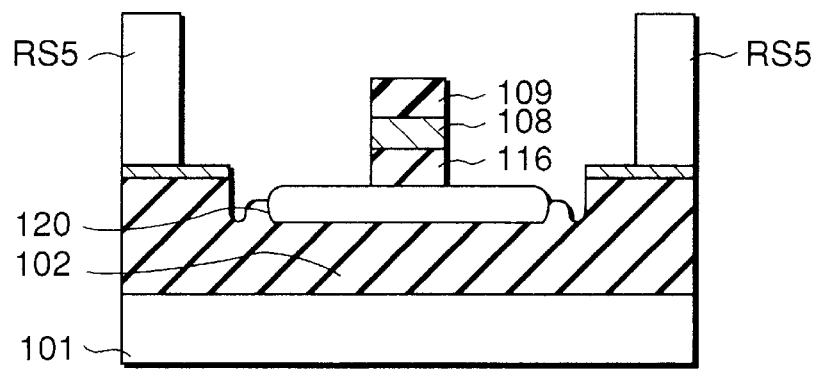
Figure 45C:
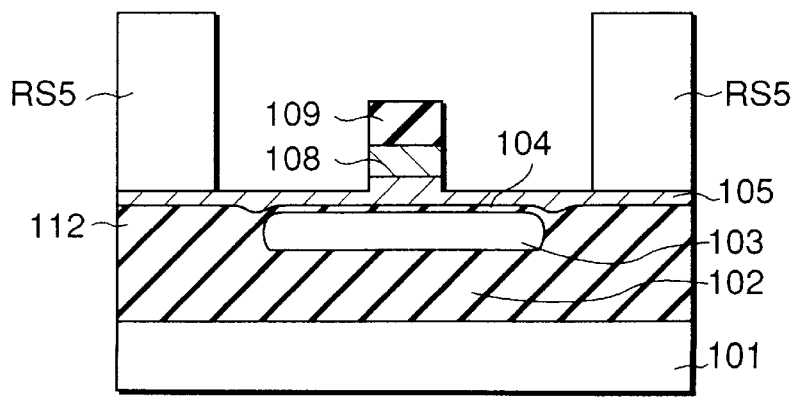

(3) Step 6-3 (FIGS. 45A to 45C)

Then, a resist pattern RS5 for defining the isolation oxide film removed region shown in FIG. 43 is formed. Then, the isolation oxide film 116 is selectively anisotropically etched by using the resist pattern RS5 as a mask. The foregoing etching operation is performed under condition that the silicon nitride film 109 on the tungsten silicide film 108 is not etched.

As a result of the foregoing etching operation, a silicon layer 120 in the body extended portion in the isolation oxide film removed region is exposed. At this time, the silicon layer 103 in the source and the drain region is not exposed because the n-type polysilicon film 105 serves as a mask. Also in the silicon layer 120 in the body extended portion, the silicon nitride film 109 serves as a mask in the portion in which the tungsten silicide film (the second gate electrode) 108 exists. Thus, a structure composed of the tungsten silicide film (the second gate electrode) 108, the isolation oxide film 116 and the silicon layer 120 is formed.

Figure 46A:
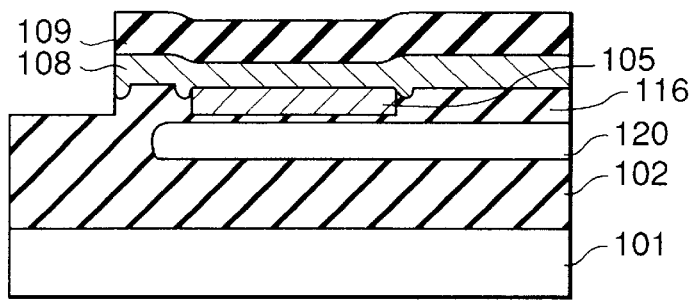
FIGS. 46A to 46C are cross sectional views showing the process of the method of manufacturing the MOS transistor having the body extended portion according to the sixth embodiment of the present invention.
Figure 46B:
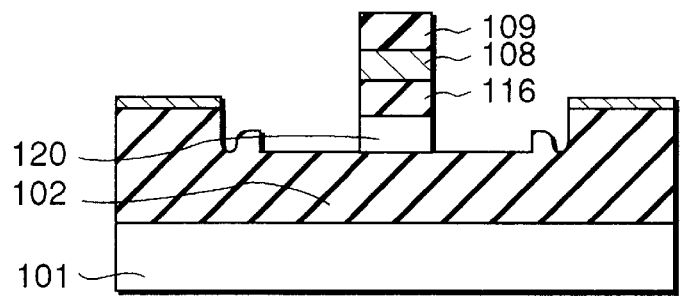
Figure 46C:
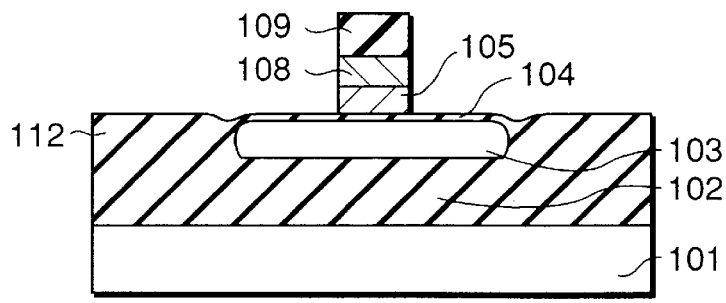

(4) Step 6-4 (FIGS. 46A to 46C)

Then, the resist pattern RS5 is separated, and then the exposed n-type polysilicon film 105 is removed by anisotropic etching. As a result of the anisotropic etching, the pattern of the gate electrode is transferred to the n-type polysilicon film 105 in the device region. On the other hand, also the silicon layer 120 in the body extended portion is etched.

As a result of the above-mentioned process, the body extended portion (a p-type diffusion layer) in the portion coupled to the body is formed below the gate electrode in a self-alignment manner, as shown in FIG. 46B to have a width which is the same as the width of the gate electrode, that is the channel length.

(5) Step 6-5

The following process is similar to that following step 1-11 according to the first embodiment.

Seventh Embodiment

Figure 47:
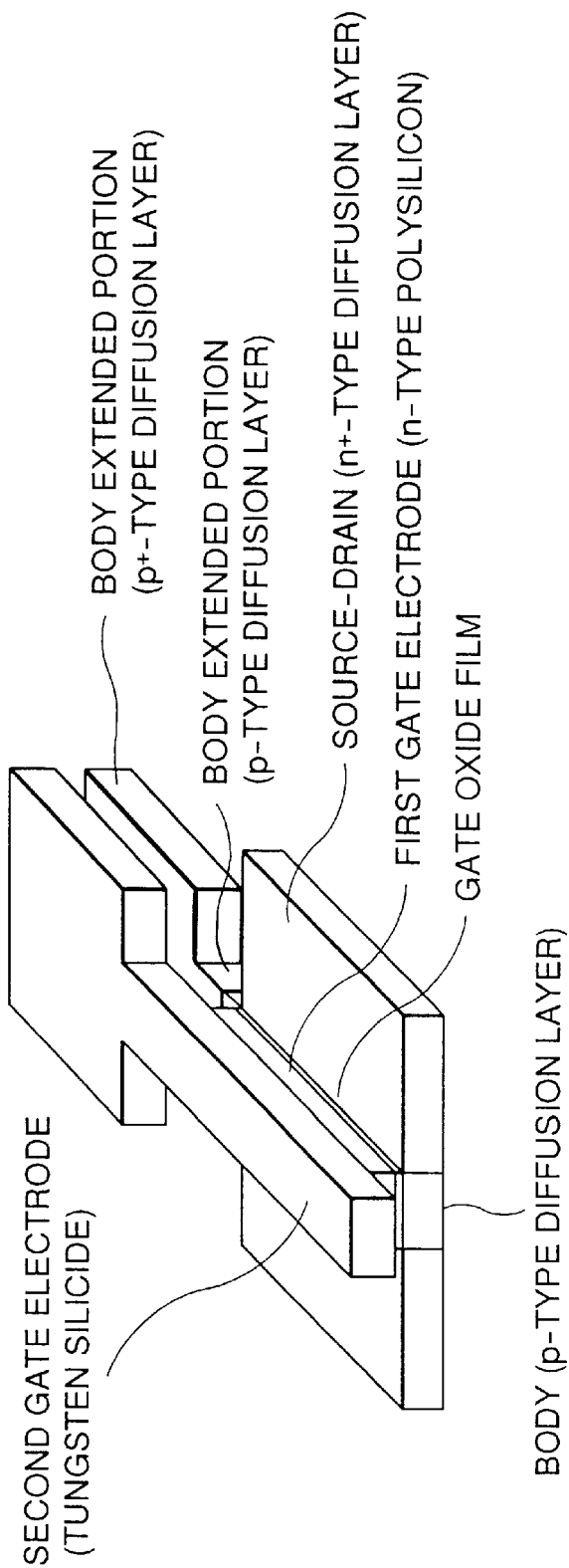
FIG. 47 is a perspective view showing a MOS transistor having a body extended portion according to a seventh embodiment of the present invention.
Figure 48:
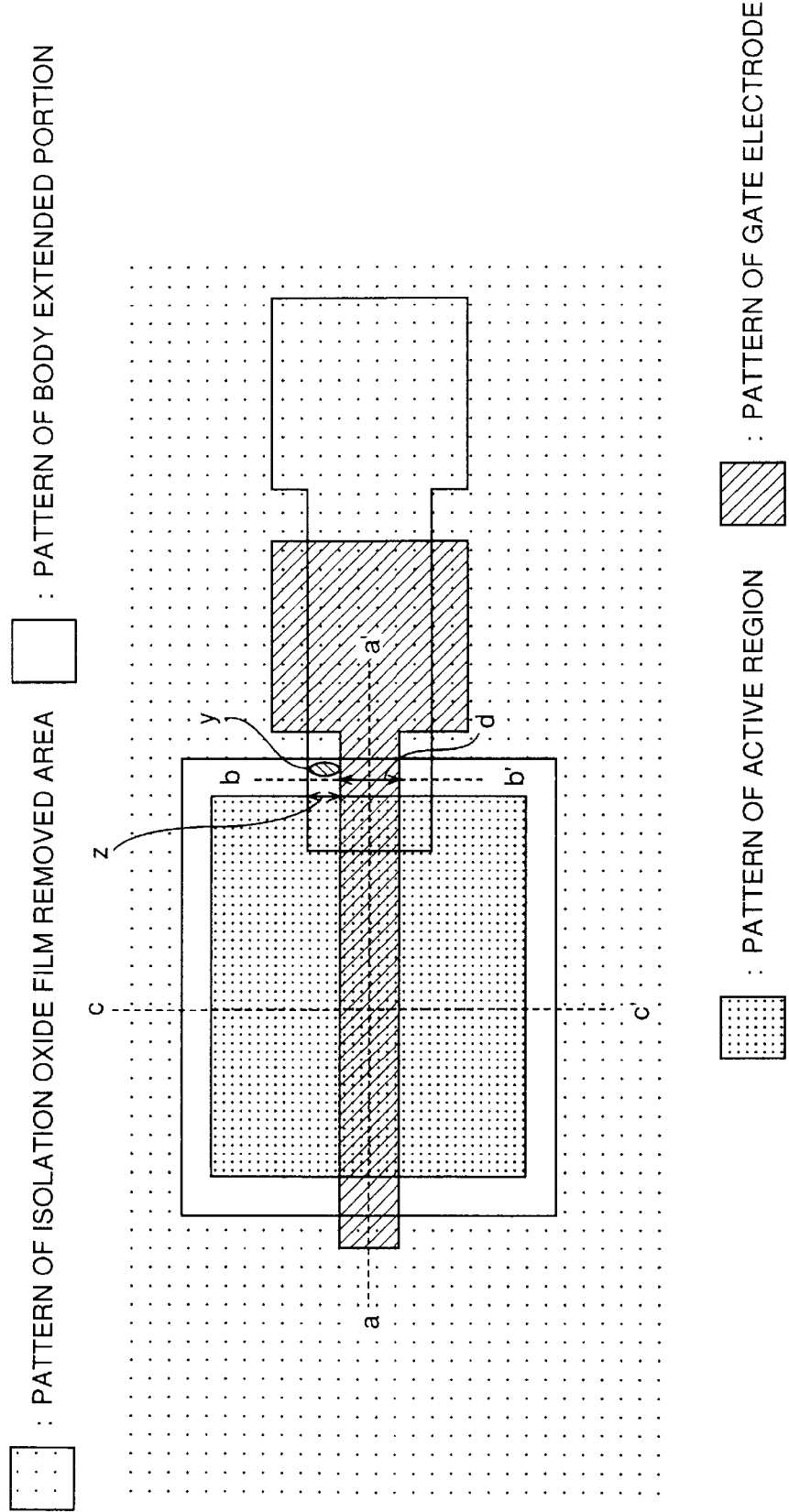
FIG. 48 is a diagram showing a variety of mask patterns for use to manufacture the MOS transistor according to the seventh embodiment.

FIG. 47 is a perspective view showing an n-channel type MOS transistor according to a seventh embodiment of the present invention. FIG. 48 shows a variety of mask patterns for use to manufacture the MOS transistor according to this embodiment.

A first characteristic of this embodiment lies in that the first gate electrode is not disposed in the body extended portion as shown in FIG. 47, similarly to the first embodiment. As a result, the parasitic capacitance in the gate and the body extended portion which has raised a problem for the conventional structure can be reduced. Moreover, the resistance of the body extended portion can be lowered.

A second characteristic lies in that the width of the body extended portion is the same as the width of the first gate electrode, similarly to the second embodiment. Since the parasitic gate edge can be eliminated in this case, the junction capacitance, the junction leak and the gate/drain capacitance and the gate/source capacitance can be reduced.

The structure of the device according to this embodiment can be realized by thick forming the body extended portion by a degree indicated by a symbol z shown in FIG. 48 in consideration of deviation in alignment. Then, the silicon layer in a region indicated by a symbol y shown in FIG. 48 is removed by etching when the gate electrode is patterned.

Figure 49A:
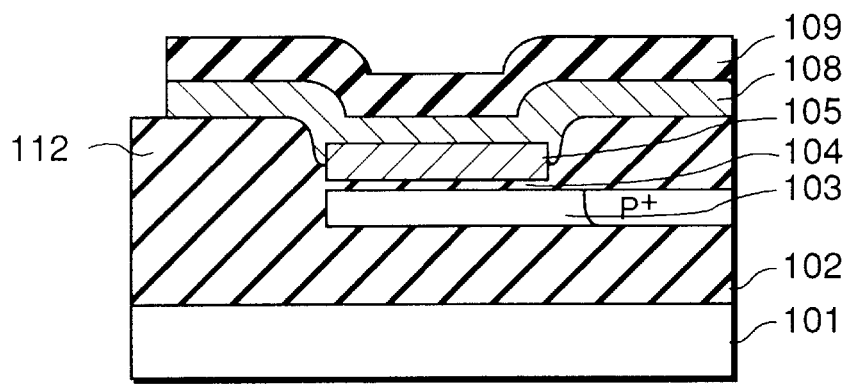
FIGS. 49A to 49C are cross sectional views showing the process of a method of manufacturing a MOS transistor having a body extended portion according to the seventh embodiment of the present invention.

Referring to FIGS. 49A to 51C, a manufacturing method according to this embodiment will now be described. FIGS. 49A to 51C are arranged such that FIGS. 49A, 49B and 49C are cross sectional views taken along lines 49A—49A, 49B—49B and 49C—49C shown in FIG. 48.

Figure 49B:
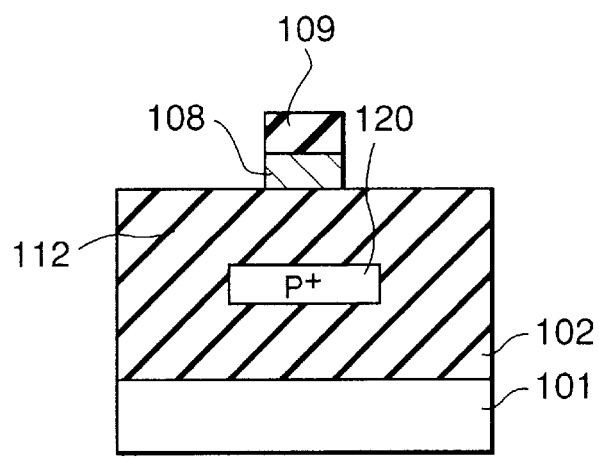
Figure 49C:
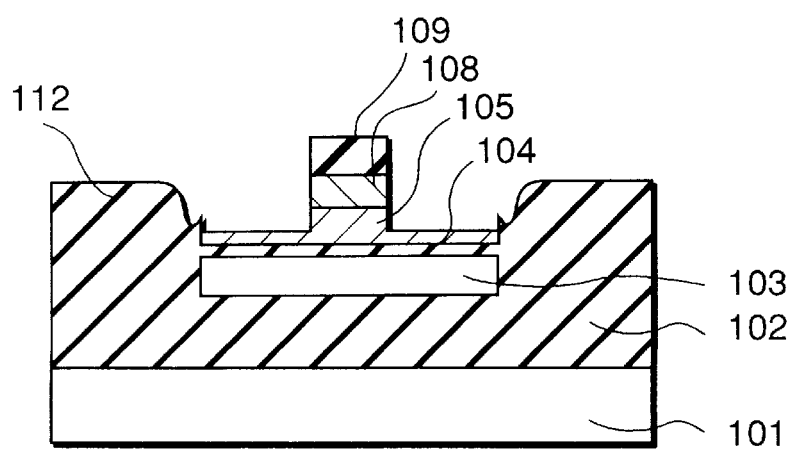

(1) Step 7-1 (FIGS. 49A to 49C)

Initially, processes in steps 2-1 to 2-11 according to the second embodiment are performed.

(2) Step 7-2 (FIGS. 49A to 49C)

Then, the tungsten silicide film 108 is anisotropically etched by using the silicon nitride film 109 as a mask. In this embodiment, a method different from that according to the second embodiment is employed such that the foregoing etching operation is performed in such a way that the period of time is adjusted so that only the tungsten silicide film 108 is etched and the n-type polysilicon film 105 on the device region is not etched.

Figure 50A:
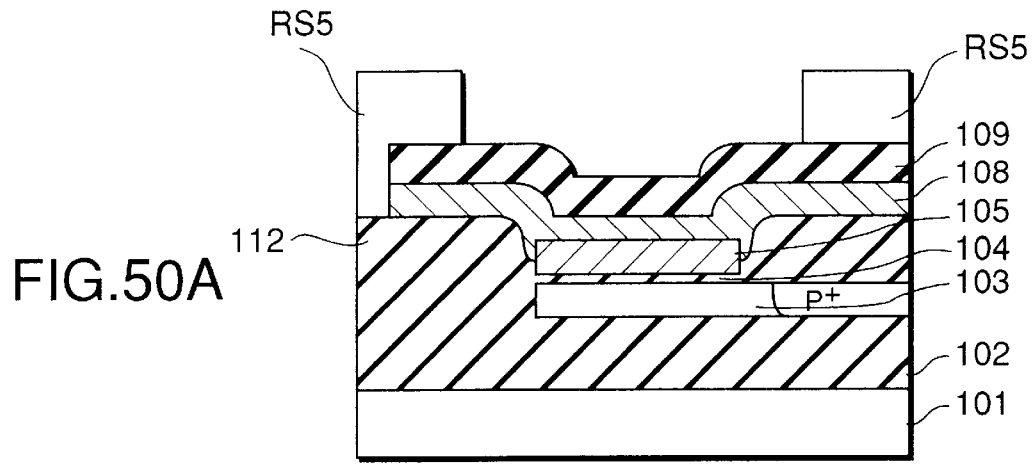
FIGS. 50A to 50C are cross sectional views showing the process of the method of manufacturing the MOS transistor having the body extended portion according to the seventh embodiment of the present invention.
Figure 50B:
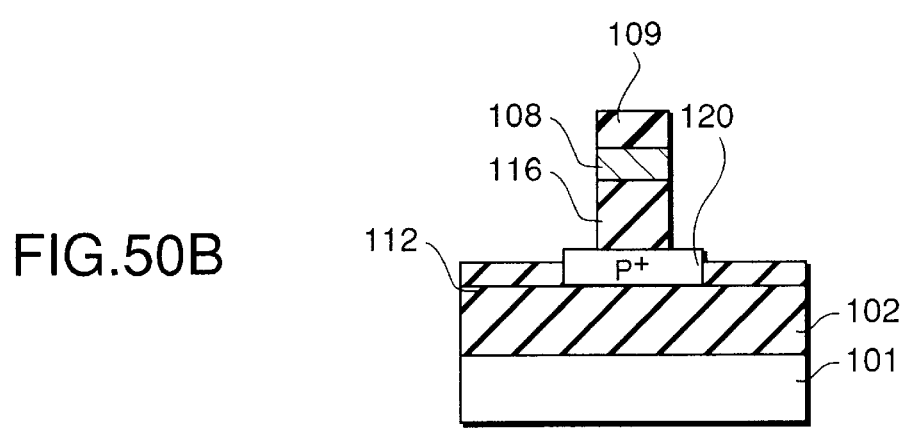
Figure 50C:
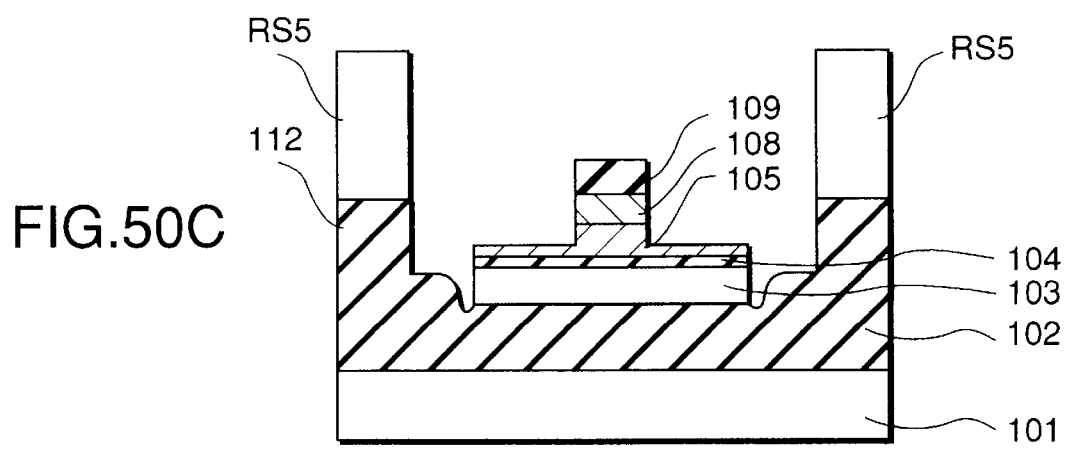

(3) Step 7-3 (FIGS. 50A to 50C)

Then, a resist pattern RS5 for defining the isolation oxide film removed region pattern shown in FIG. 48 is formed. The resist pattern RS5 is designed to cause a region somewhat larger than the device region is exposed in consideration of deviation in alignment.

Then, the isolation oxide film 112 is selectively anisotropically etched by using the resist pattern RS5 as a mask. In particular, etching of the silicon nitride film 109 must be prevented.

As a result of the foregoing etching operation, the silicon layer 120 in the isolation oxide film removed region pattern is exposed. Moreover, the silicon layer 103 in the source and the drain region is not exposed because the n-type polysilicon film 105 serves as a mask. Also in the portion in which the tungsten silicide film (the second gate electrode) 108 exists in the silicon layer 103 in the body extended portion, the silicon nitride film 109 on the tungsten silicide film 108 serves as a mask, thus causing a structure composed of the tungsten silicide film (the second gate electrode) 108, the isolation oxide film 116 and the silicon layer 120 to be formed.

Figure 51A:
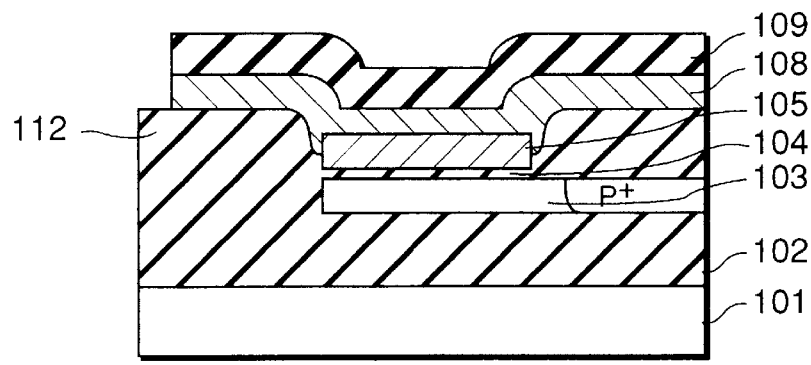
FIGS. 51A to 51C are cross sectional views showing the process of the method of manufacturing the MOS transistor having the body extended portion according to the seventh embodiment of the present invention.
Figure 51B:
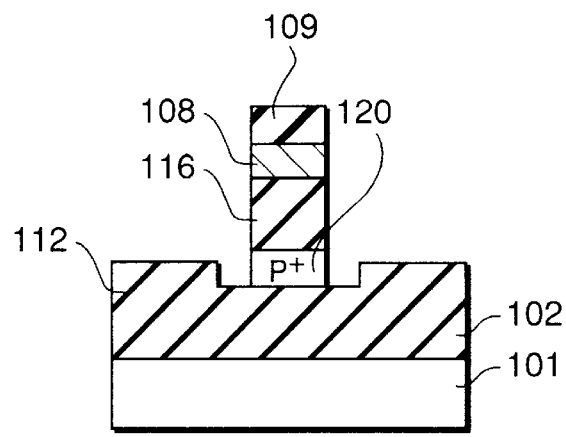
Figure 51C:
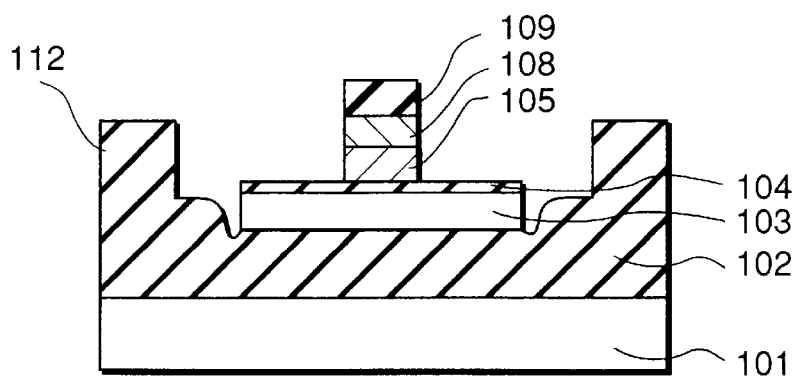

(4) Step 7-4 (FIGS. 51A to 51C)

Then, the resist pattern RS5 is separated, and then the exposed n-type polysilicon film 105 is removed by anisotropic etching. As a result of the anisotropic etching operation, the pattern of the gate electrode is transferred to the n-type polysilicon film 105 on the device region. Also the silicon layer 120 in the body extended portion is etched.

As a result of the above-mentioned process, a body extended portion (a p-type diffusion layer) in a portion coupled to the body is formed below the n-type polysilicon film 105 in a self-alignment manner to have a width which is the same as the width of the n-type polysilicon film 105, that is the channel length.

(5) Step 7-5

The following process is similar to that following step 2-13 according to the second embodiment.

When the manufacturing method according to the second embodiment is employed in which the isolation oxide film 112 is embedded and then the n-type polysilicon film 105 is patterned by the anisotropic etching, the n-type polysilicon film 105 is formed into an inversely tapered shape as shown in FIG. 21B. Thus, there arises a problem in that the first gate electrode in portion q cannot be etched because an oxide film in portion p serves as a mask. The foregoing problem also applies to a usual transistor having no body extended portion.

However, this embodiment, having the process using the resist pattern RS5 for defining the isolation oxide film removed region to remove the isolation oxide film 112 around the device region by etching, is able to overcome the foregoing problem.

Eighth Embodiment

Figure 52:
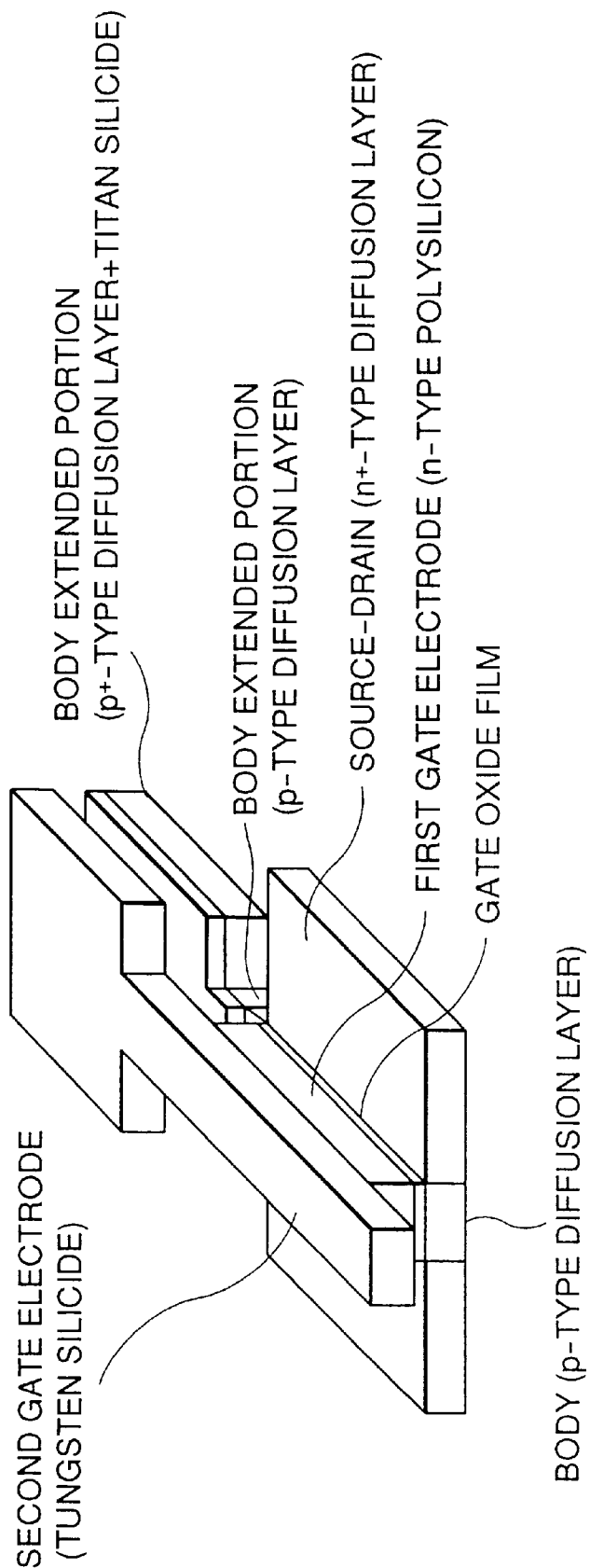
FIG. 52 is a perspective view showing a MOS transistor having a body extended portion according to an eighth embodiment of the present invention.

FIG. 52 is a perspective view showing an n-channel type MOS transistor according to an eighth embodiment of the present invention.

This embodiment is characterized in that a high concentration diffusion layer and metal are applied to the body extended portion by using a spacer formed on the side wall of the first gate electrode (formed into salicide) so as to lower the resistance. In particular, this embodiment is characterized in that the body extended portion below the gate electrode is formed into salicide, as has been impossible for the conventional technique. To realize the above-mentioned structure, a structure is required in which the first gate electrode is disposed on only the body which is the characteristic of the first embodiment.

Figure 53A:
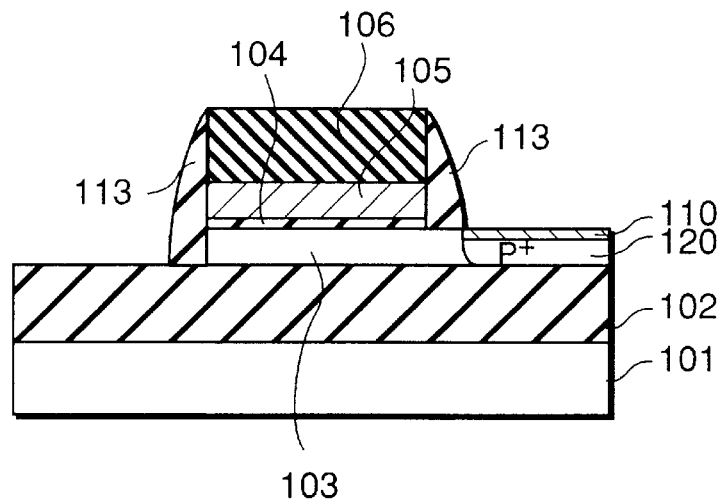
FIGS. 53A and 53B are cross sectional views showing the process of a method of manufacturing a MOS transistor having a body extended portion according to the eighth embodiment of the present invention.

Referring to FIGS. 53A to 54B, a manufacturing method according to this embodiment will now be described. Note that the various mask patterns for manufacturing the MOS transistor are the same types as those employed in the second embodiment. FIGS. 53A to 54B are arranged in such a manner that FIGS. 53A and 53B are cross sectional views taken along lines 15A—15A and 15B—15B shown in FIG. 12 which is a plan view.

Figure 53B:
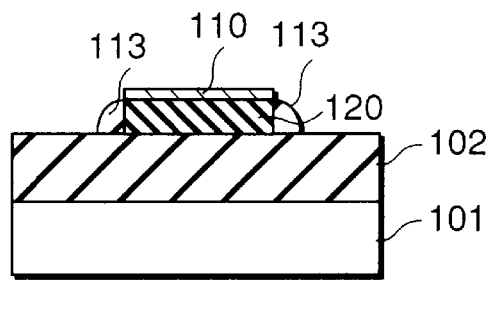

(1) Step 8-1 (FIGS. 53A and 53B)

Initially, the process in step 2-1 to 2-5 according to the second embodiment is performed.

(2) Step 8-2 (FIGS. 53A and 53B)

Then, a silicon nitride film having a thickness of about 100 nm is formed on the overall surface, and then the silicon nitride film is anisotropically etched so that a spacer 113 is formed on the side wall of the n-type polysilicon film 105. Then, p-type impurity ions are implanted by using the spacer 113 as a mask so that a body extended portion (a $p^+$-type diffusion layer) 120 is formed in a self-alignment manner.

(3) Step 8-3 (FIGS. 53A and 53B)

Then, a metal film is formed on the exposed surface of the silicon layer 103 in a self-alignment manner. For example, a titanium film is formed on the overall surface, and then the exposed silicon layer 103 and the titanium film are alloyed by annealing so that a titanium silicide film 110 is formed. Then, an SH process is performed to selectively separate the unreacted titanium film. Thus, the titanium silicide film 110 can be formed on the exposed surface of the silicon in a self-alignment manner. Note that the metal film, which is formed on the overall surface in the self-alignment manner is not limited to the titanium film. A tungsten film, a cobalt film or a nickel film may be formed if the selected film can selectively be applied.

Figure 54B:
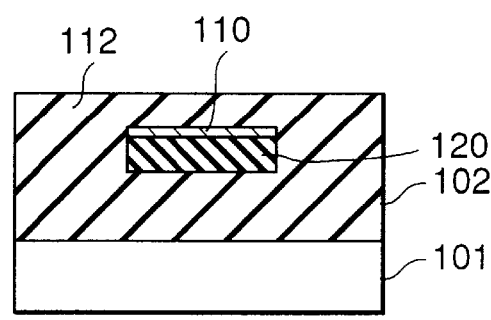
FIGS. 54A and 54B are cross sectional views showing the process of the method of manufacturing the MOS transistor having the body extended portion according to the eighth embodiment of the present invention.
Figure 54A:
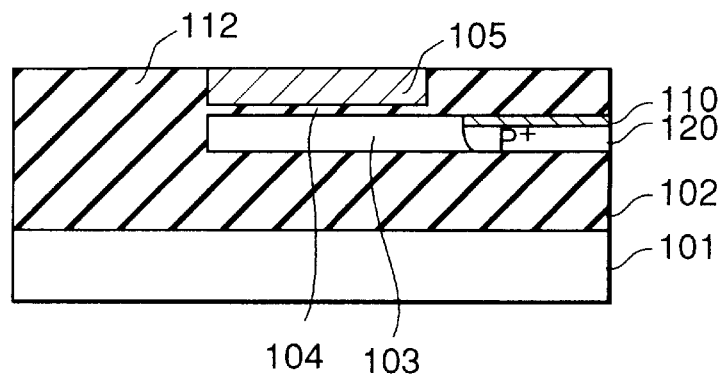

(4) Step 8-4 (FIGS. 54A and 54B)

Then, the spacer 113 and the silicon nitride film 106 are selectively separated.

(5) Step 8-5 (FIGS. 54A and 54B)

Then, the isolation oxide film 112 is formed on the overall surface, and then the isolation oxide film 112 is polished by the CMP method so that the n-type polysilicon film 105 is exposed.

(6) Step 8-6

The following process is similar to that following step 2-10 according to the second embodiment.

Since the silicide forming process is performed before the second gate electrode is patterned, forming of the parasitic transistor can be prevented even if the tungsten silicide film 108 traverses the upper layer of the patterned silicon layer 103 in the body extended portion 120. Therefore, an application may be employed in which, for example, a wiring traverses a position below the gate electrode. As a result, the degree of freedom of the layout of the devices on a plane can significantly be enlarged. Thus, the area of the chip can be reduced.

In this embodiment, the metal portion is directly applied to the body extended portion 120. In this case, if the silicon layer 103 is consumed excessively during the silicide forming process, a portion of the silicon layer 103 disappears, thus causing the area of contact between the titanium silicide film 110 and the silicon layer 103 to be reduced. As a result, there arises a problem in that the contact resistance is raised.

To prevent the above-mentioned problem, for example, a characteristic that only the body extended portion 120 is exposed is used to selectively grow the silicon layer in the body extended portion 120. As a result, the silicide film having a thickness, which can be enlarged by a degree corresponding to the selectively grown silicon layer, can be formed. Thus, the resistance can be lowered.

Ninth Embodiment

Figure 55:
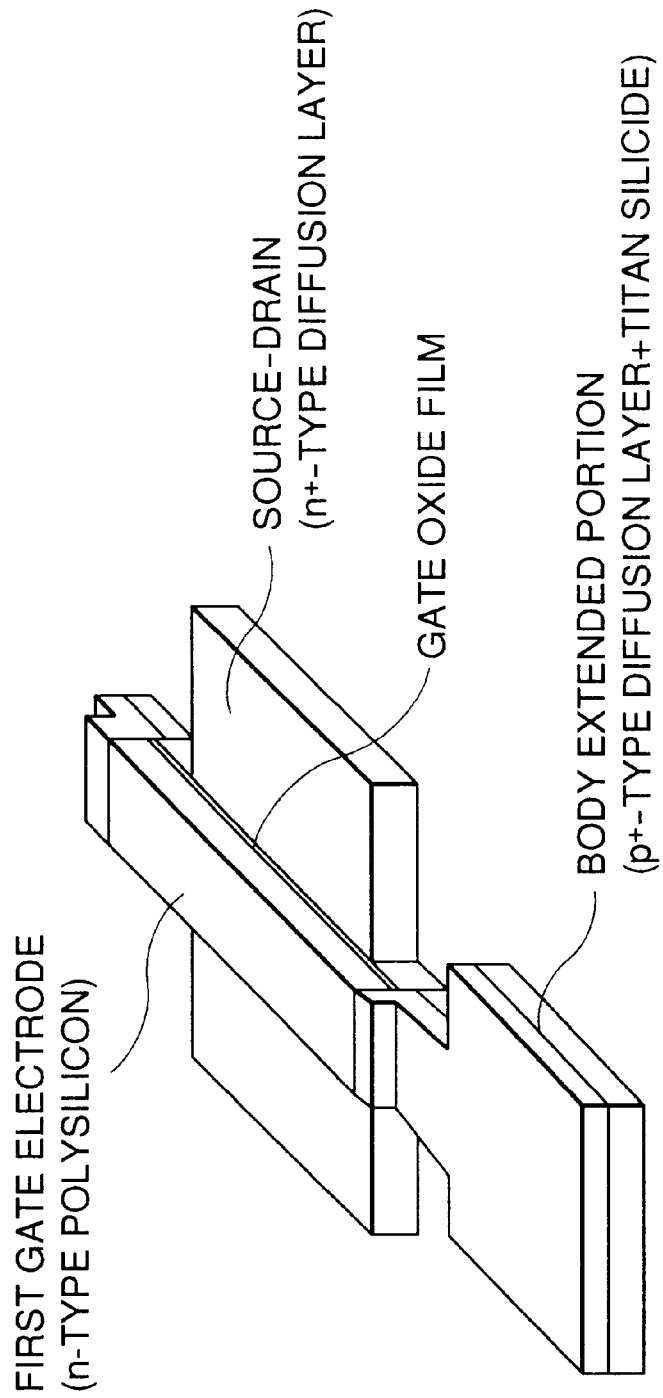
FIG. 55 is a perspective view showing a MOS transistor having a body extended portion according to a ninth embodiment of the present invention.
Figure 56:
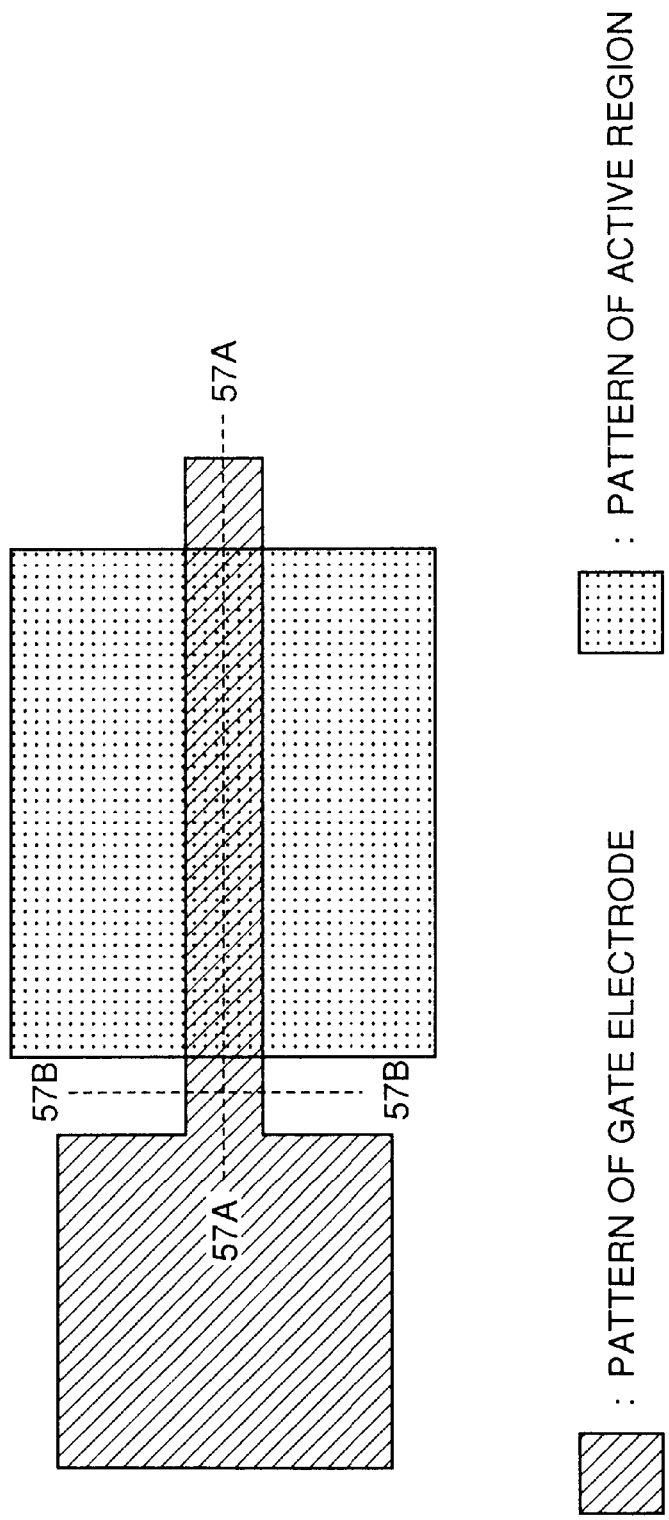
FIG. 56 is a diagram showing a variety of mask patterns for use to manufacture the MOS transistor according to the ninth embodiment.

FIG. 55 is a perspective view showing an n-channel type MOS transistor according to a ninth embodiment of the present invention. FIG. 56 shows a variety of mask patterns for use to manufacture the MOS transistor according to this embodiment.

This embodiment is characterized in that the body extended portion is formed to silicide in a self-alignment manner, and the body extended portion is, on the side wall of the first gate electrode, coupled with the salicide film. This embodiment is different from the conventional device structure such that the contact hole for establishing the connection between the gate electrode and the body is not required. Therefore, the body extended portions on the two sides and the gate electrode can be coupled to one another in such a manner that the area is the same as the conventional device. Therefore, an increasing an area, and an obstruction of a degree of a contact hole and arrangement of an aluminum wiring can be prevented. Although the conventional device structure is formed such that the source and the drain and the body extended portion form a p-n junction, this embodiment enables a high speed operation to be realized because no p-n junction is formed.

In the embodiment, a titan silicide is employed as a conductive material connecting the body extended portion and the first gate electrode, another silicide film such as a cobalt silicide, a tungsten silicide or the like can be employed, and the same advantages can be obtained by employing a single crystal silicon, a polysilicion, amorphous silicon or the like.

Figure 57A:
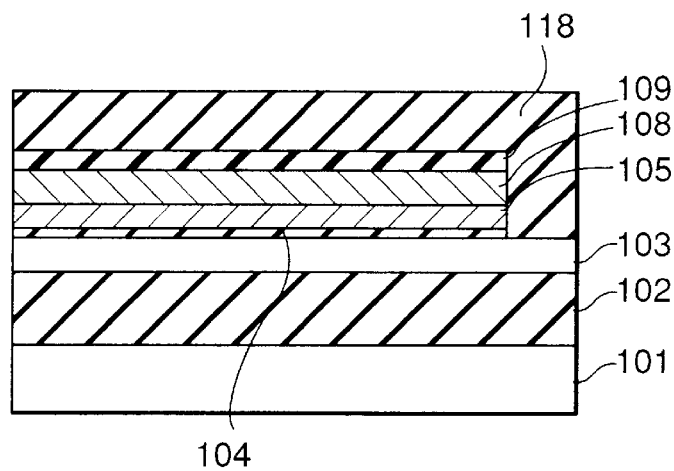
FIGS. 57A and 57B are cross sectional views showing the process of a method of manufacturing a MOS transistor having a body extended portion according to the ninth embodiment of the present invention.

Referring to FIGS. 57A to 63B, a manufacturing method according to this embodiment will now be described. FIGS. 57A to 63B are arranged such that FIGS. 57A and 57B are cross sectional views taken along lines 57A—57A and 57B—57B shown in FIG. 56 which is a plan view.

Figure 57B:
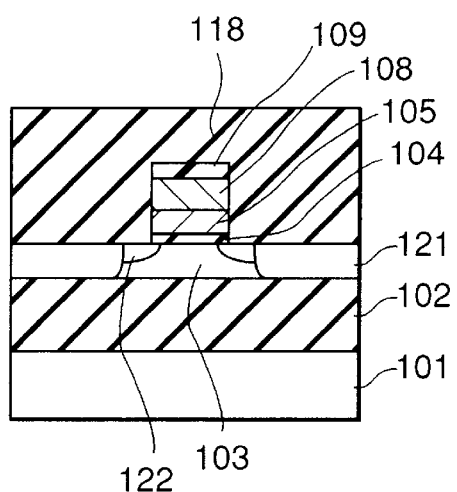

(1) Step 9-1 (FIGS. 57A and 57B)

Initially, an SOI substrate composed of a support substrate 101, a buried oxide film 102 and a silicon layer (SOI) 103 is formed. It is preferable that the thickness of the silicon layer 103 be 50 nm to 150 nm.

Then, p-type impurity ions required to adjust the threshold voltage are implanted into the silicon layer 103. Then, a gate oxide film 104 having a thickness of about 5 nm to about 10 nm is formed on the silicon layer 103. Then, an n-type polysilicon film 105, a tungsten silicide film 108 and a silicon nitride film 106 having a thickness of about 100 nm are sequentially formed on the surface of the gate oxide film 104 by a CVD method.

(2) Step 9-2 (FIGS. 57A and 57B)

Then, a resist pattern for defining the gate electrode pattern shown in FIG. 56 is formed, and then the silicon nitride film 106 is anisotropically etched by using the foregoing resist pattern as a mask. Then, the foregoing resist pattern is separated, and then the tungsten silicide film 108 and the n-type polysilicon film 105 are anisotropically etched by using the silicon nitride film 106 as a mask.

(3) Step 9-3 (FIGS. 57A and 57B)

Then, a silicon oxide film having a thickness of about 20 nm is formed on the overall surface, and then an LDD (an $n^-$-type diffusion layer) 122 is formed by implanting n-type impurity ions. Then, a polysilicon film is formed on the overall surface, and then the polysilicon film is anisotropically etched so that a spacer is formed on the side wall of the gate portion.

Then, n-type impurity ions are implanted by using the spacer as a mask so that a source and drain region (an $n^+$-type diffusion layer) 121 is formed. Then, the spacer is removed by etching by CDE or the like.

(4) Step 9-4 (FIGS. 57A and 57B)

Then, a silicon oxide film 118 is formed on the overall surface, and the silicon oxide film 118 is polished by the CMP method so that the surface of the silicon oxide film 118 is smoothed and flattened. At this time, the amount of polishing is adjusted in such a manner that the silicon nitride film 109 on the n-type polysilicon film 105 is not exposed.

Figure 58B:
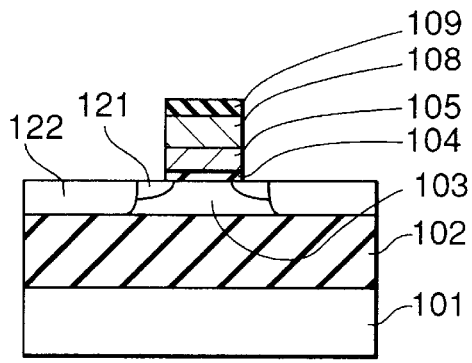
FIGS. 58A and 58B are cross sectional views showing the process of the method of manufacturing the MOS transistor having the body extended portion according to the ninth embodiment of the present invention.
Figure 58A:
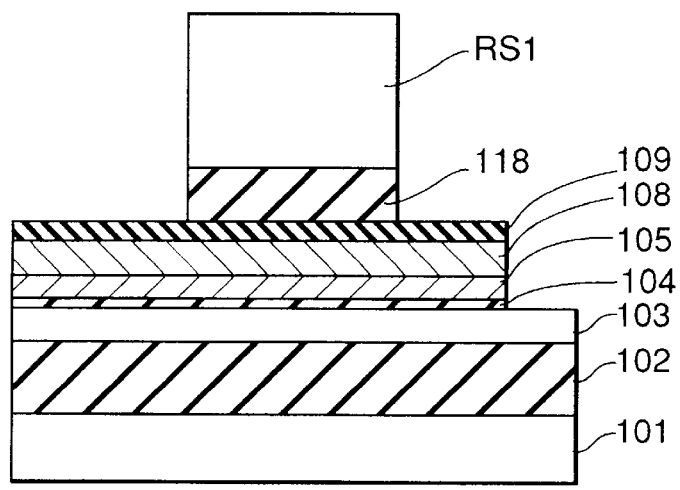

(5) Step 9-5 (FIGS. 58A and 58B)

Then, a resist pattern RS1 for defining the pattern of the device region shown in FIG. 56 is formed. Then, the silicon oxide film 118 is selectively anisotropically etched by using the resist pattern RS1 and the silicon nitride film 106 as masks.

(6) Step 9-6 (FIGS. 59A and 59B)

Then, the resist pattern RS1 is separated, and then the silicon layer 103 is anisotropically etched by using the silicon oxide film 118 and the silicon nitride film 106 as masks. Then, a silicon nitride film 109 is formed on the overall surface.

(7) Step 9-7 (FIGS. 60A and 60B)

Then, a polysilicon film is formed on the overall surface, and then the polysilicon film is anisotropically etched so that a spacer 114 is formed. Then, the silicon nitride films 106 and 109 are anisotropically etched by using the spacer 114 as a mask. As a result, the silicon nitride films 106 and 109 on the n-type polysilicon film 105 are removed so that the tungsten silicide film 108 below the silicon nitride films 106 and 109 is exposed.

Figure 61A:
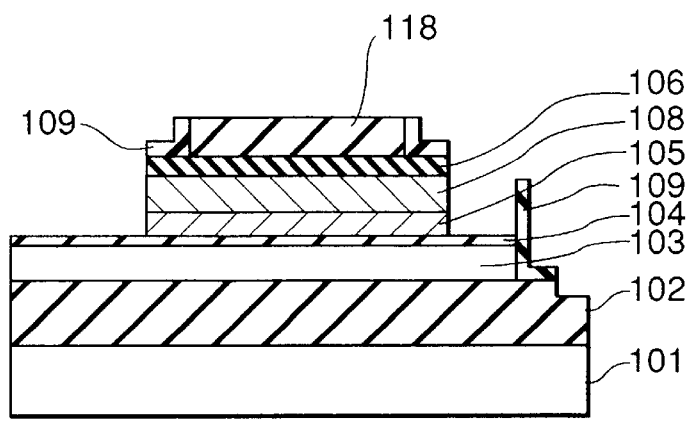
FIGS. 61A and 61B are cross sectional views showing the process of the method of manufacturing the MOS transistor having the body extended portion according to the ninth embodiment of the present invention.
Figure 61B:
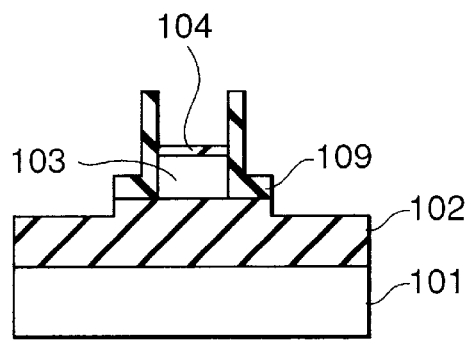

(8) Step 9-8 (FIGS. 61A and 61B)

Then, the silicon nitride film 109 and the n-type polysilicon film 105 are anisotropically etched by using the silicon nitride film 109 and the silicon oxide film 118 as masks. At this time, the spacer 114 is removed by etching.

Figure 62B:
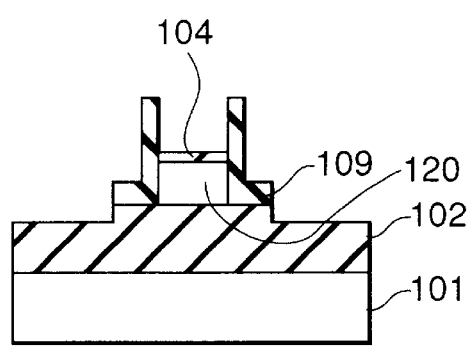
FIGS. 62A and 62B are cross sectional views showing the process of the method of manufacturing the MOS transistor having the body extended portion according to the ninth embodiment of the present invention.
Figure 62A:
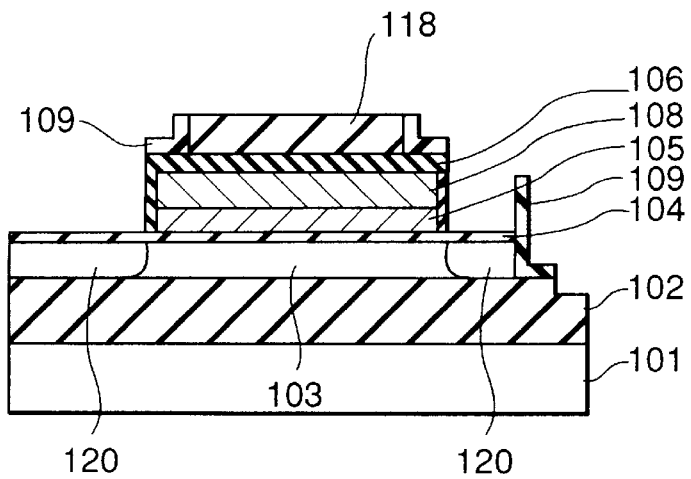

(9) Step 9-9 (FIGS. 62A and 62B)

Then, p-type impurity ions are implanted so that a body extended portion 120 is formed. If necessary, ions may be implanted after a thin silicon oxide film has been formed on the side wall of the n-type polysilicon film 105.

Figure 63A:
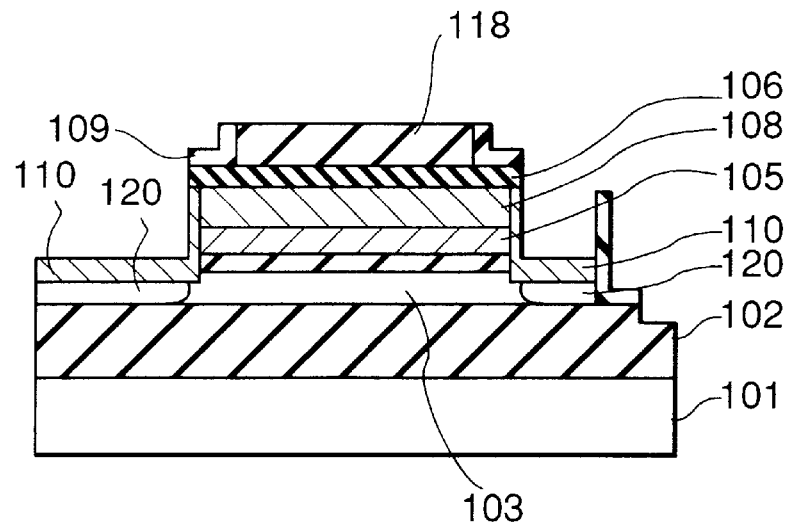
FIGS. 63A and 63B are cross sectional views showing the process of the method of manufacturing the MOS transistor having the body extended portion according to the ninth embodiment of the present invention.
Figure 63B:
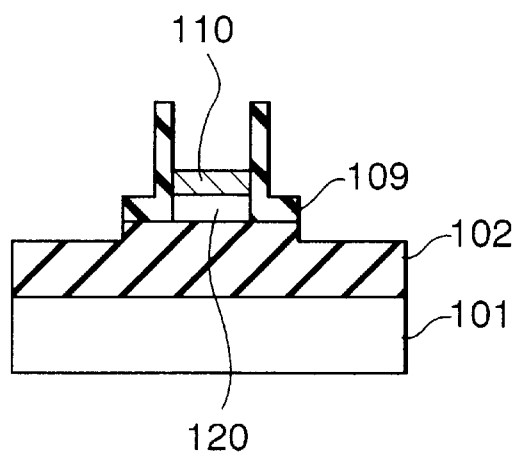

(10) Step 9-10 (FIGS. 63A and 63B)

Then, the gate oxide film 104 on the body extended portion 120 is removed by etching by using hydrofluoric acid solution or ammonium fluoride solution. If the thin silicon oxide film has been formed on the side wall of the n-type polysilicon film 105 in step 9-9, also the silicon oxide film is removed simultaneously.

Then, a titanium silicide film 110 is selectively formed on the side walls of the n-type polysilicon film (an n-type polysilicon film) 105 and the second gate electrode (the tungsten silicide film) 108 and the surface of the body extended portion 120. As a result, the body extended portion 120 and the gate electrodes 105 and 108 are coupled to one another.

(11) Step 9-11

The following process is similar to that following step 1-11 according to the first embodiment.

Tenth Embodiment

Figure 64:
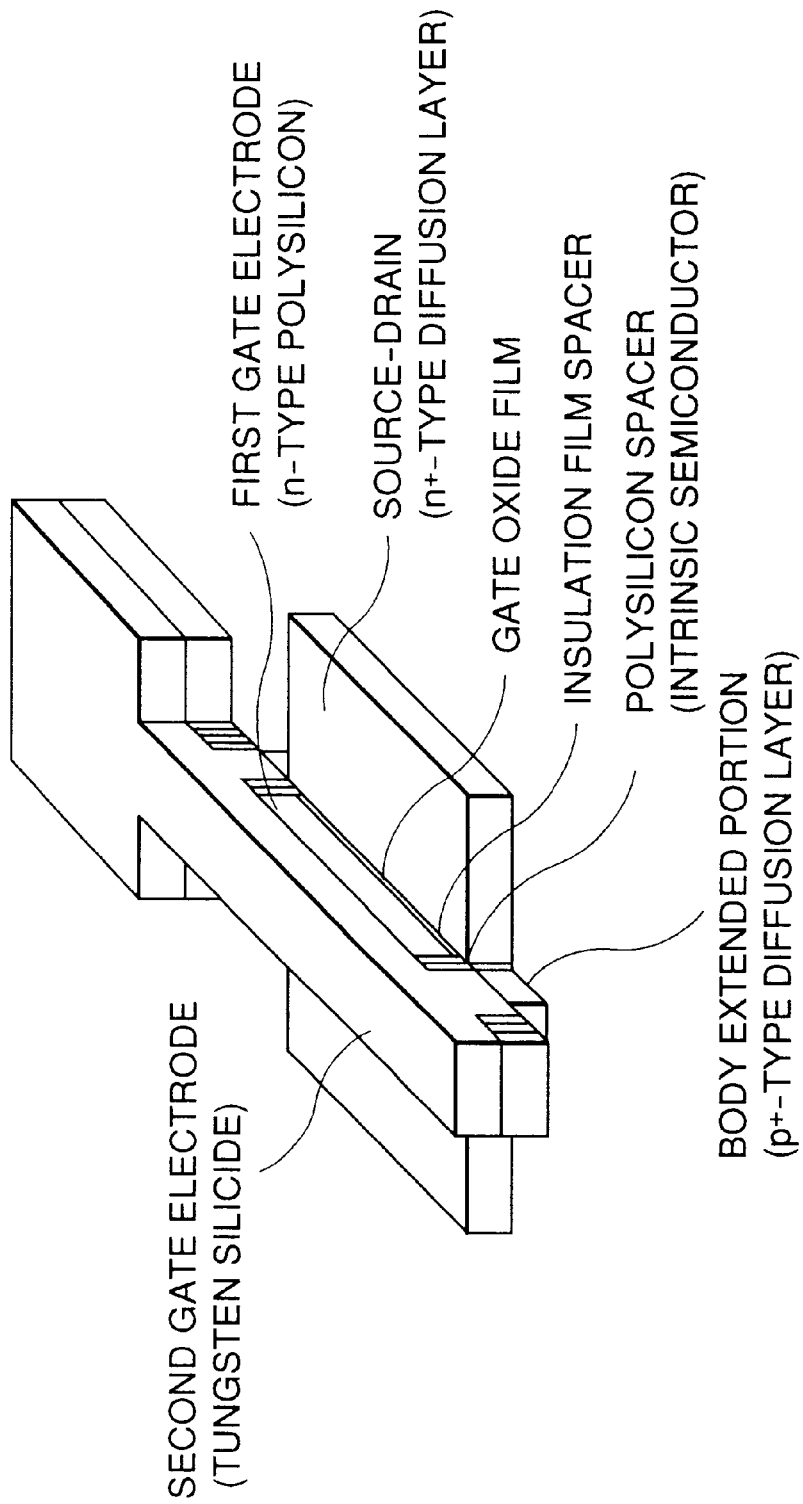
FIG. 64 is a perspective view showing a MOS transistor having a body extended portion according to a tenth embodiment of the present invention.
Figure 65:
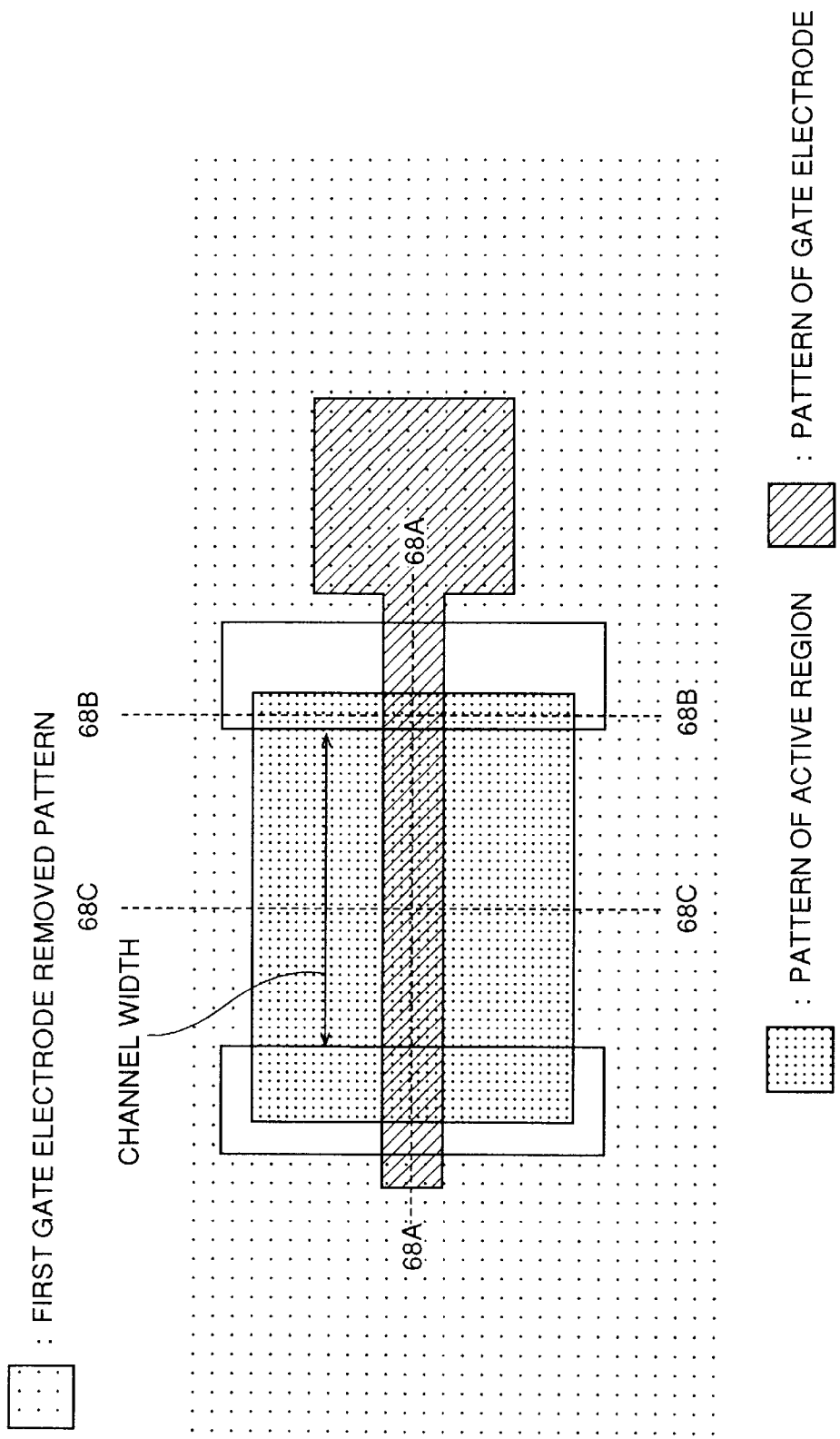
FIG. 65 is a diagram showing a variety of mask patterns for use to manufacture the MOS transistor according to the tenth embodiment.
Figure 66:
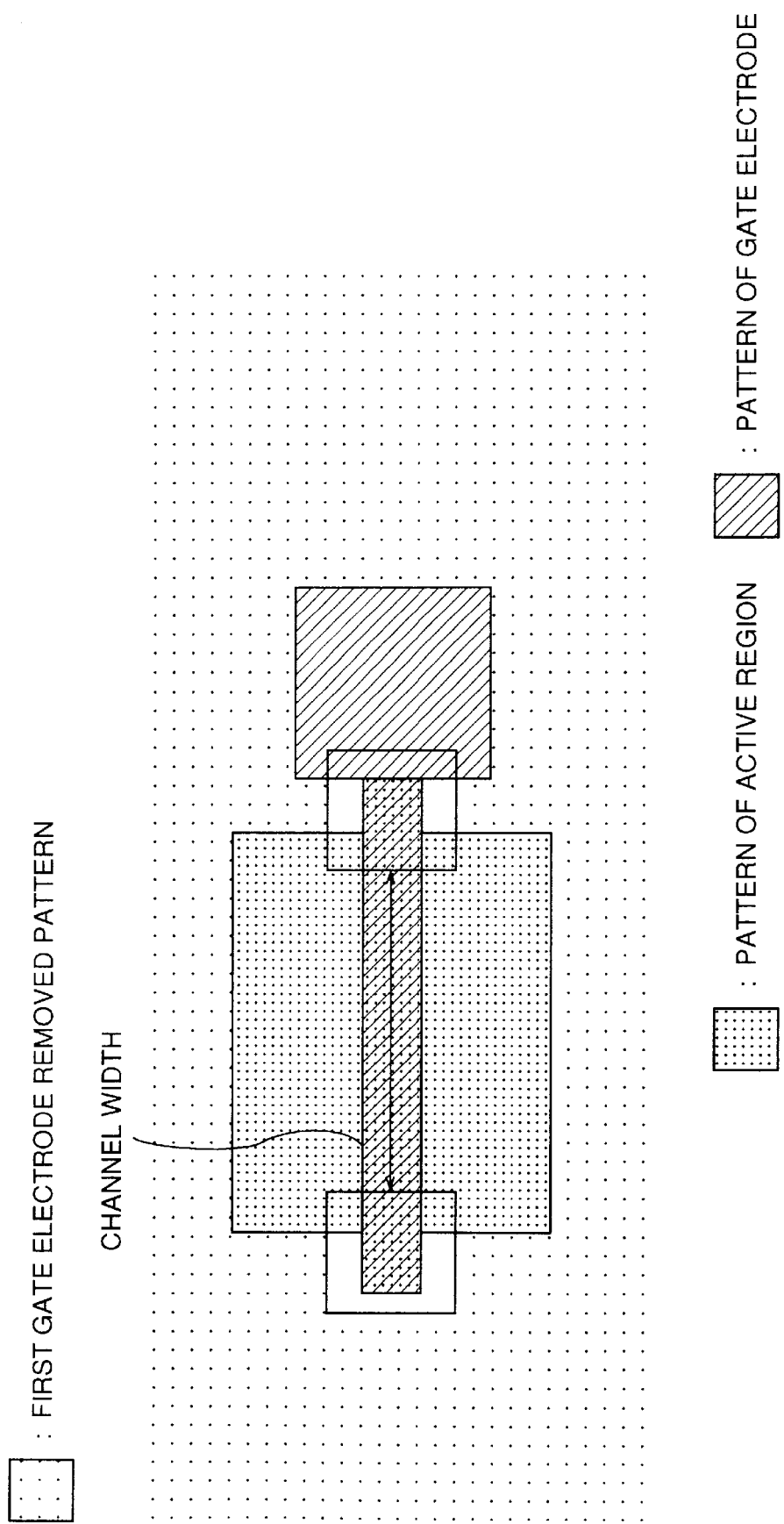
FIG. 66 is a diagram showing other mask patterns for use to manufacture the MOS transistor according to the tenth embodiment.
Figure 67:
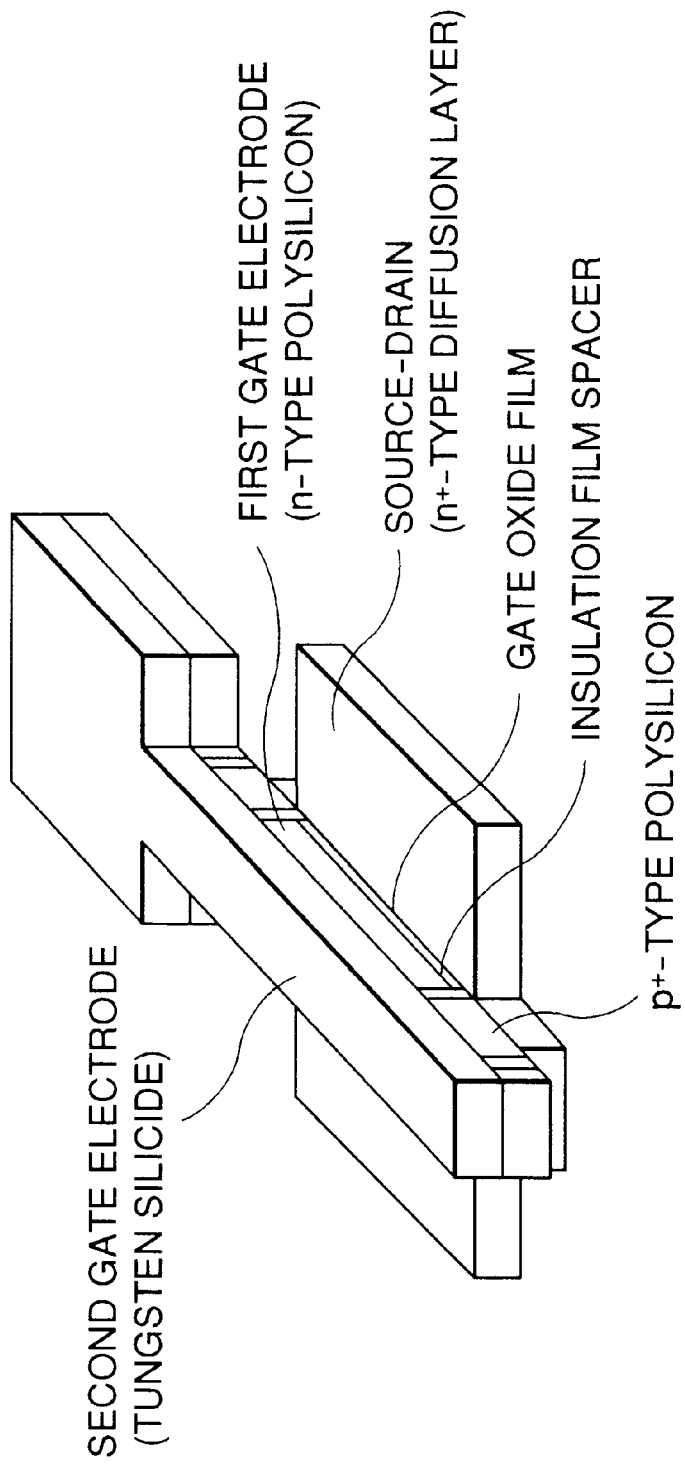
FIG. 67 is a perspective view showing a modification of the MOS transistor according to the tenth embodiment.

FIG. 64 is a perspective view showing an n-channel type MOS transistor according to a tenth embodiment of the present invention. FIG. 65 shows a variety of mask patterns for use to manufacture the MOS transistor according to this embodiment. FIG. 66 shows other mask patterns for use to manufacture the MOS transistor according to this embodiment. FIG. 67 is a perspective view showing a modification of the MOS transistor according to this embodiment.

The MOS transistors according to this embodiment and modification are commonly different from the MOS transistors according to the first to tenth embodiments in that the second gate electrode is made of metal or silicide and the second gate electrode is directly or through a $p^+$-type polysilicon plug, coupled to the body extended portion. In the first to tenth embodiment, the second electrode is insulated from the body extended portion through the gate oxide film.

The device shown in FIG. 64 has a structure in which the second gate electrode is directly coupled to the body extended portion (the $p^+$-type diffusion layer). The device shown in FIG. 67 has a structure in which the second gate electrode is coupled to the body extended portion (the $p^+$-type diffusion layer) through a $p^+$-type polysilicon film plug.

Figure 123:
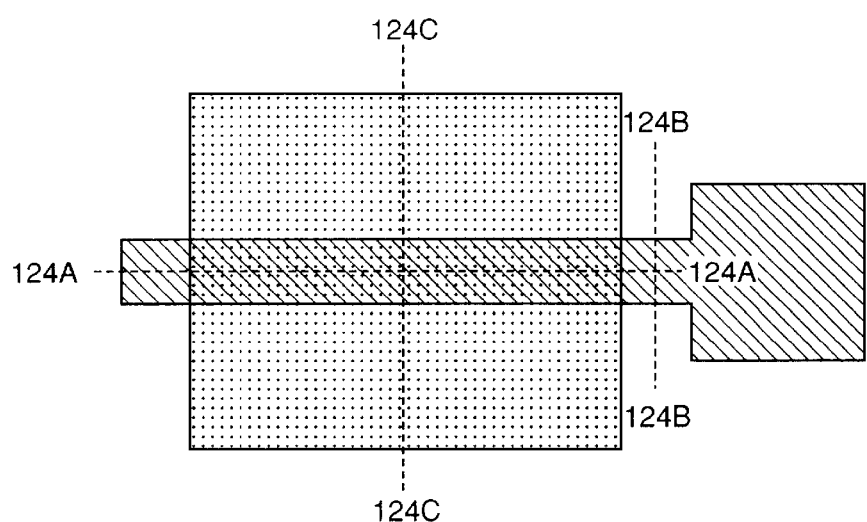

A device shown in FIG. 123 has a structure in which the gate electrode on the body is coupled to the body extended portion through an aluminum wiring which is embedded in the contact hole. However, this embodiment has a structure in which a first gate electrode on the body is coupled to the body extended portion through a second gate electrode.

That is, this embodiment is able to eliminate the necessity of forming a contact hole in the interlayer insulation film for the purpose of coupling the gate electrode and the body extended portion to each other. Therefore, the body extended portions on the two sides and the gate electrode can be coupled to one another without a necessity of enlarging the area.

The region, in which the second gate electrode is coupled to the body extended portion, is a common portion for a groove of the pattern of the first gate electrode removed region, the pattern of the device region and the pattern of the gate electrode. In consideration of deviation in alignment, the size of the pattern must be considered to enable the common portion to be formed. A pattern layout as shown in FIG. 66 is able to minimize the needless area.

An advantage of the embodiment, in which it is unnecessary to form a contact hole, is the same as the ninth embodiment thereof. This embodiment employs a simpler manufacturing process than the ninth embodiment, and no first gate electrode is formed above the body extended portion.

Figure 68A:
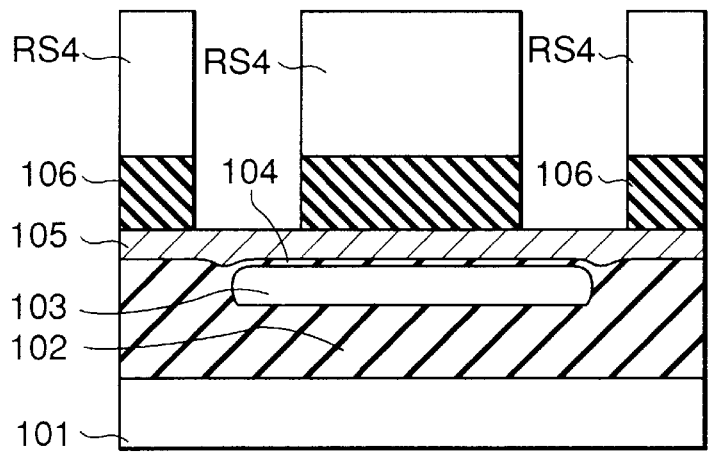
FIGS. 68A to 68C are cross sectional views showing the process of a method of manufacturing a MOS transistor having a body extended portion according to the tenth embodiment of the present invention.

Referring to FIGS. 68A to 73C, a manufacturing method according to this embodiment will now be described. FIGS. 68A to 73C are arranged such that FIGS. 68A to 68C are cross sectional views taken along lines 68A—68A, 68B—68B and 68C—68C shown in FIG. 65 which is a plan view.

Figure 68B:
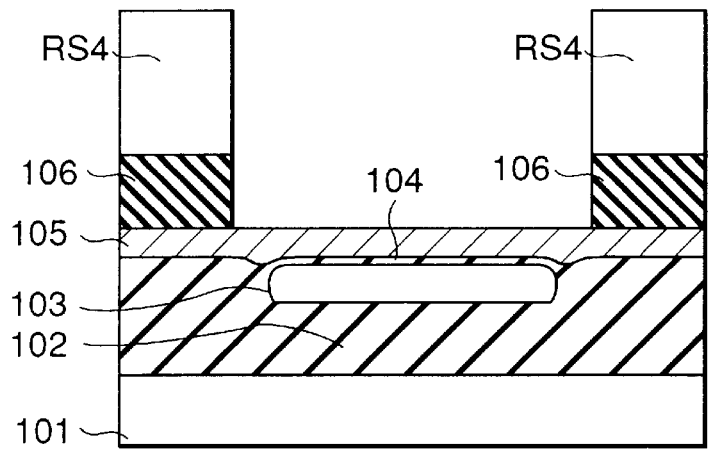
Figure 68C:
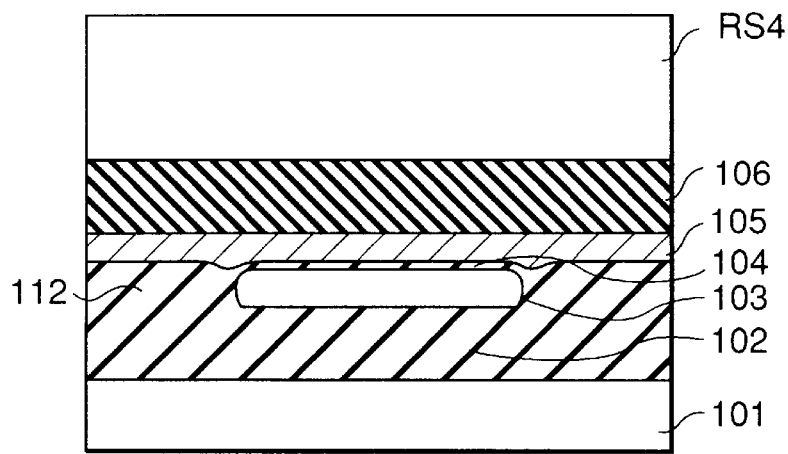

(1) Step 10-1 (FIGS. 68A to 68C)

Initially, an SOI substrate composed of a support substrate 101, a buried oxide film 102 and a silicon layer (SOI) 103 is formed. It is preferable that the thickness of the silicon layer 103 be 50 nm to 150 nm.

Then, a resist pattern for defining the device region pattern shown in FIG. 65 is used to form an isolation oxide film 112. The isolation oxide film 112 may be formed by the conventional selection oxidation method for forming the thermal oxide film (the isolation oxide film 112) or a method having the steps of removing the buried oxide film 102 in the device isolation region 103 by anisotropic etching and embedding an oxide film (the isolation oxide film 112).

(2) Step 10-2 (FIGS. 68A to 68C)

Then, p-type impurity ions required to adjust the threshold voltage are implanted into the silicon layer 103. Then, a gate oxide film 104 having a thickness of about 5 nm to about 10 nm is formed on the silicon layer 103. Then, an n-type polysilicon film 105 and a silicon nitride film 106 having a thickness of about 100 nm are sequentially formed by the CVD method.

(3) Step 10-3 (FIGS. 68A to 68C)

A resist pattern RS4 for defining the first gate removed region shown in FIG. 65 is formed, and then the silicon nitride film 106 is anisotropically etched by using the resist pattern RS4 as a mask.

Figure 69A:
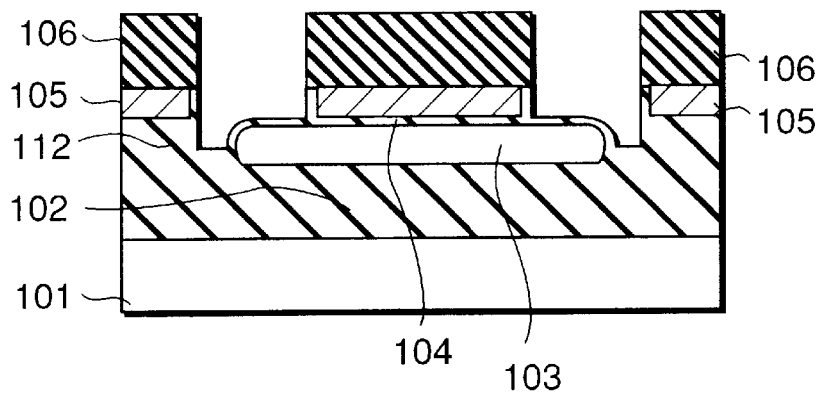
FIGS. 69A to 69C are cross sectional views showing the process of the method of manufacturing the MOS transistor having the body extended portion according to the tenth embodiment of the present invention.
Figure 69B:
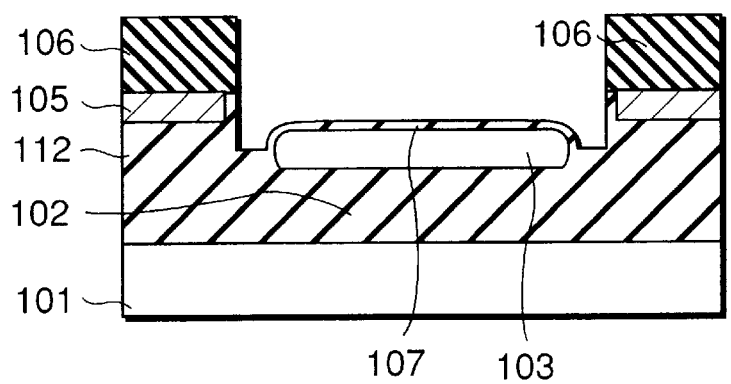
Figure 69C:
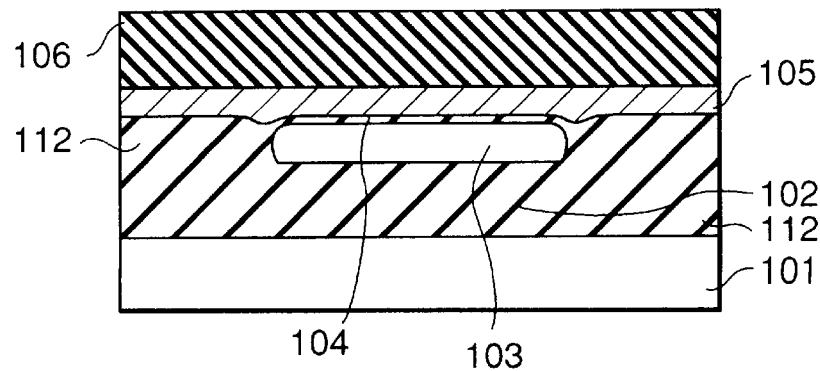

(4) Step 10-4 (FIGS. 69A to 69C)

Then, the resist pattern RS4 is separated, and then the n-type polysilicon film 105 is anisotropically etched by using the silicon nitride film 106 as a mask. Then, the exposed gate oxide film 104 and isolation oxide film 112 are removed by etching so that a silicon layer 103 in a portion of the groove formed by an etching operation using the resist pattern RS4 shown in FIG. 65 is exposed.

(5) Step 10-5 (FIGS. 69A to 69C)

Then, an oxide film 107 is formed on the side wall of the side wall of the n-type polysilicon film and the side and top surfaces of the silicon layer 103 exposed due to the heat oxidation.

Figure 70A:
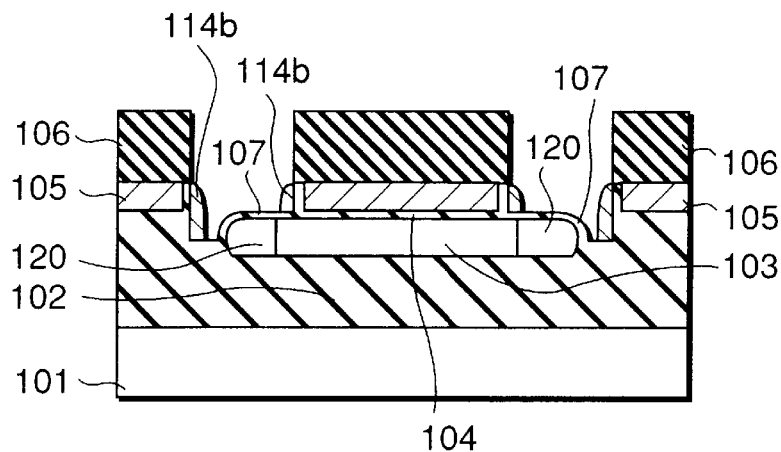
FIGS. 70A to 70C are cross sectional views showing the process of the method of manufacturing the MOS transistor having the body extended portion according to the tenth embodiment of the present invention.
Figure 70B:
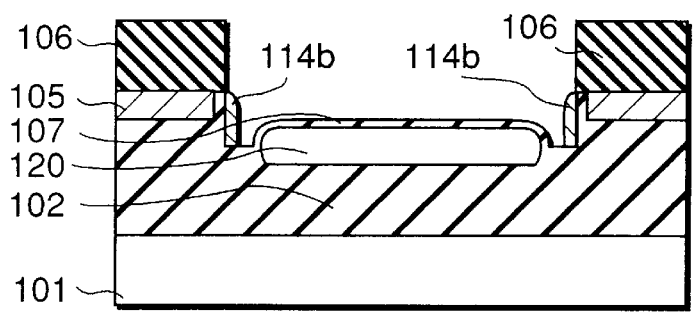
Figure 70C:
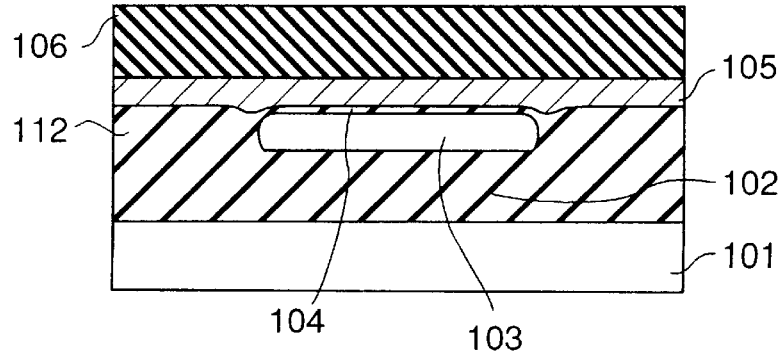

(6) Step 10-6 (FIGS. 70A to 70C)

Then, a polysilicon film having a thickness of about 50 nm is formed, and then the polysilicon film is anisotropically etched so that a spacer 114b is formed.

(7) Step 10-7 (FIGS. 70A to 70C)

Then, p-type impurity ions are implanted into the silicon layer 103 in the groove portion formed by the etching operation using the resist pattern RS4 as a mask so that a body extended portion (a $p^+$-type diffusion layer) 120 is formed. Then, the spacer 114b is etched back by anisotropic etching so that the heights of the 114b and the n-type polysilicon film are made to be the same.

Figure 71A:
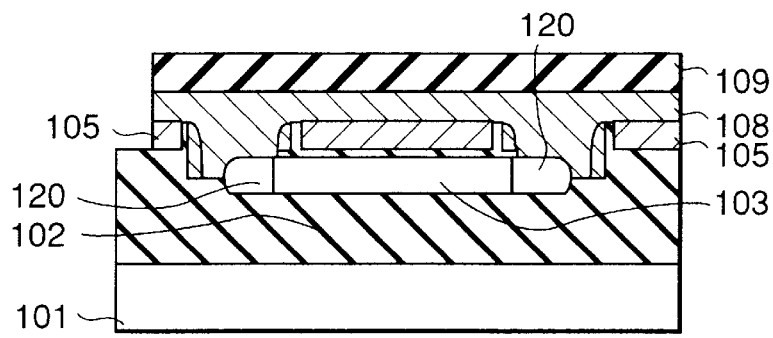
FIGS. 71A to 71C are cross sectional views showing the process of the method of manufacturing the MOS transistor having the body extended portion according to the tenth embodiment of the present invention.
Figure 71B:
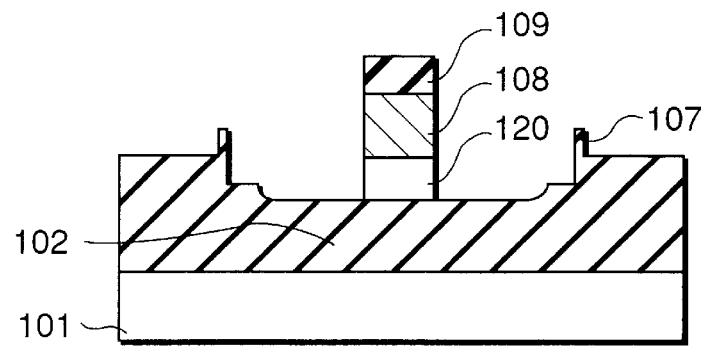
Figure 71C:
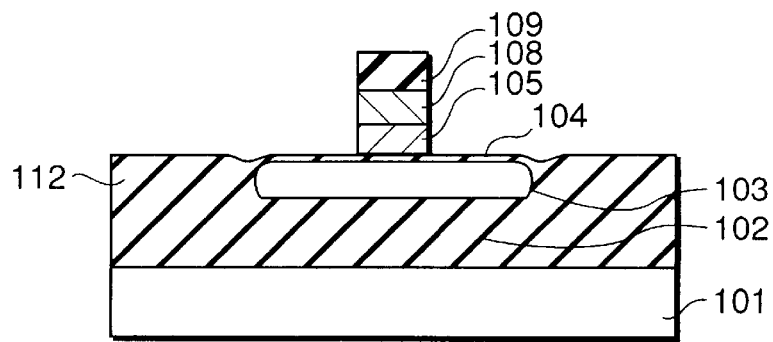

(8) Step 10-8 (FIGS. 71A to 71C)

Then, anisotropic etching or wet etching using hydrofluoric acid or ammonium fluoride is performed to remove the exposed silicon oxide film 107.

(9) Step 10-9

The following process is similar to that following step 1-7 according to the first embodiment. In step 1-8, a tungsten silicide film 108 which will be formed into a second gate electrode which is directly corresponding to the body extended portion (a $p^+$-type diffusion layer) is formed. FIGS. 71A to 71C are cross sectional views showing stages of patterning the p-type polysilicon film 105 and the tungsten silicide film 108 into the gate electrode form.

A modification of the MOS transistor shown in FIG. 67 is manufactured as follows.

Figure 72A:
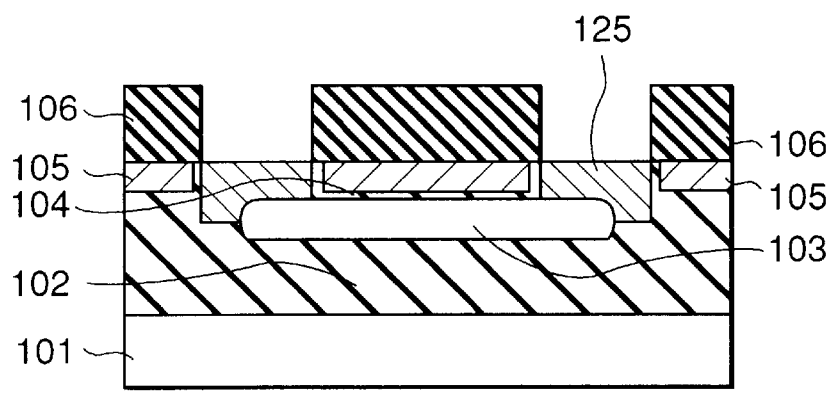
FIGS. 72A to 72C are cross sectional views showing the process of the method of manufacturing the MOS transistor having the body extended portion according to the tenth embodiment of the present invention.
Figure 72B:
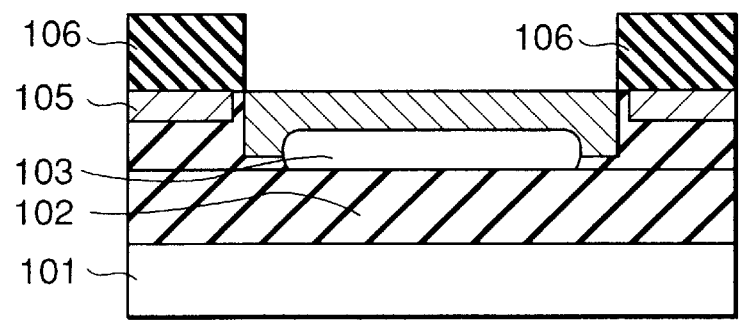
Figure 72C:
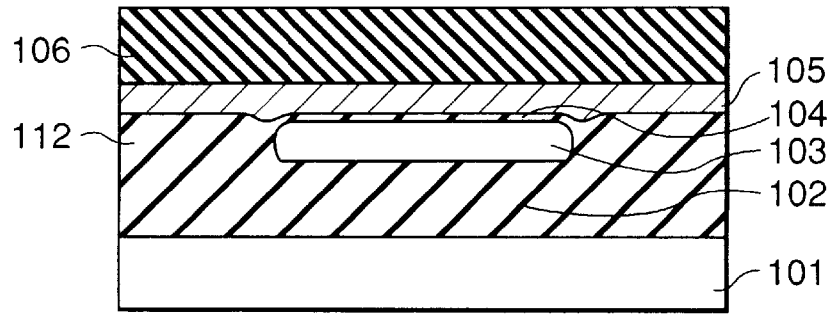

Initially, processes in steps 10-1 to 10-6 are performed. Then, step 10-7 is omitted, and then step 10-8 is performed. Then, an undoped thick polysilicon film formed by an etching operation using a resist pattern in the first gate electrode removed region as a mask and arranged to simply embed the groove is formed, and then the polysilicon film is etched back to the height of the n-type polysilicon film 105. Cross sectional views to the above-mentioned stage is shown in FIGS. 72A to 72C.

Figure 73A:
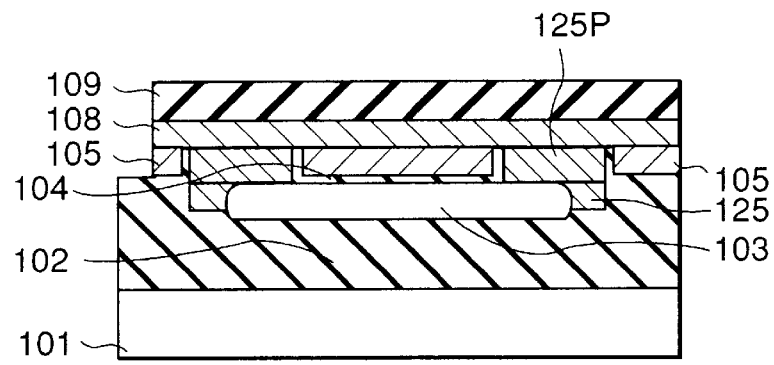
FIGS. 73A to 73C are cross sectional views showing the process of the method of manufacturing the MOS transistor having the body extended portion according to the tenth embodiment of the present invention.
Figure 73B:
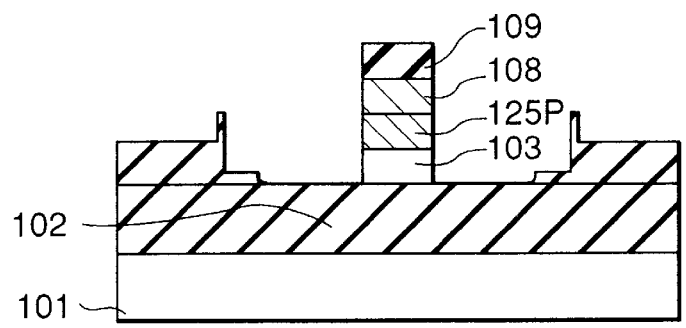
Figure 73C:
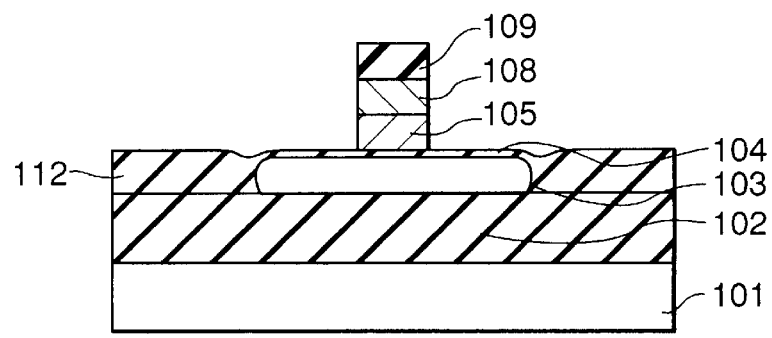

Then, p-type impurity ions are implanted into the undoped polysilicon film. The following processes are similar to those following step 1-7 according to the first embodiment. FIGS. 73A to 73C are cross sectional views showing the stages in which the n-type polysilicon film 105 and the tungsten silicide film 108 have been patterned into the gate shape.

Eleventh Embodiment

Figure 74:
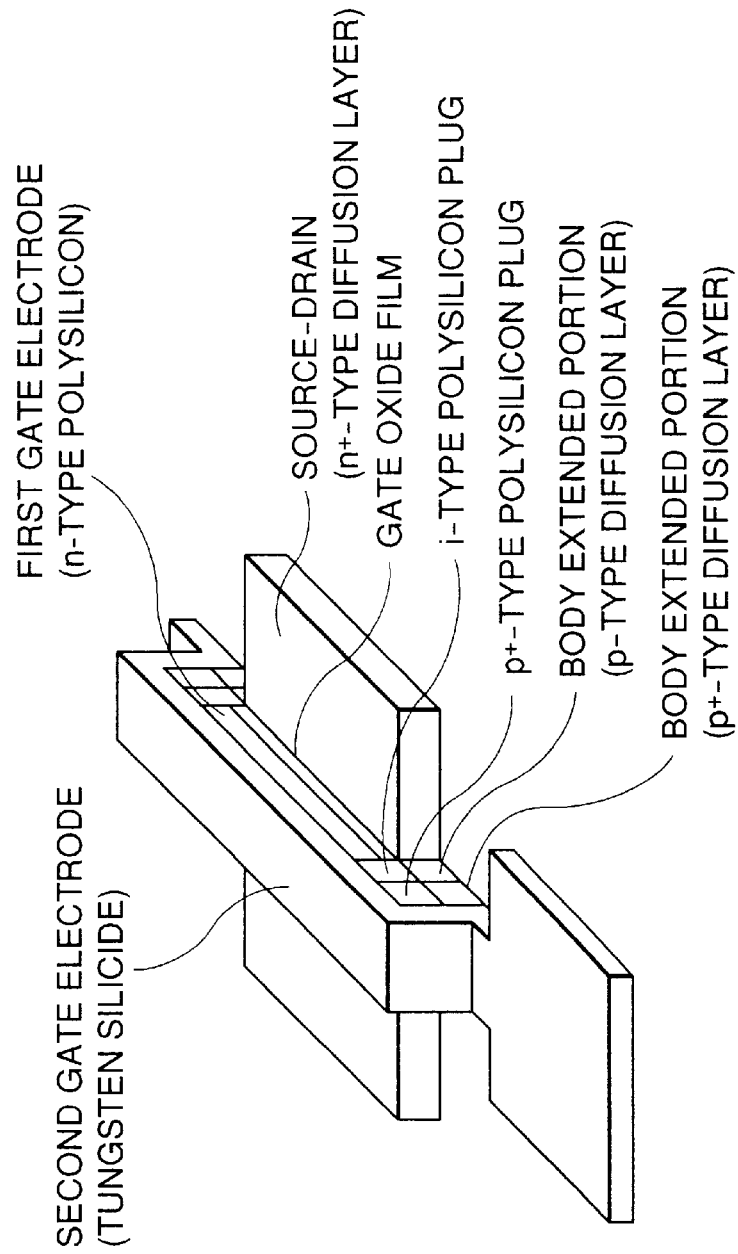
FIG. 74 is a perspective view showing a MOS transistor having a body extended portion according to an eleventh embodiment of the present invention.
Figure 75:
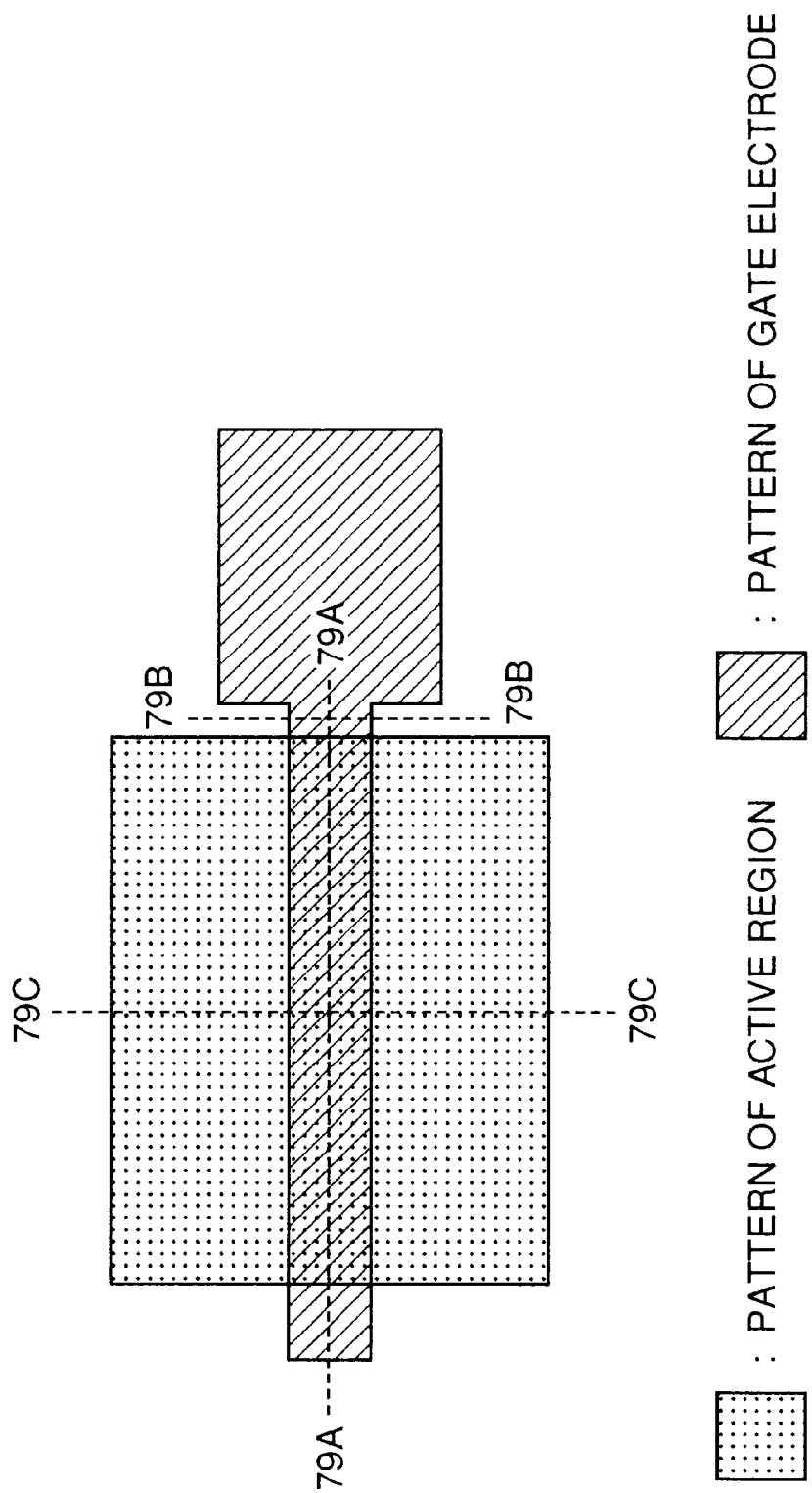
FIG. 75 is a diagram showing a variety of mask patterns for use to manufacture the MOS transistor according to the eleventh embodiment.
Figure 76:
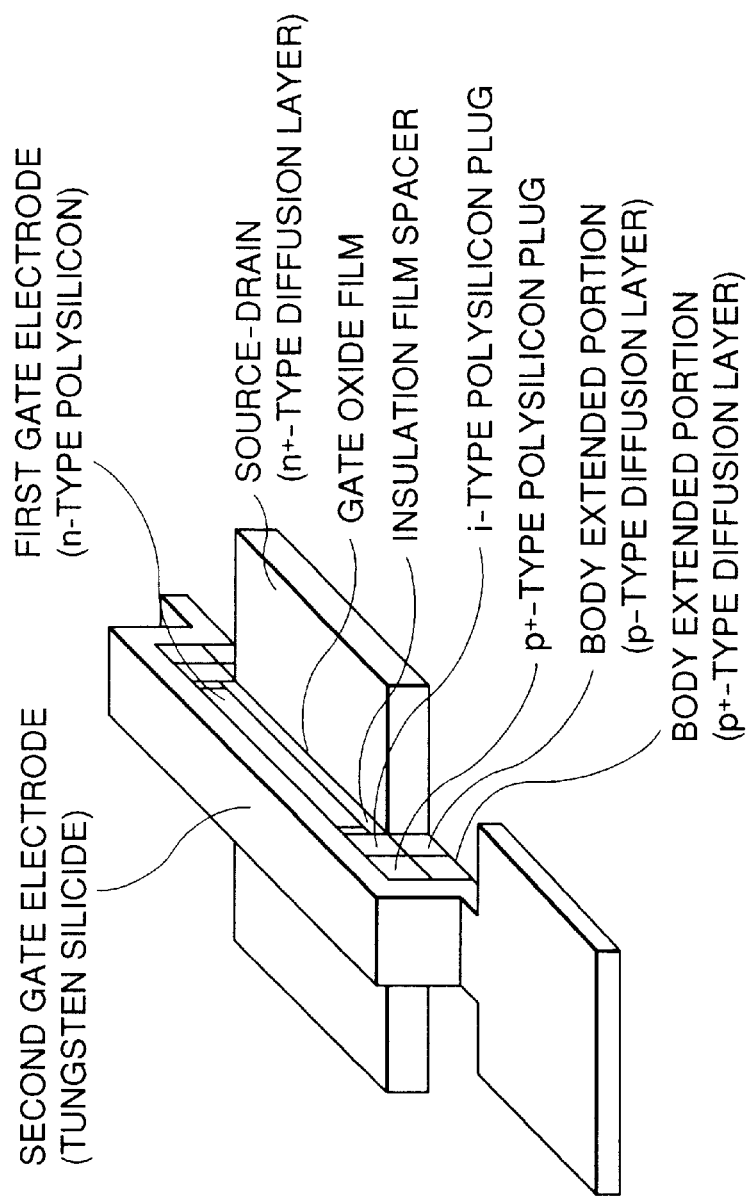
FIG. 76 is a perspective view showing a modification of the MOS transistor according to the eleventh embodiment.
Figure 77:
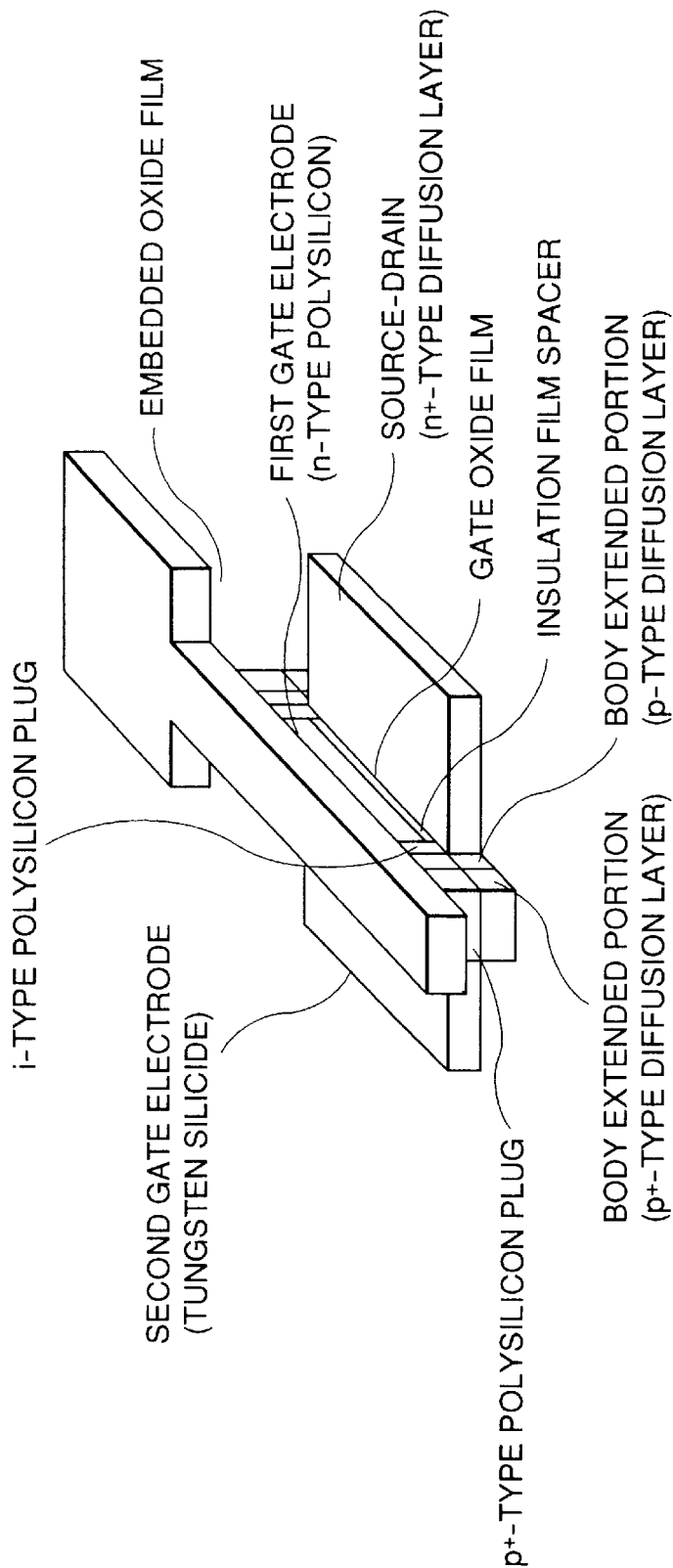
FIG. 77 is a perspective view showing a modification of the MOS transistor according to the eleventh embodiment.
Figure 78:
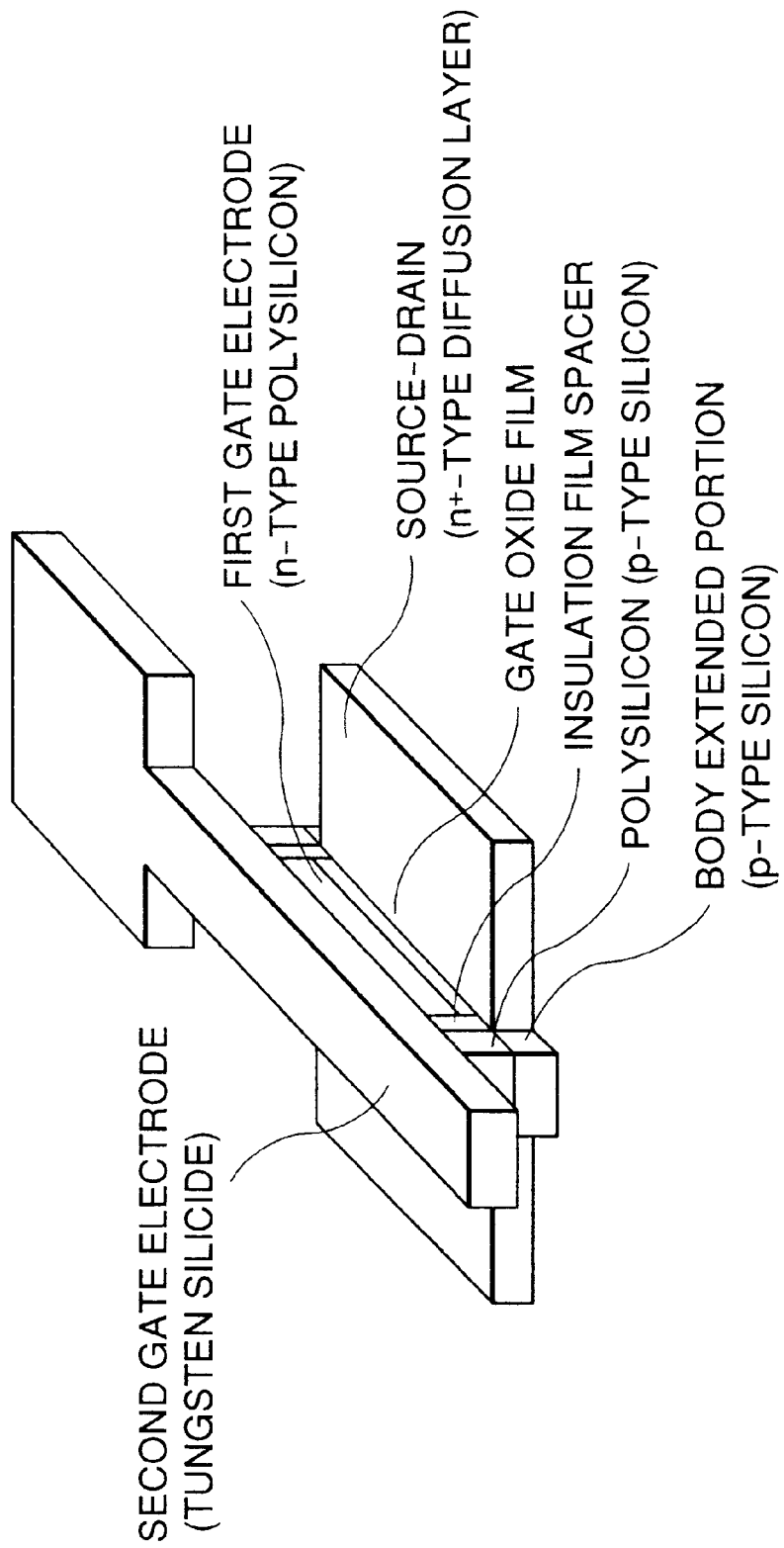
FIG. 78 is a perspective view showing a modification of the MOS transistor according to the eleventh embodiment.

FIG. 74 is a perspective view showing an n-channel type MOS transistor according to an eleventh embodiment of the present invention. FIG. 75 shows a variety of mask patterns for use to manufacture the MOS transistor according to this embodiment. FIGS. 76 to 78 are perspective views respectively showing first to third modifications of the MOS transistor according to this embodiment.

The MOS transistors are different from the MOS transistors according to the first to tenth embodiments such that the second gate electrode is made of metal or silicide and that the second gate electrode is directly or through a plug coupled to the body extended portion.

The manufacturing method according to the tenth embodiment has the structure such that the second gate electrode is coupled to the body extended portion in the common portion of the three patterns, that is, the groove formed by the resist pattern for defining the pattern of the first gate removed region, the pattern of the device region and the pattern of the gate electrode.

Therefore, there arises a problem in that deviation of the three patterns causes the area of contact to undesirably disperse. If the size of the pattern is determined in consideration of deviation in alignment in order to overcome the foregoing problem, the needless area is enlarged.

In this embodiment, the area of contact between the second gate electrode and the body extended portion is determined in accordance with the thickness of the polysilicon film and the insulation film spacer which are formed during the process. Thus, the area of contact does not depend upon the deviation in the alignment. Therefore, this embodiment is able to reduce the needless area as compared with the tenth embodiment.

The structure of the device shown in FIG. 74 has the body extended portion having the width arranged such that the width of the first gate electrode and that of the second gate electrode, similarly to the third embodiment. The length of the body extended portion from the channel edge is determined in accordance with the thicknesses of the polysilicon film spacer and the insulation film spacer which are formed during the process.

The polysilicon plug is formed by a $p^+$-type polysilicon plug and an i-type polysilicon plug. The i-type polysilicon plug is a buffer portion for preventing a fact that the body extended portion below the i-type polysilicon plug and the source and the drain do not form a high concentration p-n junction. On the other hand, the $p^+$-type polysilicon plug is a contact portion for establishing an ohmic contact between the $p^+$-type polysilicon plug and the second gate electrode.

Since the structure of the device shown in FIG. 76 is formed such that an insulation film spacer is formed between the first gate electrode and the i-type polysilicon plug in the body extended portion, diffusion of the n-type impurity in the first gate electrode into the i-type polysilicon plug can be prevented. Therefore, change in the threshold voltage caused from diffusion of the n-type impurity in the first gate electrode can be prevented. The insulation film spacer may be made of a nitride or an oxide.

FIG. 77 shows a structure of the device in which a buried oxide film is formed to reduce stepped portions when the pattern of the second gate electrode is formed.

FIG. 78 shows a structure of the device in which the i-type polysilicon plug employed in the structure shown in FIG. 77 is not employed and the area of the body extended portion is minimized.

The $p^+$-type polysilicon plug is formed by doping a high concentration p-type impurity into the polysilicon film in order to raise the concentration of a portion which is in contact with the second gate electrode. In this case, the thermal process must be optimized in order to prevent excessive diffusion of the p-type impurity causing the junction leak between the body extended portion and the source and the drain to be increased.

Figure 79A:
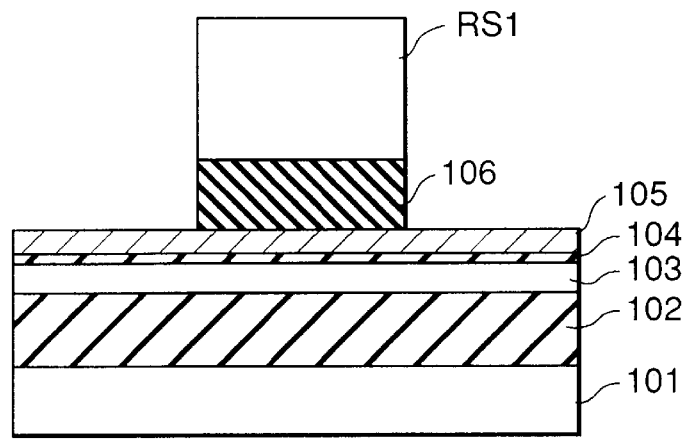
FIGS. 79A to 79C are cross sectional views showing the process of a method of manufacturing a MOS transistor having a body extended portion according to the eleventh embodiment of the present invention.

Referring to FIGS. 79A to 84C, a manufacturing method according to this embodiment will now be described. FIGS. 79A to 84C are arranged such that FIGS. 79A, 79B and 79C are cross sectional views respectively taken along lines 79A—79A, 79B—79B and 79C—79C shown in FIG. 75 which is a plan view.

Figure 79B:
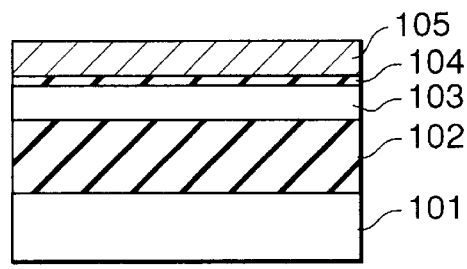
Figure 79C:
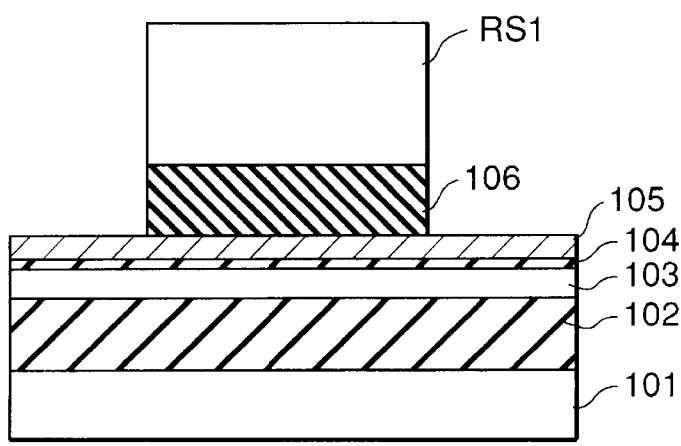

(1) Step 11-1 (FIGS. 79A to 79C)

Initially, an SOI substrate composed of a support substrate 101, a buried oxide film 102 and a silicon layer (SOI) 103 is formed. It is preferable that the thickness of the silicon layer 103 be 50 nm to 150 nm.

Then, p-type impurity ions required to adjust the threshold voltage are implanted into the silicon layer 103. Then, a gate oxide film 104 having a thickness of about 5 nm to 10 nm is formed on the silicon layer 103. Then, an n-type polysilicon film 105 and a silicon nitride film 106 having a thickness of about 100 nm are sequentially formed by the CVD method.

(2) Step 11-2 (FIGS. 79A to 79C)

A step RS1 for defining the pattern of the device region shown in FIG. 75 is formed, and then the silicon nitride film 106 is anisotropically etched by using the resist pattern RS1 as a mask.

Figure 80A:
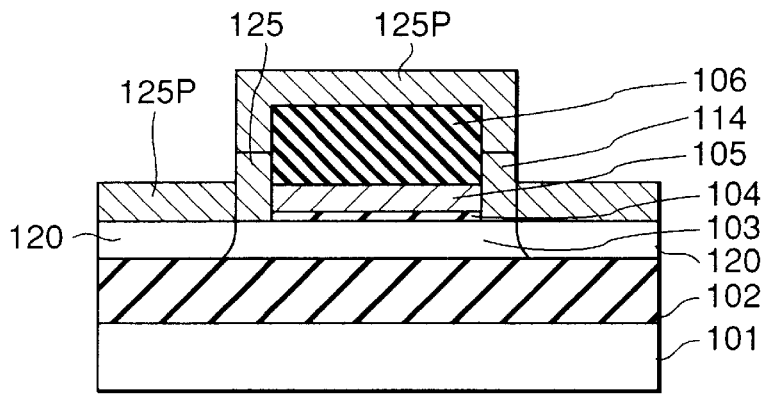
FIGS. 80A to 80C are cross sectional views showing the process of the method of manufacturing the MOS transistor having the body extended portion according to the eleventh embodiment of the present invention.
Figure 80B:
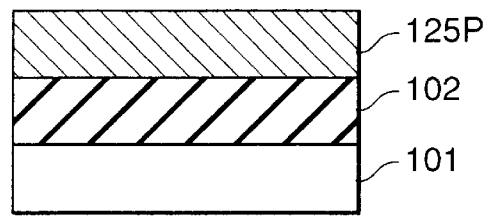
Figure 80C:
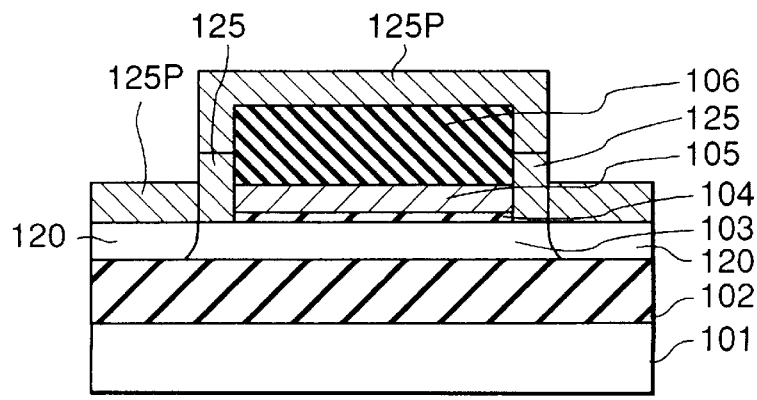

(3) Step 11-3 (FIGS. 80A to 80C)

Then, the resist pattern RS1 is separated, and then the n-type polysilicon film 105 and the gate oxide film 104 are anisotropically etched by using the silicon nitride film 106 as a mask.

(4) Step 11-4 (FIGS. 80A to 80C)

Then, an undoped polysilicon having a thickness of about 100 nm to about 200 nm is formed, and then p-type impurity ions are implanted into the polysilicon film 125 and the silicon layer 103 so that a body extended portion (a $p^+$-type diffusion layer) 120, a $p^+$-type polysilicon film (a $p^+$-type polysilicon plug) 125*p* and a polysilicon film (a i-type polysilicon plug) 125 are formed.

Since the silicon nitride film 106 is formed on the first gate electrode 105, the p-type impurity is not introduced into the first gate electrode 105 during the ion implantation. Since a thick polysilicon film is formed on the polysilicon film surrounding the first gate electrode 105, the p-type impurity is introduced. As a result, the polysilicon film (the i-type polysilicon plug) 125 is formed. Also the p-type impurity is not introduced into the silicon layer 103 below the polysilicon film (the i-type polysilicon plug) 125, any high concentration p-n junction is not formed between the source and the drain and the body extended portion 120.

Figure 81A:
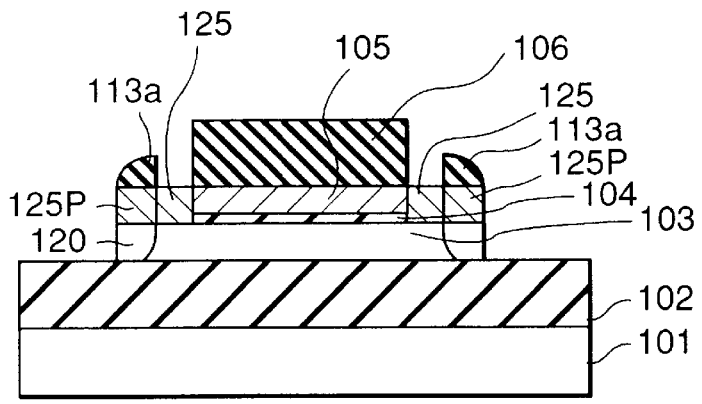
FIGS. 81A to 81C are cross sectional views showing the process of the method of manufacturing the MOS transistor having the body extended portion according to the eleventh embodiment of the present invention.
Figure 81B:
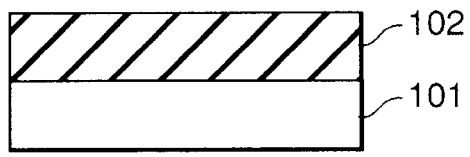
Figure 81C:
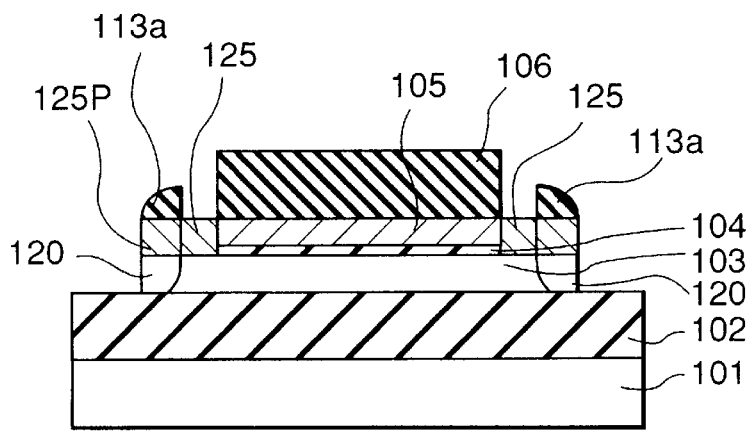

(5) Step 11-5 (FIGS. 81A to 81C)

Then, a silicon nitride film is formed on the overall surface, and then the silicon nitride film is anisotropically etched so that a spacer 113a is formed on the side wall of the gate portion.

(6) Step 11-6 (FIGS. 81A to 81C)

Then, the $p^+$-type polysilicon film 125p, the polysilicon film 125, the $p^+$-type polysilicon film 125 and the silicon layer 103 are anisotropically etched by using the silicon nitride film 106 and the spacer 113a as a masks. As a result, the i-type polysilicon plug and the $p^+$-type polysilicon plug 125p having predetermined patterns are formed.

Figure 82A:
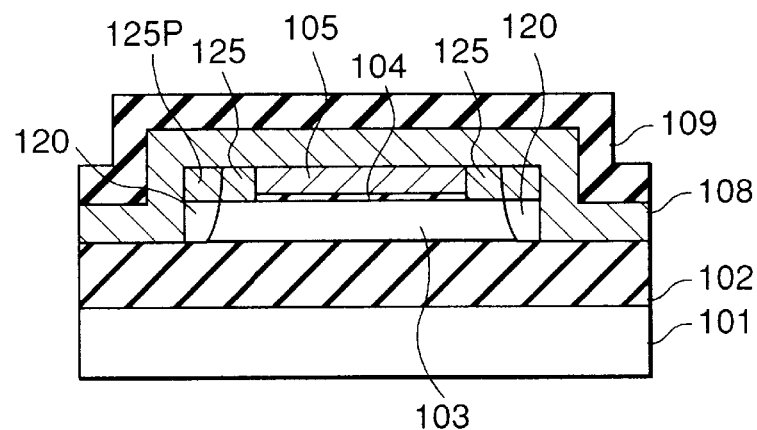
FIGS. 82A to 82C are cross sectional views showing the process of the method of manufacturing the MOS transistor having the body extended portion according to the eleventh embodiment of the present invention.
Figure 82B:
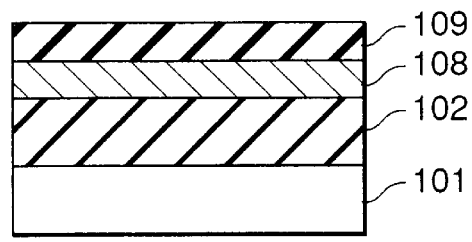
Figure 82C:
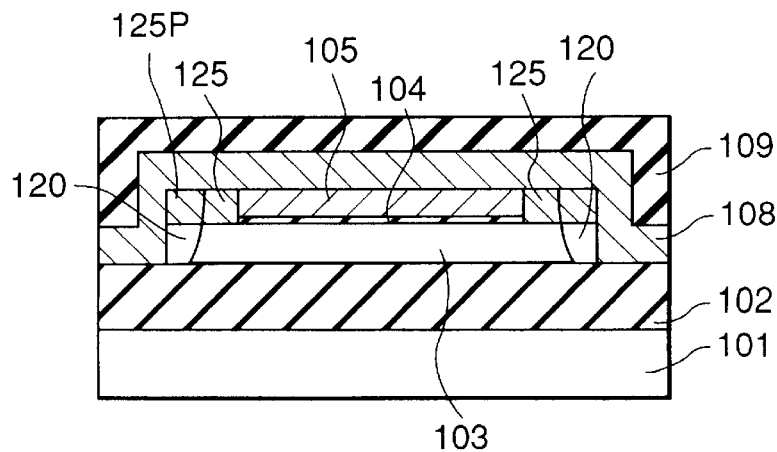

(7) Step 11-7 (FIGS. 82A to 82C)

Then, the silicon nitride film 106 and the spacer 113a are selectively separated.

(8) Step 11-8 (FIGS. 82A to 82C)

Then, a tungsten silicide film (a second gate electrode) 108 arranged to serve as the second gate electrode and having a thickness of about 100 nm and a silicon nitride film 109 having a thickness of about 100 nm are sequentially formed.

Figure 83A:
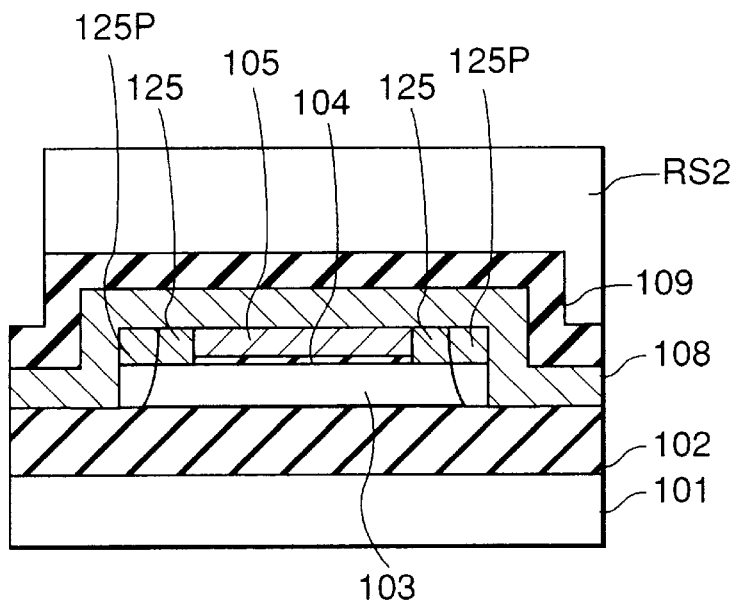
FIGS. 83A to 83C are cross sectional views showing the process of the method of manufacturing the MOS transistor having the body extended portion according to the eleventh embodiment of the present invention.
Figure 83B:
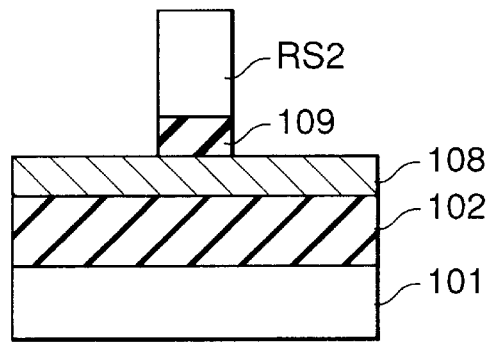
Figure 83C:
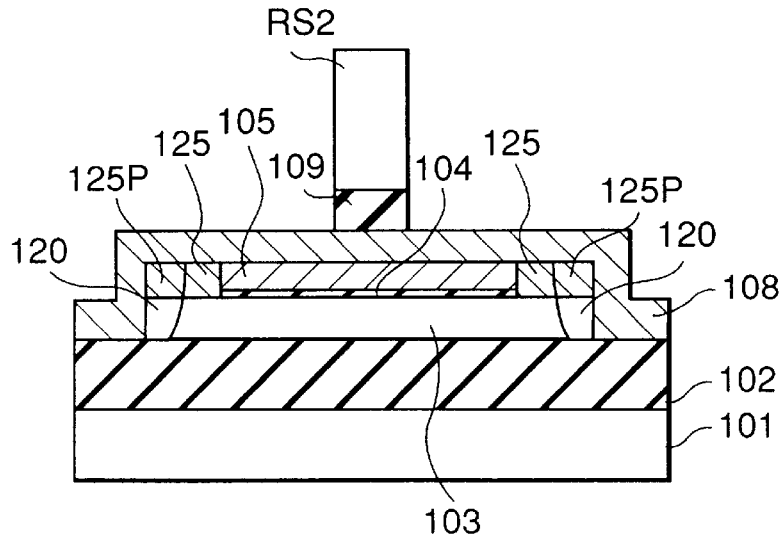

(9) Step 11-9 (FIGS. 83A to 83C)

Then, a resist pattern RS2 for defining the gate electrode pattern shown in FIG. 75 is formed, and then the silicon nitride film 109 is anisotropically etched by using the resist pattern RS2 as a mask.

Figure 84A:
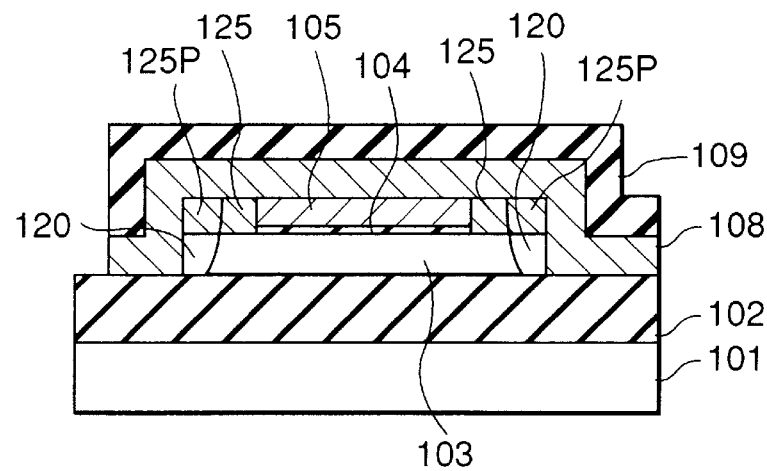
FIGS. 84A to 84C are cross sectional views showing the process of the method of manufacturing the MOS transistor having the body extended portion according to the eleventh embodiment of the present invention.
Figure 84B:
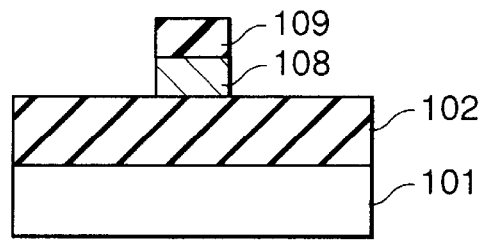
Figure 84C:
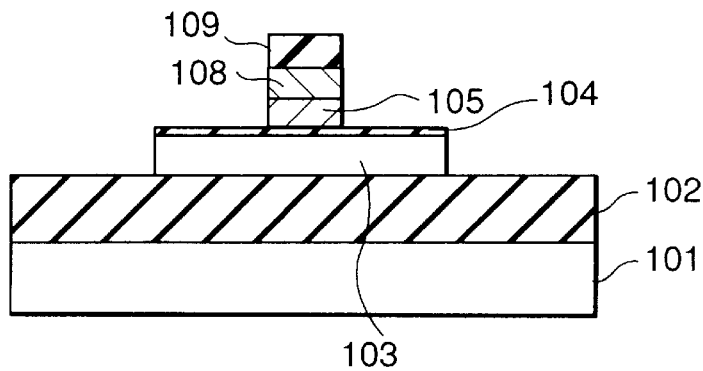

(10) Step 11-10 (FIGS. 84A to 84C)

Then, the resist pattern RS2 is separated, and then the tungsten silicide film (the second gate electrode) 108 and the n-type polysilicon film 105 are anisotropically etched by using the silicon nitride film 109 as a mask. As a result, a tungsten silicide film 108 having a predetermined pattern is formed.

The following process is similar to that following step 1-11 according to the first embodiment.

Figure 86A:
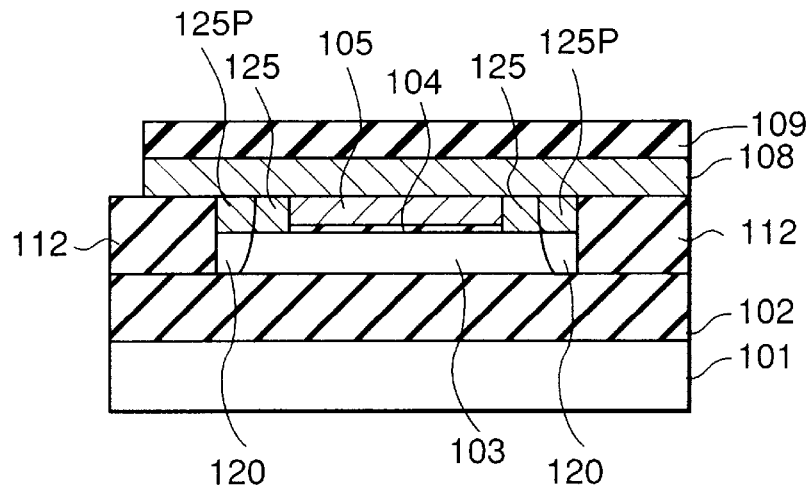
FIGS. 86A to 86C are cross sectional views showing the process of the method of manufacturing the MOS transistor having the body extended portion according to the eleventh embodiment of the present invention.
Figure 86B:
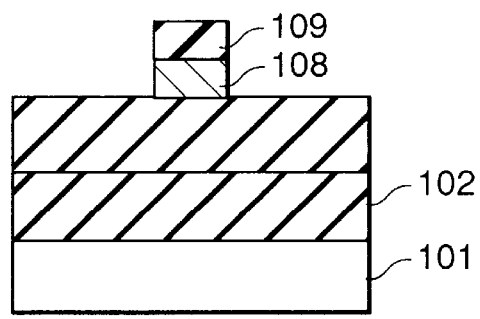
Figure 86C:
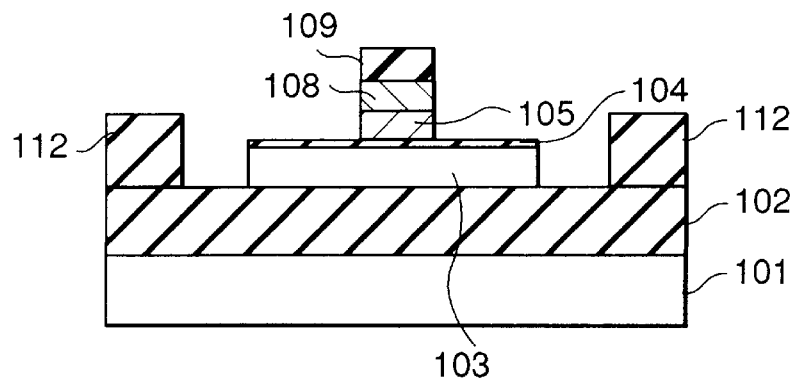

To realize the device structure shown in FIG. 77, the element isolation film 112 is formed after the process in step 11-6 has been performed, and then the element isolation film 112 is polished by CMP so that the surface is smoothed and flattened. Cross sections in the foregoing stage are shown in FIGS. 85A to 85C. Then, the process following step 11-8 is performed. Cross sections in a state where patterning of the gate electrode has been completed are shown in FIGS. 86A to 86C.

Twelfth Embodiment

Figure 87:
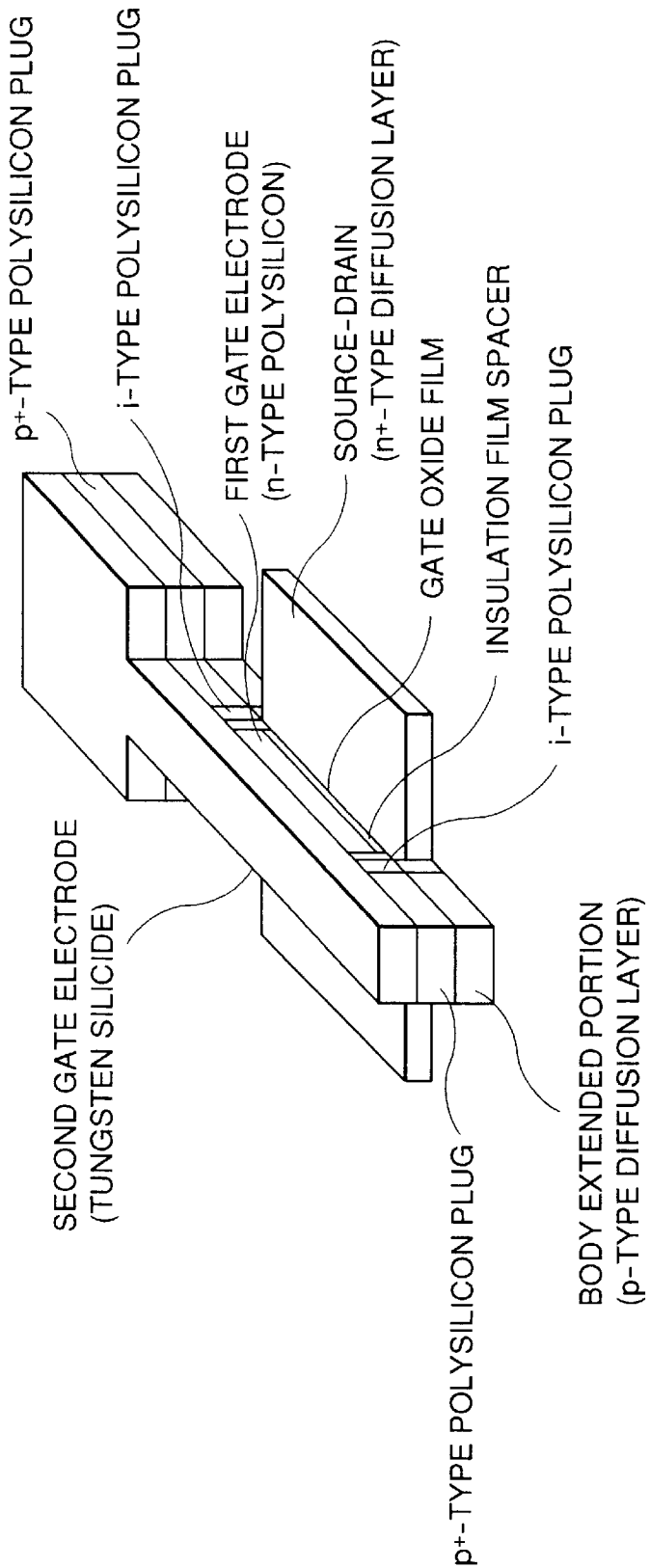
FIG. 87 is a perspective view showing a MOS transistor having a body extended portion according to a twelfth embodiment of the present invention.

FIG. 87 is a perspective view showing an n-channel type MOS transistor according to a twelfth embodiment of the present invention. Note that a variety of mask patterns for use to manufacture the MOS transistor according to this embodiment are the same as those (FIG. 75) employed in the eleventh embodiment.

This embodiment is characterized in that a body extended portion (the $p^+$-type diffusion layer) is formed below the second gate electrode in the field region and that also the second gate electrode in the field region is coupled to the body extended portion (the $p^+$-type diffusion layer) through the $p^+$-type polysilicon plug and the i-type polysilicon plug. As a result, the area of contact between the second gate electrode and the body extended portion can be enlarged and thus the contact resistance can be lowered. As a result, a further high speed operation can be performed.

Figure 88A:
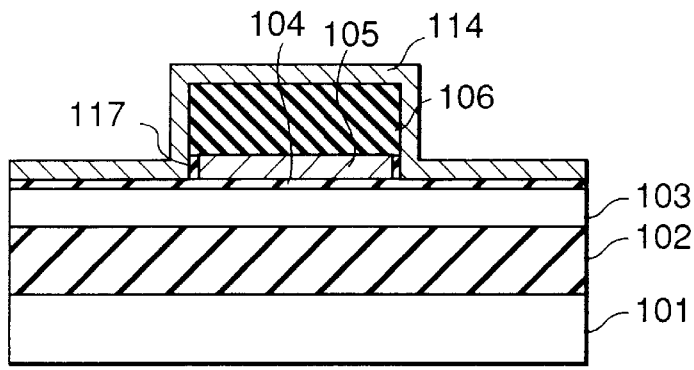
FIGS. 88A to 88C are cross sectional views showing the process of a method of manufacturing a MOS transistor having a body extended portion according to twelfth embodiment of the present invention.

Referring to FIGS. 88A to 95C, a manufacturing method according to this embodiment will now be described. FIGS. 88A to 95C are arranged such that FIGS. 88A, 88B and 88C are cross sectional views respectively taken along lines 79A—79A, 79B—79B and 79C—79C shown in FIG. 75 which is a plan view.

Figure 88B:
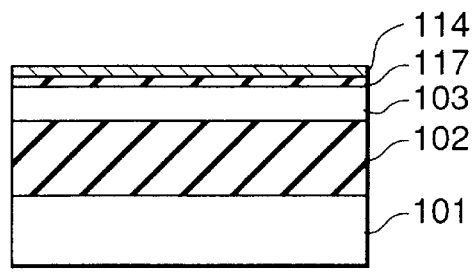
Figure 88C:
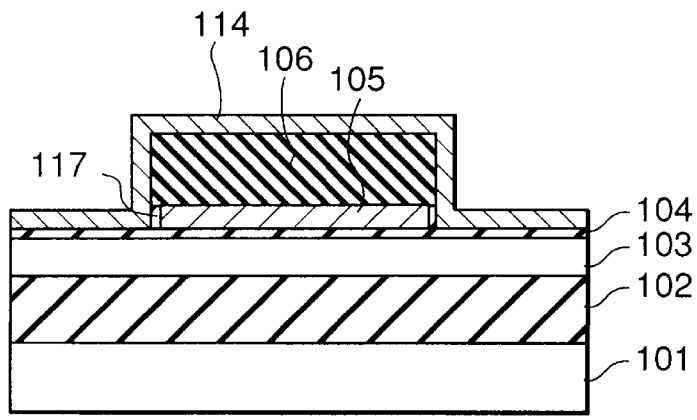

(1) Step 12-1 (FIGS. 88A to 88C)

Initially, an SOI substrate composed of a support substrate 101, a buried oxide film 102 and a silicon layer (SOI) 103 is formed. It is preferable that the thickness of the silicon layer 103 be 50 nm to 150 nm.

Then, p-type impurity ions required to adjust the threshold voltage are implanted into the silicon layer 103. Then, a gate oxide film 104 having a thickness of about 5 nm to 10 nm is formed on the silicon layer 103. Then, a polysilicon film is formed on the gate oxide film 104 by the CVD method. Then, n-type impurity ions are implanted so that an n-type polysilicon film 105 is formed. Then, a silicon nitride film 106 having a thickness of about 100 nm is formed on the n-type polysilicon film 105 by the CVD method.

(2) Step 12-2 (FIGS. 88A to 88C)

Then, a resist pattern for defining the device region pattern shown in FIG. 75 is formed, and then the silicon nitride film 106 is anisotropically etched by using the resist pattern as a mask. Then, the foregoing resist pattern is separated.

(3) Step 12-3 (FIGS. 88A to 88C)

The n-type polysilicon film (the first gate electrode) 105 is anisotropically etched by using the silicon nitride film 106 as a mask. As a result, the n-type polysilicon film 105 is formed.

(4) Step 12-4 (FIGS. 88A to 88C)

Then, a silicon oxide film 117 is formed on the surface of the silicon layer 103 and the first gate electrode exposed attributable to heat oxidation. Then, a spacer 114 having a thickness of about 50 nm is formed on the overall surface.

Figure 89A:
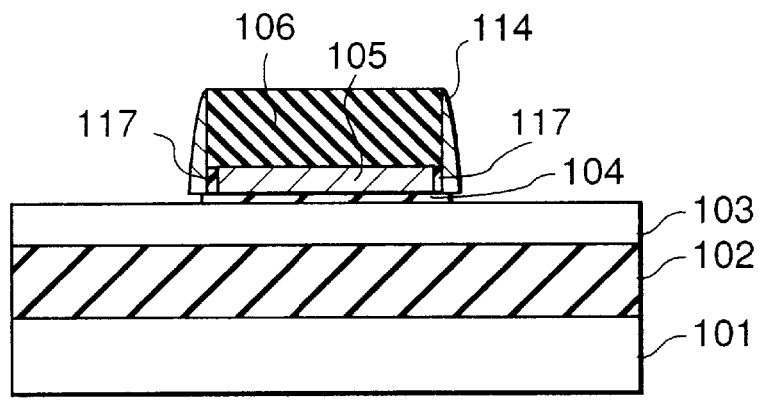
FIGS. 89A to 89C are cross sectional views showing the process of the method of manufacturing the MOS transistor having the body extended portion according to the twelfth embodiment of the present invention.
Figure 89B:
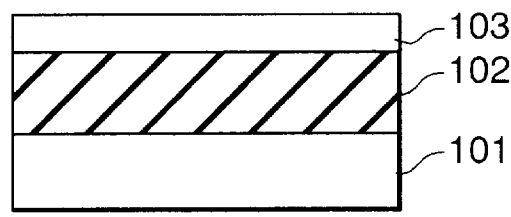
Figure 89C:
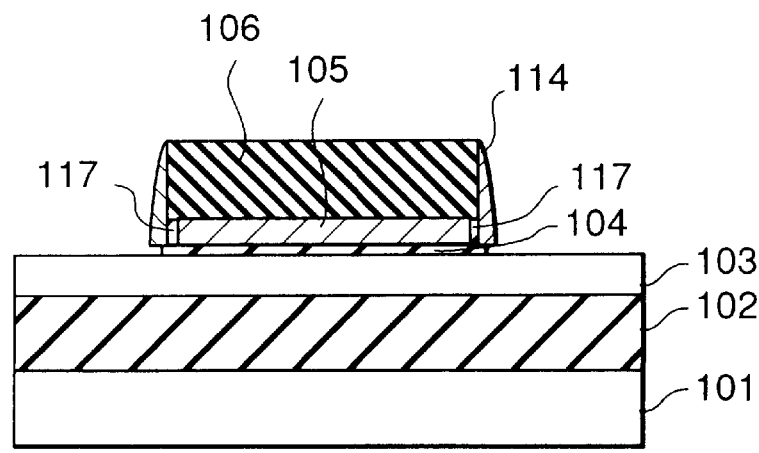

(5) Step 12-5 (FIGS. 89A to 89C)

Then, the polysilicon film 114 is anisotropically etched so as to be left on the side wall of the gate. Then, wet etching is performed by using hydrofluoric acid or ammonium fluoride so that the silicon oxide film 117 is removed.

Figure 90A:
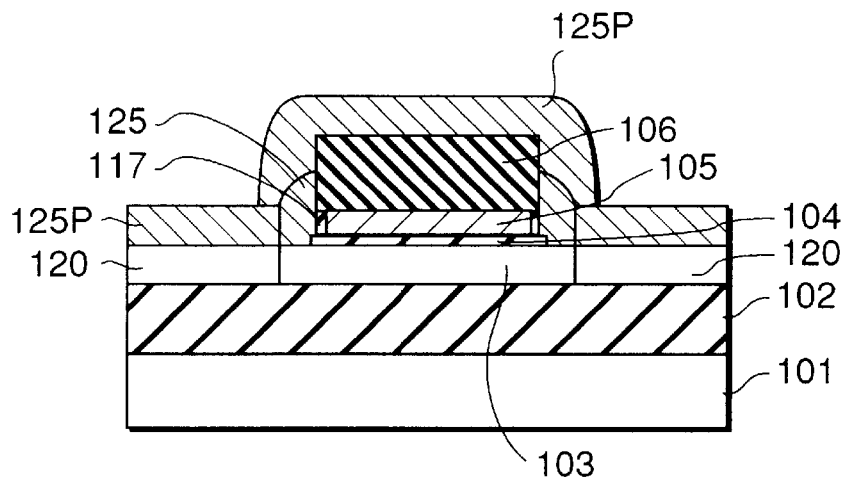
FIGS. 90A to 90C are cross sectional views showing the process of the method of manufacturing the MOS transistor having the body extended portion according to the twelfth embodiment of the present invention.
Figure 90B:
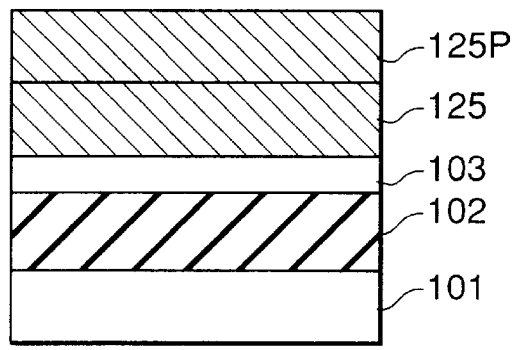
Figure 90C:
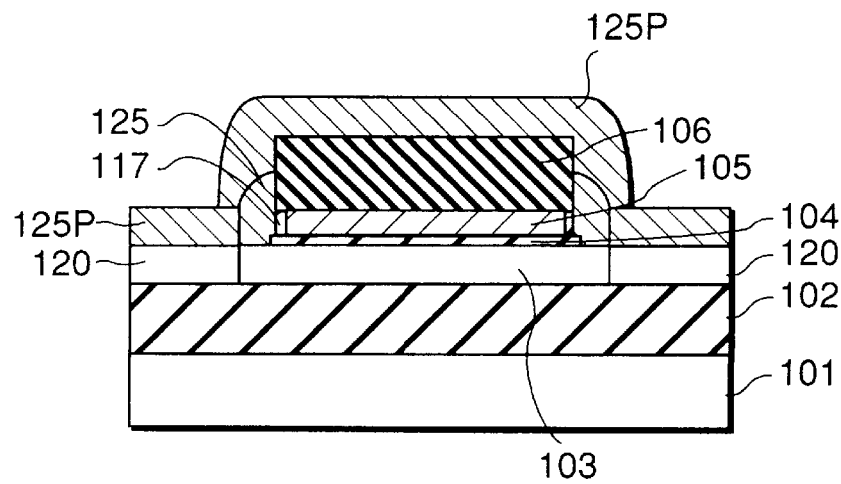

(6) Step 12-6 (FIGS. 90A to 90C)

Then, another polysilicon film 125 is formed on the overall surface.

(7) Step 12-7 (FIGS. 90A to 90C)

Then, p-type impurity ions are implanted into the polysilicon film 125 and the silicon layer 103 so that a body extended portion (a $p^+$-type diffusion layer) 120 and a $p^+$-type polysilicon film (a $p^+$-type polysilicon plug) 125p are formed.

Since the silicon nitride film 106 exists on the n-type polysilicon film 105, the p-type impurity is not introduced into the n-type polysilicon film 105 during the foregoing implantation of ions. Since the polysilicon film 125 around the gate portion has a large thickness, the p-type impurity is introduced into only the portion above the portion of the polysilicon film 125. The lower portion of the polysilicon film 125 is retained to be undoped. That is, a portion of the polysilicon film 125 around the gate portion is formed into an i-type polysilicon plug. Since p-type impurity is not introduced also into the silicon layer 103 below the polysilicon film (the i-type polysilicon plug), no high concentration p-n junction is formed between the source and the drain and the body extended portion 120.

Figure 91A:
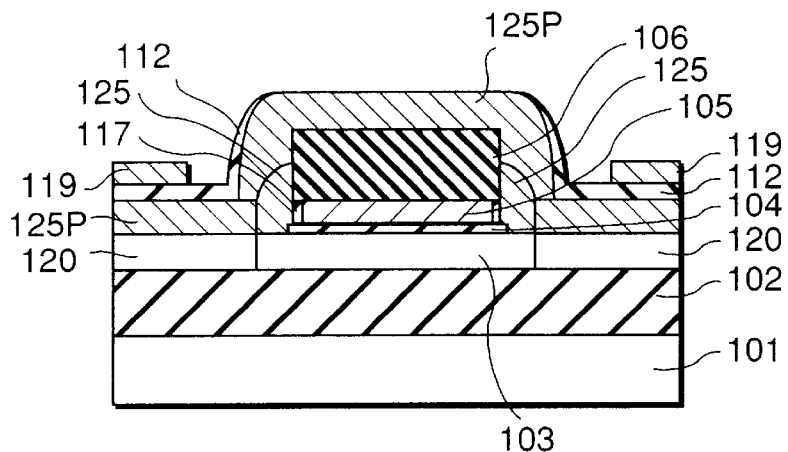
FIGS. 91A to 91C are cross sectional views showing the process of the method of manufacturing the MOS transistor having the body extended portion according to the twelfth embodiment of the present invention.
Figure 91B:
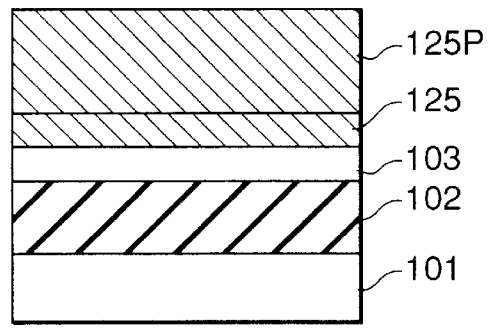
Figure 91C:
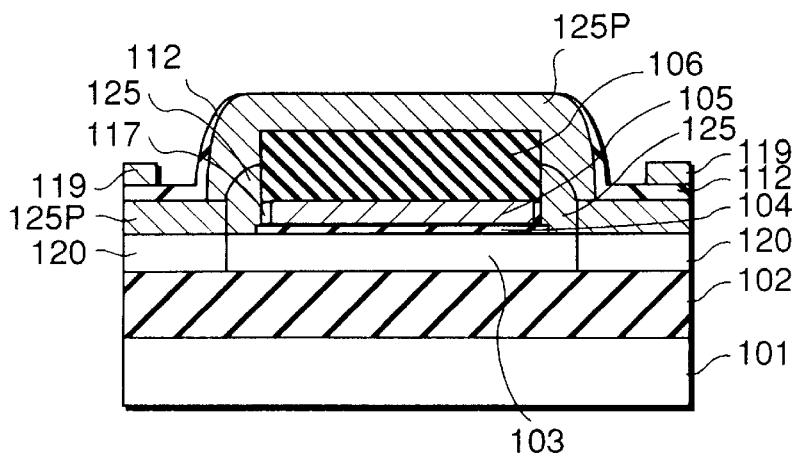

(8) Step 12-8 (FIGS. 91A to 91C)

Then, a silicon oxide film 112 is formed on the overall surface, and then a polysilicon film 119 serving as a stopper is formed on the silicon oxide film 112 in the field region. Then, the silicon oxide film 112 is polished by the CMP method. The polishing operation is performed under condition that the polishing rate for the polysilicon film 119 is lower than that for the silicon oxide film 112. As a result, only the silicon oxide film 112 in the device region is polished so that the p$^+$-type polysilicon film 125p in the device region is exposed.

Figure 92A:
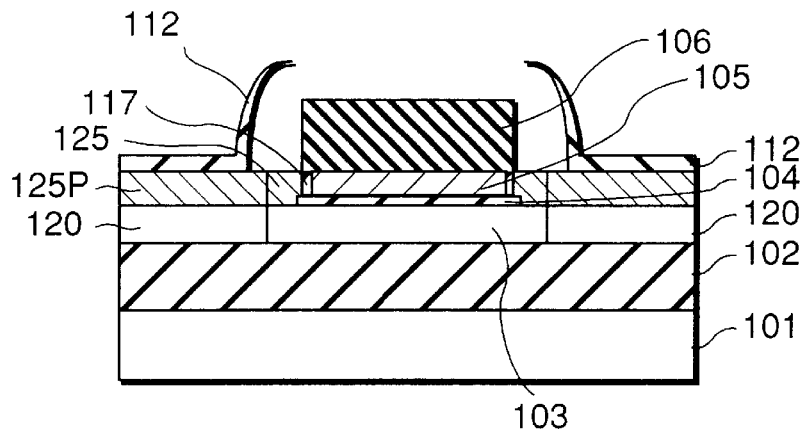
FIGS. 92A to 92C are cross sectional views showing the process of the method of manufacturing the MOS transistor having the body extended portion according to the twelfth embodiment of the present invention.
Figure 92B:
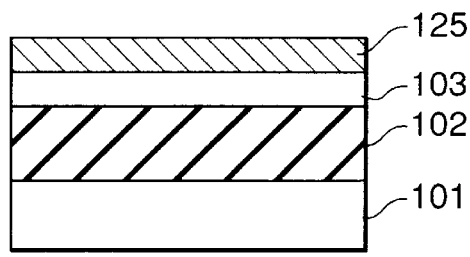
Figure 92C:
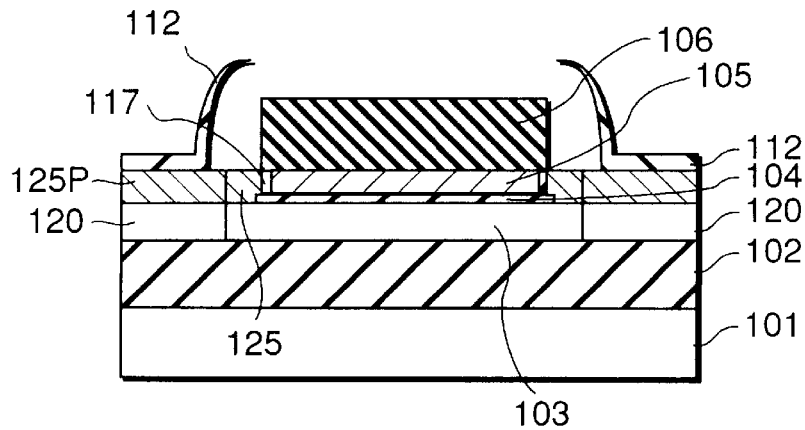

(9) Step 12-9 (FIGS. 92A to 92C)

Then, the polysilicon films 124 and 125p are etched back by the CDE method so that the heights of the n-type polysilicon film 105 formed on the device region and arranged to serve as the first gate electrode and those of the polysilicon films 114 and 114p in the field region are made to be substantially the same.

Figure 93A:
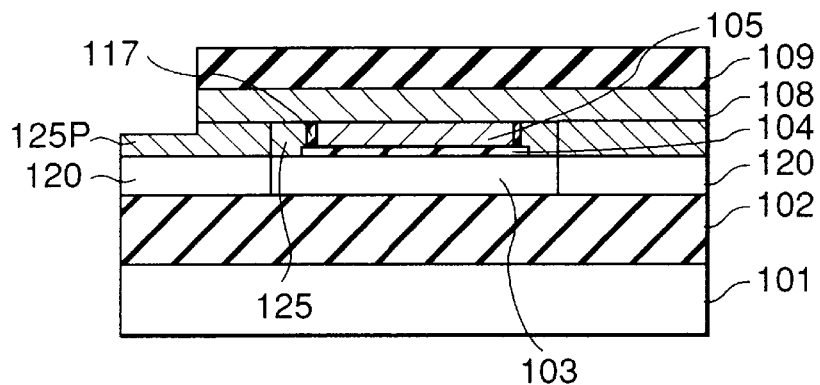
FIGS. 93A to 93C are cross sectional views showing the process of the method of manufacturing the MOS transistor having the body extended portion according to the twelfth embodiment of the present invention.
Figure 93B:
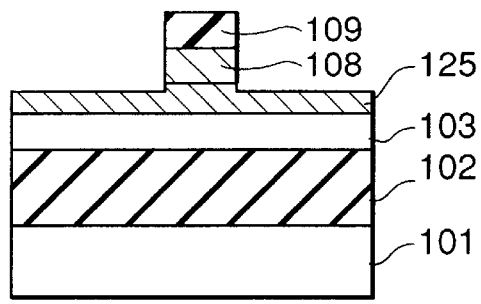
Figure 93C:
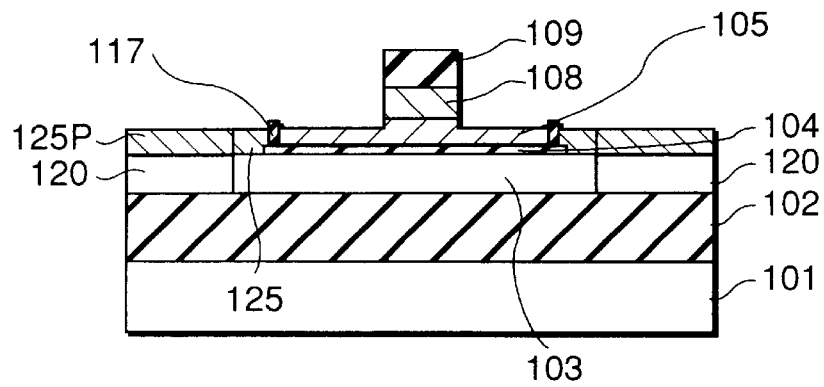

(10) Step 12-10 (FIGS. 93A to 93C)

Then, the silicon oxide film 112 is removed by anisotropic etching, and then the silicon nitride film 106 is selectively separated.

(11) Step 12-11 (FIGS. 93A to 93C)

Then, a tungsten silicide film 108 and a silicon nitride film 109 are sequentially formed on the overall surface, and then a resist pattern (not shown) for defining the gate electrode pattern shown in FIG. 75 is formed. Then, the silicon nitride film 109 is anisotropically etched by using the resist pattern as a mask. Then, the foregoing resist pattern is separated.

(12) Step 12-12 (FIGS. 93A to 93C)

Then, the tungsten silicide film (the second gate electrode) 108 is etched by using the silicon nitride film 109 as a mask. As a result, the tungsten silicide film 108 having a predetermined pattern is formed.

Figure 94A:
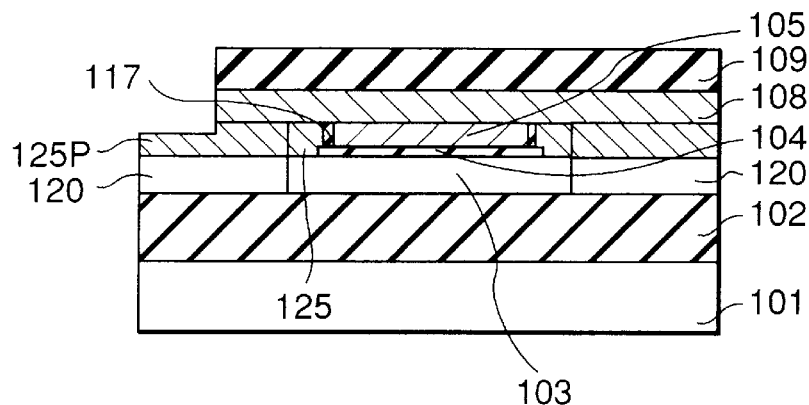
FIGS. 94A to 94C are cross sectional views showing the process of the method of manufacturing the MOS transistor having the body extended portion according to the twelfth embodiment of the present invention.
Figure 94B:
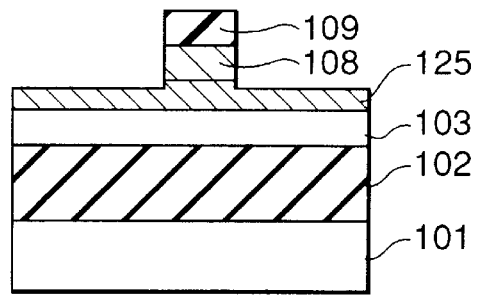
Figure 94C:
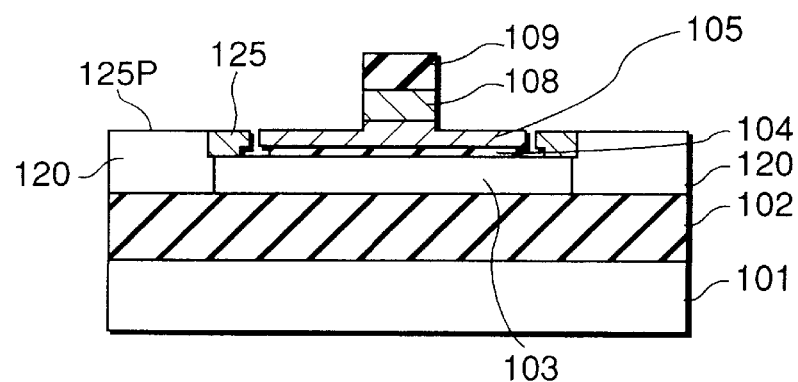

(13) Step 12-13 (FIGS. 94A to 94C)

Wet etching using hydrofluoric acid or ammonium fluoride is performed so that the silicon oxide film 117 formed on the side wall of the n-type polysilicon film 105 is removed, as shown in FIGS. 94A to 94C.

As a result, a problem can be prevented which arises in a next step for anisotropically etching the n-type polysilicon film 105 in that the n-type polysilicon film 105 is undesirably left because the n-type polysilicon film 105 is masked by the silicon oxide film 117.

Note that the silicon oxide film 117 on the side wall of the n-type polysilicon film 105 may selectively be removed by anisotropic etching.

Figure 95A:
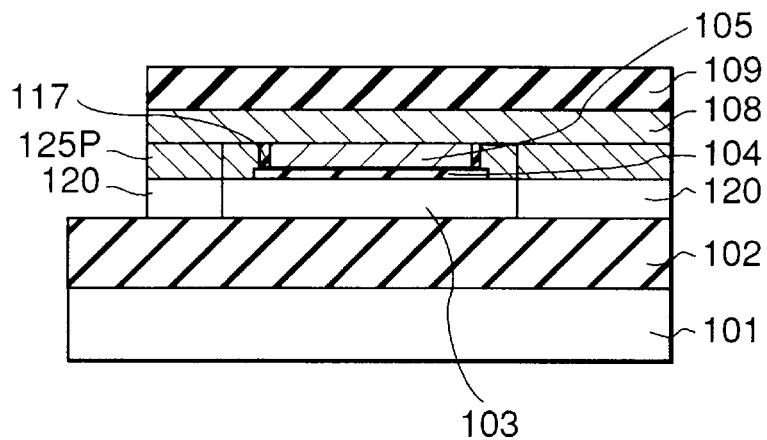
FIGS. 95A to 95C are cross sectional views showing the process of the method of manufacturing the MOS transistor having the body extended portion according to the twelfth embodiment of the present invention.
Figure 95B:
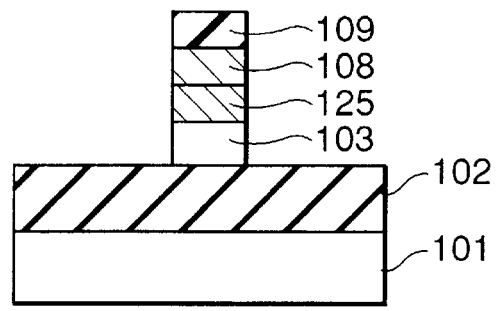
Figure 95C:
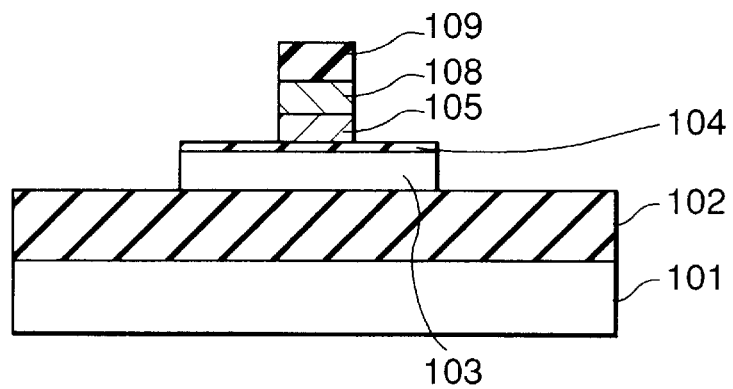

(14) Step 12-14 (FIGS. 95A to 95C)

Then, the n-type polysilicon film 105 is anisotropically etched by using the silicon nitride film 109 as a mask. At this time, etching in the device region is interrupted at the gate oxide film 104. In the field region, etching proceeds to the silicon layer 103, and then etching is interrupted at the buried oxide film 102.

The following process is the same as that following step 1-11 according to the first embodiment.

Thirteenth Embodiment

Figure 96:
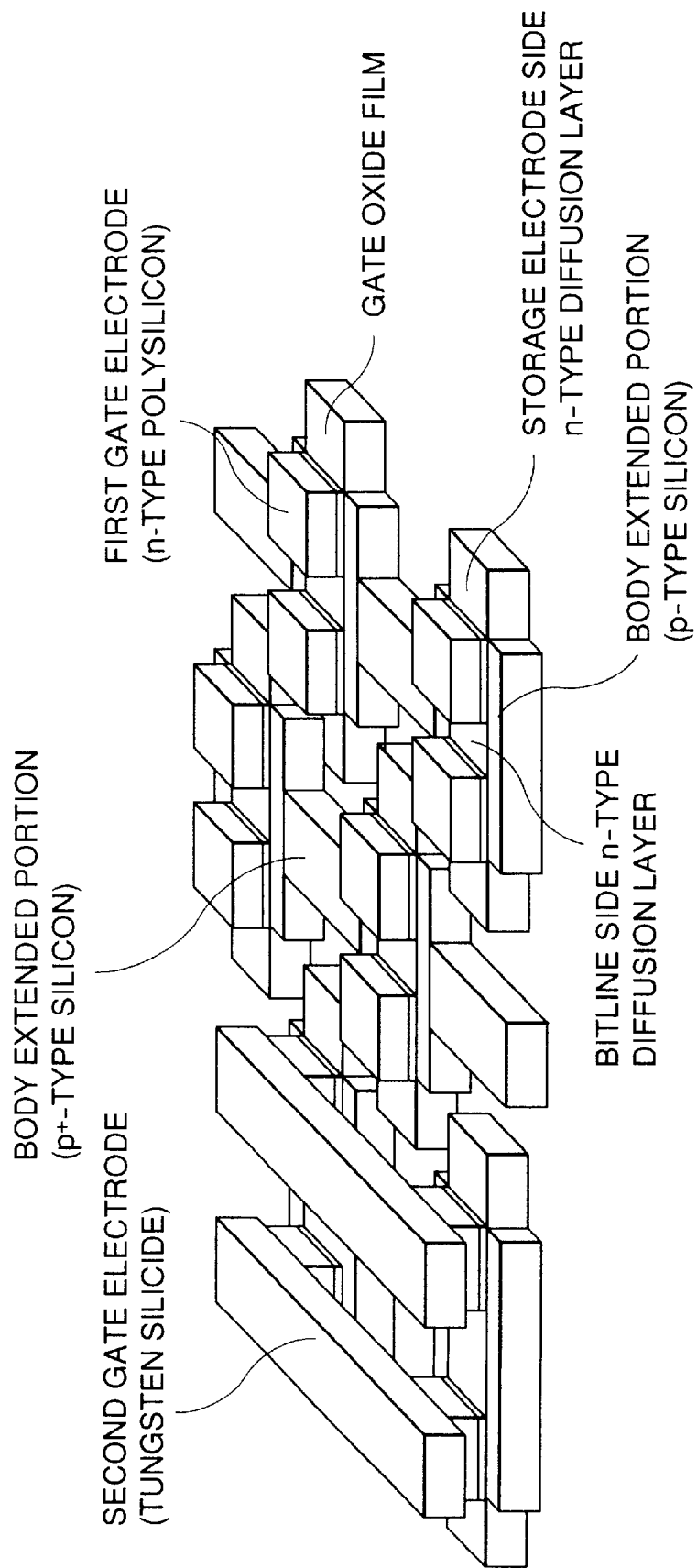
FIG. 96 is a perspective view showing a select transistor of a memory cell array of a DRAM having a body extended portion according to a thirteenth embodiment of the present invention.
Figure 97:
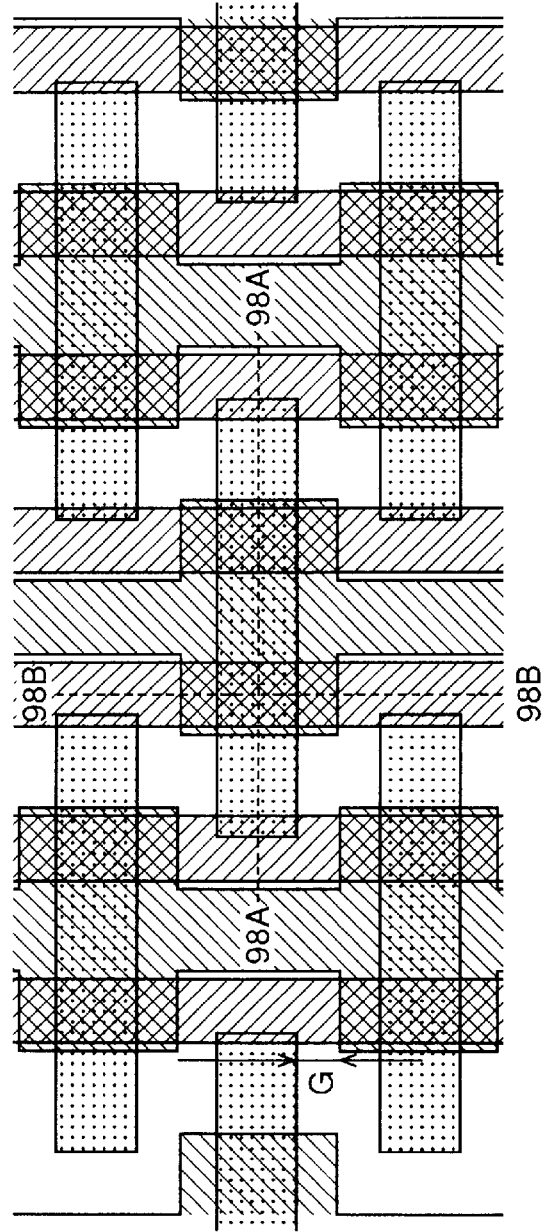
FIG. 97 is a diagram showing a variety of mask patterns for use to manufacture the select transistor according to the thirteenth embodiment.

FIG. 96 is a perspective view showing a select transistor of a memory cell array of a DRAM (Dynamic Random Access Memory) according to a thirteenth embodiment of the present invention. FIG. 97 shows a variety of mask patterns for use to manufacture the select transistor.

This embodiment having a body extended portion to apply a fixed potential to the body is able to prevent a problem which arises because the potential of the substrate is not fixed, for example, in that leak currents increase due to a transitional reduction of the threshold voltage.

According to this embodiment, a specific problem for the memory cell array of the DRAM can be overcome which arises when a resist pattern is formed.

A layout pattern of a conventional transistor having no body extended portion is as shown in FIG. 97 which shows the device region pattern. On the other hand, a layout pattern of a transistor having the body extended portion is formed such that the body extended portion pattern is added to the device region pattern shown in FIG. 97.

In this case, the conventional method has the steps of making a pattern formed by adding the body extended portion pattern to the device region pattern to be a device region pattern, forming a resist pattern for defining the device region pattern and etching the silicon layer (SOI) by using the resist pattern as a mask.

Since a memory cell array of a DRAM has a structure such that the isolation width between transistors is minimum device isolation width F, the width of a portion indicated with symbol G shown in FIG. 97 is smaller than F. Therefore, the conventional method cannot form the resist pattern obtained by adding the pattern of the body extended portion to the pattern of the device region shown in FIG. 97.

If the pattern formed by adding the word line pattern shown in FIG. 97 and the device region pattern to each other is made to be the device region pattern, a p-type silicon layer is formed below the word line word line and a multiplicity of source and the drain (an n-type diffusion layer) adjacent to the storage electrode are coupled to one word line. Therefore, p-n junction leak is increased undesirably. Moreover, the capacitance of the word line and that of the p-type silicon layer are enlarged excessively.

Accordingly, this embodiment is arranged such that the region in which the transistor is formed and the body extended portion are not formed by one resist pattern, that is, they are formed by individual resist patterns. As a result, an element isolation region in which the width of the portion indicated with the symbol G shown in FIG. 97 is F/2 or smaller can be realized. Therefore, the peculiar problem for the above-mentioned memory cell array of the DRAM can be overcome.

Referring to FIGS. 98A to 105B, a manufacturing method according to this embodiment will now be described. FIGS. 98A to 105B are arranged in such a manner that FIGS. 98A and 98B respectively are cross sectional views taken along lines 98A—98A and 98B—98B shown in FIG. 97 which is a plan view.

Figure 98A:
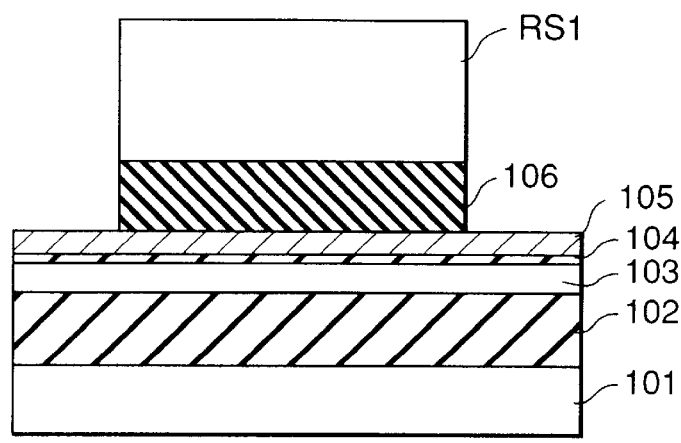
FIGS. 98A and 98B are cross sectional views showing the process of a method of manufacturing a MOS transistor having a body extended portion according to the thirteenth embodiment of the present invention.
Figure 98B:
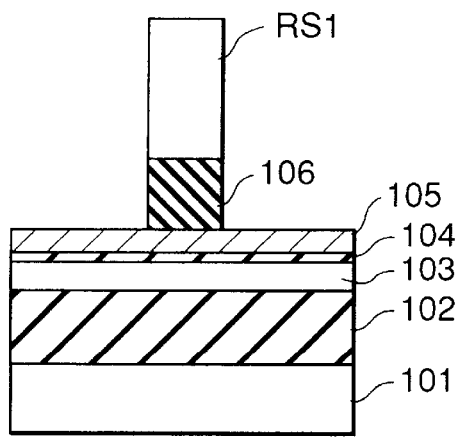

(1) Step 13-1 (FIGS. 98A and 98B)

Initially, an SOI substrate composed of a support substrate 101, a buried oxide film 102 and a silicon layer (SOI) 103 is formed. It is preferable that the thickness of the silicon layer 103 be 50 nm to 150 nm.

Then, p-type impurity ions required to adjust the threshold voltage are implanted into the silicon layer 103. Then, a gate oxide film 104 having a thickness of about 5 nm to 10 nm is formed on the silicon layer 103. Then, an n-type polysilicon film 105 and a silicon nitride film 106 having a thickness of about 100 nm are sequentially formed by the CVD method.

(2) Step 13-2 (FIGS. 98A and 98B)

Then, a resist pattern RS1 for defining the device region pattern shown in FIG. 97 is formed, and then the silicon nitride film 106 is anisotropically etched by using the resist pattern RS1 as a mask.

Figure 99B:
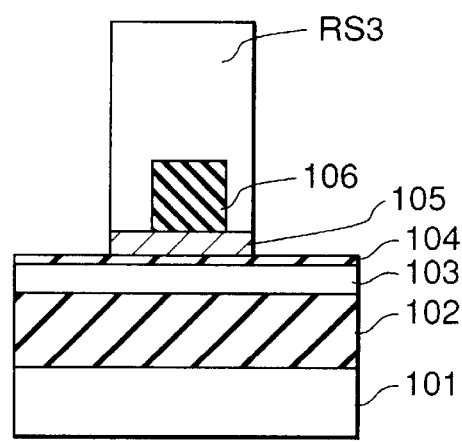
FIGS. 99A and 99B are cross sectional views showing the process of the method of manufacturing the MOS transistor having the body extended portion according to the thirteenth embodiment of the present invention.
Figure 99A:
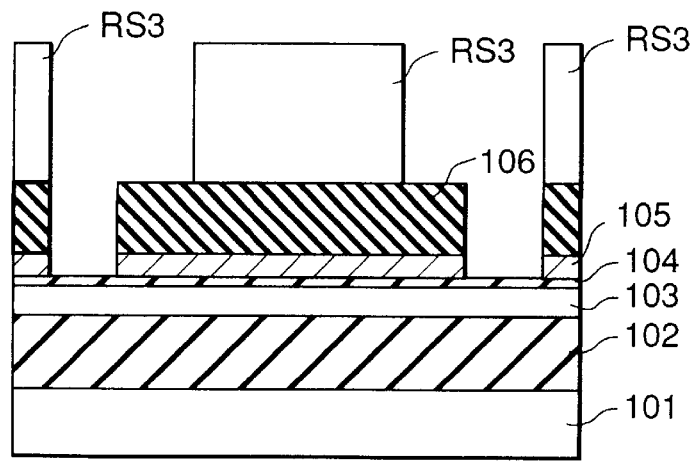

(3) Step 13-3 (FIGS. 99A and 99B)

Then, the resist pattern RS1 is separated. Then, the polysilicon film 105 is patterned. If a resist pattern RS3 for defining the body extended portion shown in FIG. 97 is formed and the polysilicon film 105 is anisotropically etched by using the resist pattern RS3 as a mask, the necessity for the resist pattern RS3 to be also formed on a stepped portion formed by the silicon nitride film 106 to which the pattern of the gate electrode has been transferred results a fact that the designed resist pattern RS3 cannot easily be obtained.

Accordingly, this embodiment is structured such that the following steps 13-31 and 13-32 are employed in the above-mentioned Step 3-3.

Figure 100A:
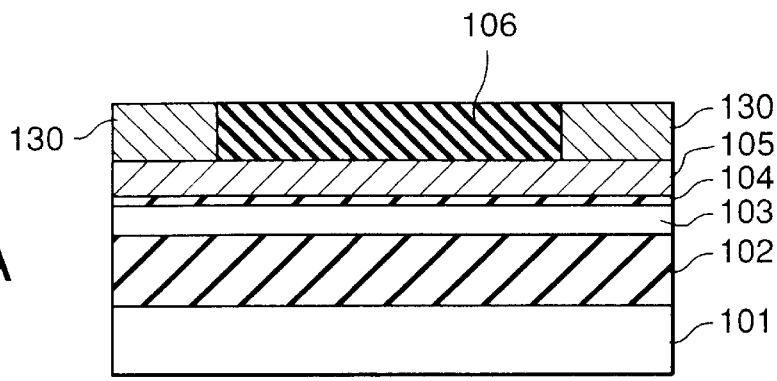
FIGS. 100A and 100B are cross sectional views showing the process of the method of manufacturing the MOS transistor having the body extended portion according to the thirteenth embodiment of the present invention.
Figure 100B:
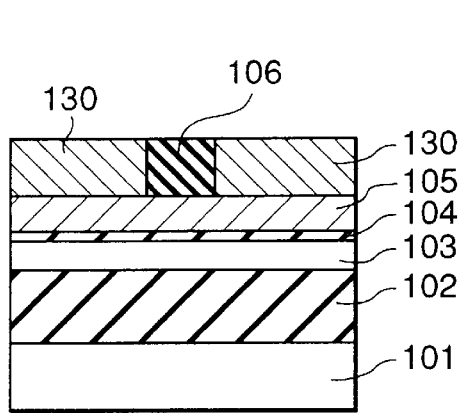

(3-1) Step 13-31 (FIGS. 100A and 100B)

The resist pattern RS1 is separated, and then a polysilicon film 130 having a thickness lager than a thickness required to embed the memory cell array is embedded in the cell array. Then, the CDE method or CMP method is employed to etch back the polysilicon film 130 so as to have the same height as that of the silicon nitride film 106. Thus, the surface is smoothed and flattened.

Figure 101B:
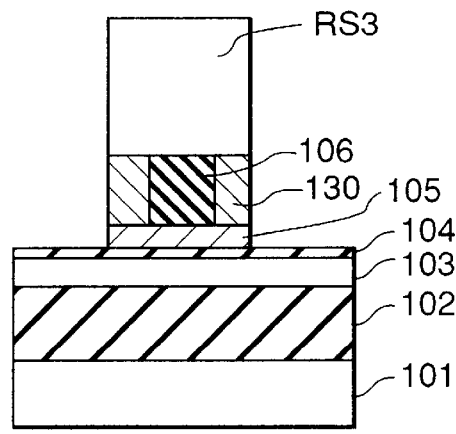
FIGS. 101A and 101B are cross sectional views showing the process of the method of manufacturing the MOS transistor having the body extended portion according to the thirteenth embodiment of the present invention.
Figure 101A:
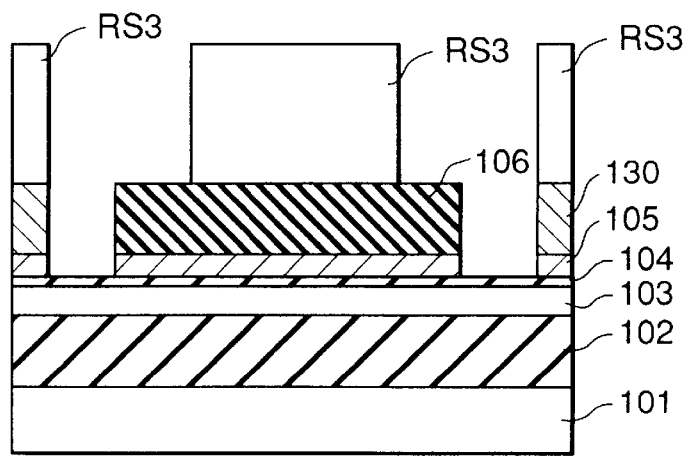

(3-2) Step 13-32 (FIGS. 101A and 101B)

Then, the resist pattern RS3 for defining the pattern of the body extended portion, and then the polysilicon film 130 is anisotropically etched by using the resist pattern RS3 as a mask.

Figure 102A:
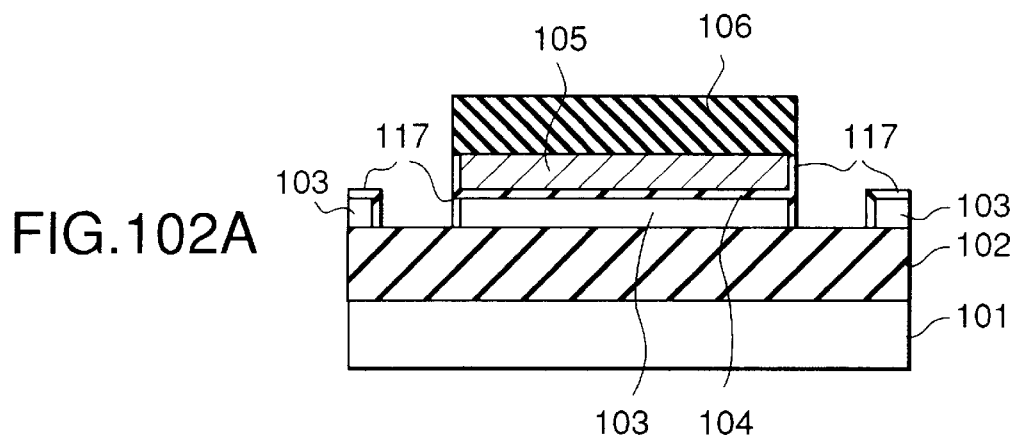
FIGS. 102A and 102B are cross sectional views showing the process of the method of manufacturing the MOS transistor having the body extended portion according to the thirteenth embodiment of the present invention.
Figure 102B:
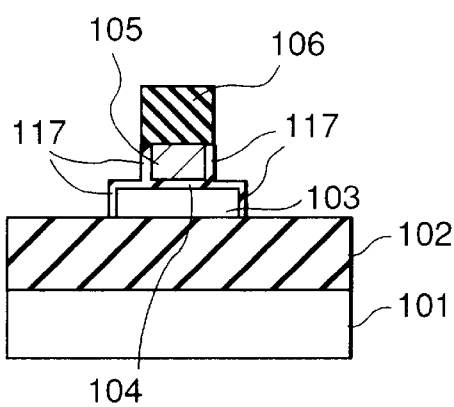

(4) Step 13-4 (FIGS. 102A and 102B)

Then, the resist pattern RS3 is removed. Then, the exposed gate oxide film 104 is removed by anisotropic etching. As a result, the silicon layer 103 and the polysilicon film 130 in a region except for the region, which will be formed into the body extended portion, and the device region are exposed. The silicon nitride film 106 on the n-type polysilicon film 105 on the device region does not appear.

(5) Step 13-5 (FIGS. 102A and 102B)

Then, the silicon layer 103 and the polysilicon film 130 are anisotropically etched by using the silicon nitride film 106 as a mask so that the silicon layer 103 and the polysilicon film 130 in a region except for the device region and the body extended portion and the n-type polysilicon film 105 in the body extended portion are removed. Then, heat oxidation is performed so that a silicon oxide film 117 is formed on the side wall of the n-type polysilicon film 105, the side wall of the silicon layer 103 and the surface of the silicon layer 103 in the body extended portion are formed.

Figure 103B:
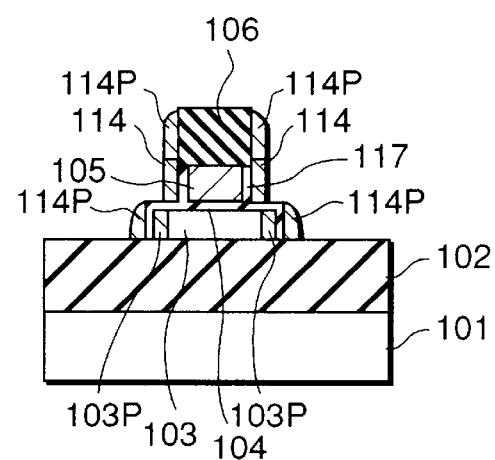
FIGS. 103A and 103B are cross sectional views showing the process of the method of manufacturing the MOS transistor having the body extended portion according to the thirteenth embodiment of the present invention.
Figure 103A:
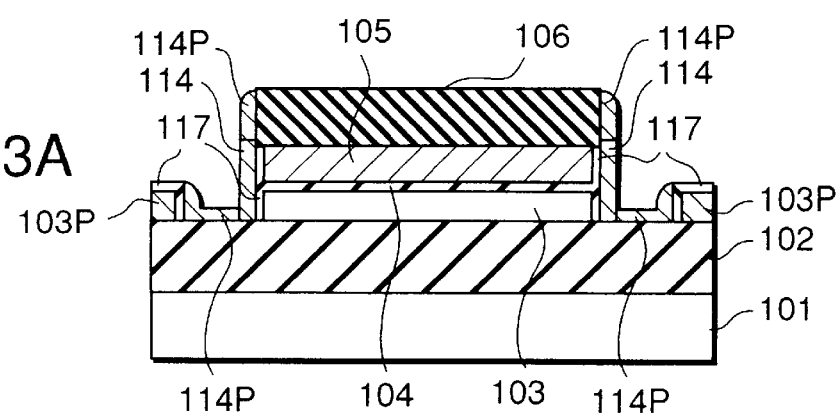

(6) Step 13-6 (FIGS. 103A and 103B)

Then, a polysilicon film having a thickness of about 30 nm is formed on the overall surface, and then the polysilicon film is anisotropically etched so that spacers 114 and 114p are formed. Then, p-type impurity ions are implanted so that the silicon layer 103p of the silicon layer 103 in the body extended portion is selectively made to be a p-type silicon layer.

Note that the spacer 114 is a spacer into which the p-type impurity has not been implanted after the foregoing ion implantation has been performed and the spacer 114p is a spacer into which the p-type impurity has been implanted.

Figure 104A:
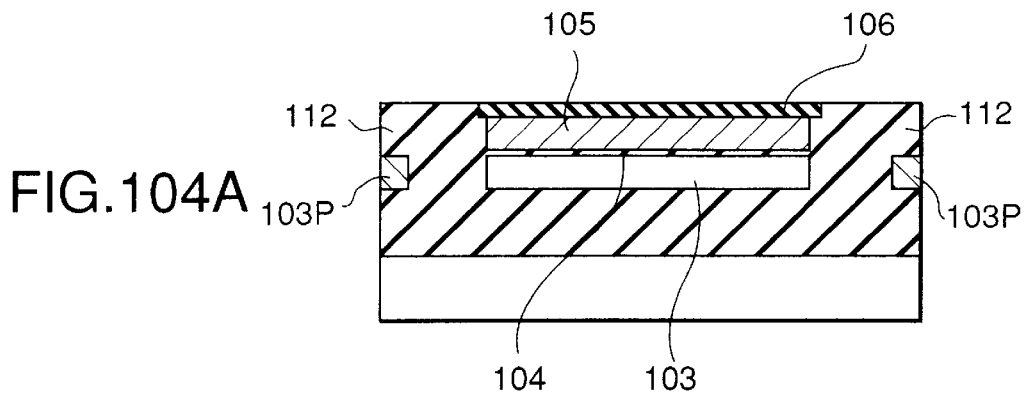
FIGS. 104A and 104B are cross sectional views showing the process of the method of manufacturing the MOS transistor having the body extended portion according to the thirteenth embodiment of the present invention.
Figure 104B:
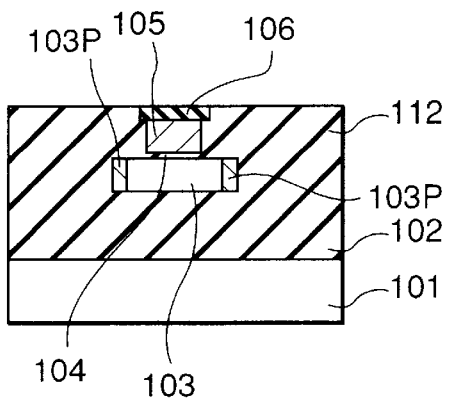

(7) Step 13-7 (FIGS. 104A and 104B)

Then, CDE is performed so that the spacers 114 and 114p are removed. Then, an isolation oxide film 112 is formed on the overall surface, and then the isolation oxide film 112 is polished by the CMP method by using the silicon nitride film 106 as a stopper so that the surface of the isolation oxide film 112 is smoothed and flattened.

Figure 105B:
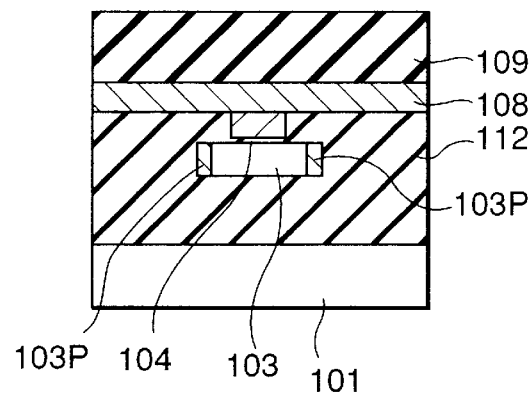
FIGS. 105A and 105B are cross sectional views showing the process of the method of manufacturing the MOS transistor having the body extended portion according to the thirteenth embodiment of the present invention.
Figure 105A:
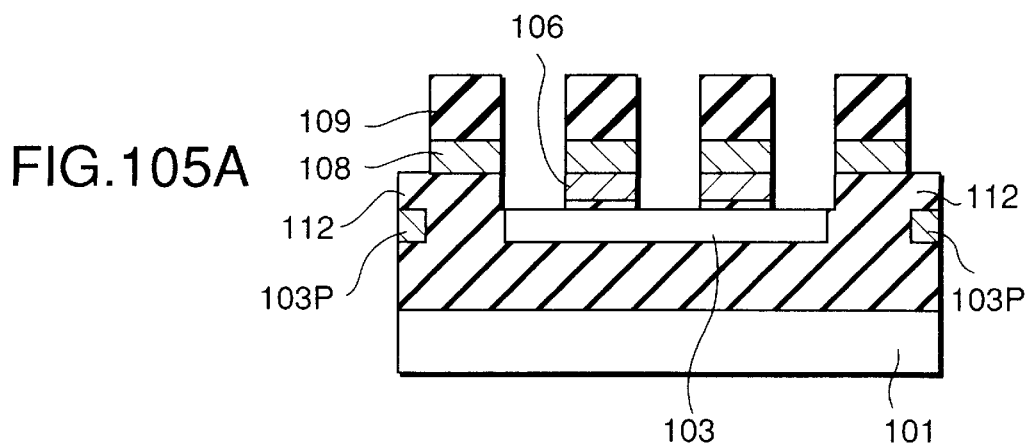

(8) Step 13-8 (FIGS. 105A and 105B)

Then, the silicon nitride film 106 is selectively separated by CDE, and then a tungsten silicide film 108 and a silicon nitride film 109 are sequentially formed on the overall surface.

(9) Step 13-9 (FIGS. 105A and 105B)

Then, a resist pattern (not shown) for defining the word line pattern shown in FIG. 97 is formed, and the silicon nitride film 109 is anisotropically etched by using the resist pattern as a mask. Then, the resist pattern is separated.

(10) Step 13-10 (FIGS. 105A and 105B)

Then, the n-type polysilicon film (the first gate electrode) 105 is etched by using the silicon nitride film 109 as a mask. As a result, the n-type polysilicon film 105 having a predetermined pattern is formed.

(11) Step 13-11

The following process is the same as that for forming the usual DRAM memory cell. Note that the capacitor may be a stack type capacitor or a trench type capacitor.

Fourteenth Embodiment

Figure 106:
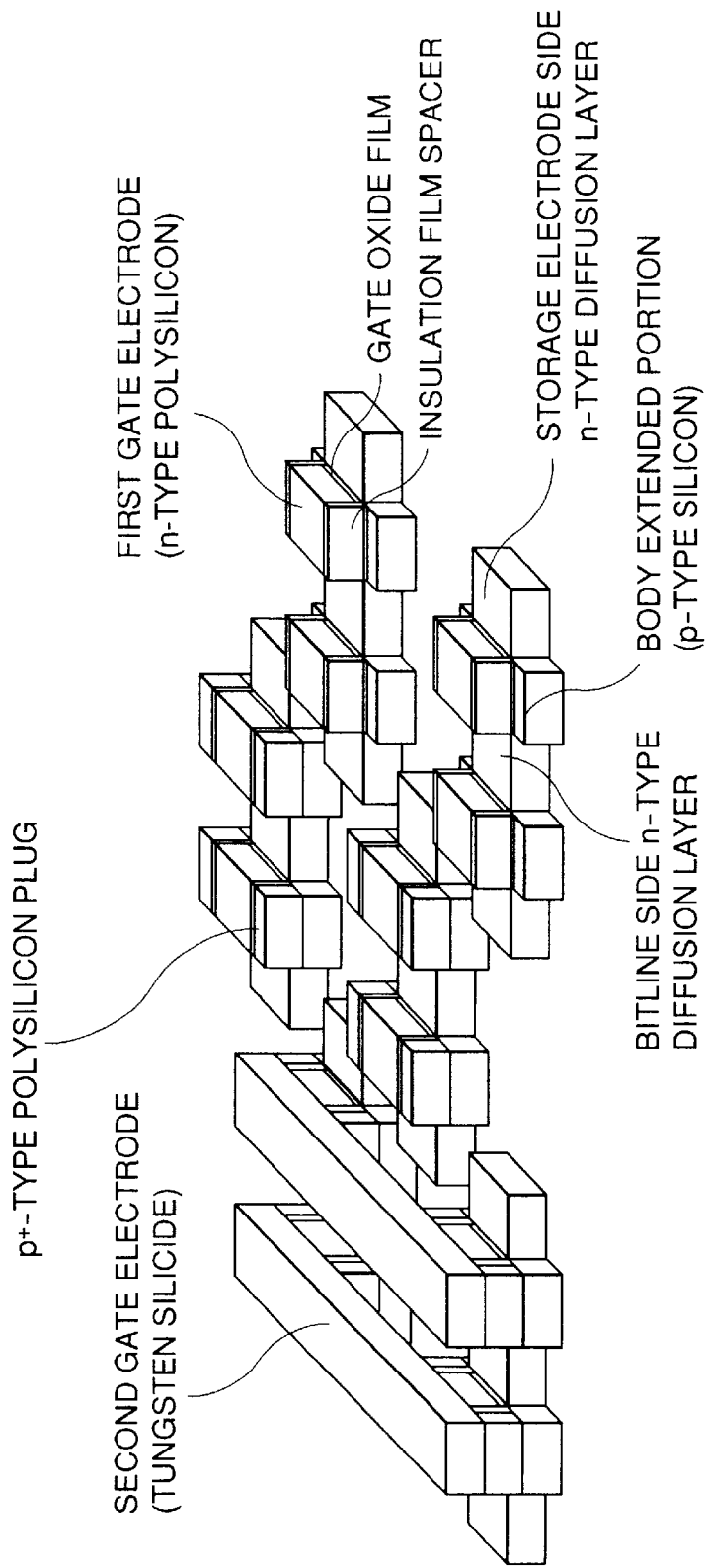
FIG. 106 is a perspective view showing a select transistor of a memory cell array of a DRAM having a body extended portion according to a fourteenth embodiment of the present invention.
Figure 107:
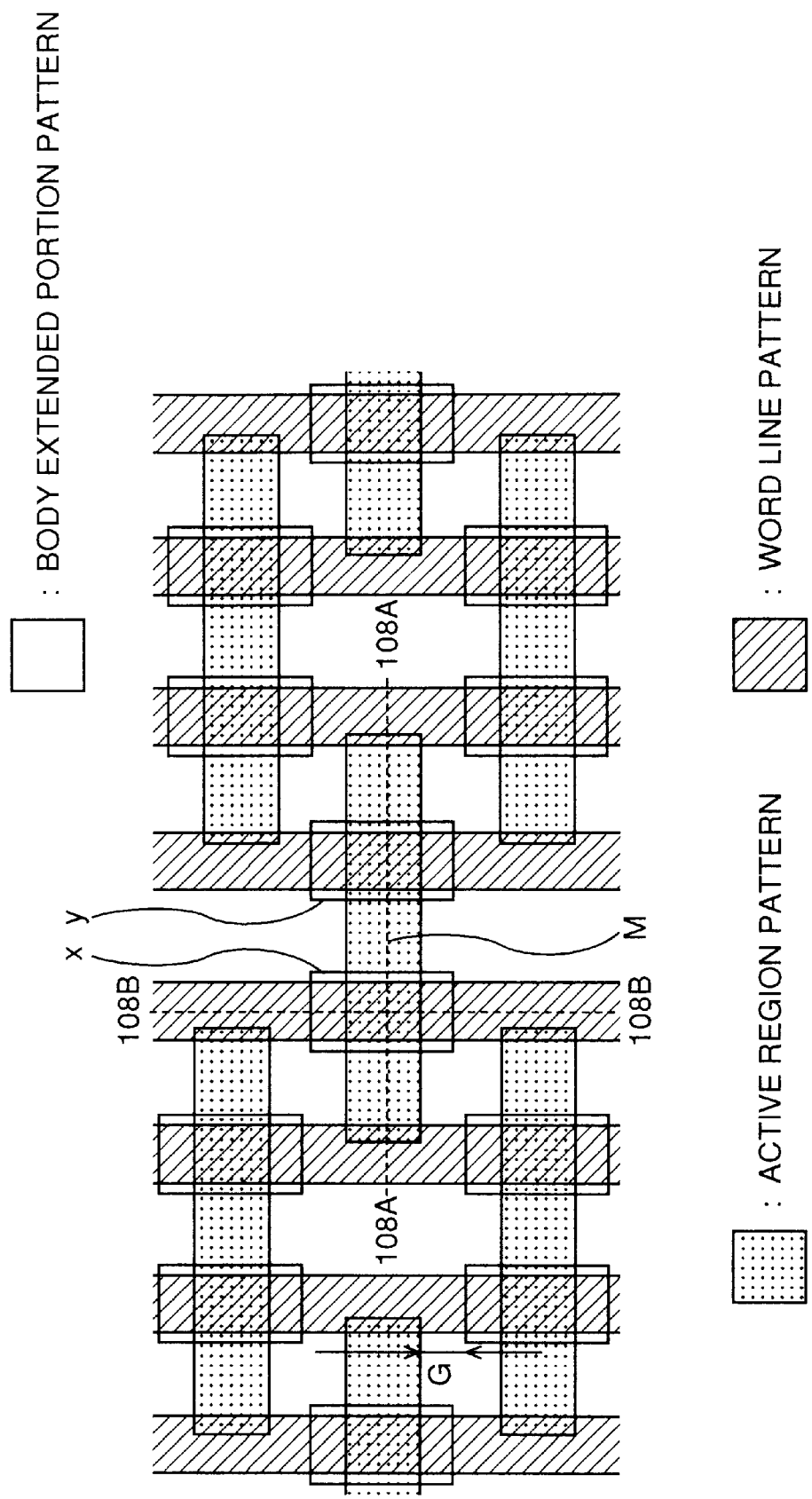
FIG. 107 is a diagram showing a variety of mask patterns for use to manufacture the MOS transistor according to the fourteenth embodiment.

FIG. 106 is a perspective view showing a select transistor of a memory cell array of a DRAM according to a fourteenth embodiment of the present invention. FIG. 107 shows a variety of mask patterns for use to manufacture the transistor according to this embodiment.

As described in the thirteenth embodiment, the conventional method cannot form the p-type silicon layer below the word line and make the p-type silicon layer to be the body extended portion. As described above, when the gate electrode and the body extended portion are coupled to each other by the conventional method shown in FIG. 1, a contact hole and the gate electrode having an opening having a size similar to that of the contact hole in the central portion thereof are required.

However, the above-mentioned method involves the area of the mechanism being enlarged. Since the gate (the word line) of the memory cell of the DRAM is usually designed to have a minimum featuring size F, a pattern, in which the central portion of the gate electrode is opened, cannot easily be formed.

On the other hand, the transistor according to this embodiment shown in FIG. 106, similarly to the eleventh embodiment, has a structure in which the second gate electrode and the body extended portion are coupled to each other by the $p^+$-type polysilicon plug formed on the side wall of the first gate electrode. Therefore, the contact hole is not required and the connection can be established with a very small area.

However, the manufacturing method according to the eleventh embodiment shown in FIG. 78 involves the oxide film P on the silicon portion Q in the body extended portion serves as a mask to cause the silicon portion Q to be omitted from etching when the pattern of the gate electrode is transferred to the body extended portion, as shown in FIGS. 80A to 80C. Thus, the silicon portion Q is left in the peripheral portion of the device region.

The above-mentioned fact that silicon is left does not raise a problem in a case of, for example, the transistor shown in FIG. 78 and arranged such that one gate is formed in one device region. However, since two word lines are formed in the device region M shown in FIG. 107, the two word lines short-circuit through the silicon or the plug member in the body extended portion which has been masked by the oxide film and which has been omitted from etching.

Accordingly, this embodiment employs the pattern of the body extended portion as shown in FIG. 107 so that body extended portions (and polysilicon plugs formed on the surfaces of the body extended portions) indicated with symbols x and y shown in FIG. 107 are separated by anisotropic etching.

Figure 108A:
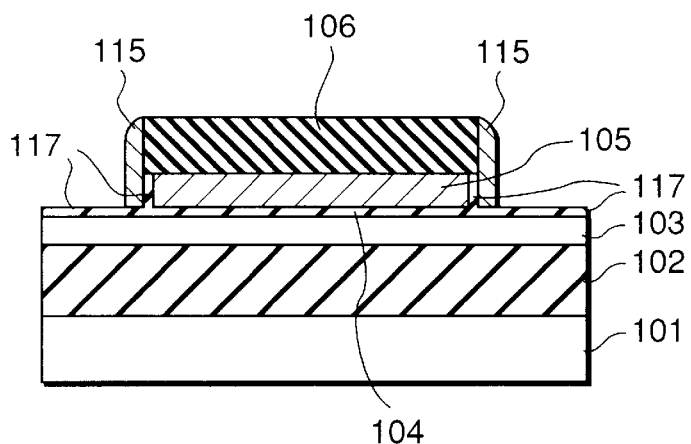
FIGS. 108A and 108B are cross sectional views showing the process of a method of manufacturing a MOS transistor having a body extended portion according to the fourteenth embodiment of the present invention.

Referring to FIGS. 108A to 111B, a manufacturing method according to this embodiment will now be described. FIGS. 108A to 111B are arranged such that FIGS. 108A and 108B are cross sectional views respectively taken along lines 108A—108A and 108B—108B shown in FIG. 107 which is a plan view.

Figure 108B:
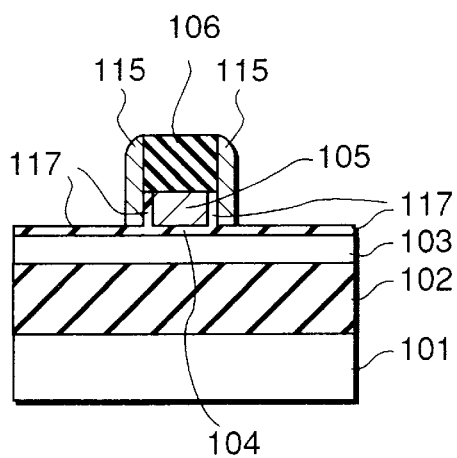

(1) Step 14-1 (FIGS. 108A and 108B)

The same processes in steps 13-1 and 13-2 according to the thirteenth embodiment are performed.

(2) Step 14-2 (FIGS. 108A and 108B)

Then, the n-type polysilicon film 105 is anisotropically etched by using the silicon nitride film 106 as a mask. Then, the resist pattern RS1 is separated.

(3) Step 14-3 (FIGS. 108A and 108B)

Then, heat oxidation is performed so that a silicon oxide film 117 is formed on the side wall of the n-type polysilicon film 105, the side wall of the silicon layer 103 and the surface of the silicon layer 103 in the body extended portion.

(4) Step 14-4 (FIGS. 108A and 108B)

Then, a p-type polysilicon film having a thickness of about 30 nm is formed on the overall surface, and the p-type polysilicon film is anisotropically etched so that a spacer 115 is formed.

Figure 109B:
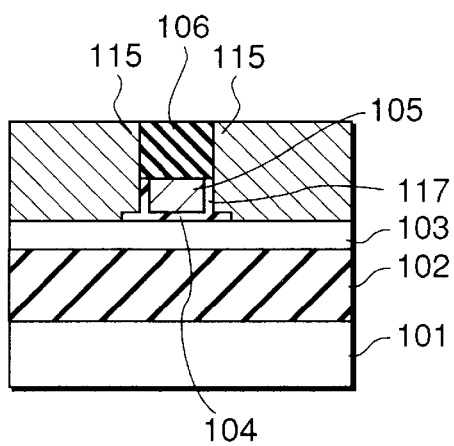
FIGS. 109A and 109B are cross sectional views showing the process of the method of manufacturing the MOS transistor having the body extended portion according to the fourteenth embodiment of the present invention.
Figure 109A:
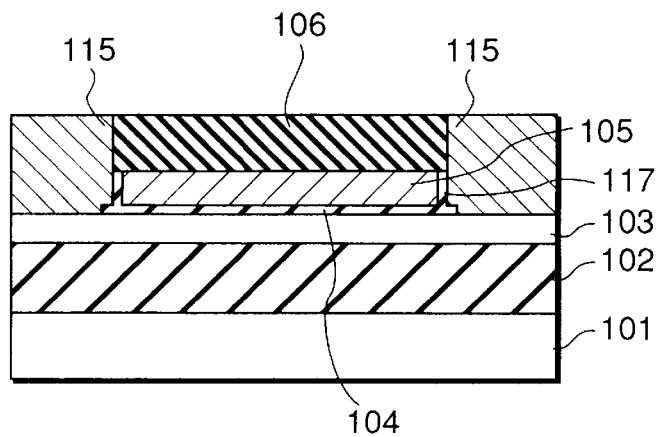

(5) Step 14-5 (FIGS. 109A and 109B)

Then, wet etching is performed by using hydrofluoric acid or ammonium fluoride so that the silicon oxide film 117 is removed. Then, a p-type silicon film 115 is further formed to have a thickness larger than the thickness required to embed the memory cell array, and the p-type polysilicon film 115 is etched back by CDE or CMP to have the same height as that of the silicon nitride film 106.

Figure 110A:
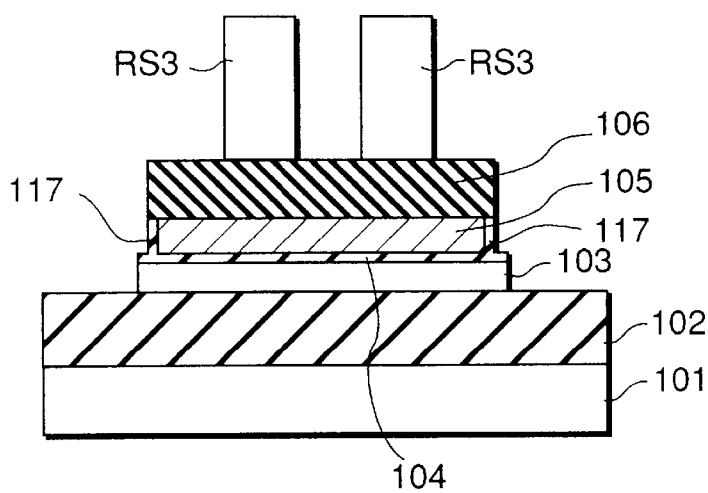
FIGS. 110A and 110B are cross sectional views showing the process of the method of manufacturing the MOS transistor having the body extended portion according to the fourteenth embodiment of the present invention.
Figure 110B:
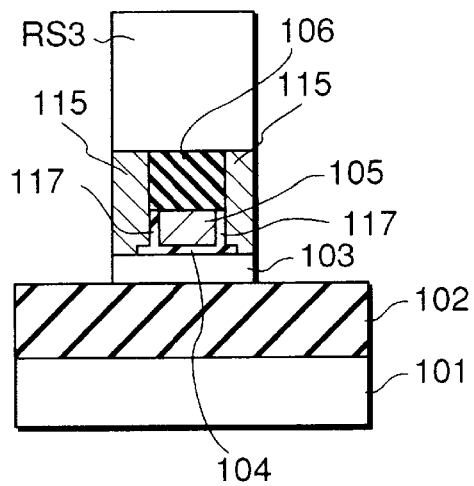

(6) Step 14-6 (FIGS. 110A and 110B)

Then, a resist pattern RS3 having the pattern of the body extended portion shown in FIG. 107 is formed. Then, the n-type polysilicon film 105, the silicon layer 103 and the p-type silicon film 115 (the p$^+$-type silicon plug) are anisotropically etched by using the resist pattern RS3 and the silicon nitride film 106 as masks.

(7) Step 14-7

Then, the resist pattern RS3 is separated, and then the p-type polysilicon film 115 is etched back to have the same height as that of the n-type polysilicon.

(8) Step 14-8

Figure 111B:
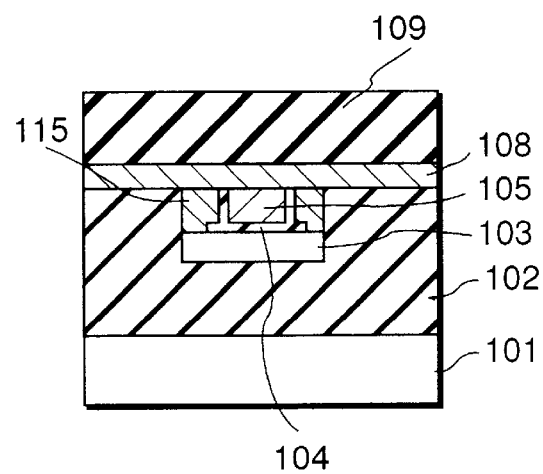
FIGS. 111A and 111B are cross sectional views showing the process of the method of manufacturing the MOS transistor having the body extended portion according to the fourteenth embodiment of the present invention.
Figure 111A:
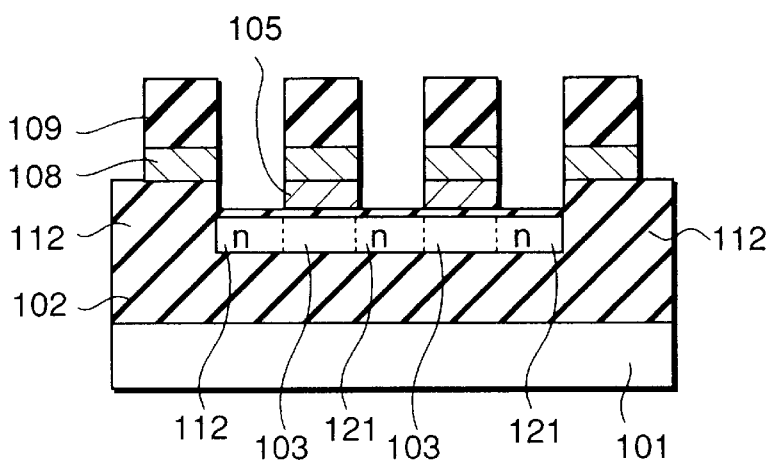

The following process is the same as that following step 13-7 according to the thirteenth embodiment. Cross sections in a stage where the gate electrode has been formed are shown in FIGS. 111A and 111B.

Fifteenth Embodiment

Figure 112:
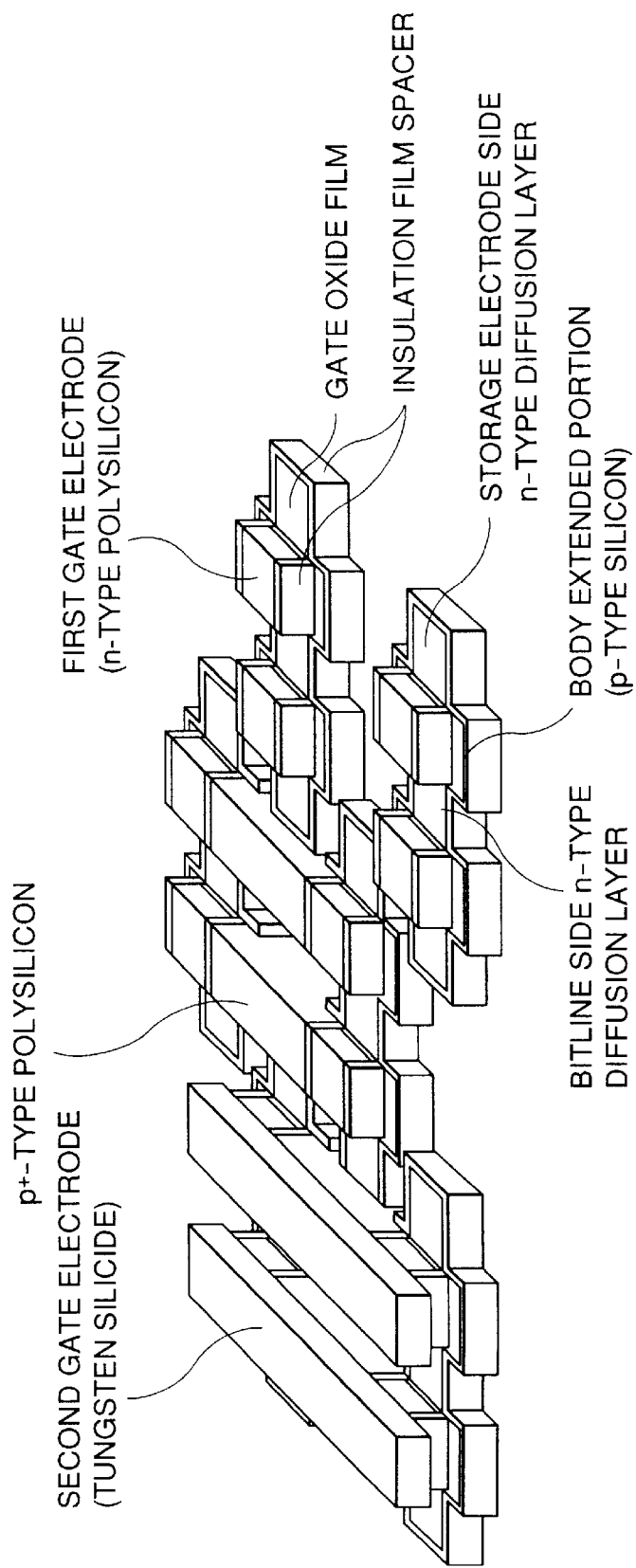
FIG. 112 is a perspective view showing a select transistor of a memory cell array of a DRAM according to a fifteenth embodiment of the present invention.
Figure 113:
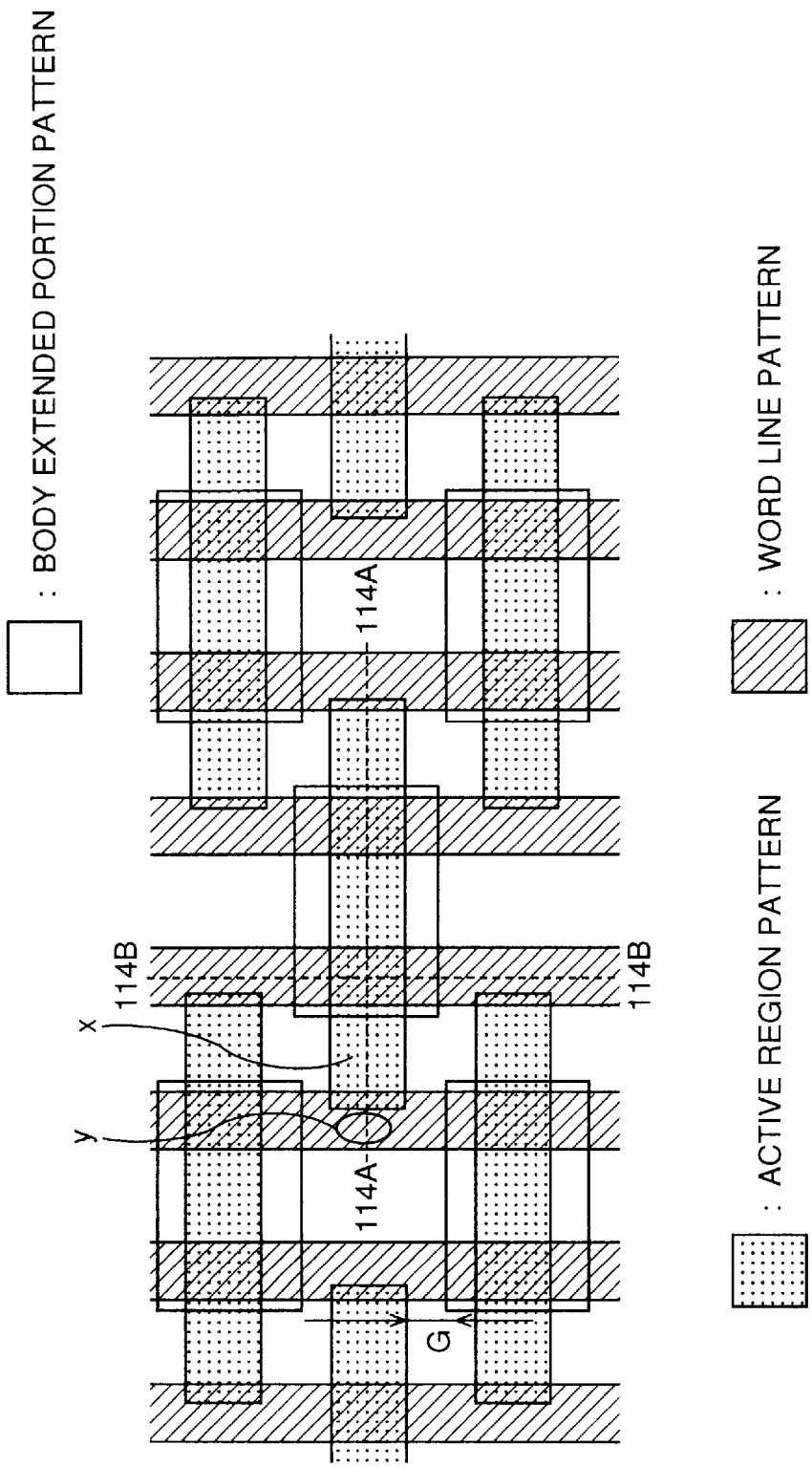
FIG. 113 is a diagram showing a variety of mask patterns for use to manufacture the MOS transistor according to the fifteenth embodiment.

FIG. 112 is a perspective view showing a select transistor of a memory cell array of a DRAM according to a fifteenth embodiment of the present invention. FIG. 113 shows a variety of mask patterns for use to manufacture the select transistor. The mask pattern according to the fourteenth embodiment shown in silicon oxide film 107 may be employed to form the same structure.

The MOS transistor according to the twelfth embodiment, as shown in FIG. 87, has the structure in which also the p$^+$-type silicon layer and the p$^+$-type polysilicon plug exist also below the second gate electrode of a non-device region.

If the foregoing structure is as it is applied to the memory cell array of the DRAM, the p$^+$-type silicon layer is formed below the word line (the second gate electrode). Thus, a multiplicity of n-type diffusion layers adjacent to the storage electrode are coupled to one word line. As a result, p-n junction leak increases undesirably.

Accordingly, this embodiment has a structure in which an insulation film spacer is also formed on the side wall of the silicon layer, as shown in FIG. 112. As a result, the n-type diffusion layer adjacent to the storage electrode indicated with symbol x shown in FIG. 113 and the p$^+$-type polysilicon (a portion indicated with symbol y shown in FIG. 113) formed below the passing word line are insulated from each other by the insulation film spacer. Therefore, any p-n junction leak is not generated.

Since the p-type polysilicon is, in place of the oxide film, embedded in the field region when the gate electrode is formed by anisotropic etching, short-circuit of the word line described in the fourteenth embodiment can be prevented.

Figure 114A:
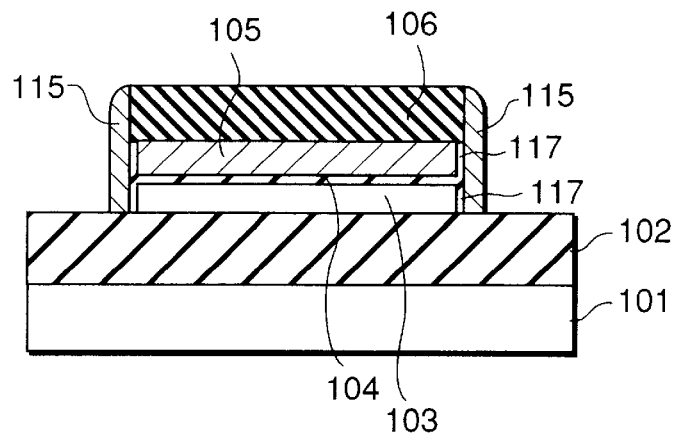
FIGS. 114A and 114B are cross sectional views showing the process of a method of manufacturing a MOS transistor having a body extended portion according to the fifteenth embodiment of the present invention.

Referring to FIGS. 114A to 118B, a manufacturing method according to this embodiment will now be described. FIGS. 114A to 118B are arranged such that FIGS. 114A and 114B are cross sectional views respectively taken along lines 114A—114A and 114B—114B shown in FIG. 113.

The manufacturing according to this embodiment will now be described.

Figure 114B:
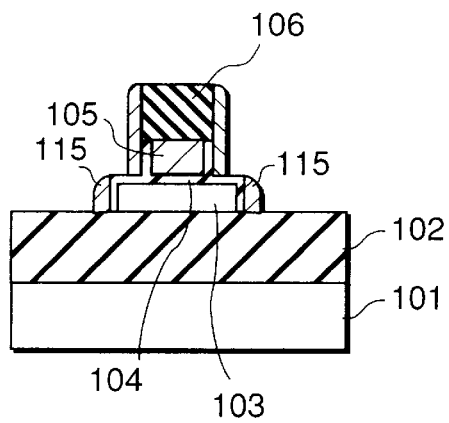

(1) Step 15-1 (FIGS. 114A and 114B)

Initially, the same process in steps 13-1 to 13-5 according to the thirteenth embodiment is performed.

(2) Step 15-2 (FIGS. 114A and 114B)

Then, the process in step 14-4 according to the fourteenth embodiment is performed.

Figure 115B:
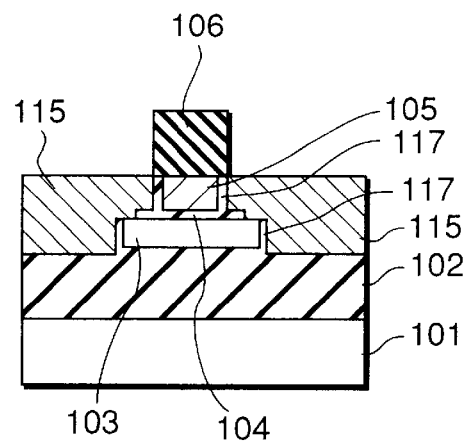
FIGS. 115A and 115B are cross sectional views showing the process of the method of manufacturing the MOS transistor having the body extended portion according to the fifteenth embodiment of the present invention.
Figure 115A:
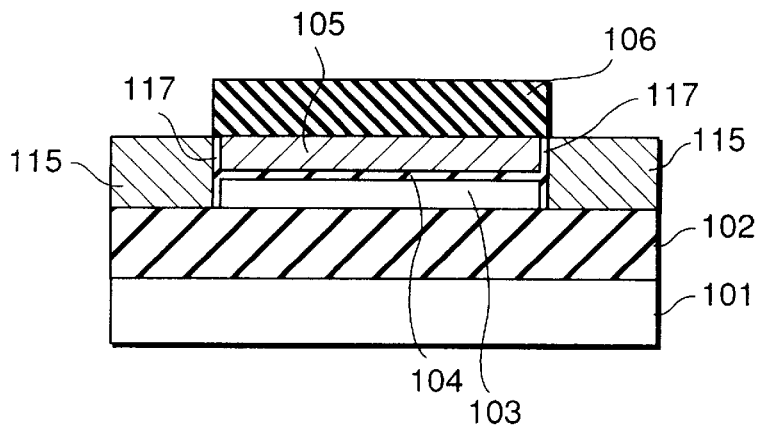

(3) Step 15-3 (FIGS. 115A and 115B)

Then, wet etching is performed by using hydrofluoric acid or ammonium fluoride so that the exposed silicon oxide film 117 is etched. Then, a p-type polysilicon film 115 having a thickness which is larger than the thickness for embedding the memory cell array is formed, and then the p-type polysilicon film 115 is etched back by the CDE method to have the same height as that of the n-type polysilicon film 105.

Then, the process following step 13-7 according to the thirteenth embodiment is performed. Cross sectional views in a state in which the gate electrode has been formed are shown in FIGS. 116A and 116B.

Although the foregoing process has formed the structure in which the p-type polysilicon film 115 is coupled to the surface of the body extended portion as shown in FIG. 115B, the p-type polysilicon film 115 may be coupled to the side surface of the body extended portion in order to enlarge the area of contact. A method for establishing the foregoing connection will now be described.

Initially, the exposed gate oxide film 104 is removed by anisotropic etching after step 15-2 has been performed. Then, the silicon layer 103 around the gate portion is removed by anisotropic etching. At this time, also the p-type polysilicon film 115 is etched. Cross sections in this stage are shown in FIGS. 117A and 117B. As shown in FIGS. 117A and 117B, the silicon oxide film 117 formed on the side wall of the body extended portion is left in the form of a fence.

Figure 118A:
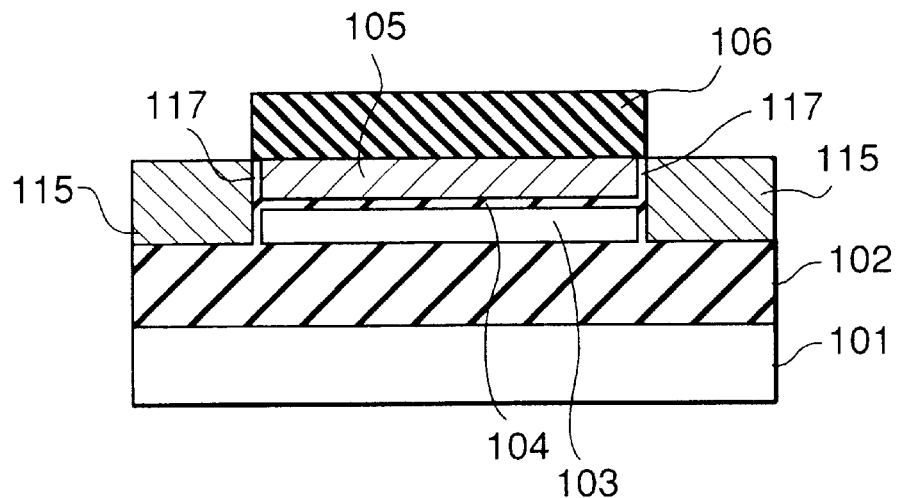
FIGS. 118A and 118B are cross sectional views showing the process of the method of manufacturing the MOS transistor having the body extended portion according to the fifteenth embodiment of the present invention.
Figure 118B:
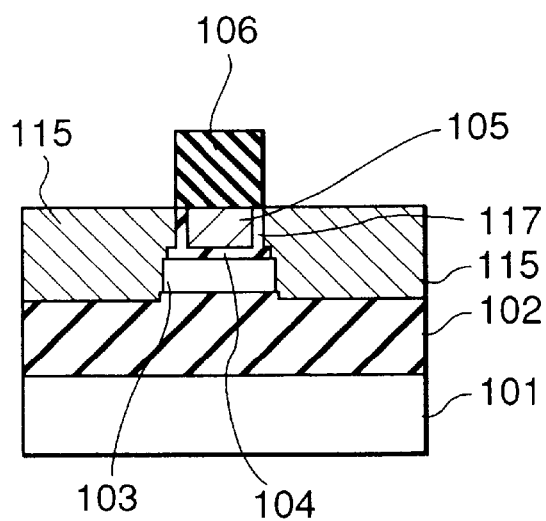

Then, step 15-3 is performed. In this step, wet etching is performed by using hydrofluoric acid or ammonium fluoride so that the silicon oxide film 117 left in the form of the fence attributable to the wet etching is etched from the two sides and thus the silicon oxide film 117 disappears. Thus, the p-type polysilicon film 115 is also coupled on the side surface of the body extended portion. Cross sections in this state are shown in FIGS. 118A and 118B.

Sixteenth Embodiment

Figure 119:
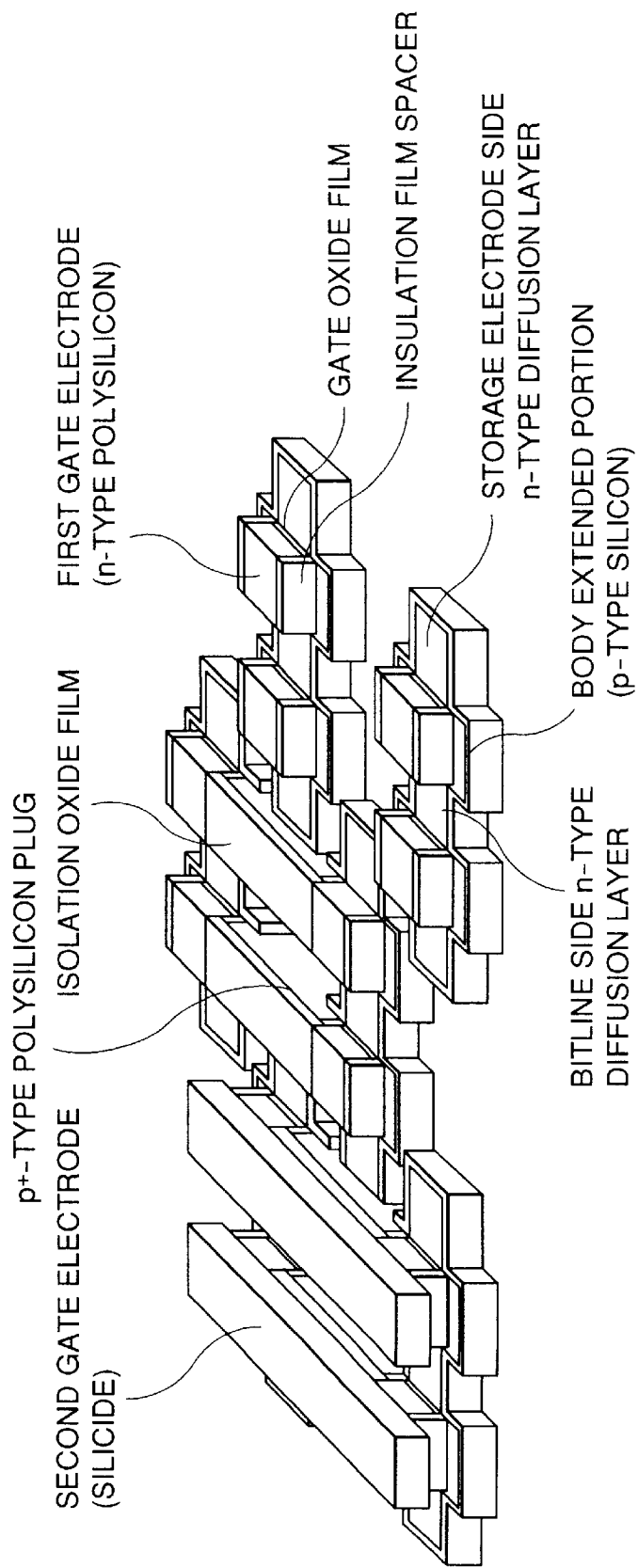

FIG. 119 is a perspective view showing a select transistor of a memory cell array of a DRAM according to a sixteenth embodiment of the present invention.

In this embodiment, a p$^+$-type polysilicon plug extending in the direction of the word line is coupled to the body extended portion (p-type silicon). A second gate electrode (tungsten silicide) integrated with the word line through an isolation oxide film is formed on the p$^+$-type polysilicon plug. The second gate electrode is coupled to the first gate electrode (n-type polysilicon). The first gate electrode is isolated from the p$^+$-type polysilicon plug by the insulation film spacer.

In the fourteenth and fifteenth embodiments, in each of which the body and the word line (the second gate electrode) are coupled to each other, the body is applied with the same potential as the potential which is applied to the word line. Since the threshold voltage is lowered when the voltage level of the word line is raised because the potential of the body is raised, electric charges in the storage electrode (a capacitor) can be fetched to the bit line with a word line potential having a small amplitude.

On the other hand, the potential of the source and the drain (an n-type diffusion layer) to which the bit line is coupled and the potential of the source and the drain (an n-type diffusion layer) to which the storage electrode is coupled may be a potential between a high potential corresponding to data "1" and a low potential level corresponding to data "0".

Therefore, data can be read/write under condition that the raised potential of the word line is higher than the threshold voltage even if the source and the drain (the n-type diffusion layer) and that the p-n junction between the n-type diffusion layer and the body (p-type silicon) is forwards biased and no forward current does not flow between the body and the bit line when the source and the drain (the n-type diffusion layer) has a low potential. That is, the upper limit for the word line is, in the fourteenth and fifteenth embodiments, limited by the forward biasing characteristic of the body and the bit line.

Since this embodiment has a structure in which the body extended portion and the first and second electrodes are insulated from one another by the insulation oxide film and the insulation spacer, the body and the word line can be supplied with different potentials. Thus, the body and the word line can independently be controlled.

Although the potential of the body is raised when the potential of the word line is raised, the potential of the body is made to be not higher than the low potential level for the bit line. The upper limit of the potential for the word line may be determined independently from the potential of the body. As a result, the margin permitted for the threshold voltage for the transistor and that permitted for rise in the voltage level can be widened.

Referring to FIGS. 120A, 120B, 121A and 121B, a manufacturing method according to this embodiment will now be described. The manufacturing method according to this embodiment has a structure in which the embodiment according to the seventh embodiment is applied to the fifteenth embodiment. Either of the resist pattern shown in FIG. 107 or that shown in FIG. 113 may be employed. FIGS. 120A, 120B, 121A and 121B are cross sectional views respectively taken along lines 108A—108A, 108B—108B, 113A—113A and 113B—113B shown in FIG. 107 or FIG. 113.

(1) Step 16-1 (FIGS. 120A and 120B)

Initially, the same process as that in steps 15-1 to 15-3 according to the fifteenth embodiment is performed. Note that the p-type polysilicon film 115 is, in step 15-3, etched back by an amount which is reduced by a degree corresponding to the thickness of the isolation oxide film 116.

(2) Step 16-2 (FIGS. 120A and 120B)

Then, an isolation oxide film 116 is formed on the overall surface, and then the isolation oxide film 116 is polished by CMP by using the silicon nitride film 106 as a stopper so that the surface of the isolation oxide film 116 is smoothed and flattened. The isolation oxide film 116 insulates a second gate electrode 108, which will be formed later, from the p$^+$-type polysilicon plug.

Then, the isolation oxide film 116 is oxidized so as to be densified, if necessary. The foregoing process is performed to prevent complete removal of the isolation oxide film 116 by wet etching using hydrofluoric acid or ammonium fluoride solution which is performed as a process for naturally removing an oxide film which is performed before the tungsten silicide film is formed.

(3) Step 16-3 (FIGS. 121A and 121B)

Then, processes in steps 13-8 and 13-9 according to the thirteenth embodiment are performed.

(4) Step 16-4 (FIGS. 121A and 121B)

Then, the tungsten silicide film 108 is anisotropically etched by using the silicon nitride film 109 as a mask. At this time, the etching period of time is adjusted in such a manner that only the tungsten silicide film 108 is etched and the n-type polysilicon film 105 on the device region is not etched.

(5) Step 16-5 (FIGS. 121A and 121B)

Then, the isolation oxide film 116 is selectively anisotropically etched in such a manner that the silicon nitride film 109 is not etched. Then, the n-type polysilicon film 105 is anisotropically etched. As a result of the foregoing anisotropic etching, the pattern of the word line is transferred to the n-type polysilicon film 105 in the device region. On the other hand, also the silicon layer 103 and the p-type polysilicon film 115 in a region except for the word line region in the non-device region are etched. As a result, a body extended portion is formed in a self-alignment manner below the pattern of the word line.

Although this embodiment has the structure in which the body extended portion is separated to be aligned to each word line to be supplied with a potential which is changed as time elapses in synchronization with the word line, a structure similar to that according to the thirteenth embodiment may be employed in which the body extended portion is shared by all cell transistors and thus a fixed potential is applied.

Seventeenth Embodiment

Figure 122:
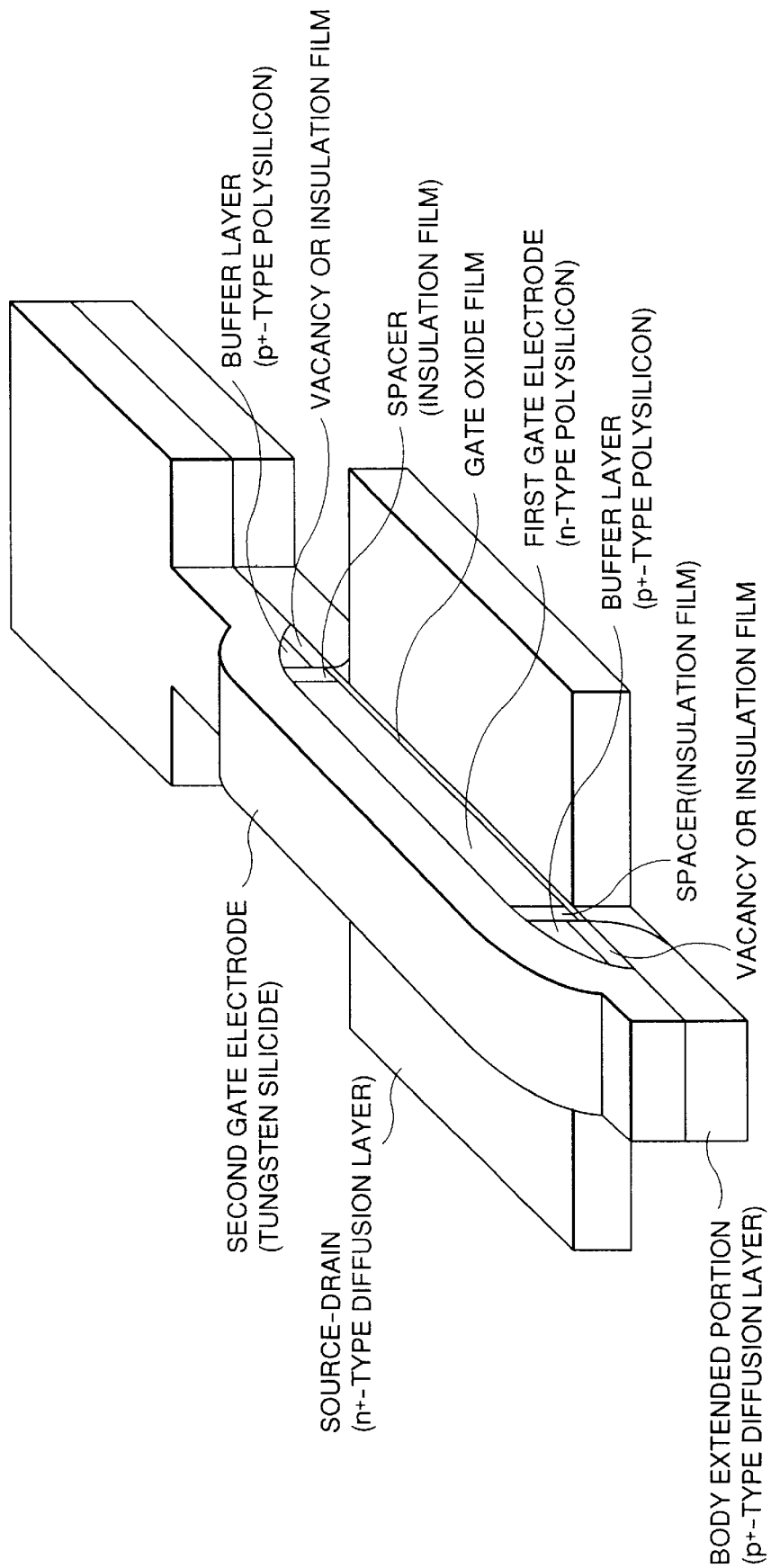

FIG. 122 is a perspective view showing a MOS transistor according to a seventeenth embodiment of the present invention and having a body extended portion.

A first characteristic of this embodiment lies in that the second gate electrode (tungsten silicide) is coupled to the top surface of the body extended portion (p-type diffusion layer). The area of contact between the second gate electrode and the top surface of the body extended portion can easily be enlarged as compared with enlargement of the area of contact between the second gate electrode and the side surface of the body extended portion. Therefore, this embodiment is able to reduce the area of contact between the second gate electrode and the body extended portion and thus a higher operation can be performed.

A second characteristic of this embodiment lies in that a buffer layer (p$^+$-type polysilicon) is formed on the body extended portion (a p$^+$-type diffusion layer) adjacent to a boundary from the first gate electrode (n-type polysilicon) and that the second gate electrode is coupled to the body extended portion across the buffer layer.

Since the buffer layer is formed to have a height which is reduced in proportion to the distance from the first gate electrode, the difference in level between the first gate electrode and the substrate potential control layer can be mitigated. As a result, disconnection of the second gate electrode can be prevented and the resist pattern for forming the second gate electrode can be easily formed.

Since the buffer layer is formed, the body extended portion (the p$^+$-type diffusion layer) is formed not to join the source and the drain (an n$^+$-type diffusion layer). Thus, formation of a p-n junction containing a high concentration impurity causing a leak current can be prevented.

Since this embodiment employs n-type polysilicon to form the first gate electrode and p$^+$-type silicon is employed to form the buffer layer, the characteristics of the device can be improved as follows.

Since n-type polysilicon film has an internal potential higher than that of p-type silicon, a depletion layer and an inversion layer can easily be formed in a semiconductor below the n-type polysilicon as compared with a semiconductor below p-type silicon.

Therefore, if a buffer layer made of n-type polysilicon is disposed on the body extended portion (a p$^+$-type diffusion layer), a depletion layer and inversion layer are formed in the body extended portion (the p$^+$-type diffusion layer) below the buffer layer.

As a result, the parasitic capacitance is enlarged and a leak current is increased attributable to a diffusion current caused from the p-n junction, a recombination current caused from the recombination center included in the depletion layer and a tunnel current between bands which is generated between the inversion layer and the body extended portion below the inversion layer. Therefore, it is preferable that the buffer layer be made of p$^+$-type polysilicon having a low internal potential.

Since the n-type polysilicon has the internal potential higher than that of the p-type silicon, employment of p-type polysilicon as the material for the first gate electrode results in the threshold voltage being raised excessively.

Therefore, when the p-type polysilicon is employed to form the first gate electrode, counter doping, in which an n-type impurity is doped into the channel region, must be performed to lower the threshold voltage.

However, counter doping undesirably causes a fact that the channel is induced at a certain depth from the surface of the substrate takes place, that is, a so-called embedded type MOS transistor is undesirably formed.

As a result, the design of the transistor becomes too complicated. What is worse, the characteristics of the deviation deteriorates such that the potential of the body cannot easily be transmitted to the channel because of the embedded channel type structure and performance for preventing the short channel effect deteriorates. Therefore, it is preferable that the first gate electrode be made of the n-type polysilicon having a high internal potential.

Referring to FIGS. 123 to 130C, a method of manufacturing a MOS transistor according to this embodiment will now be described. FIG. 123 is a plan view showing a variety of mask patterns for use to manufacture the MOS transistor according to this embodiment. FIGS. 124A to 130C are arranged such that FIGS. 124A, 124B and 124C are cross sectional views respectively taken along lines 124A—124A, 124B—124B and 124C—124C shown in FIG. 123.

Figure 124A:
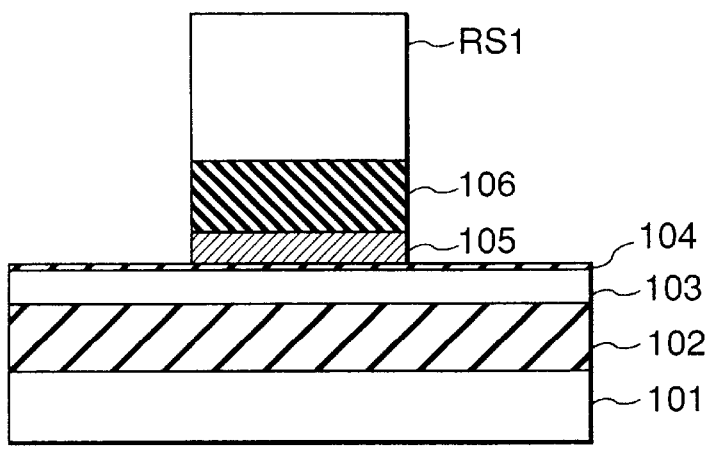
Figure 124B:
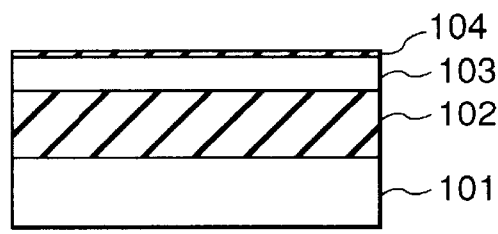
Figure 124C:
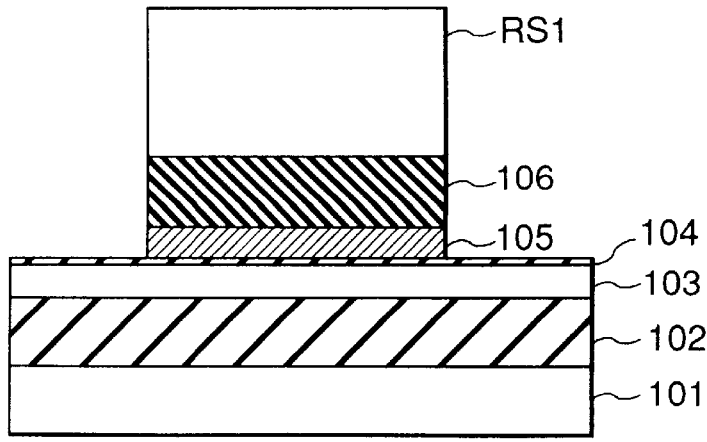

(1) Step 17-1 (FIGS. 124A to 124C)

Initially, an SOI substrate composed of a support substrate 101, a buried oxide film 102 and a silicon layer (SOI) 103 is formed. Then, the threshold voltage is adjusted by implanting ions of a p-type impurity into the silicon layer 103.

Then, a gate oxide film 104 having a thickness of about 5 nm to 50 nm is formed on the silicon layer 103, and then a polysilicon film is formed on the gate oxide film 104 by the CVD method. Then, n-type impurity ions are implanted into the gate oxide film 104 so that an n-type polysilicon film 105 serving as the first gate electrode is formed.

Note that a silicon film having a thickness of about 50 nm may be formed on the silicon layer 103 by epitaxial growth and then the gate oxide film 104 may be formed on the silicon film.

Then, a silicon nitride film 106 having a thickness of about 100 nm is formed on the n-type polysilicon film 105 by the CVD method.

(2) Step 17-2 (FIGS. 124A to 124C)

Then, a resist pattern RS1 for defining the pattern of the device region shown in FIG. 123 is formed, and then the silicon nitride film 106 and the n-type polysilicon film 105 are anisotropically etched by using the resist pattern RS1 as a mask.

Figure 125A:
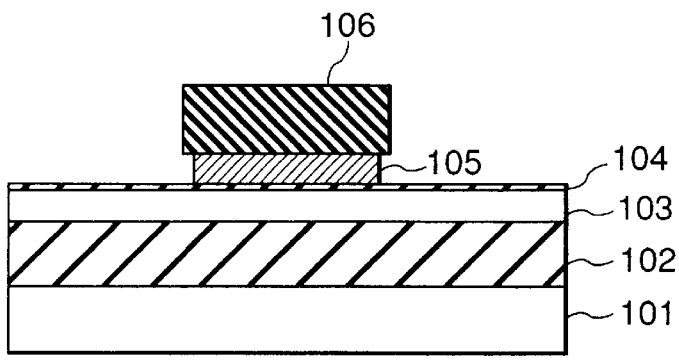
Figure 125B:
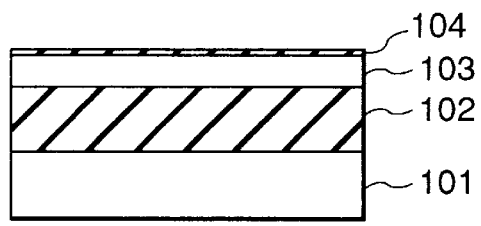
Figure 125C:
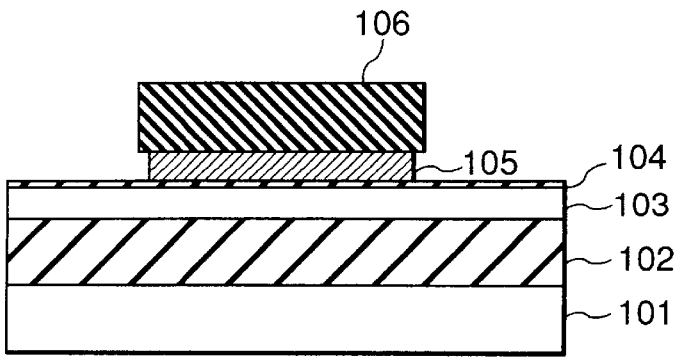

(3) Step 17-3 (FIGS. 125A to 125C)

Then, the resist pattern RS1 is separated, and then the side surface of the n-type polysilicon film 105 is etched by an isotropic etching method, such as CDE. At this time, the top surface of the n-type polysilicon film 105 is protected by the silicon nitride film 106 so that the top surface is not etched.

Figure 126A:
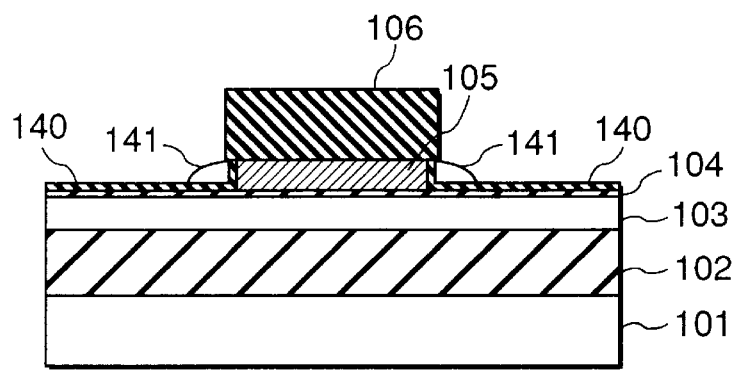
Figure 126B:
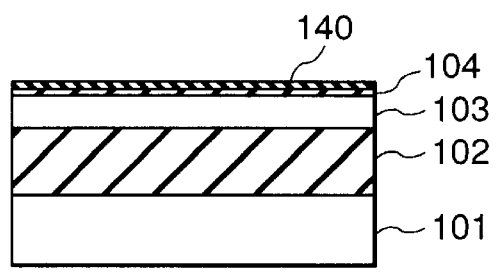
Figure 126C:
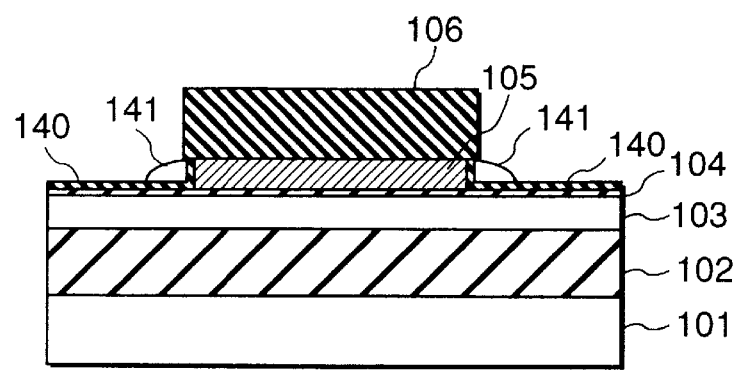

(4) Step 17-4 (FIGS. 126A to 126C)

Then, a heat oxidation method is employed to form a silicon oxide film (a spacer) 140 on the side wall of the n-type polysilicon film 105. At this time, also the silicon oxide film 140 is formed on the exposed gate oxide film 104.

(5) Step 17-5 (FIGS. 126A to 126C)

Then, an undoped polysilicon film having a thickness of about 200 nm is formed on the overall surface to serve as a buffer layer 141, and then the polysilicon film is anisotropically etched. Thus, the buffer layer 141 is formed on the side surface of the n-type polysilicon film 105. The buffer layer 141 is in contact with the side surface of the n-type polysilicon film 105 through a spacer 140.

Figure 127A:
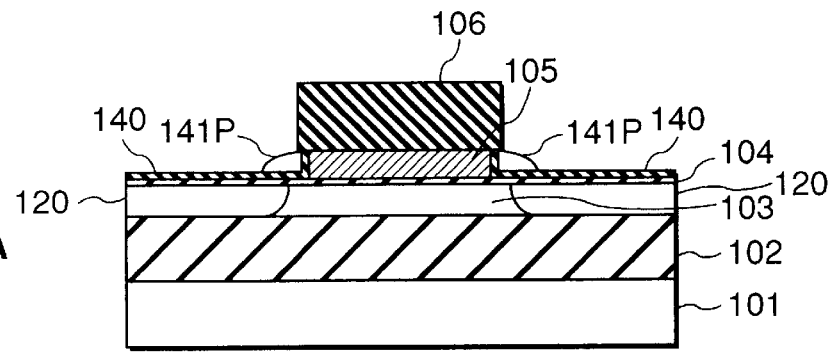
Figure 127B:
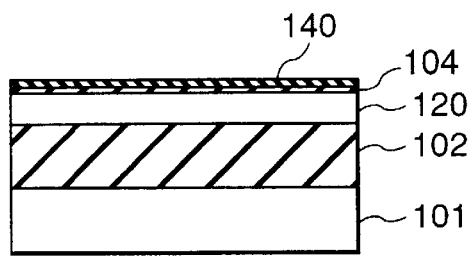
Figure 127C:
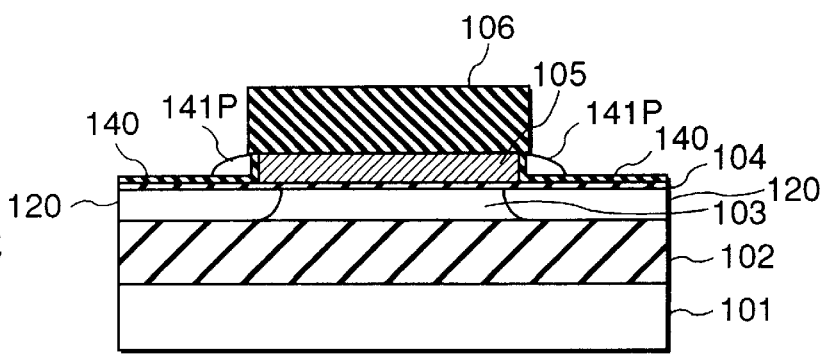

(6) Step 17-6 (FIGS. 127A to 127C)

Then, p-type impurity ions are implanted into the silicon layer 103 by using the silicon nitride film 106 as a mask so that a body extended portion (a p$^+$-type diffusion layer) 120 is formed. At this time, also p-type impurity ions are implanted into the buffer layer (the undoped polysilicon film) 141 so that a low resistance buffer layer (p$^+$-type polysilicon) 141p is obtained.

Figure 128A:
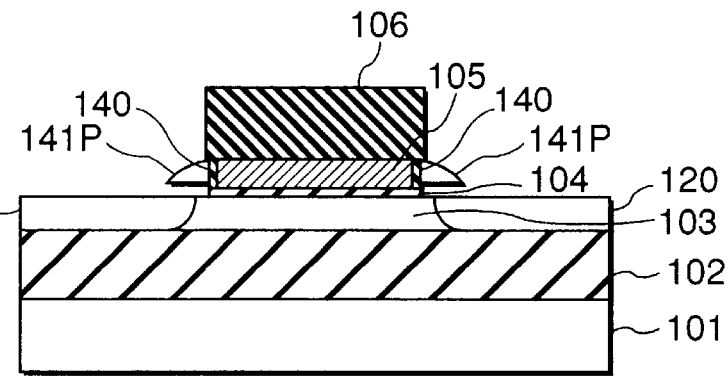
Figure 128B:
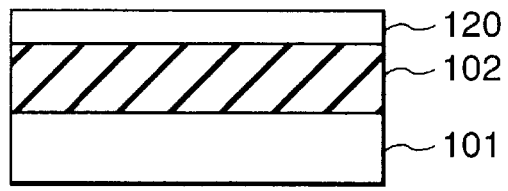
Figure 128C:
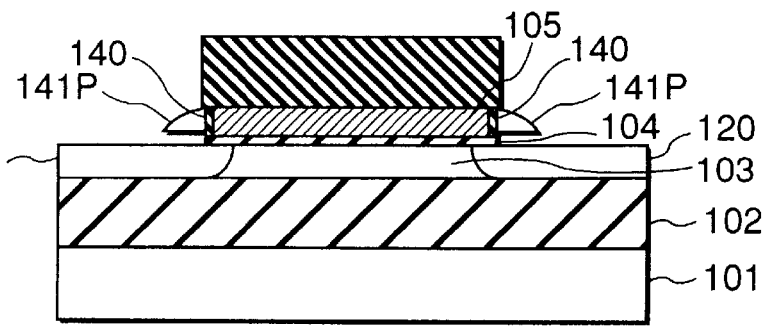

(7) Step 17-7 (FIGS. 128A to 128C)

Then, wet etching is performed by using hydrofluoric acid or ammonium fluoride solution so that the exposed silicon oxide film 140, the gate oxide film 104 below the silicon oxide film 140, the silicon oxide film 140 below the buffer layer 141p and the gate oxide film 104 below the silicon oxide film 140 are removed.

Figure 129A:
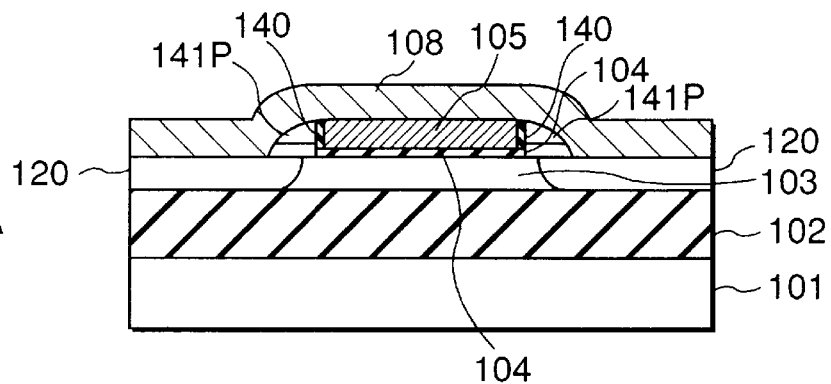
Figure 129B:
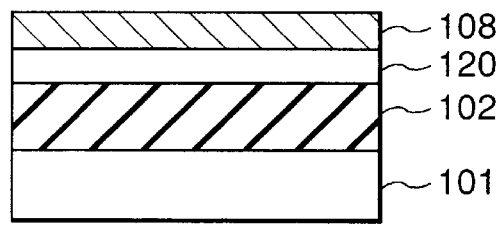
Figure 129C:
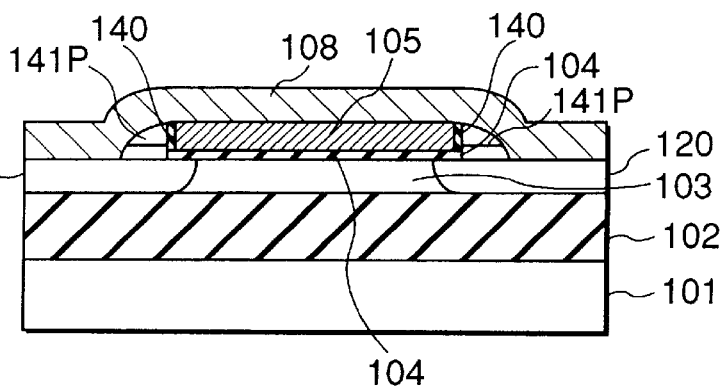

(8) Step 17-8 (FIGS. 129A to 129C)

Then, the silicon nitride film 106 selectively removed, and then a tungsten silicide film 108 serving as the second gate electrode is formed on the overall surface by a sputtering method. At this time, a portion below the buffer layer 141p in which the silicon oxide film 140 does not exist is formed into a vacancy layer.

Note that another silicon oxide film (a post oxidation film) may be formed in the removed portion by a latter oxidation process after the silicon oxide film 140 has been removed in step 17-7.

Figure 130A:
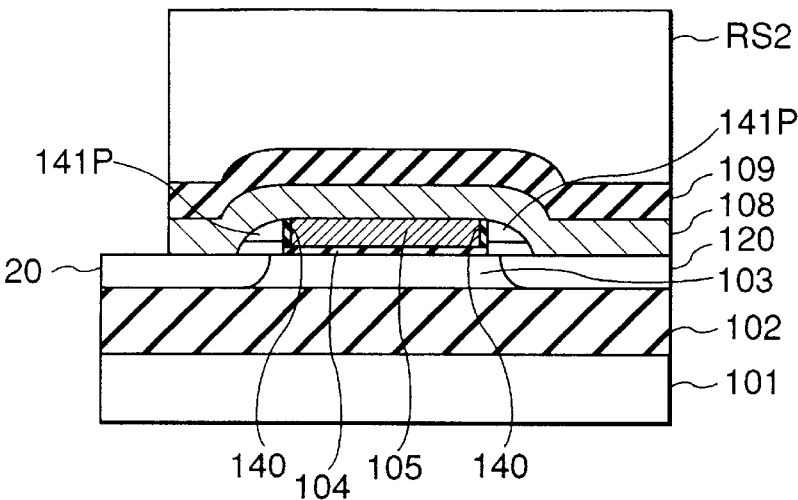
Figure 130B:
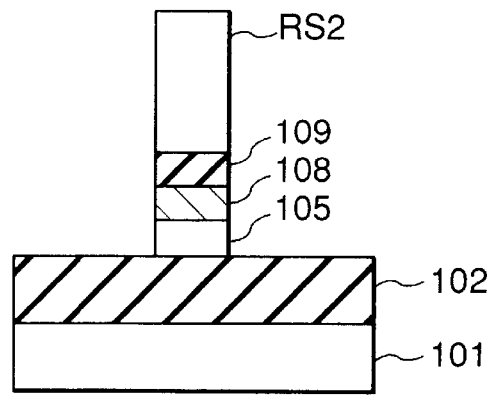
Figure 130C:
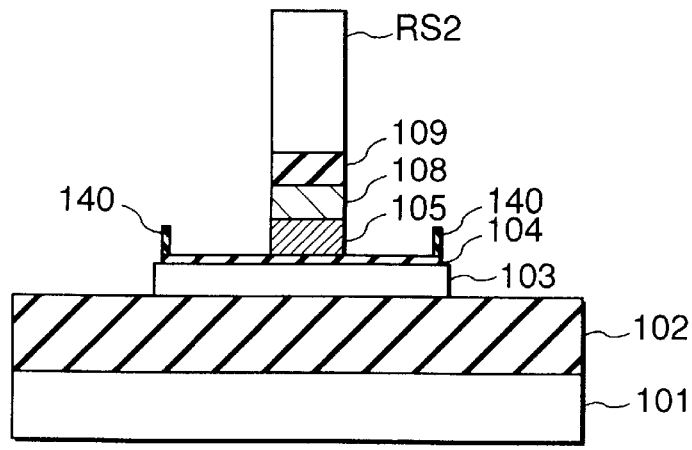

(9) Step 17-9 (FIGS. 130A to 130C)

Then, a silicon nitride film 109 is formed on the tungsten silicide film 108, and then a resist pattern RS2 for defining the pattern of a gate electrode shown in FIG. 123 is formed. Then, the silicon nitride film 109, the tungsten silicide film 108, the n-type polysilicon film 105, the silicon layer 103 and the body extended portion 120 are etched by using the resist pattern RS2 as a mask.

(10) Step 17-10

Then, the fence-shape silicon oxide film 140 shown in FIG. 130C is removed by a thin hydrofluoric acid process. The following process is the same as that for forming the usual MOS transistor.

Eighteenth Embodiment

FIG. 131 is a perspective view showing a MOS transistor according to an eighteenth embodiment of the present invention and having a body extended portion.

A first characteristic of the device according to this embodiment lies in that a buffer layer ($p^+$-type polysilicon) is in direct contact with the body extended portion (a $p^+$-type diffusion layer). As a result, the contact resistance between the body extended portion (the $p^+$-type diffusion layer) and the second gate electrode (tungsten silicide) can be lowered as compared with the seventeenth embodiment. In the seventeenth embodiment in which a portion below the buffer layer ($p^+$-type polysilicon) is in the form of a vacancy layer or a insulation film, the buffer layer ($p^+$-type polysilicon) is not in direct contact with the body extended portion (the $p^+$-type diffusion layer).

A second characteristic of the device according to this embodiment lies in that a titanium silicide film (not shown) is, in a self-alignment manner, formed on the first gate electrode (n-type polysilicon) and the source and the drain ($n^+$-type diffusion layer) so that the sheet resistance of the first gate electrode (n-type polysilicon) and source and the drain ($n^+$-type diffusion layer) is lowered.

Referring to FIGS. 132A to 137C, a method of manufacturing the MOS transistor according to this embodiment will now be described.

FIGS. 132A to 137C are arranged such that FIGS. 132A, 132B and 132C are cross sectional views respectively taken along lines 124A—124A, 124B—124B and 124C—124C shown in FIG. 123 which is a plan view. The various mask patterns for use to manufacture the MOS transistor according to this embodiment are the same as those according to the seventeenth embodiment (FIG. 123).

(1) Step 18-1

The same process as that in steps 17-1 (FIGS. 124A to 124C) and step 17-5 (FIGS. 126A to 126C) according to the seventeenth embodiment is performed.

(2) Step 18-2 (FIGS. 132A to 132C)

Then, wet etching is performed by using hydrofluoric acid or ammonium fluoride solution so that the exposed silicon oxide film 140, the gate oxide film 104 below the silicon oxide film 140, the silicon oxide film 140 below the buffer layer 141 and the gate oxide film 104 below the silicon oxide film 140 are removed.

Then, a gap below the buffer layer 141 is filled with an undoped polysilicon film 142. The polysilicon film 142 can be formed by forming an undoped polysilicon film having a thickness of, for example, about 50 nm and by etching back the polysilicon film by isotropic etching, such as CDE.

(3) Step 18-3 (FIGS. 133A to 133C)

Then, p-type impurity ions are implanted into the silicon layer 103 by using the silicon nitride film 106 as a mask so that a body extended portion ($p^+$-type diffusion layer) 120 is formed. At this time, also p-type impurity ions are implanted into the buffer layer (an undoped polysilicon film) 141 and the undoped polysilicon film 142 so that low resistance buffer layer (a $p^+$-type polysilicon film) 141$p$ and a $p^+$-type polysilicon film 142$p$ are obtained. The $p^+$-type polysilicon film 142$p$, together with the buffer layer (a $p^+$-type polysilicon film) 141$p$, form a buffer layer. Thus, the buffer layers 141$p$ and 142$p$ which are directly in contact with the body extended portion 120 are formed.

(4) Step 18-4 (FIGS. 134A to 134C)

Then, the silicon nitride film 106 is selectively removed, and then a silicon nitride film 143 is formed on the overall surface.

(5) Step 18-5 (FIGS. 135A to 135C)

Then, a resist pattern RS2 for defining the pattern of the gate electrode shown in FIG. 123 is formed, and then the silicon nitride film 143, the n-type polysilicon film 105 and the body extended portion 120 are anisotropically etched by using the resist pattern RS2 as a mask.

(6) Step 18-6 (FIGS. 136A to 136C)

Then, the resist pattern RS2 is separated, and then the fence-shape silicon oxide film 140 shown in FIG. 135C is removed by, for example, a thin hydrofluoric acid process. Then, a silicon oxide film (a spacer) 144 is formed on the side walls of the first gate electrode 105 and the silicon layer 103. Then, ions are implanted to form an LDD (an $n^-$-type diffusion layer) 145.

Then, a polysilicon film 146 is formed on the side walls of the silicon nitride film 143 and the silicon oxide film 144. The foregoing polysilicon film 146 can be formed by forming a polysilicon film on the overall surface and by anisotropically etching the polysilicon film.

Then, n-type impurity ions are implanted into the silicon layer 103 by using the polysilicon film 146 and the silicon nitride film 143 as masks so that a source and drain region (an $n^+$-type diffusion layer) 121 is formed.

(7) Step 18-7 (FIGS. 137A to 137C)

Then, the polysilicon film 146 and the silicon nitride film 143 are removed by etching, such as CDE, and then a silicon nitride film, which will be formed into a spacer 147, is formed on the overall surface. Then, the silicon nitride film is anisotropically etched so that the spacer 147 is formed.

Then, a titanium film which will be formed into a titanium silicide film 148 is formed on the overall surface, and then a silicide reaction is allowed to take place so that the titanium silicide film 148 is formed on the n-type polysilicon film 105 and the source and drain region 121 in a self-alignment manner. The following process is similar to that for the process for forming a usual MOS transistor.

Nineteenth Embodiment

A nineteenth embodiment of the present invention will now be described. The device according to this embodiment characterized in that a silicon nitride film is employed as the gate insulation film.

If the time for which the silicon oxide film 140 is etched is too long in step 17-7 (FIGS. 128A to 128C) according to the seventeenth embodiment and step 18-2 (FIGS. 132A to 132C) according to the eighteenth embodiment, there arises a problem in that the gate oxide film 104 below the n-type polysilicon film 105 is undesirably etched. If the etching period of time is too short, p-n junction of a high concentration impurity is formed by the body extended portion (the $p^+$-type diffusion layer) and the source and drain region (the $n^+$-type diffusion layer) 121 and thus leak currents increase. If the etching period of time disperses, there arises a problem in that the characteristics of the device disperse.

Accordingly, this embodiment is arranged such that a silicon nitride film which is capable of changing the etching selection ratio with the silicon oxide film is employed. The etching rate of the silicon nitride film can be made to be significantly be lower than the silicon oxide film. Therefore, even if etching (overetching) is performed for a period of time longer than the period of time for which the silicon oxide film 140 is completely removed, the gate insulation film is not substantially etched. Thus, the above-mentioned problem can be prevented.

Twentieth Embodiment

FIGS. 138A to 138C and 139A to 139C are cross sectional views showing a method of manufacturing a MOS transistor having a body extended portion according to a twentieth embodiment. FIGS. 138A to 138C and 139A to 139C are arranged such that FIGS. 138A to 138C and 139A to 139C respectively are cross sectional views taken along lines 124A—124A, 124B—124B and 124C—124C shown in FIG. 123 which is a plan view.

Initially, an SOI substrate composed of a support substrate 101, a buried oxide film 102 and a silicon layer (SOI) 103 is formed.

Then, p-type impurity ions are implanted into a region 149 which will be formed into the body and the body extended portion in such a manner that the concentration of the impurity in their bottom portions is made to be $1 \times 10^{18}$ to $1 \times 10^{19}$ [number/cm$^3$]. The thickness of the body is made to be about 100 nm in order to prevent the fact that the body is made to be a vacancy layer and to cause the potential to be effectively transmitted in the direction of the width of the channel (see FIGS. 138A to 138C). Note that ions may be implanted after a buffer oxide film is formed on the silicon layer 103.

Then, an epitaxial growth method is employed to form an undoped epitaxial silicon film 150 on the silicon layer 103 (see FIGS. 139A to 139C).

It is preferable that the thickness of the epitaxial silicon film 150 be about 50 nm. If the thickness is the foregoing value, large operating force can be obtained while preventing the short channel effect.

Since the silicon layer 103 is not patterned into an island form (since the element is not isolated) when the epitaxial silicon film 150 is grown, the thickness of the epitaxial silicon film 150 is made to be uniform.

However, the conventional method, having the steps of patterning the silicon layer 103 into the island form (each device is isolated) and forming the epitaxial silicon film 150 on the silicon layer 103, encounters a problem in that a so-called local loading effect takes place such that the density of the device region causes the thickness of the epitaxial silicon film 150 to be dispersed.

Moreover, the conventional method has a problem in that the crystallinity of the epitaxial silicon film 150 deteriorates in the boundary between the isolation oxide film and the silicon layer 103 and thus a fault of crystal easily takes place. Since the gate electrode is formed to across the boundary between the isolation oxide film and the silicon layer 103, generation of the fault of crystal undesirably increase the leak current.

However, this embodiment having the structure, in which the isolation oxide film does not exist when the epitaxial silicon film 150 is grown, does not encounter the problem in that a fault of crystal takes place in the epitaxial silicon film 150 and thus the leak current increases.

Then, the threshold voltage is adjusted by implanting p-type impurity ions into the body. If adjustment is not needed and therefore implantation of p-type impurity ions is not performed, the concentration of the impurity in the body can be made to be about $10^{16}$ [number/cm$^3$].

Since the concentration of oxygen in the epitaxial silicon film 150 may be $10^{17}$ [number/cm$^3$] or lower, occurrence of a fault caused from precipitation of oxygen can be prevented as compared with a structure in which a usual silicon substrate in which the concentration of oxygen is about $10^{18}$ [number/cm$^3$].

Then, a gate oxide film is formed, and then an n-type polysilicon film and a silicon nitride film, which will be formed into the first gate electrode, are formed on the gate oxide film.

The following process is the same as that following step 17-2 according to the seventeenth embodiment. Since the process following step 17-2 enables the element to be isolated without a necessity of performing heat treatment at high transistors for a long time, dispersion of the impurity in the silicon layer 103 into the epitaxial film 159 can be prevented. Therefore, a profile having a sharp impurity concentration can be realized.

Twenty-First Embodiment

FIG. 140 is a perspective view showing a MOS transistor according to a twenty-first embodiment.

The device according to this embodiment is a MOS transistor having a buffer layer similarly to the seventeenth embodiment and arranged such that the gate electrode is not coupled to the body. Therefore, although the effect attainable from the buffer layer can be obtained, the effect attainable from the body extended portion cannot be obtained.

However, the method of manufacturing the device according to this embodiment has an excellent conformity with the manufacturing method according to the seventeenth embodiment. That is, employment of the element according to this embodiment as the MOS transistor of the type in which the gate electrode and the body are not coupled to each other enables both of a MOS transistor of the type in which the gate electrode and the body are coupled to each other and a MOS transistor of the type in which the gate electrode and the body are not coupled to each other to easily be manufactured on the same substrate. Moreover, isolation of the element can easily be performed.

The first gate electrode is made of n-type polysilicon, while the buffer layer is made of p-type polysilicon. The p-type polysilicon has an internal potential which is lower than that of the n-type polysilicon by about 1 V.

Therefore, the inversion layer cannot easily be formed in the body which is in contact with the buffer layer through the spacer (the insulation film) as compared with the body which is in contact with the first gate electrode through a gate oxide film.

As a result, generation of a parasitic transistor having a low threshold voltage in the edge portion of the body can be prevented. Thus, increase in the leak current in the sub-threshold region can be prevented.

Referring to FIGS. 141 to 145C, a manufacturing method according to this embodiment will now be described.

FIG. 141 is a plan view showing a variety of mask in patterns for use to manufacture the MOS transistor shown in FIG. 140. FIGS. 142A to 145C are arranged such that FIGS. 142A, 142B and 142C are cross sectional views respectively taken along lines 142A—142A, 142B—142B and 142C—142C shown in FIG. 141 which is a plan view.

(1) Step 21-1 (FIGS. 142A to 142C)

Initially, an SOI substrate composed of a support substrate 101, a buried oxide film 102 and a silicon layer (SOI) 103 is formed. Then, the threshold voltage is adjusted by implanting p-type impurity ions into the body, and then a gate oxide film 104 having a thickness of about 5 nm to about 10 nm is formed on the silicon layer 103. Note that an epitaxial silicon film having a thickness of 50 nm may be formed on the silicon layer 103 and the gate oxide film 104 may be formed on the epitaxial silicon film.

Then, a polysilicon film is formed on the gate oxide film 104 by the CVD method, and then n-type impurity ions are implanted into the polysilicon film so that an n-type polysilicon film 105 serving as the first gate electrode is formed. Then, a silicon nitride film 106 having a thickness of about 100 nm is formed on the n-type polysilicon film 105 by the CVD method.

(2) Step 21-2 (FIGS. 142A to 142C)

Then, a resist pattern (not shown) for defining the device region pattern shown in FIG. 141 is formed on the silicon nitride film 106. Then, the silicon nitride film 106 is anisotropically etched by using the resist pattern as a mask. Then, the resist pattern is separated.

(3) Step 21-3 (FIGS. 142A to 142C).

Then, a resist pattern RS6 for defining the buffer layer pattern shown in FIG. 141 is formed. Then, the n-type polysilicon film 105 and the gate oxide film 104 are anisotropically etched by using the resist pattern RS6 and the silicon nitride film 106 as masks so that the surface of the silicon layer 103 in the region in which the buffer layer will be formed is exposed.

(4) Step 21-4 (FIGS. 143A to 143C)

Then, the resist pattern RS6 is separated, and then the n-type polysilicon film 105, the gate oxide film 104 and the silicon layer 103 are anisotropically etched by using the silicon nitride film 106 as a mask so that the silicon layer 103 in the region in which the buffer layer will be formed and the n-type polysilicon film 105 and the gate oxide film 104 adjacent to the silicon layer 103 are removed.

(5) Step 21-5 (FIGS. 143A to 143C)

Then, a silicon oxide film (a spacer) 151 is, by heat oxidation, formed on the surfaces of the exposed silicon layer 103, the n-type polysilicon film (the first gate electrode) 105 and the gate oxide film 104.

(6) Step 21-6 (FIGS. 144A to 144C)

Then, an undoped polysilicon film having a thickness of about 200 nm and arranged to be a buffer layer ($p^+$-type polysilicon) 141$p$ is formed on the overall surface, and then the polysilicon film is anisotropically etched.

(7) Step 21-7 (FIGS. 144A to 144C)

Then, p-type impurity ions are implanted into the polysilicon film and the silicon layer 103 by using the silicon nitride film 106 as a mask so that a buffer layer ($p^+$-type polysilicon) 141$p$ and the body extended portion ($p^+$-type silicon) 120 are formed.

(8) Step 21-8 (FIGS. 145A to 145C)

Then, the silicon nitride film 106 is selectively separated. Then, a tungsten silicide film 108 and a silicon nitride film 109 are sequentially formed on the overall surface to serve as the second gate electrode. Then, a resist pattern RS2 for defining the pattern of the gate electrode shown in FIG. 141 is formed on the silicon nitride film 109. Then, the silicon nitride film 109, the tungsten silicide film 108, the n-type polysilicon film 105, the body extended portion 120 and the silicon oxide film 151 are etched by using the resist pattern RS2 as a mask. The tungsten silicide film 108 is formed by, for example, a sputtering method.

(9) Step 21-9

Then, a fence-shape silicon oxide film 151 shown in FIG. 145C is removed by, for example, a hydrofluoric acid process. The following process is similar to that for forming the usual MOS transistor.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor device comprising:
   a semiconductor layer formed on an insulation layer;
   a source diffusion layer and a drain diffusion layer formed in said semiconductor layer, said source diffusion layer and said drain diffusion layer being in contact with said insulation layer;
   a first gate electrode disposed on a gate insulation film over a first region of said semiconductor located between said source diffusion layer and said drain diffusion layer, said first gate electrode having a bottom surface area substantially equal to an upper surface area of said first region;
   a substrate potential control layer coupled to said first region and having a portion formed in a second region of said semiconductor layer that is not under said first gate electrode; and
   a second gate electrode disposed on and in contact with said first gate electrode.

2. An apparatus according to claim 1, wherein an impurity concentration of said substrate potential control layer is higher than that of said first region.

3. A semiconductor device comprising:
   a semiconductor layer formed on an insulation layer;
   a first gate electrode formed on a gate insulation layer over a first region of said semiconductor layer;
   a source diffusion layer and a drain diffusion layer formed in said semiconductor layer so as to be on opposite sides of said first region under said first gate electrode; and
   a substrate potential control layer coupled to said first region and having a portion adjacent to said first region whose length runs parallel to a line running between said source diffusion layer and said drain diffusion layer and is equal to a length of said first gate electrode running parallel to a line between said source diffusion layer and said drain diffusion layer.

4. An apparatus according to claim 3, wherein said substrate potential control layer has at least a portion that is formed in a second region of said semiconductor layer not under said first gate electrode, and further comprising a second gate electrode disposed to be coupled to said first gate electrode.

5. A semiconductor device comprising:
   a semiconductor layer formed on an insulation layer;
   a gate electrode disposed on a gate insulation film over a first region of said semiconductor layer, said first gate electrode having a bottom surface area substantially equal to an upper surface area of said first region;
   a source diffusion layer and a drain diffusion layer formed in said semiconductor layer on each of two opposite sides of said gate electrode to interpose said gate electrode and said first region there between;
   a substrate potential control layer coupled to said first region; and
   a conductor formed on a region of said substrate potential control layer and coupled to said gate electrode.

6. A semiconductor device comprising:
   a semiconductor layer formed on an insulation layer;
   a source diffusion layer and a drain diffusion layer formed in said semiconductor layer;
   a first gate electrode disposed on a gate insulation film over a first region of said semiconductor layer located between said source diffusion layer and said drain diffusion layer, said first gate electrode having a bottom surface area substantially equal to an upper surface area of said first region;
   a substrate potential control layer coupled to said first region and having at least a portion formed in a second region of said semiconductor layer that is not under said first gate electrode; and a second gate electrode disposed in contact with said first gate electrode and coupled directly or through a conductive material to said substrate potential control layer.

7. An apparatus according to claim 6, wherein a contact area of said second gate electrode and an upper surface of said substrate potential control layer is larger than a contact area of said second gate electrode and a side surface of said substrate potential control layer.

8. An apparatus according to claim 6, further comprising:

a buffer layer formed on a top surface of said substrate potential control layer adjacent to a boundary with said first gate electrode; and said second gate electrode is coupled to said substrate potential control layer across said buffer layer.

9. An apparatus according to claim 8, further comprising an insulation layer formed between said substrate potential control layer and said buffer layer.

10. A method of manufacturing a semiconductor device having a semiconductor layer formed on an insulation layer, a first gate electrode disposed on a gate insulation layer over a first region of semiconductor layer, a source diffusion layer and a drain diffusion layer formed in said semiconductor layer on each of two opposite sides of said first gate electrode, a substrate potential control layer coupled to said first region, and a second gate electrode disposed to be in contact with said first gate electrode, comprising the steps of:

forming said first electrode;

forming a conductive film on the overall surface in such a manner that said conductive film in contact with said first gate electrode so as to serve as said second gate electrode;

forming a mask pattern on said conductive film;

forming said second gate electrode by transferring said mask pattern to said conductive film; and forming said substrate potential control layer by transferring the pattern of said second gate electrode to said semiconductor layer.

* * * * *